(12) United States Patent
Nakamura

(10) Patent No.: US 11,101,133 B2
(45) Date of Patent: *Aug. 24, 2021

(54) SEMICONDUCTOR DEVICE AND MANUFACTURING METHOD THEREOF

(71) Applicant: Mitsubishi Electric Corporation, Tokyo (JP)

(72) Inventor: Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 16/448,225

(22) Filed: Jun. 21, 2019

(65) Prior Publication Data

US 2020/0058506 A1 Feb. 20, 2020

(30) Foreign Application Priority Data

Aug. 17, 2018 (JP) .............................. JP2018-153571

(51) Int. Cl.
*H01L 21/22* (2006.01)
*H01L 29/06* (2006.01)
(Continued)

(52) U.S. Cl.
CPC ...... *H01L 21/221* (2013.01); *H01L 21/26506* (2013.01); *H01L 21/304* (2013.01);
(Continued)

(58) Field of Classification Search
CPC ............. H01L 21/221; H01L 21/26506; H01L 21/304; H01L 21/30604; H01L 21/3225;
(Continued)

(56) References Cited

U.S. PATENT DOCUMENTS 5,025,293 A * 6/1991 Seki ...................... H01L 29/167
257/142
5,783,491 A 7/1998 Nakamura et al.
(Continued)

FOREIGN PATENT DOCUMENTS

JP H07-263692 A 10/1995
JP 2001-085686 A 3/2001
(Continued)

OTHER PUBLICATIONS

H. Takahashi et al., "1200V Reverse Conducting IGBT," Proceedings of International Symposium on Power Seminconductor Devices, 2004, pp. 133-136, Fukuoka, Japan.
(Continued)

*Primary Examiner* — Dale E Page
*Assistant Examiner* — Quovaunda Jefferson
(74) *Attorney, Agent, or Firm* — Studebaker & Brackett PC

(57) ABSTRACT

An object of the present invention is to provide stable withstand voltage characteristics, reduce turn-off losses along with a reduction in leakage current when the device is off, improve controllability of turn-off operations, and improve blocking capability at turn-off. An N buffer layer includes a first buffer layer joined to an active layer and having one peak in impurity concentration, and a second buffer layer joined to the first buffer layer and an N⁻ drift layer, having at least one peak point in impurity concentration, and having a lower maximum impurity concentration than the first buffer layer. The impurity concentration at the peak point of the first buffer layer is higher than the impurity concentration of the N⁻ drift layer, and the impurity concentration of the second buffer layer is higher than the impurity concentration of the N⁻ drift layer in the entire area of the second buffer layer.

6 Claims, 93 Drawing Sheets

(51) Int. Cl.
| | |
|---|---|
| *H01L 29/10* | (2006.01) |
| *H01L 29/08* | (2006.01) |
| *H01L 29/739* | (2006.01) |
| *H01L 29/868* | (2006.01) |
| *H01L 21/324* | (2006.01) |
| *H01L 29/66* | (2006.01) |
| *H01L 21/322* | (2006.01) |
| *H01L 21/304* | (2006.01) |
| *H01L 21/306* | (2006.01) |
| *H01L 21/265* | (2006.01) |
| *H01L 29/87* | (2006.01) |

(52) U.S. Cl.
CPC ...... *H01L 21/30604* (2013.01); *H01L 21/324* (2013.01); *H01L 21/3225* (2013.01); *H01L 29/0638* (2013.01); *H01L 29/0834* (2013.01); *H01L 29/1095* (2013.01); *H01L 29/66121* (2013.01); *H01L 29/66348* (2013.01); *H01L 29/7397* (2013.01); *H01L 29/868* (2013.01); *H01L 29/87* (2013.01)

(58) Field of Classification Search
CPC ............... H01L 21/324; H01L 29/0638; H01L 29/0834; H01L 29/1095; H01L 29/66121; H01L 29/66348; H01L 29/7397; H01L 29/868; H01L 29/87
See application file for complete search history.

(56) References Cited

U.S. PATENT DOCUMENTS

| | | | |
|---|---|---|---|
| 6,482,681 | B1 | 11/2002 | Francis et al. |
| 6,953,968 | B2 | 10/2005 | Nakamura et al. |
| 7,514,750 | B2 | 4/2009 | Mauder et al. |
| 7,538,412 | B2 | 5/2009 | Schulze et al. |
| 8,686,469 | B2 | 4/2014 | Nakamura |
| 8,698,195 | B2 | 4/2014 | Oya et al. |
| 9,041,051 | B2 | 5/2015 | Chen et al. |
| 9,287,391 | B2 | 3/2016 | Chen et al. |
| 10,026,803 | B1 * | 7/2018 | Nakamura ......... H01L 29/0834 |
| 2002/0121661 | A1 | 9/2002 | Nakamura |
| 2003/0042537 | A1 | 3/2003 | Nakamura et al. |
| 2003/0047778 | A1 | 3/2003 | Nakamura et al. |
| 2010/0327313 | A1 | 12/2010 | Nakamura |
| 2015/0235866 | A1 | 8/2015 | Nakamura |
| 2016/0254375 | A1 | 9/2016 | Nakamura |
| 2016/0260703 | A1 | 9/2016 | Nakamura |
| 2017/0154955 | A1 | 6/2017 | Harada et al. |
| 2018/0012762 | A1 | 1/2018 | Mukai et al. |
| 2018/0182844 | A1 | 6/2018 | Nakamura |

FOREIGN PATENT DOCUMENTS

| | | |
|---|---|---|
| JP | 4205128 B2 | 1/2009 |
| JP | 4785334 B2 | 10/2011 |
| JP | 5256357 B2 | 8/2013 |
| JP | 2014-056976 A | 3/2014 |
| JP | 2014-241433 A | 12/2014 |
| JP | 5634318 B2 | 12/2014 |
| JP | 5701447 B2 | 4/2015 |
| JP | 5708803 B2 | 4/2015 |
| JP | 5908524 B2 | 4/2016 |
| JP | 2017-098440 A | 6/2017 |
| JP | 2018-107303 A | 7/2018 |
| WO | 2002/058160 A1 | 7/2002 |
| WO | 2002/061845 A1 | 8/2002 |
| WO | 2009/122486 A1 | 10/2009 |
| WO | 2014/054121 A1 | 4/2014 |
| WO | 2015/114747 A1 | 8/2015 |
| WO | 2015/114748 A1 | 8/2015 |
| WO | 2017/047285 A1 | 3/2017 |

OTHER PUBLICATIONS

T. Naito et al., "1200V Reverse Blocking IGBT with low loss for Matrix Converter," Proceedings of International Symposium on Power Semiconductor Devices, 2004, pp. 125-128, Japan.

K. Nakamura et al., "Evaluation of Oscillatory Phenomena in Reverse Operation for High Voltage Diodes," Proceedings of International Symposium on Power Semiconductor Devices, 2009, pp. 156-159, Japan.

K. Nakamura et al., "Advanced RFC Technology with New Cathode Structure of Field Limiting Rings for High Voltage Planar Diode," Proceedings of the 22nd International Symposium on Power Semiconductor Devices, HV-P3, 2010, pp. 133-136, Japan.

G. Davies et al., "Radiation Damage in Silicon Exposed to High-Energy Proton," Physical Review B 73, 165292, 2006, pp. 165202-1-165202-10.

An Office Action mailed by the Japanese Patent Office dated Jun. 29, 2021, which corresponds to Japanese Patent Application No. 2018-153571 and is related to U.S. Appl. No. 16/448,225.

* cited by examiner

FIG. 47

| SAMPLE NUMBER | DIODE PERFORMANCE | | | |
|---|---|---|---|---|
| | $J_R$ (A/cm²) @$V_R$=1200 V 175 °C | BREAKDOWN TOLERANCE | | |
| | | $V_{snap-off}$ @900 V, $J_F$=×0.1$J_A$, $dj/dt$=7000A/μs, $dv/dt$=56000V/μs, $L_S$=200nH, 298 K | INTERRUPTING TEMPERATURE @950 V, $J_F$=×0.1$J_A$, $dj/dt$=1000A/μs, $dv/dt$=12500V/μs, $L_S$=2.0μH | MAXIMUM BLOCKING CURRENT DENSITY ($J_A$(break)) @900 V, $dj/dt$=30000A/μs, $dv/dt$=15000V/μs, $L_S$=200nH, 448 K |
| 1 | 1.31×10⁻³ | 1177 V | 213 K | ≧3300 A/cm²(10$J_A$) (NONDESTRUCTIVE) |
| 2 | 1.64×10⁻³ | 1175 V | 213 K | ≧3300 A/cm²(10$J_A$) (NONDESTRUCTIVE) |
| 3 | 2.06×10⁻³ | 1286 V | 213 K | 2280 A/cm²(7$J_A$) |

FIG. 49

| SAMPLE NUMBER | $J_R(A/cm^2)$ @$V_R$=1200 V 175 °C | DIODE PERFORMANCE | | |
|---|---|---|---|---|
| | | BREAKDOWN TOLERANCE | | |
| | | $V_{snap-off}$ @900 V, dj/dt=7000A/μs, dv/dt=56000V/μs, $L_S$=200nH, 298 K | INTERRUPTING TEMPERATURE @950 V, dj/dt=1000A/μs, dv/dt=12500V/μs, $L_S$=2.0μH | MAXIMUM BLOCKING CURRENT DENSITY ($J_A$(break)) @900 V, dj/dt=30000A/μs, dv/dt=15000V/μs, $L_S$=200nH, 448 K |
| 1 | $1.31 \times 10^{-3}$ | 1177 V | 213 K | ≧3300 A/cm² (10$J_A$) (NONDESTRUCTIVE) |
| 5 | $1.37 \times 10^{-3}$ | 1167 V | 213 K | ≧3300 A/cm² (10$J_A$) (NONDESTRUCTIVE) |
| 6 | $1.38 \times 10^{-3}$ | 1160 V | 213 K | ≧3300 A/cm² (10$J_A$) (NONDESTRUCTIVE) |

SEMICONDUCTOR DEVICE AND MANUFACTURING METHOD THEREOF

BACKGROUND OF THE INVENTION

Field of the Invention

The present invention relates to a semiconductor device including a power semiconductor element such as an IGBT or a diode.

Description of the Background Art

Conventional vertical semiconductor devices such as trench-gate IGBTs and PIN diodes have a vertical structure area. In IGBTs, the vertical structure area is an area that includes an N-type drift layer, an N-type buffer layer, and a P-type collector layer, and in diodes, the vertical structure area is an area that includes an N-type drift layer, an N-type buffer layer, and an N-type cathode layer. International Publication No. 2014/054121 discloses an IGBT having a vertical structure.

Conventional vertical semiconductor devices having a vertical structure area such as IGBTs or diodes may use a wafer manufactured by the FZ method as an Si wafer for manufacturing a semiconductor device, instead of a wafer manufactured by epitaxial growth. In that case, the vertical structure area of the wafer, e.g., the N-type buffer layer in an IGBT, has a high impurity concentration and an impurity profile with a steep gradient toward its junction with the N-type drift layer.

SUMMARY

It is an object of the present invention to, in a semiconductor device having a vertical structure, provide stable withstand voltage characteristics, reduce turn-off losses along with a reduction in leakage current when the device is off, improve controllability of turn-off operations, and improve blocking capability at turn-off.

A semiconductor device according to the present invention includes a semiconductor base substrate, a buffer layer of a first conductivity type, an active layer, a first electrode, and a second electrode. The semiconductor base substrate has first and second main surfaces and includes a drift layer of the first conductivity type as a principle component. In the semiconductor base substrate, the buffer layer is formed adjacent to the drift layer on the second main surface side of the drift layer. The active layer is formed on the second main surface of the semiconductor base substrate and has at least one of first and second conductivity types. The first electrode is formed on the first main surface of the semiconductor base substrate. The second electrode is formed on the active layer. The buffer layer is joined to the active layer. The buffer layer includes a first buffer layer and a second buffer layer. The first buffer layer has one peak point in impurity concentration. The second buffer layer is joined to the first buffer layer and the drift layer, has at least one peak point in impurity concentration, and has a lower maximum impurity concentration than the first buffer layer. The impurity concentration at the peak point of the first buffer layer is higher than the impurity concentration of the drift layer. The impurity concentration of the second buffer layer is higher than the impurity concentration of the drift layer in the entire area of the second buffer layer.

In the semiconductor device according to the present invention, the impurity concentration at the peak point of the first buffer layer is higher than the impurity concentration of the drift layer, and the impurity concentration of the second buffer layer is higher than the impurity concentration of the drift layer in the entire area of the second buffer layer. Therefore, the semiconductor device according to the present invention achieves providing stable withstand voltage characteristics, reducing turn-off losses along with a reduction in leakage current when the device is off, improving controllability of turn-off operations, and improving blocking capability at turn-off.

BRIEF DESCRIPTION OF THE DRAWINGS

FIG. 47 illustrates diode performance of the RFC diode that applies the impurity profiles of Samples 1 to 3;

FIG. 49 illustrates diode performance of the RFC diodes that applies impurity profiles of Samples 1, 5, and 6;

DESCRIPTION OF THE PREFERRED EMBODIMENTS

Principle of Present Invention

The present invention relates to a vertical structure area of a semiconductor device that includes a bipolar power semiconductor element such as a diode or an insulated gate bipolar transistor (IGBT) serving as a key component of a power module (with a withstand voltage (rated voltage) higher than or equal to 600 V). The vertical structure area has features (a) to (d) described below.

Feature (a) is to achieve low turn-off losses or high-temperature operations by improving voltage blocking capability in the OFF state and reducing leakage current when the withstand voltage is held at a high temperature.

Feature (b) is to suppress a phenomenon in which a voltage jumps up at the end of a turn-off operation (hereinafter, simply referred to as a "snap-off phenomenon") and an oscillation phenomenon caused by the snap-off phenomenon.

Feature (c) is to improve blocking capability during a turn-off operation.

Feature (d) is the ability to be incorporated in a wafer process technique that is compatible with an increase in diameter greater than or equal to 200 nm for wafers that are used in manufacturing semiconductors.

Note that the "voltage blocking capability in the OFF state" in Feature (a) refers to voltage holding capability in a static state where no current flows. The "blocking capability during a turn-off operation" in Feature (c) refers to voltage holding capability in a dynamic state where current is flowing.

Although in embodiments described below, an IGBT and a diode are given as typical examples of a power semiconductor element, the present invention is also applicable to a power semiconductor such as a reverse conducting (RC-) IGBT, a reverse blocking (RB-) IGBT, or a metal oxide semiconductor field effect transistor (MOSFET), and can achieve effects on the above-described object.

Such an RC-IGBT is described in H. Takahashi, et. al., "1200-V Reverse Conducting IGBT," Proc. ISPSD2004, pp. 133-136, 2004, and such an RB-IGBT is described in T. Naito, et. al., "1200-V Reverse Blocking IGBT with Low Loss for Matrix Converter," Proc. ISPSD2004, pp. 125-128, 2004.

While a semiconductor device using Si as its semiconductor material is exemplified hereinafter, the present invention also achieves effects on semiconductor devices using a wide bandgap material such as silicon carbide (SiC) or gallium nitride (GaN). Although an example of using the floating zone (FZ) method as a method of producing Si crystals is described hereinafter, the same effects can also be achieved by using the magnetic field applied Czochralski (MCZ) method. Furthermore, although semiconductor devices with withstand-voltage classes of 1200 V and 4500 V are exemplified hereinafter, the present invention can achieve effects on the above-described object, regardless of the withstand-voltage class.

Figure 1:
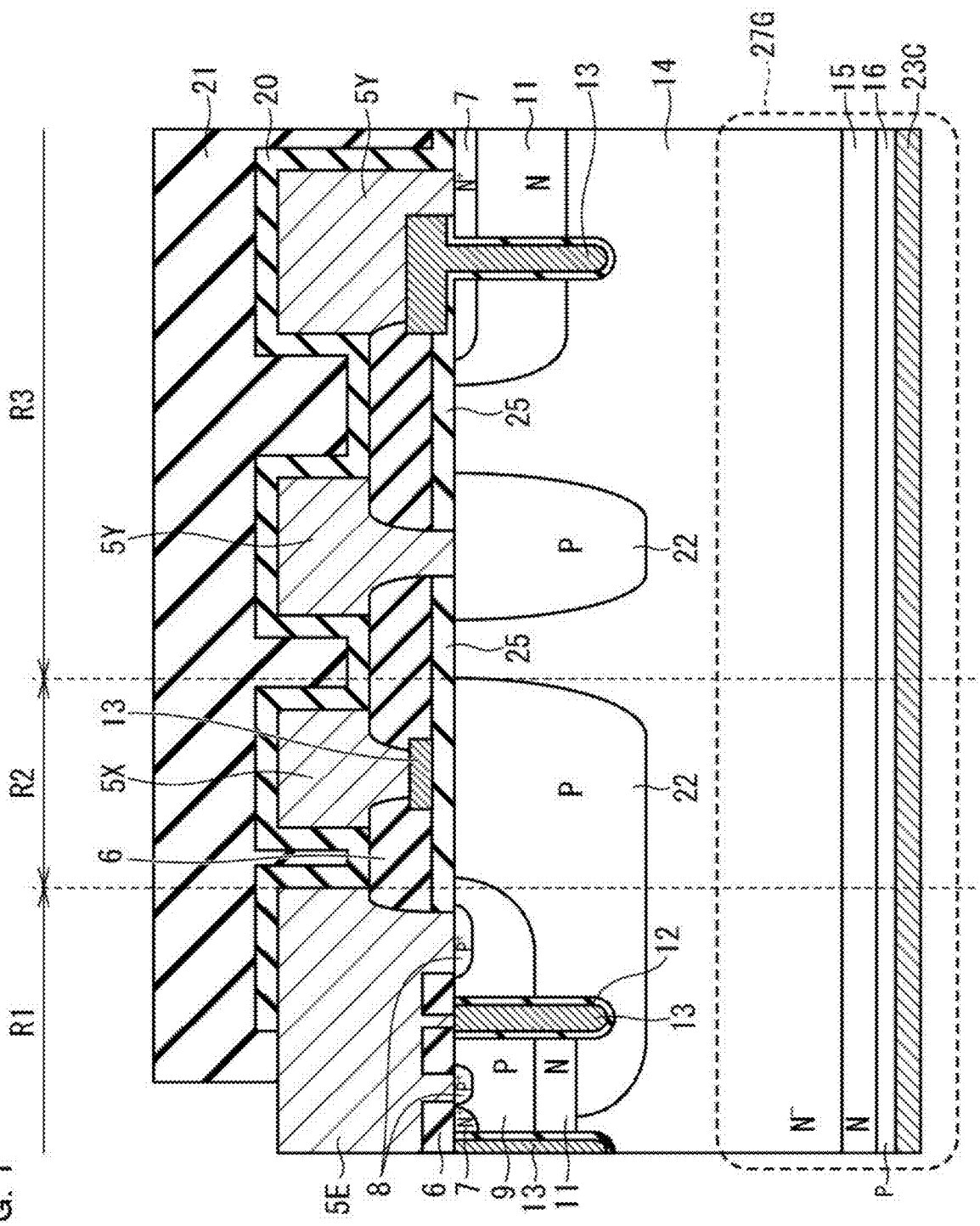
FIG. 1 is a sectional view of a trench-gate IGBT as a basic structure of the present invention.
Figure 2:
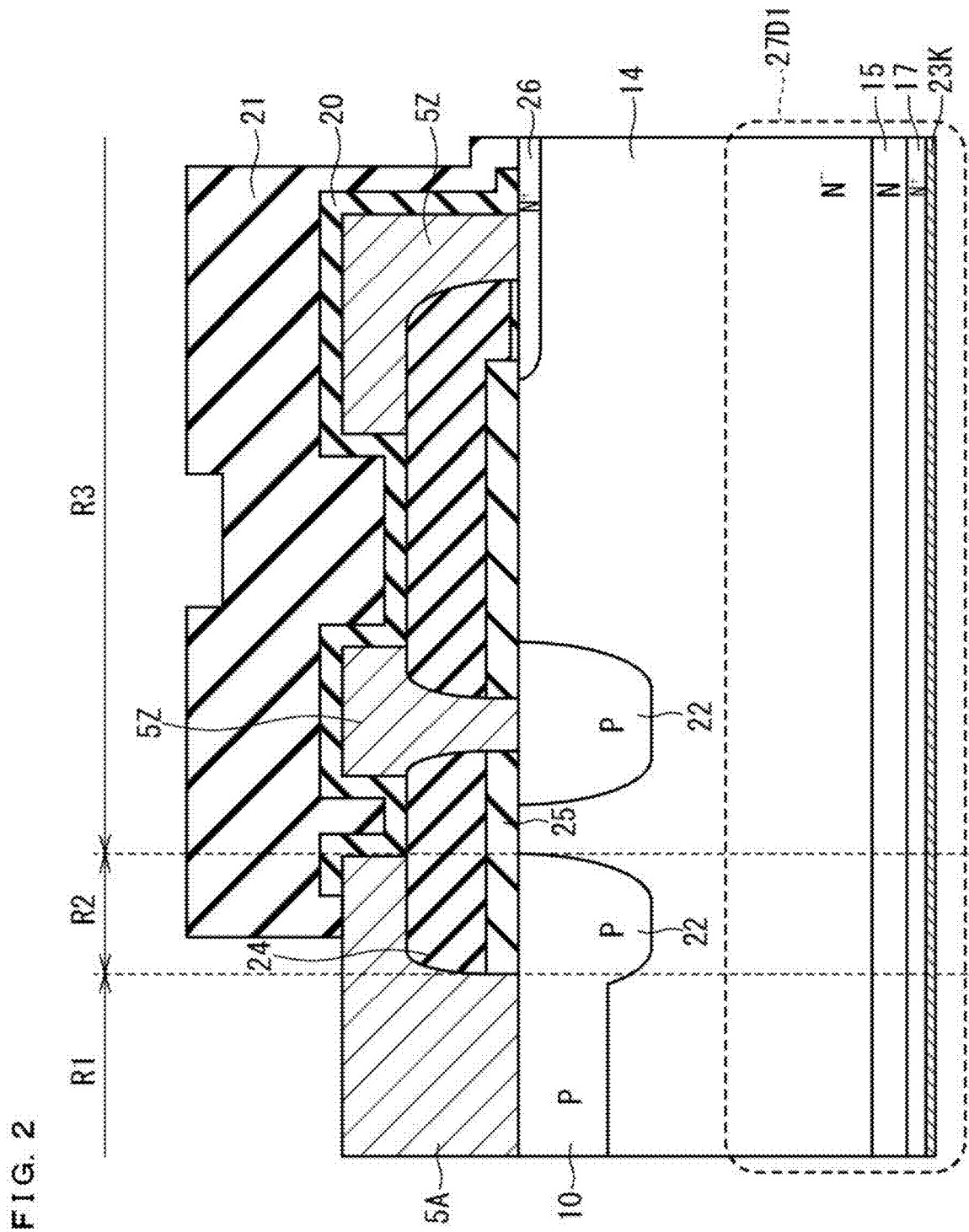
FIG. 2 is a sectional view of a PIN diode as a basic structure of the present invention.
Figure 3:
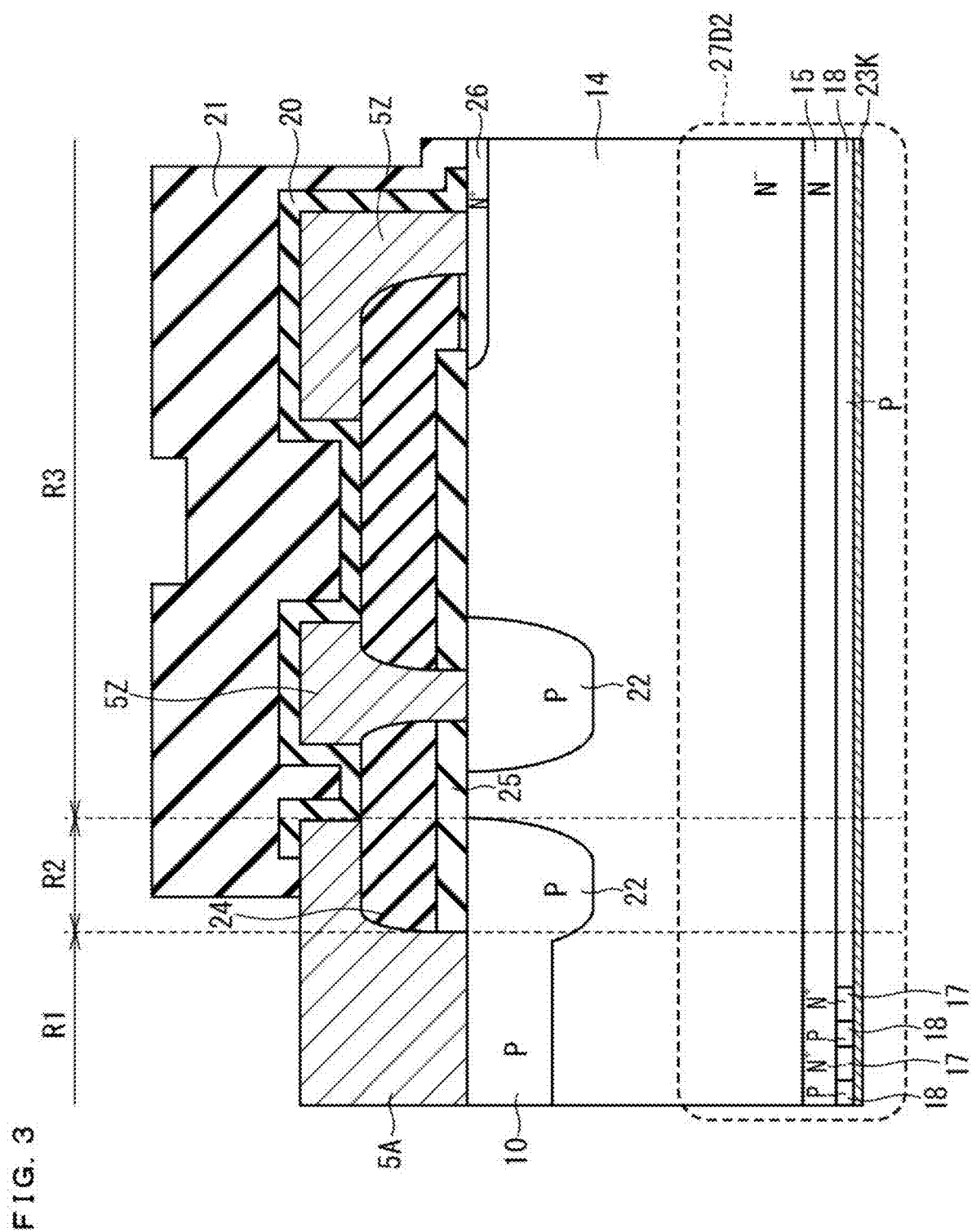
FIG. 3 is a sectional view of a relaxed field of cathode (RFC) diode as a basic structure of the present invention.

FIGS. 1, 2 and 3 are sectional views illustrating structures of semiconductor devices each having a vertical structure, and the structures illustrated in these drawings serve as a basic structure of the present invention. FIG. 1 illustrates a trench-gate IGBT, FIG. 2 illustrates a PIN diode, and FIG. 3 illustrates an RFC diode. The RFC diode is a diode formed by connecting a PIN diode and a PNP transistor in parallel. The RFC diode is described in K. Nakamura, et. al., Proc. ISPSD2009, pp. 156-158, 2009 and K. Nakamura, et. al., Proc. ISPSD2010, pp. 133-136. 2010.

The structure of the trench-gate IGBT is described with reference to FIG. 1.

First, the structure in an active cell area R1 of the trench-gate IGBT is described. An N buffer layer 15 is formed adjacent to an N⁻ drift layer 14 on the lower surface (second main surface) of the N⁻ drift layer 14. On the lower surface of the N buffer layer 15, a P collector layer 16 of a P-type (second conductivity type) is formed adjacent to the N buffer layer 15. On the lower surface of the P collector layer 16, a collector electrode 23C is formed adjacent to the P collector layer 16. In the following description, a structural part that includes at least the N⁻ drift layer 14, which is a drift layer of an N-type (first conductivity type), and the N buffer layer 15, which is a buffer layer of the N-type, may be referred to as a "semiconductor base substrate." The N⁻ drift layer 14 is a principle component of the semiconductor base substrate.

An N layer 11 is formed in the upper layer portion of the N⁻ drift layer 14. On the upper surface of the N layer 11, a P base layer 9 is formed. Gate electrodes 13 made of polysilicon and having a trench structure are formed so as to vertically penetrate the P base layer 9 and the N layer 11. The gate electrodes 13 face the N⁻ drift layer 14, the N layer 11, the P base layer 9, and an N⁺ emitter layer 7 via a gate insulating film 12. The gate electrodes 13, the N⁺ emitter layer 7, the P base layer 9, and the N layer 11 thereby form an insulated gate transistor-forming area in the IGBT.

The N+ emitter layer 7 of the N-type is formed in contact with the gate insulating film 12 in the outer layer of the P base layer 9. A P+ layer 8 is also formed in the outer layer of the P base layer 9. An interlayer insulating film 6 is formed on the gate electrodes 13. On the upper surface (first main surface) of the N− drift layer 14, an emitter electrode 5E is formed as a first electrode so as to be electrically connected to the N+ emitter layer 7 and the P+ layer 8. Among two gate electrodes 13 illustrated in the active cell area R1 in FIG. 1, the left gate electrode 13 serves actually as the gate electrode, but the right gate electrode 13 does not actually serve as the gate electrode and serves as a dummy electrode that is to be an emitter potential. The purpose and effect of the dummy electrode are described in Japanese Patents No. 4205128, No. 4785334, and No. 5634318 and includes, for example, suppressing saturation current densities in the IGBT; suppressing oscillations in short-circuit conditions at no load by controlling capacitance characteristics; improving short-circuit current capability thereby; and reducing an ON-state voltage by improving the carrier density on the emitter side.

Next, the structure in an interface area R2 of the trench-gate IGBT is described. A P area 22 is formed in the upper layer portion of the N− drift layer 14. The P area 22 extends toward the active cell area R1 and is formed deeper than a gate electrode 13 that serves as a dummy electrode. The P area 22 functions as a guard ring.

An insulating film 25 is formed on the upper surface of the N− drift layer 14, and on the insulating film 25, part of the gate electrode 13 that is also referred to as a surface gate electrode and an interlayer insulating film 6 that surrounds the surface gate electrode are formed. On the surface gate electrode surrounded by the interlayer insulating film 6, an electrode 5X that functions as a gate electrode is formed. The electrode 5X is formed simultaneously with and independently of the emitter electrode 5E formed in the active cell area R1.

Next, a termination area R3 of the trench-gate IGBT is described. A P area 22 is selectively formed in the upper layer portion of the N− drift layer 14. The P area 22 functions as a field limiting ring. Moreover, a configuration of the insulated gate transistor structure in the active cell area R1, other than the P base layer 9, is formed.

The P area 22 is provided as an area that stimulates a withstand voltage holding function in each of the interface area R2 and the termination area R3. The N+ emitter layer 7 and the N layer 11 of the insulated gate transistor structure in the termination area R3 are provided in order to prevent extension of a depletion layer that extends from a p-n junction between the P area 22 and the N− drift layer 14.

On the upper surface of the N− drift layer 14, a laminated structure of the insulating films 25 and the interlayer insulating film 6 is formed selectively. Also, an electrode 5Y is formed so as to be electrically connected to the P area 22 and the gate electrode 13 and to serve as a floating electrode. This electrode 5Y is formed simultaneously with the emitter electrode 5E formed in the active cell area R1 and independently of the emitter electrode 5E and the electrode 5X.

Then, a passivation film 20 is formed on the emitter electrode 5E and the electrodes 5X and 5Y across the active cell area R1, the interface area R2, and the termination area R3. The passivation film serves as a protective film for protecting the surfaces where the emitter electrodes 5E, 5X, and 5Y are formed. Also, a passivation film 21 serving as a protective film is formed on the passivation film 20 and part of the emitter electrode 5E in the active cell region R1.

Moreover, a common vertical structure area 27G for the IGBT is formed in the active cell area R1, the interface area R2, and the termination area R3. The vertical structure area 27G has a laminated structure of the N− drift layer 14, the N buffer layer 15, the P collector layer 16, and the collector electrode 23C, the N− drift layer 14 and the N buffer layer 15 forming the semiconductor base substrate.

The structure of the PIN diode is described with reference to FIG. 2. First, the structure in the active cell area R1 of the PIN diode is described. An N buffer layer 15 is formed on the lower surface of the N− drift layer 14 that is a second surface. On the lower surface of the N buffer layer 15, an N+ cathode layer 17 that serves as an active layer is formed. On the lower surface of the N+ cathode layer 17, a cathode electrode 23K is formed as a second electrode.

In the upper layer portion of the N− drift layer 14, a P anode layer 10 is formed as a first electrode area. The P anode layer 10, the N− drift layer 14, the N buffer layer 15, and the N+ cathode layer 17 form a PIN diode structure. Then, an anode electrode 5A is formed as a first electrode on a first main surface that is the upper surface of the P anode layer 10.

Next, the structure in the interface area R2 of the PIN diode is described. The P area 22 is formed in the upper layer portion of the N− drift layer 14. The P area 22 extends toward the active cell area R1 and is coupled to the P anode layer 10. At this time, the P area 22 is formed deeper than the P anode layer 10. This P area 22 functions as a guard ring.

An insulating film 25 is formed on the upper surface of the N− drift layer 14, an interlayer insulating film 24 is formed on the insulating film 25, and an electrode 5A is formed on part of the interlayer insulating film 24.

Next, the structure in the termination area R3 in FIG. 2 is described. The P area 22 is formed selectively in the upper layer portion of the N− drift layer 14. The P area 22 functions as a field limiting ring. Also, an N+ layer 26 is formed selectively and independently of the P area 22 in the outer layer of the N− drift layer 14. The N+ layer 26 is provided in order to prevent extension of a depletion layer that extends from a junction between the P area 22 and the N− drift layer 14. The withstand-voltage class of the PIN diode rises as the number of P areas 22 increases.

On the upper surface of the N− drift layer 14, a laminated structure of the insulating film 25 and the interlayer insulating film 24 is formed selectively, and an electrode 5Z is formed so as to be electrically connected to the P area 22 and the N+ layer 26. The electrode 5Z is formed simultaneously with and independently of the anode electrode 5A formed in the active cell area R1.

Then, the passivation film 20 serving as a protective film is formed on the anode electrode 5A and the electrode 5Z in the interface area R2 and the termination area R3, and the passivation film 21 serving as a protective film is formed on the passivation film 20 and part of the anode electrode 5A in the interface area R2.

Moreover, a common vertical structure area 27D1 for the diode is formed in the active cell area R1, the interface area R2, and the termination area R3. The vertical structure area 27D1 has a laminated structure of the N− drift layer 14, the N buffer layer 15, the N+ cathode layer 17, and the cathode electrode 23K, in which the N− drift layer 14 and the N buffer layer 15 form the semiconductor base substrate.

Next, the structure of the RFC diode in FIG. 3 is described. The RFC diode is configured such that part of the N+ cathode layer 17 serving as an active layer in the active cell area R1 of the PIN diode illustrated in FIG. 2 is replaced by the P cathode layer 18, and the N⁺ cathode layer 17 in the interface area R2 and the termination area R3 is replaced by the P cathode layer 18. The other configuration is similar to that of the PIN diode. That is, the active layer in the RFC diode is configured to include the N⁺ cathode layer 17 that serves as a first partial active layer, and the P cathode layer 18 that serves as a second partial active layer.

As compared with the PIN diode, the RFC diode has distinctive effects in terms of diode performance, such as an electric field-relieving phenomenon in which the electric field intensity on the cathode side is relieved, as described in Japanese Patent No. 5256357 and Japanese Patent Application Laid-Open No. 2014-241433. As described in Japanese Patent No. 5256357 or Japanese Patent Application Laid-Open No. 2014-241433 (U.S. Pat. No. 8,686,469), hole injection from the P cathode layer 18 is encouraged in the latter half of a recovery operation. This relieves the electric field intensity on the cathode side and suppresses a snap-off phenomenon and a subsequent oscillation phenomena at the end of the recovery operation, thereby producing distinctive effects in terms of diode performance, such as improving breakdown tolerance during a recovery operation.

From the viewpoint of ensuring the aforementioned effects, the N⁺ cathode layer 17 and the P cathode layer 18 are disposed so as to satisfy the relationship described in Japanese Patent No. 5256357 or Japanese Patent Application Laid-Open No. 2014-241433 (U.S. Pat. No. 8,686,469). The RFC diode, expressed by an equivalent circuit, has a diode structure in which a PIN diode and a PNP transistor are connected in parallel. The N⁻ drift layer 14 is a variable resistance area.

Figure 4:
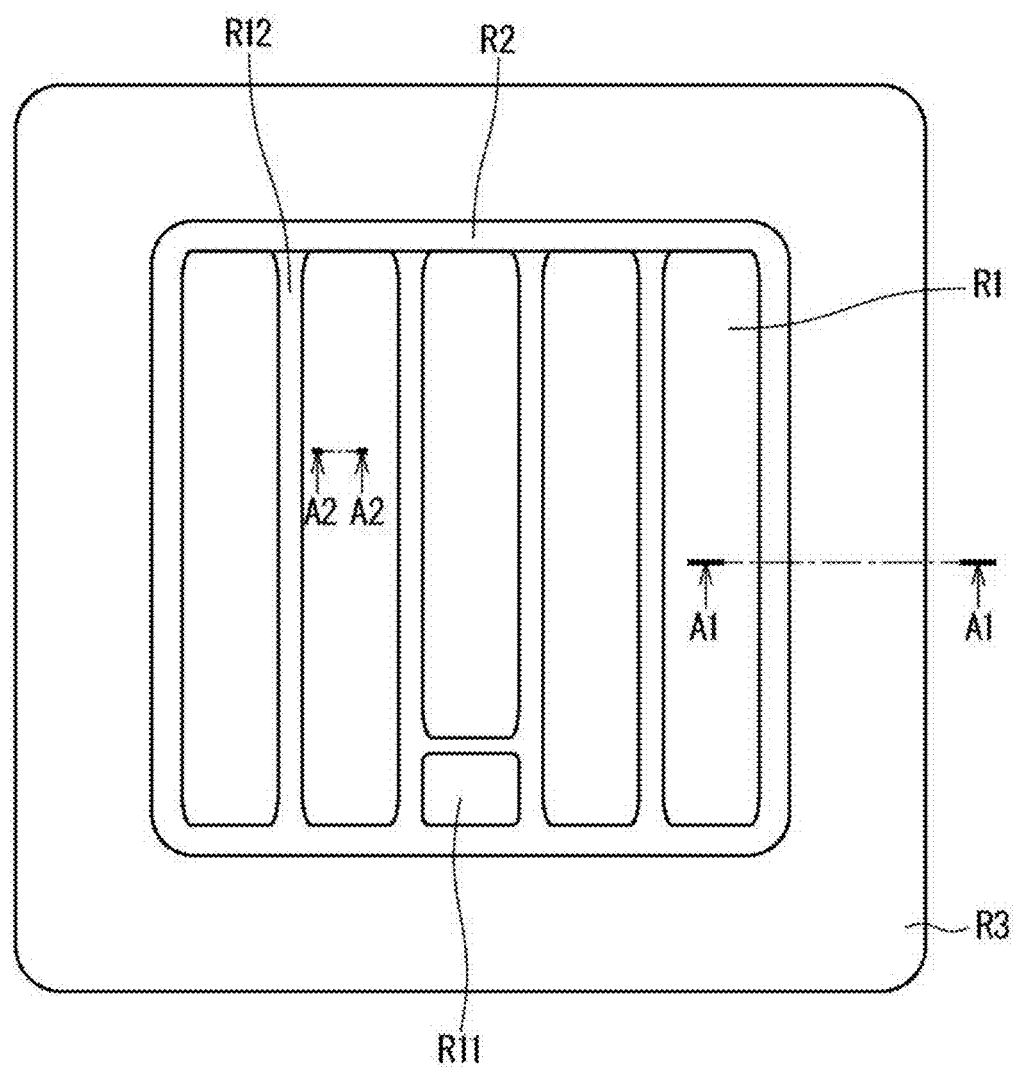
FIG. 4 is a plan view of one of the vertical semiconductor devices illustrated in FIGS. 1 to 3.

FIG. 4 is an explanatory diagram schematically illustrating a planar structure of the vertical semiconductor device such as an IGBT or a diode. As illustrated in FIG. 4, a plurality of active cell areas R1 is provided in a central portion, a surface gate line portion R12 is provided between each pair of adjacent active cell areas R1, and a gate pad portion R11 is provided in a partial area.

The interface area R2 is formed so as to surround the active cell areas R1, the gate pad portion R11, and the surface gate line portion R12, whereas the termination area R3 is provided so as to surround the interface area R2. The structures illustrated in FIG. 1, FIG. 2, and FIG. 3 correspond to a section taken along A1-A1 in FIG. 4.

The aforementioned active cell areas R1 are element forming areas that ensure basic performance of a power semiconductor chip. A peripheral area including the interface area R2 and the termination area R3 is provided for the purpose of holding the withstand voltage in terms of reliability. Out of these areas, the interface area R2 is an area that ensures breakdown tolerance when a power semiconductor performs a dynamic operation in a joint area of the active cell area R1 and the termination area R3 and that supports intrinsic performance (of the semiconductor elements) in the active cell areas R1. The termination area R3 is an area that holds the withstand voltage in a static state, stabilizes withstand voltage characteristics, ensures reliability, suppresses failures in breakdown tolerance during a dynamic operation, and supports intrinsic performance in the active cell areas R1.

The vertical structure area 27 (vertical structure areas 27G, 27D1, and 27D2) is an area that ensures total loss performance, holds the withstand voltage in a static state, stabilizes withstand voltage characteristics, ensures reliability and stability in leakage characteristics at high temperatures, ensures controllability and breakdown tolerance during a dynamic operation, and supports basic performance of the power semiconductor. The total loss as used herein refers to a loss obtained by adding losses in an ON state and losses in turn-on and -off states. In particular, the N buffer layer 15 in the vertical structure area 27 has the above-described features (a) to (c).

Method of Manufacturing IGBT

FIG. 5 to 17 are sectional views illustrating a method of manufacturing the IGBT. These drawings illustrate a method of manufacturing the IGBT in the active cell area R1.

Figure 5:
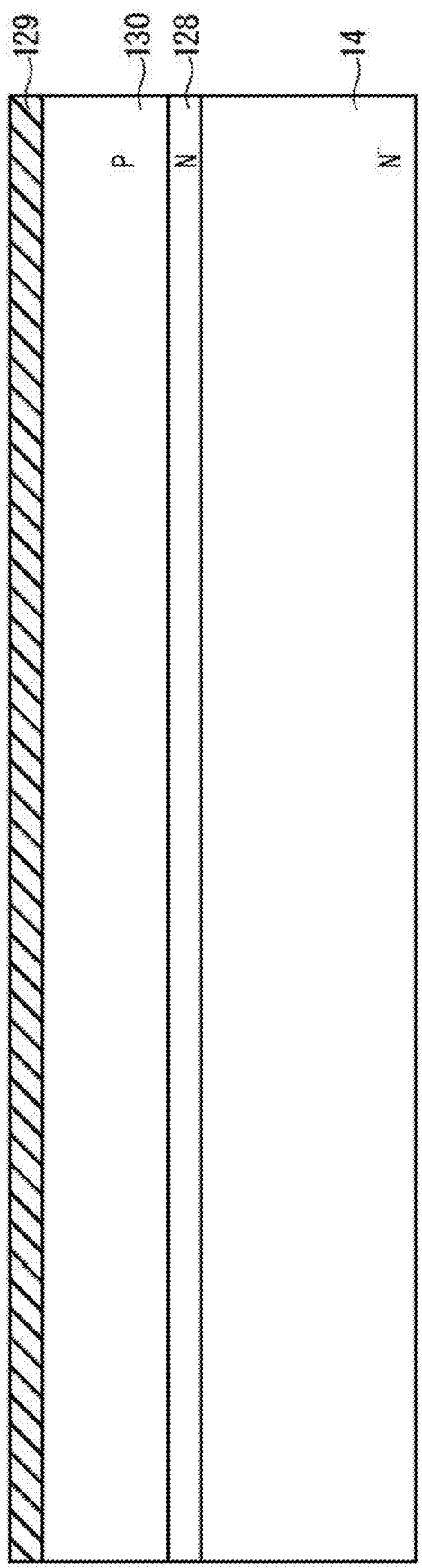
FIG. 5 is a sectional view illustrating a step of manufacturing the IGBT.

First, a silicon wafer formed by the FZ method (hereinafter, such a silicon wafer or a processed silicon wafer is referred to as a "semiconductor base substrate") is prepared. As illustrated in FIG. 5, an N layer 128 and a P base layer 130 are formed in the upper layer portion of the semiconductor base substrate in which the N⁻ drift layer 14 is formed. Specifically, the N layer 128 and the P base layer 130 are formed by subjecting the N⁻ drift layer 14 to ion implantation and annealing. Also, an $SiO_2$ film 129 is formed on the P base layer 130.

Figure 6:
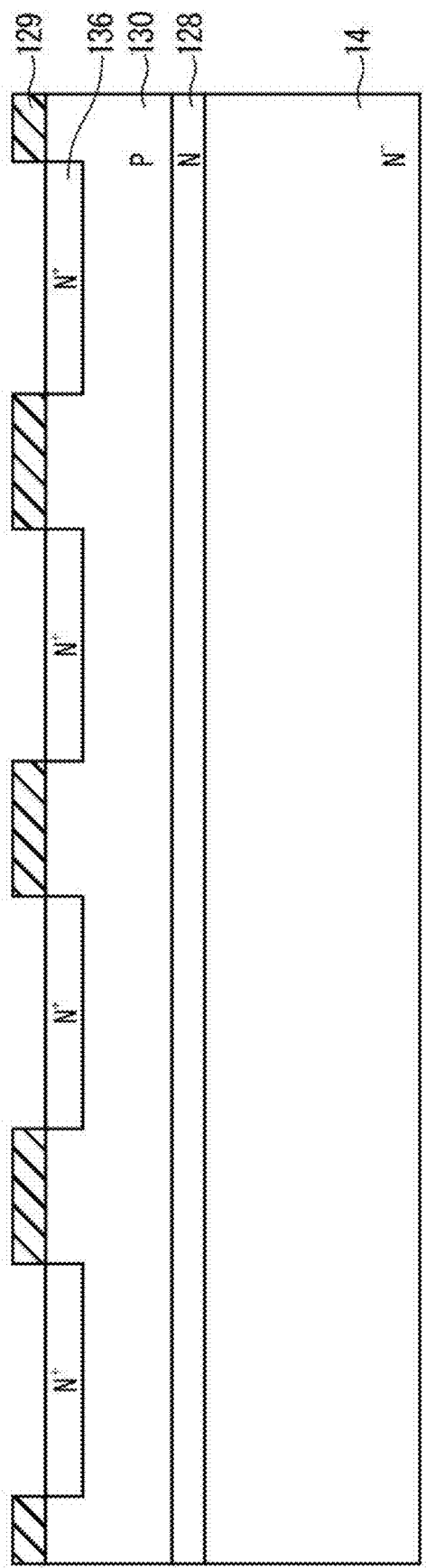
FIG. 6 is a sectional view illustrating a step of manufacturing the IGBT.

Next, as illustrated in FIG. 6, the semiconductor base substrate is subjected to ion implantation and annealing to selectively form a plurality of N⁺ emitter layers 136 in the outer surface of the P base layer 130.

Figure 7:
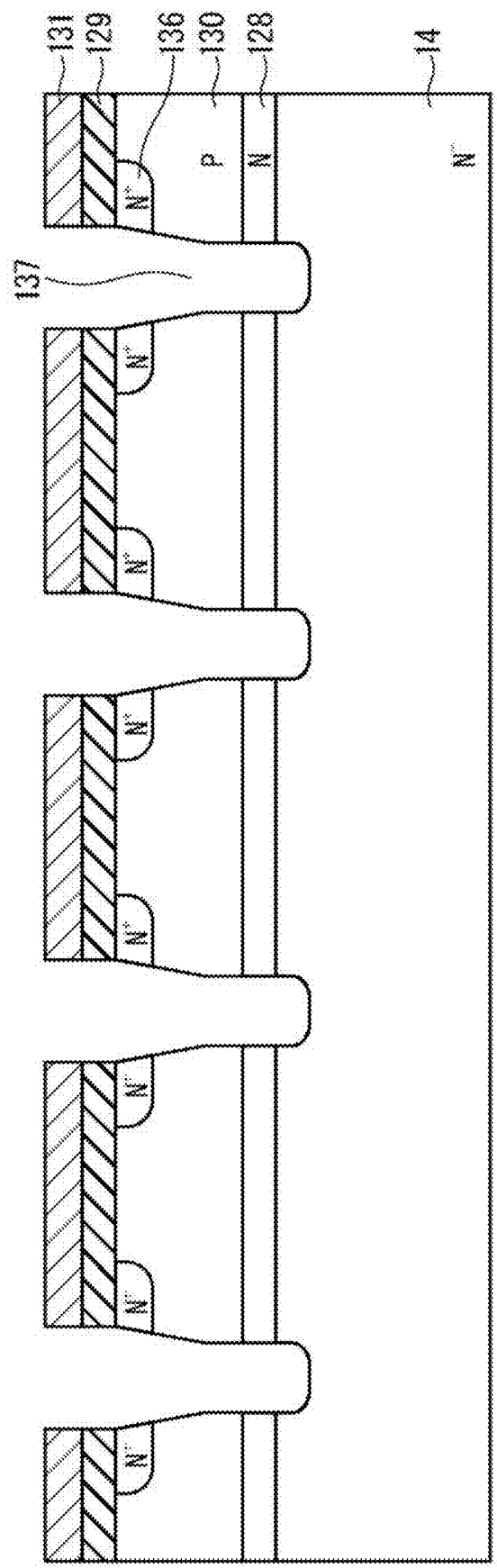
FIG. 7 is a sectional view illustrating a step of manufacturing the IGBT.

Next, as illustrated in FIG. 7, an oxide film 131 is formed on the upper surface of the semiconductor base substrate and is patterned using a photomechanical technique. Portions of the oxide film 131 that are exposed through openings are subjected to reactive ion etching using plasma so as to form trenches 137. Subsequently, chemical dry etching and sacrificial oxidation treatment are performed in order to remove crystal defects and plasma-damaged layers around the trenches 137, to round the bottoms of the trenches 137, and to flatten the inner walls of the trenches 137. The chemical dry etching and the sacrificial oxidation treatment are disclosed in, for example, Japanese Patent Application Laid-Open No. H7-263692. An appropriate depth of the trenches 137 is disclosed in, for example, WO 2009/122486.

Figure 8:
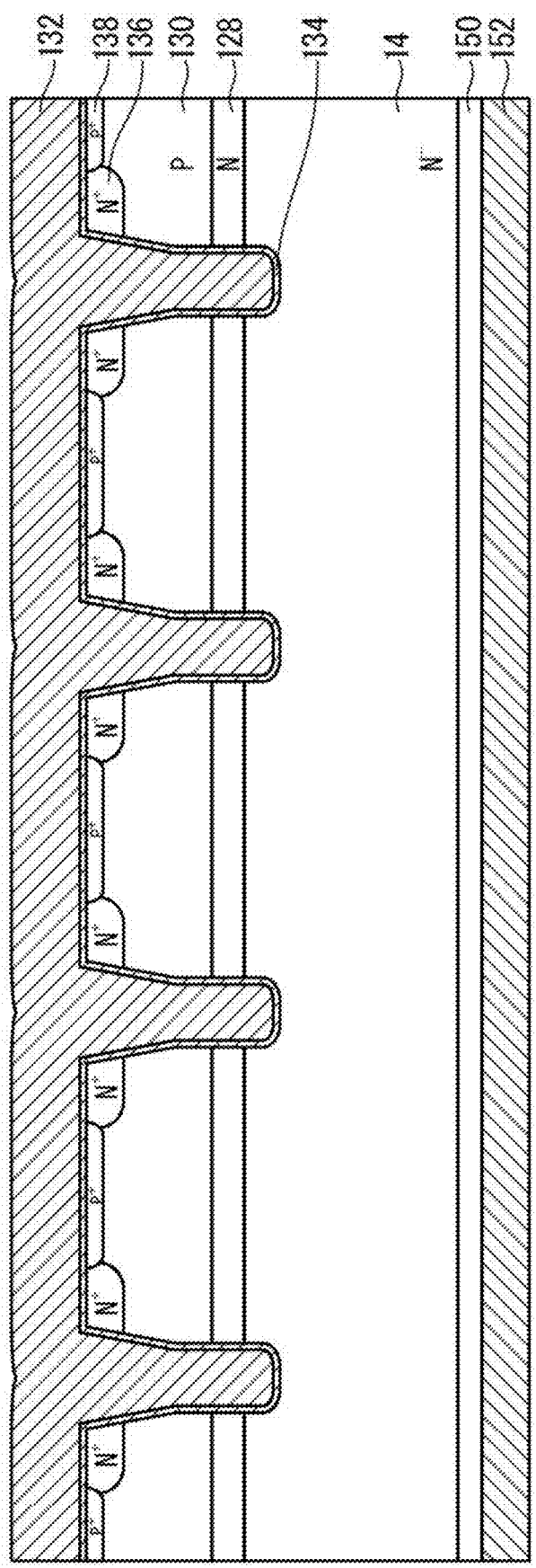
FIG. 8 is a sectional view illustrating a step of manufacturing the IGBT.

Then, as illustrated in FIG. 8, a gate oxide film 134 is formed on the inner walls of the trenches by thermal oxidation or CVD (see, for example, Japanese Patent Application Laid-Open No. 2001-085686). Then, a polysilicon layer 132 doped with phosphorus is formed within the trenches 137 including the gate oxide film 134 so as to fill the trenches 137. Simultaneously with the formation of the gate oxide film 134, an oxide film 150 is formed on the lower surface of the semiconductor base substrate, and simultaneously with the formation of the polysilicon layer 132, a polysilicon layer 152 doped with phosphorus is formed on the oxide film 150.

Figure 9:
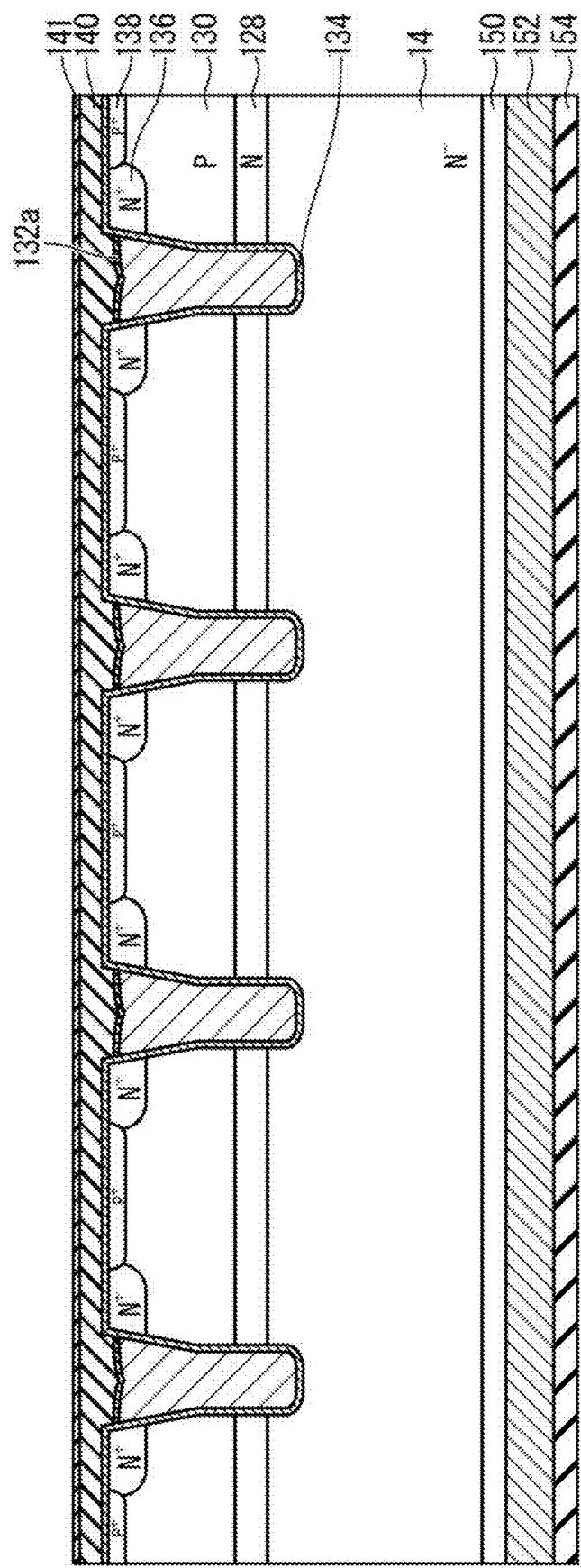
FIG. 9 is a sectional view illustrating a step of manufacturing the IGBT.

Next, as illustrated in FIG. 9, a portion of the polysilicon layer 132 that protrudes outside the trenches 137 is etched. After the etching, an oxide film 132a is formed by oxidizing or depositing the polysilicon layer 132 that is exposed at the upper surface of the semiconductor base substrate and the surfaces where the trenches 137 are embedded, by thermal oxidation or CVD. Thereafter, a P⁺ layer 138 is formed in the outer surface of the semiconductor base substrate. Then, an oxide film 140 doped with boron or phosphorus and a TEOS film 141 are formed by CVD on the upper surface of the semiconductor base substrate. The oxide film 140 may be a TEOS film or silicate glass. On the lower surface of the semiconductor base substrate, a TEOS film 154 is formed simultaneously with the formation of the oxide film 140 and the TEOS film 141.

Figure 10:
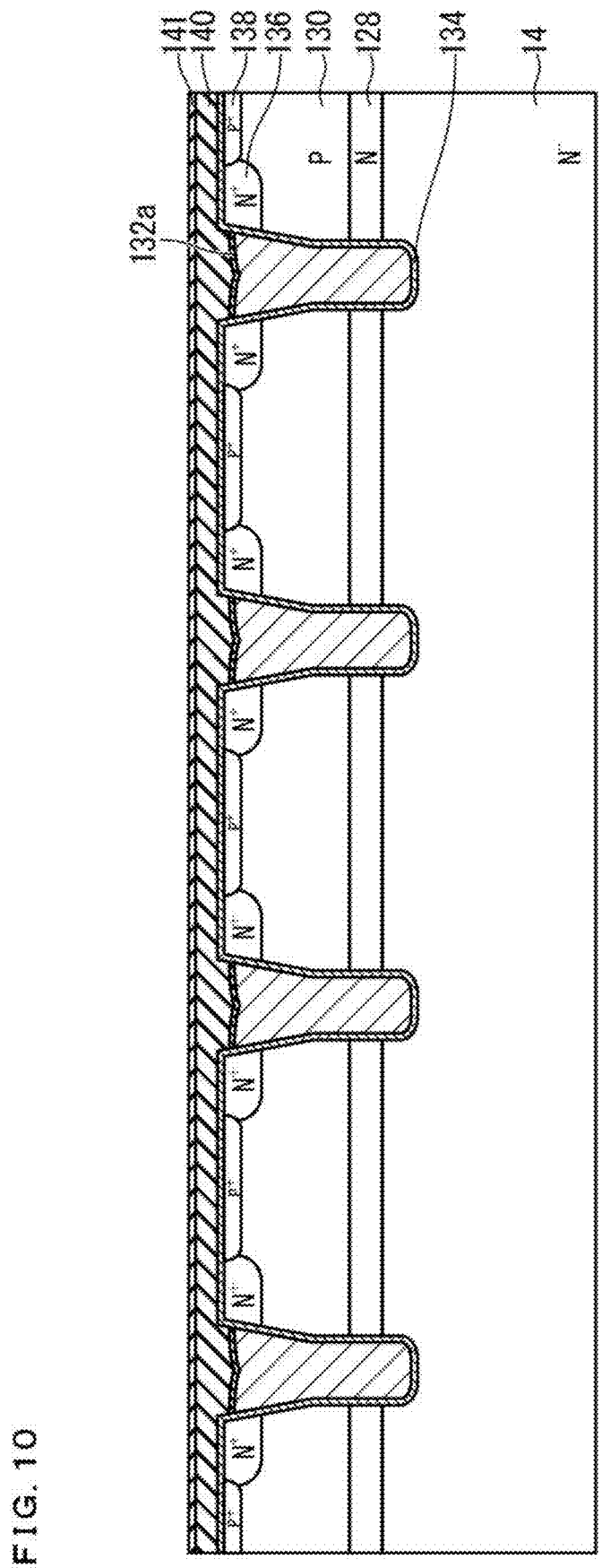
FIG. 10 is a sectional view illustrating a step of manufacturing the IGBT.

Next, as illustrated in FIG. 10, the N⁻ drift layer 14 is exposed by etching the TEOS film 154, the polysilicon layer 152, and the oxide film 150 on the lower surface of the semiconductor base substrate, using a liquid that contains fluoric acid or a mixed acid (e.g., a mixed solution of fluoric acid, nitric acid, and acetic acid).

Figure 11:
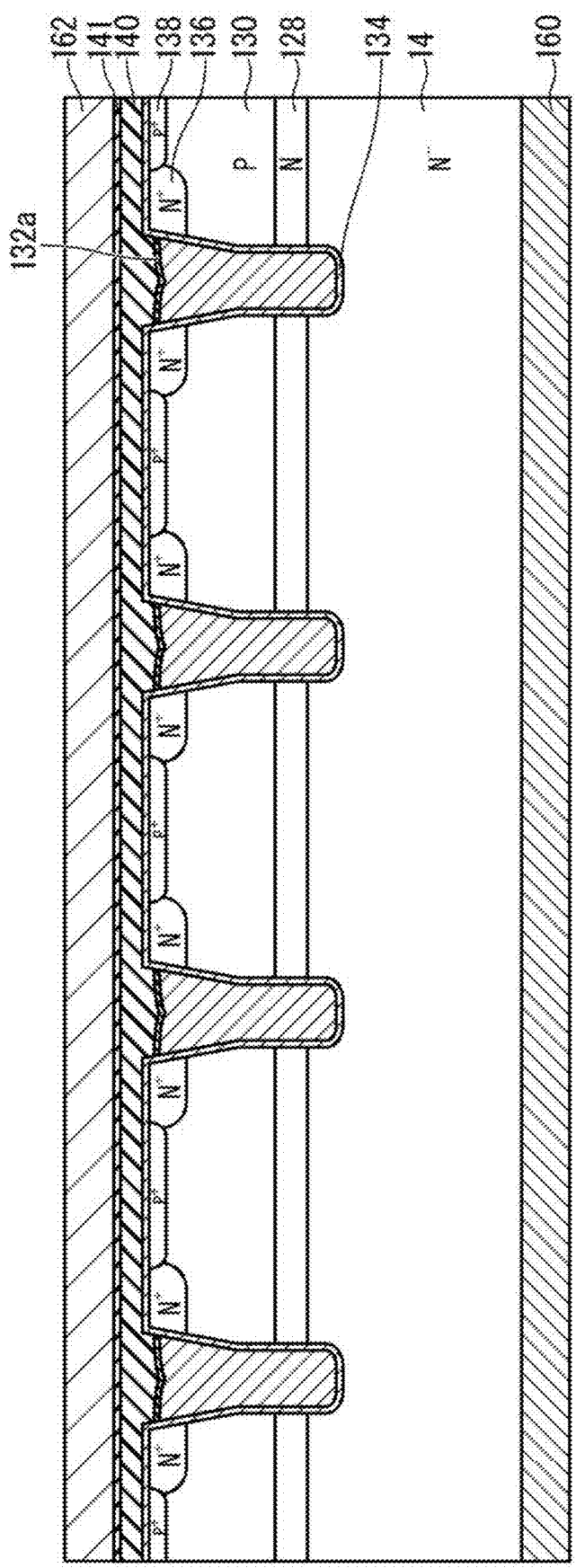
FIG. 11 is a sectional view illustrating a step of manufacturing the IGBT.

Then, as illustrated in FIG. 11, a polysilicon layer 160 doped with impurities is formed in contact with the N⁻ drift layer 14 that is exposed at the lower surface of the semiconductor base substrate. At this time, a polysilicon layer 162 is also undesirably formed on the upper surface of the semiconductor base substrate. The polysilicon layers 160 and 162 are formed by LPCVD. Examples of the impurities that are doped in the polysilicon layers 160 and 162 include phosphorus, arsenic, and antimony in order to form the polysilicon layers 160 and 162 into N⁺ layers. The impurity concentrations of the polysilicon layers 160 and 162 are set to be higher than or equal to $1 \times 10^{19}$ cm$^{-3}$. The layer thicknesses of the polysilicon layers 160 and 162 are set to be greater than or equal to 500 nm.

Figure 12:
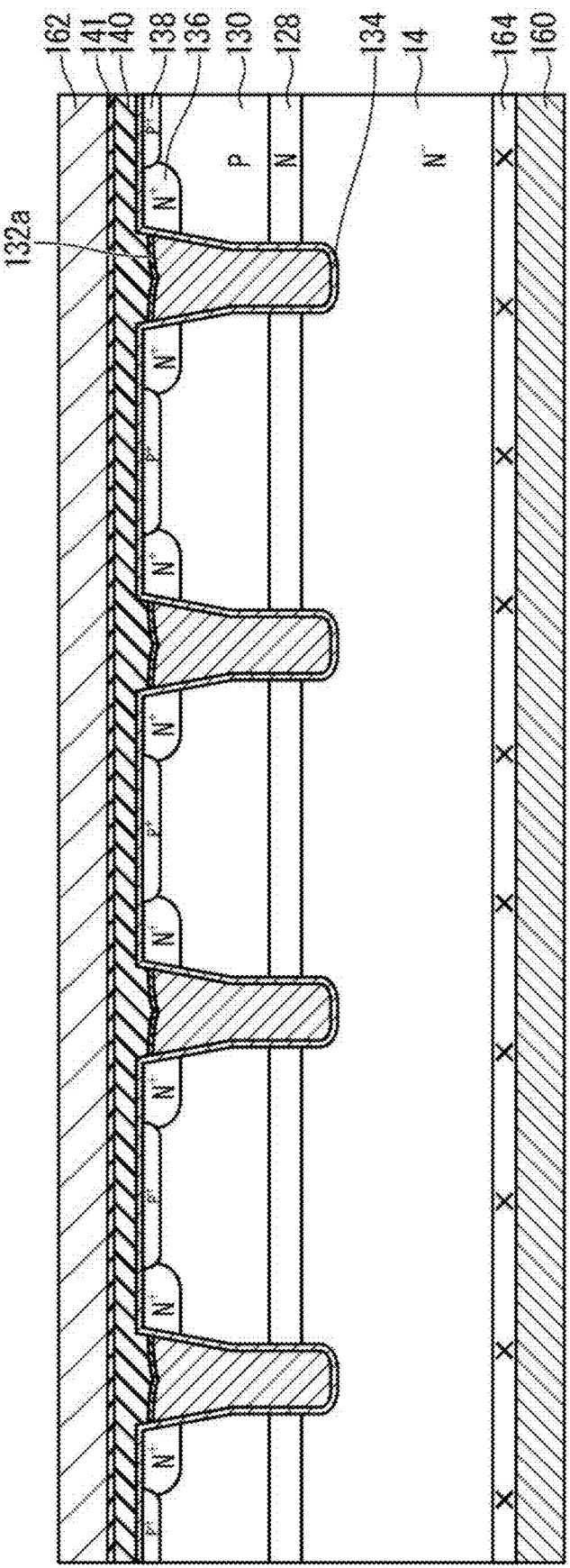
FIG. 12 is a sectional view illustrating a step of manufacturing the IGBT.

Next, as illustrated in FIG. 12, the semiconductor base substrate is heated to a temperature of approximately 900 to 1000° C. in a nitrogen atmosphere so as to diffuse the impurities in the polysilicon layer 160 toward the lower surface of the N⁻ drift layer 14. This diffusion results in forming a gettering layer 164 that includes crystal defects and highly concentrated impurities on the lower surface side of the N⁻ drift layer 14. As described above, a gettering layer forming step refers to a step of forming the gettering layer 164 on the lower surface side of the N⁻ drift layer 14 exposed at the lower surface of the semiconductor base substrate. The impurity concentration at the surface of the gettering layer 164 is set in the range of, for example, $1.0 \times 10^{19}$ to $1.0 \times 10^{22}$ cm$^{-3}$.

After the gettering layer forming step, the temperature of the semiconductor base substrate is reduced at an arbitrary temperature drop speed to a temperature of approximately 600 to 700° C., and this temperature is maintained for four hours or more. This step is referred to as an annealing step. In the annealing step, the semiconductor base substrate is heated so that metallic impurities, contaminated atoms, and damage that have been introduced in the N⁻ drift layer 14 in the manufacturing steps are diffused and then captured by the gettering layer 164.

Figure 13:
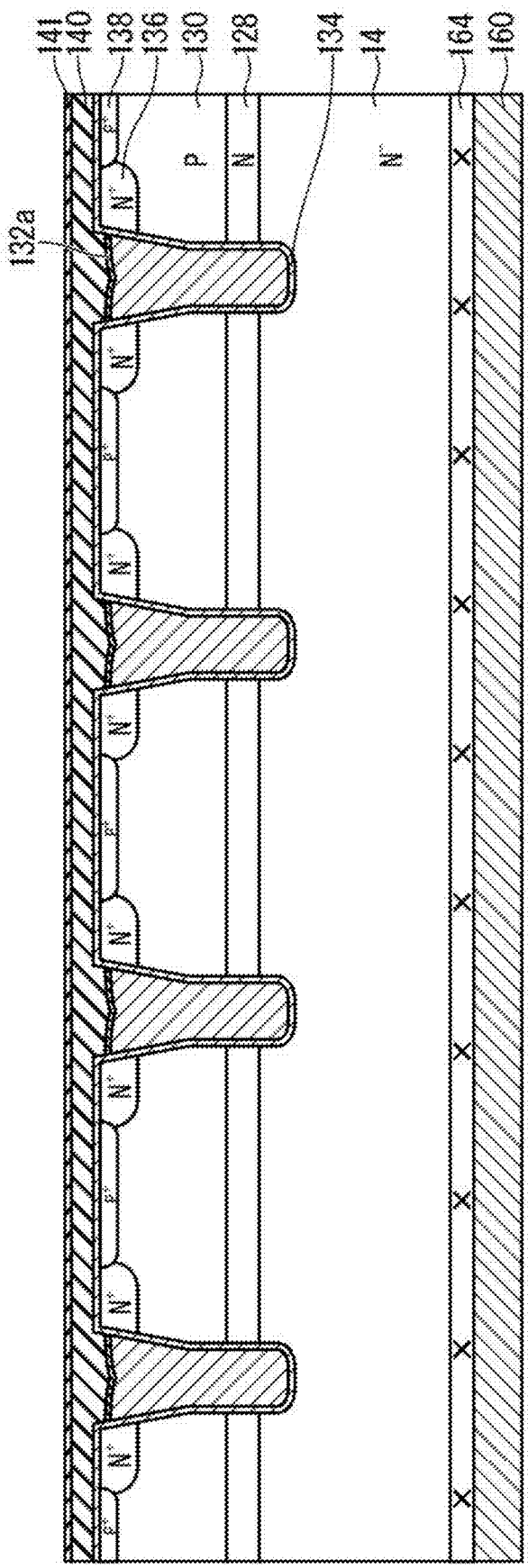
FIG. 13 is a sectional view illustrating a step of manufacturing the IGBT.

Next, as illustrated in FIG. 13, the polysilicon layer 162 on the upper surface of the semiconductor base substrate is selectively removed using a solution of fluoric acid or a mixture acid (e.g., a mixture solution of fluoric acid, nitric acid, and acetic acid). The gettering process illustrated in FIGS. 11 to 13 is disclosed in, for example, WO 2014/054121.

Figure 14:
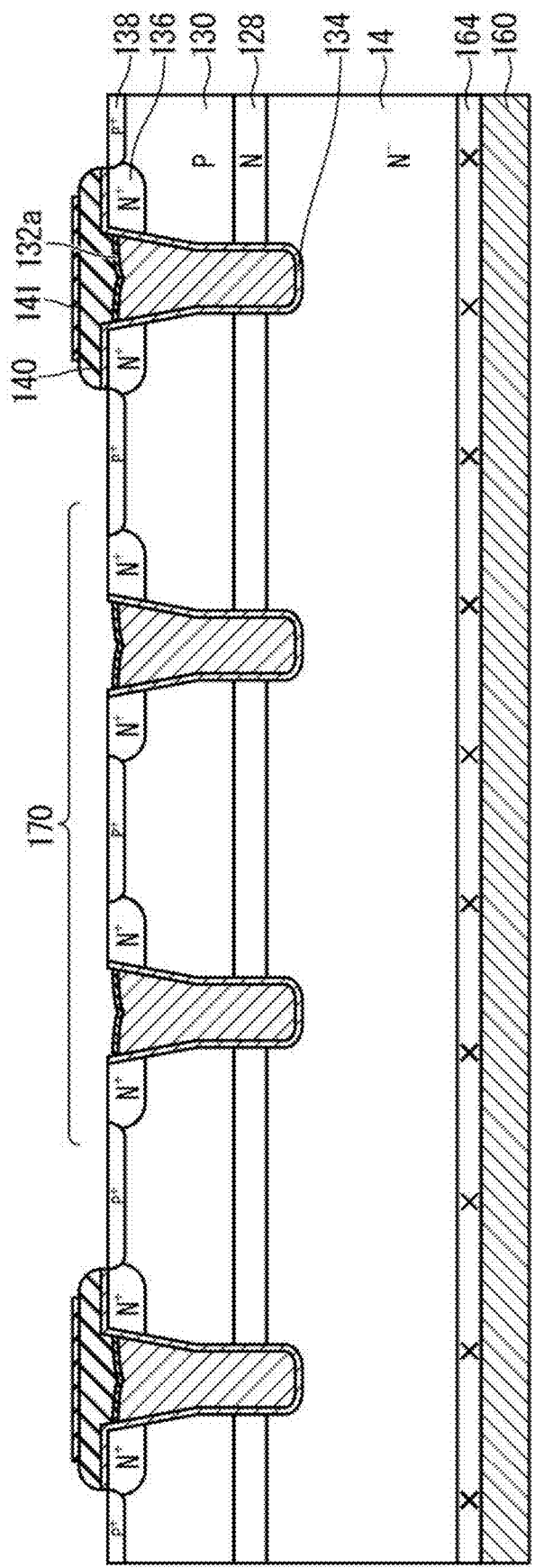
FIG. 14 is a sectional view illustrating a step of manufacturing the IGBT.

Then, as illustrated in FIG. 14, the oxide film 140 and the TEO film 141 on the upper surface of the semiconductor base substrate are partially etched so as to expose part of the oxide film 140 and the TEO film 141 to the outside and thereby form a trench exposed portion 170 having a contact hole. The portion other than the trench exposed portion 170 functions as an MOS transistor portion in the IGBT.

The purpose for partially forming the trench exposed portion 170 in the area where the trenches 137 filled with the polysilicon layer 132 are formed, as illustrated in FIG. 14, is to reduce the effective gate width and adjust the capacitance by making part of the polysilicon layer 132 into an emitter potential. This makes it possible to reduce saturation current densities, suppress oscillations at a short circuit by controlling capacitance, improve short-circuit tolerance (see WO 2002/058160 and WO 2002/061845 for detailed information), and reduce the ON-state voltage by improving the carrier density on the emitter side in the ON state.

Figure 15:
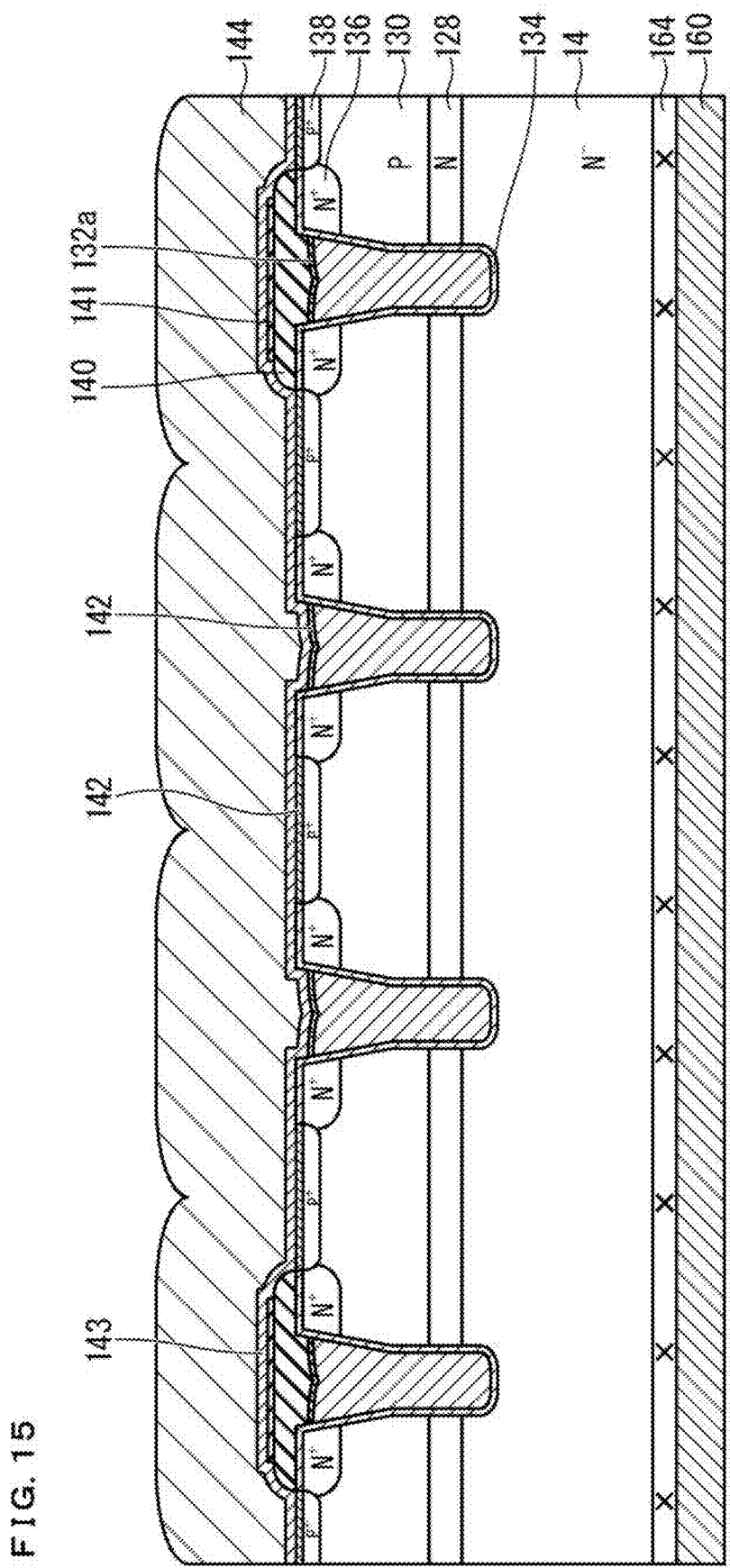
FIG. 15 is a sectional view illustrating a step of manufacturing the IGBT.

Next, as illustrated in FIG. 15, metal for forming a silicide layer 142 and a barrier metal layer 143 is formed by sputtering, and a metal wiring layer 144 with Si added in amounts of approximately 1 to 3% is formed by sputtering on the upper surface of the semiconductor base substrate. Examples of the material for the metal wiring layer 144 include AlSi, AlSiCu, and AlCu. The metal wiring layer 144 is electrically connected to the trench exposed portion 170.

Figure 16:
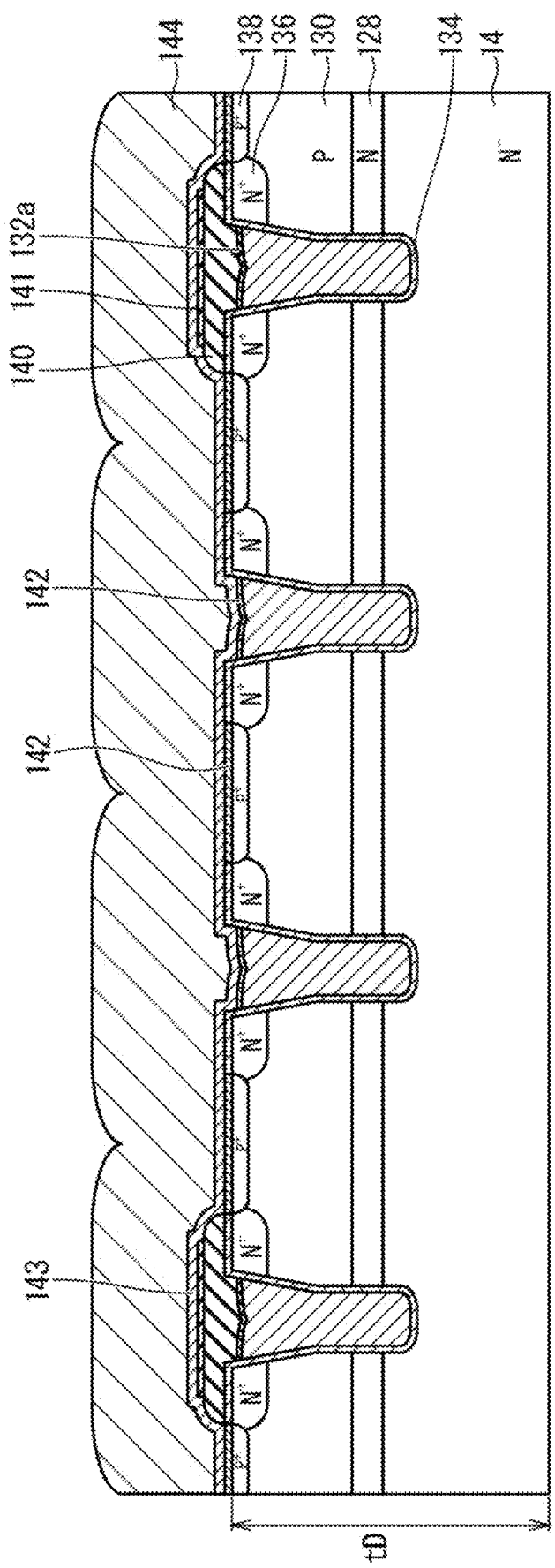
FIG. 16 is a sectional view illustrating a step of manufacturing the IGBT.

Next, as illustrated in FIG. 16, the gettering layer 164 and the polysilicon layer 160 formed on the lower surface of the semiconductor base substrate are removed by polishing or etching. The step of removing the gettering layer 164 and other layers is referred to as a removal step. In the removal step, a portion of the N⁻ drift layer 14 that is in contact with the gettering layer 164 may be removed by an amount corresponding to the desired thickness. This makes the thickness of the semiconductor base substrate (N⁻ drift layer 14) compatible with the withstand-voltage class of the semiconductor device.

Figure 17:
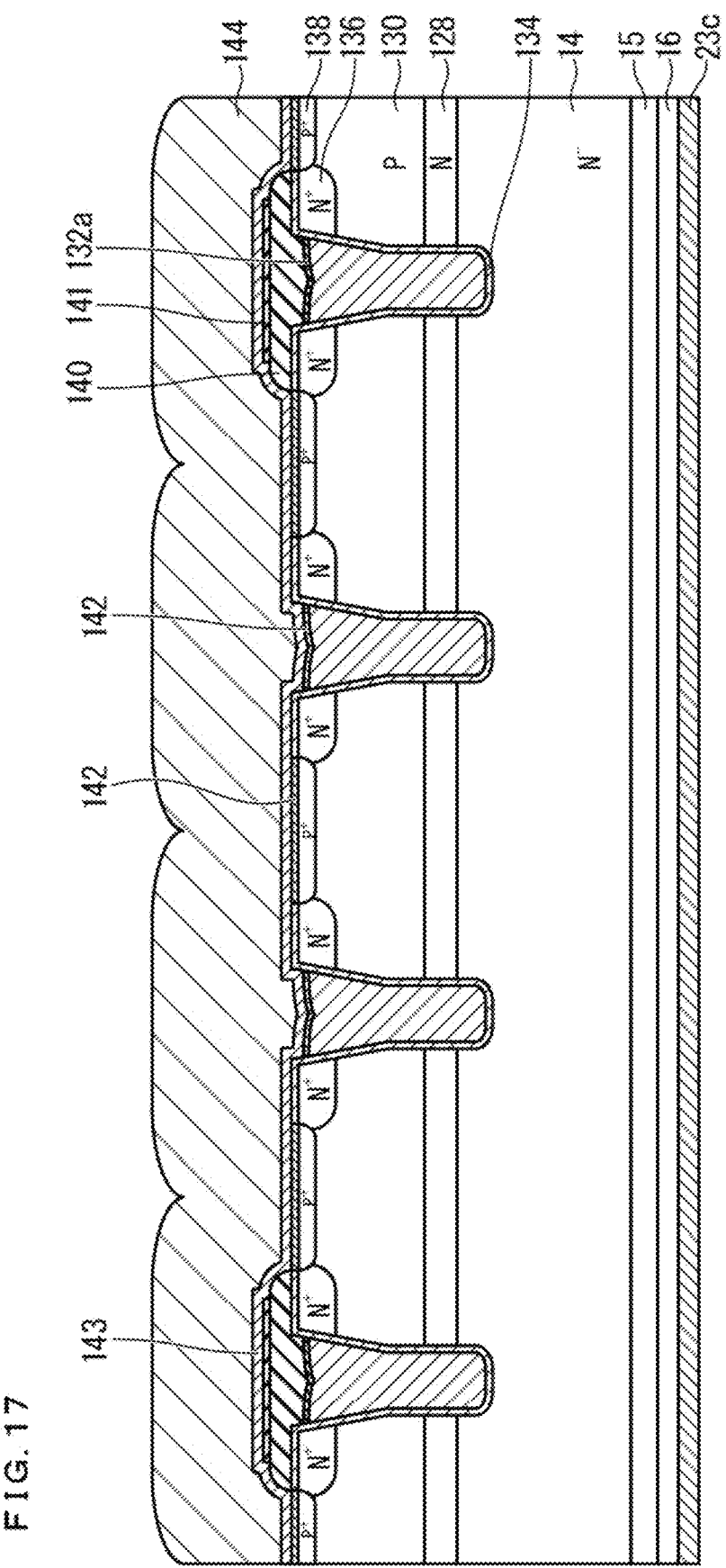
FIG. 17 is a sectional view illustrating a step of manufacturing the IGBT.

Subsequently, as illustrated in FIG. 17, the N buffer layer 15 that serves as a first buffer layer is formed in the lower surface of the semiconductor base substrate. The N buffer layer 15 is formed by implanting phosphorus, selenium, sulfur, or protons (hydrogen) from the lower surface side, i.e., the second surface side, of the semiconductor base substrate and further subjecting the semiconductor base substrate to annealing so as to activate implanted ions. Thereafter, the p-type P collector layer 16 is formed on the lower surface of the N buffer layer 15. Furthermore, the collector electrode 23C is formed as a second electrode on the lower surface of the P collector layer 16. The collector electrode 23C is a portion that is to be soldered to, for example, the semiconductor base substrate in a module when the semiconductor device is mounted on that module. Thus, the collector electrode 23C is preferably formed to have a low contact resistance by laminating a plurality of metal layers.

A relationship between FIGS. 17 and 1 is such that the polysilicon layer 132 corresponds to the gate electrodes 13, the gate oxide film 134 corresponds to the gate insulating film 12, the N layer 128 corresponds to the N layer 11, the P base layer 130 corresponds to the P base layer 9, the N⁺ emitter layer 136 corresponds to the N⁺ emitter layer 7, the P⁺ layer 138 corresponds to the P⁺ layer 8, and the metal wiring layer 144 corresponds to the emitter electrode 5E.

Method of Manufacturing Diode

FIGS. 18 to 26 are sectional views illustrating a method of manufacturing the RFC diode illustrated in FIG. 3.

Figure 18:
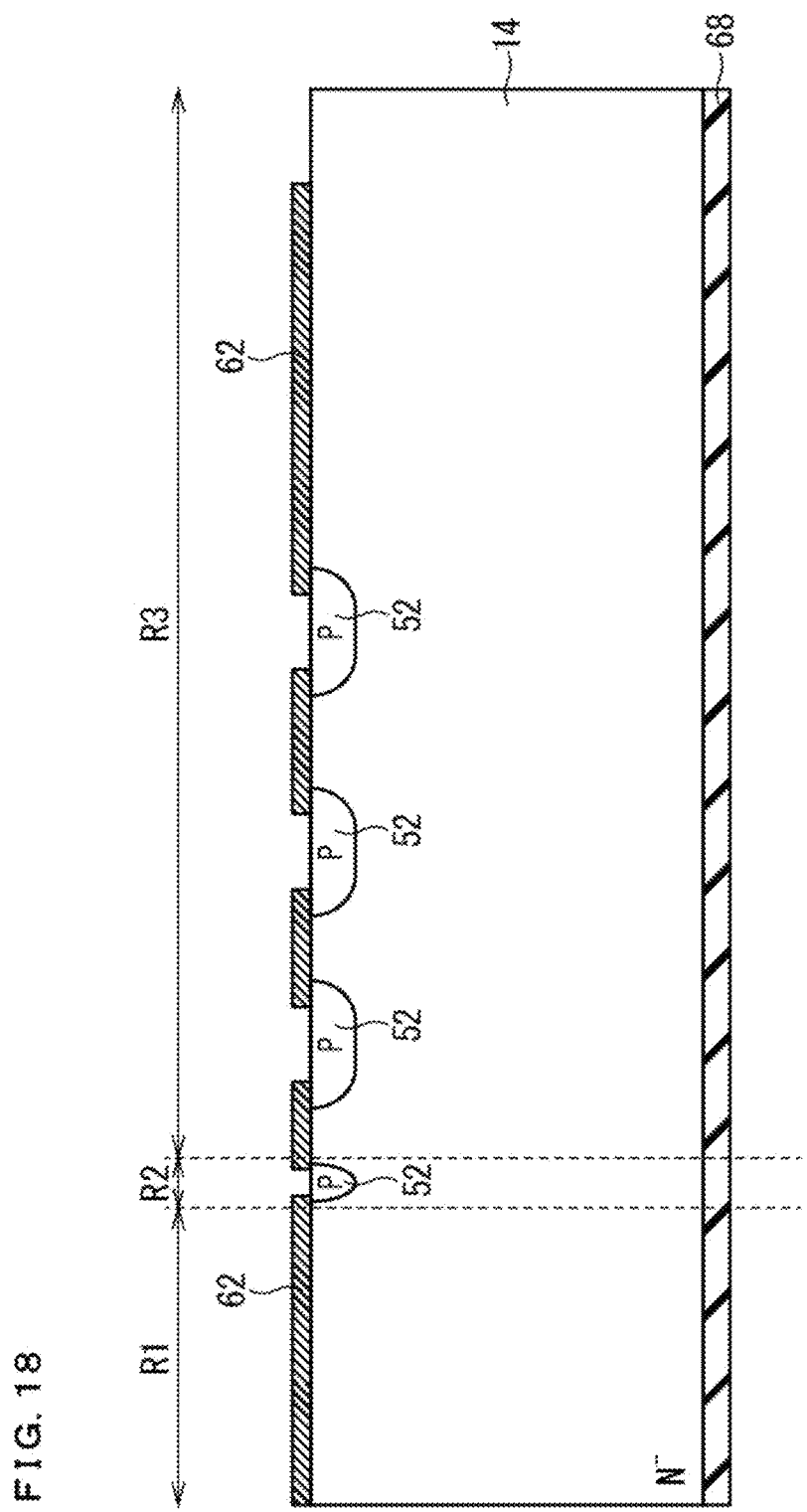
FIG. 18 is a sectional view illustrating a step of manufacturing the RFC diode.

FIG. 18 illustrates the active cell area R1, and the interface area R2 and the termination area R3 that are formed to surround the active cell area R1. First, a semiconductor base substrate that includes only the N⁻ drift layer 14 is prepared. Then, a plurality of P layers 52 is selectively formed on the surface of the N⁻ drift layer 14 in the interface area R2 and the termination area R3. The P layers 52 are formed by subjecting the semiconductor base substrate to ion implantation using a pre-formed oxide film 62 as a mask and to subsequent annealing. Note that when the oxide film 62 is formed, an oxide film 68 is also formed on the lower surface of the semiconductor base substrate.

Figure 19:
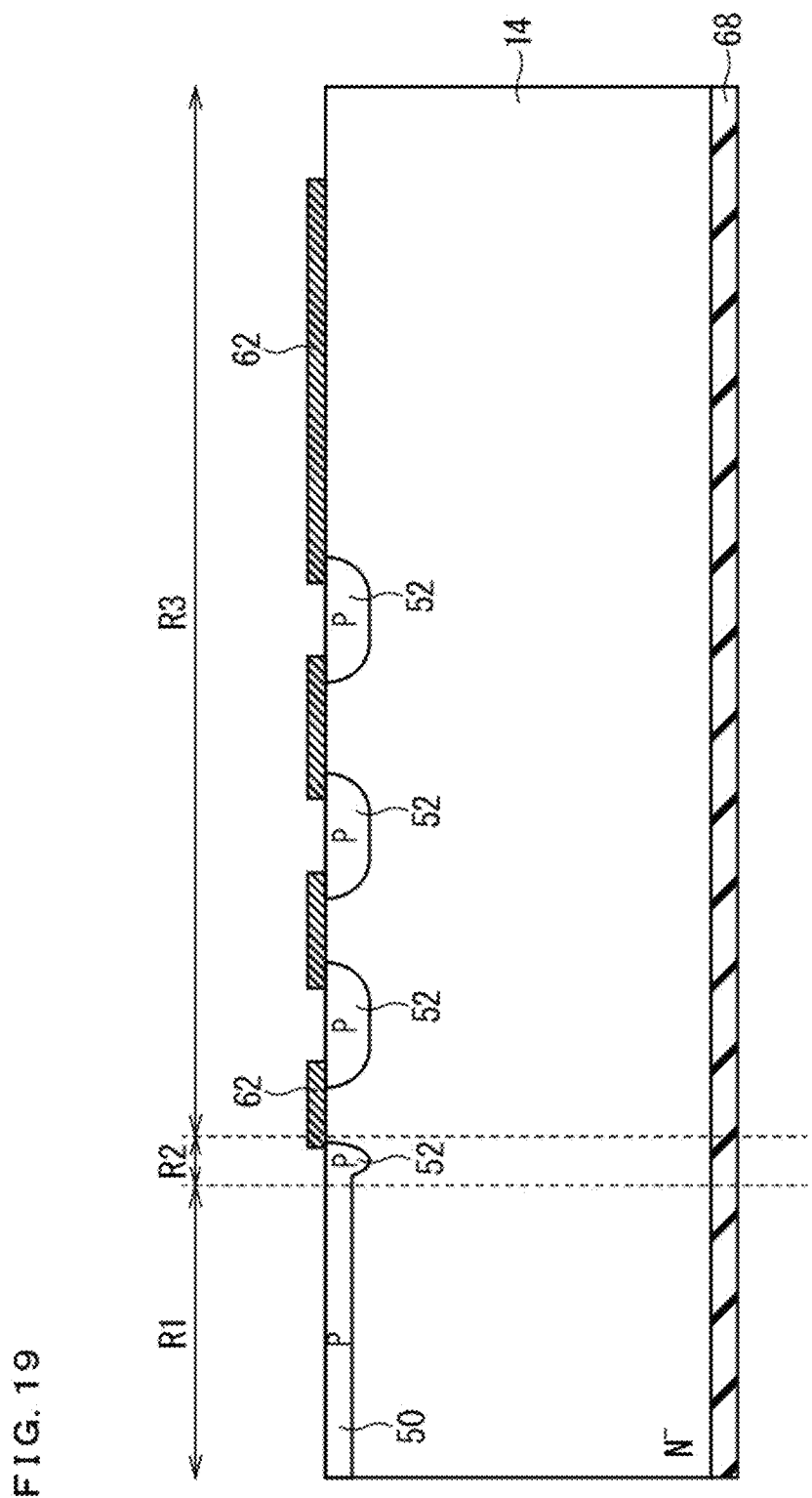
FIG. 19 is a sectional view illustrating a step of manufacturing the RFC diode.

Next, as illustrated in FIG. 19, a P layer 50 is formed on the surface of the N⁻ drift layer 14 in the active cell area R1 by ion implantation and annealing.

Figure 20:
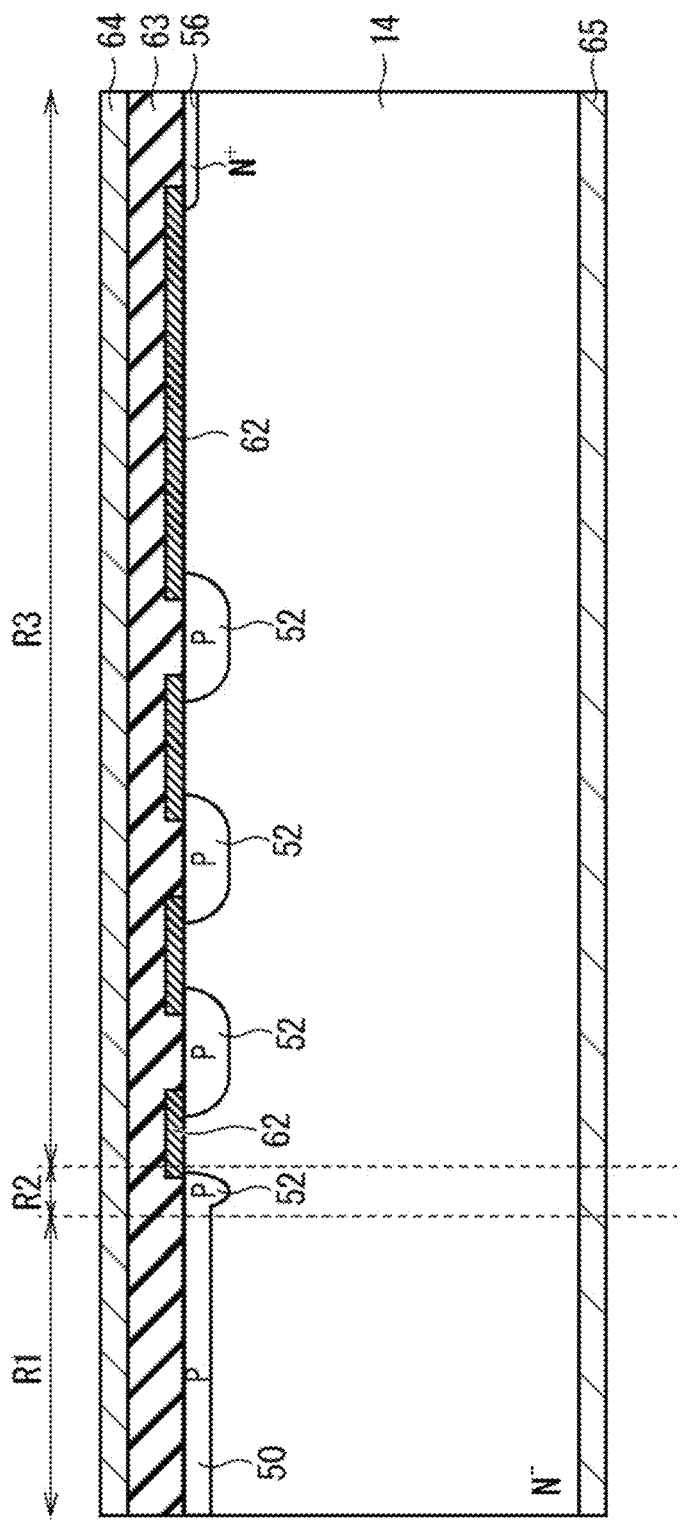
FIG. 20 is a sectional view illustrating a step of manufacturing the RFC diode.

Subsequently, as illustrated in FIG. 20, an N⁺ layer 56 is formed at the end of the termination area R3 in the upper surface of the semiconductor base substrate. Next, a TEOS layer 63 is formed on the upper surface of the semiconductor base substrate. Thereafter, processing for exposing the lower surface of the semiconductor base substrate is performed. Then, a polysilicon layer 65 doped with impurities is formed in contact with the N⁻ drift layer 14 exposed at the lower surface of the semiconductor base substrate. At this time, a polysilicon layer 64 is also formed on the upper surface of the semiconductor base substrate.

Figure 21:
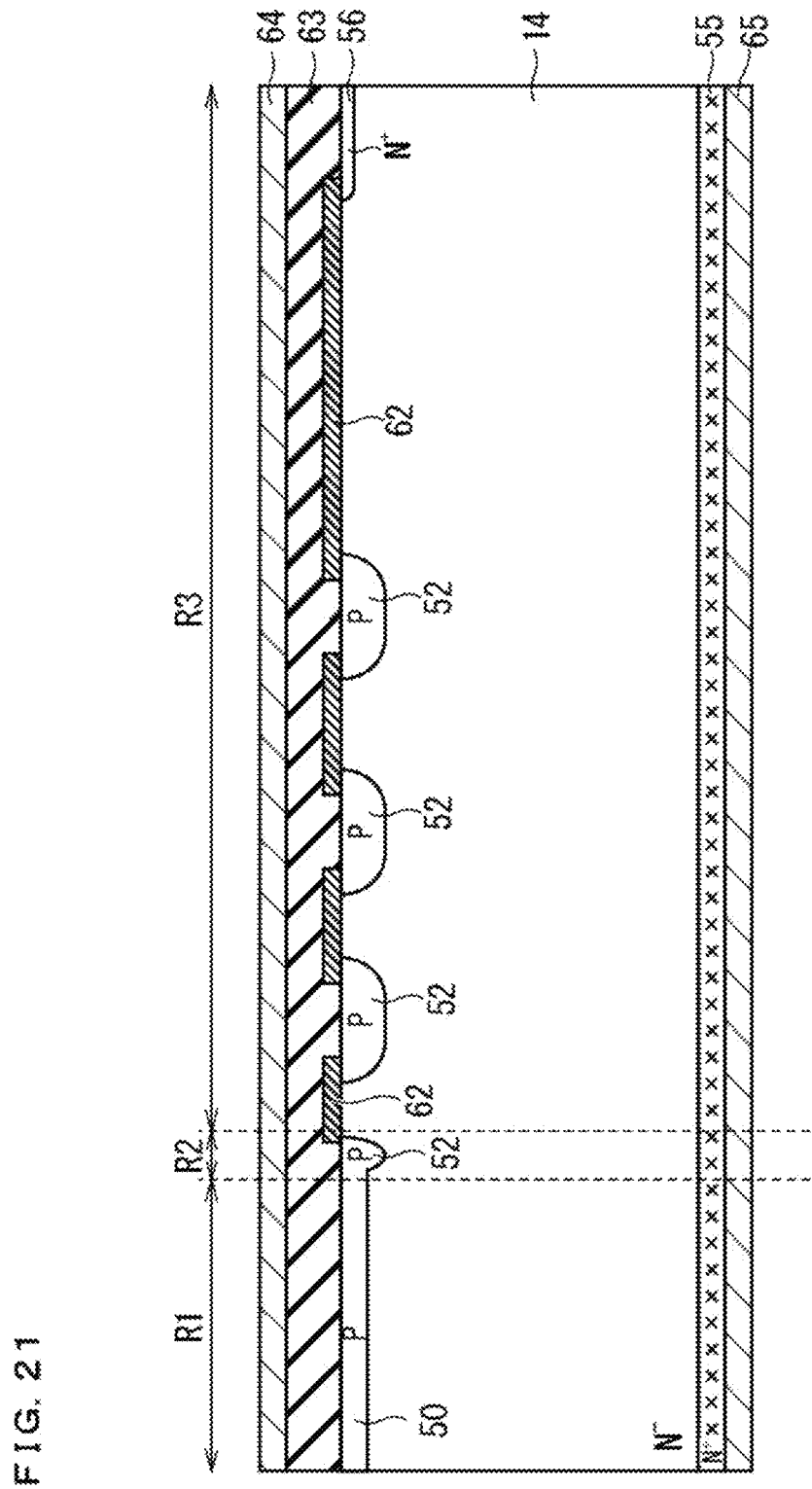
FIG. 21 is a sectional view illustrating a step of manufacturing the RFC diode.

Next, as illustrated in FIG. 21, the semiconductor base substrate is heated so as to diffuse impurities in the polysilicon layer 65 toward the lower surface of the N⁻ drift layer 14 and thereby form a gettering layer 55 that includes crystal defects and impurities on the lower surface of the N⁻ drift layer 14. This step is similar to the step of forming the gettering layer 164 in the method of manufacturing the IGBT illustrated in FIG. 12. Thereafter, metal impurities, contaminated atoms, and damage in the N⁻ drift layer 14 are captured by the gettering layer 55 through annealing.

Figure 22:
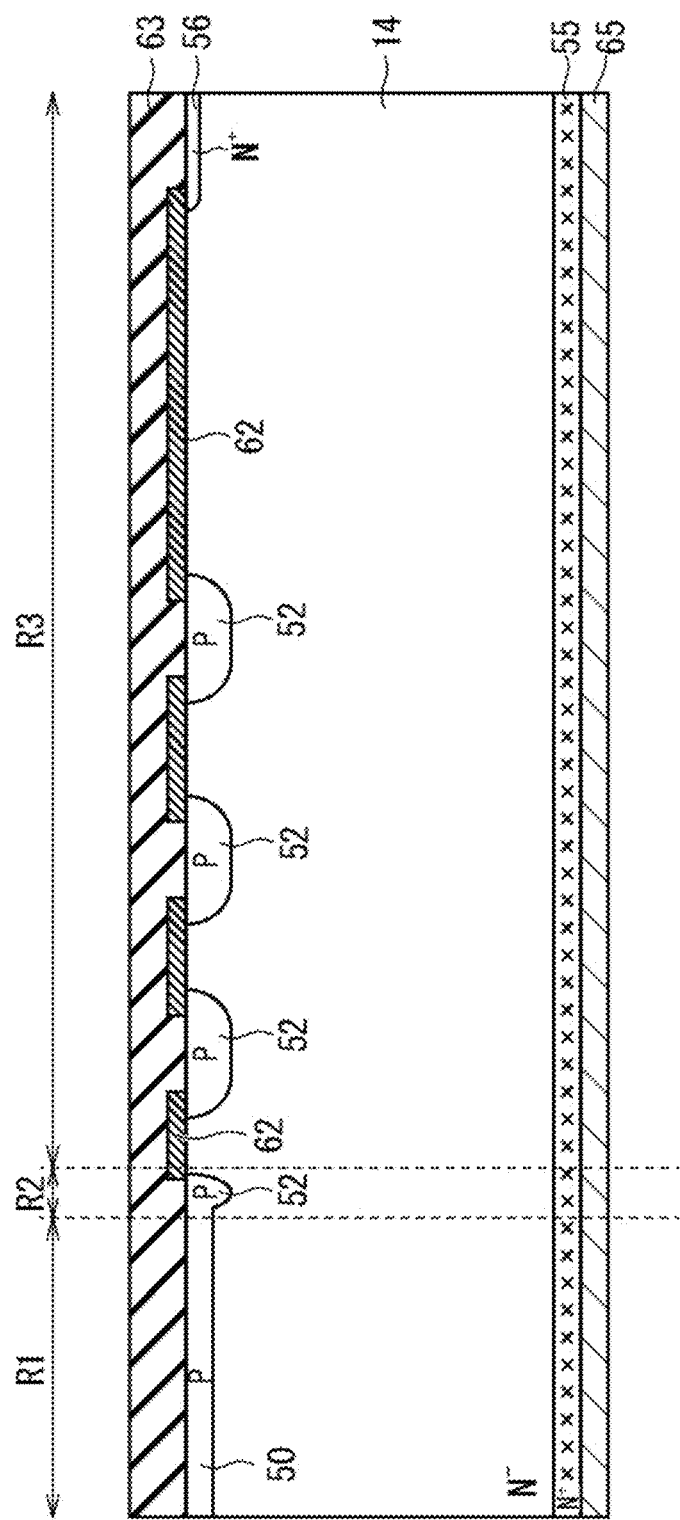
FIG. 22 is a sectional view illustrating a step of manufacturing the RFC diode.

Then, as illustrated in FIG. 22, the polysilicon layer 64 formed on the upper surface of the semiconductor base substrate is selectively removed using a solution of fluoric acid or a mixture acid (e.g., a mixture solution of fluoric acid, nitric acid, and acetic acid). This gettering process is the same as the aforementioned gettering process performed for the IGBT.

Figure 23:
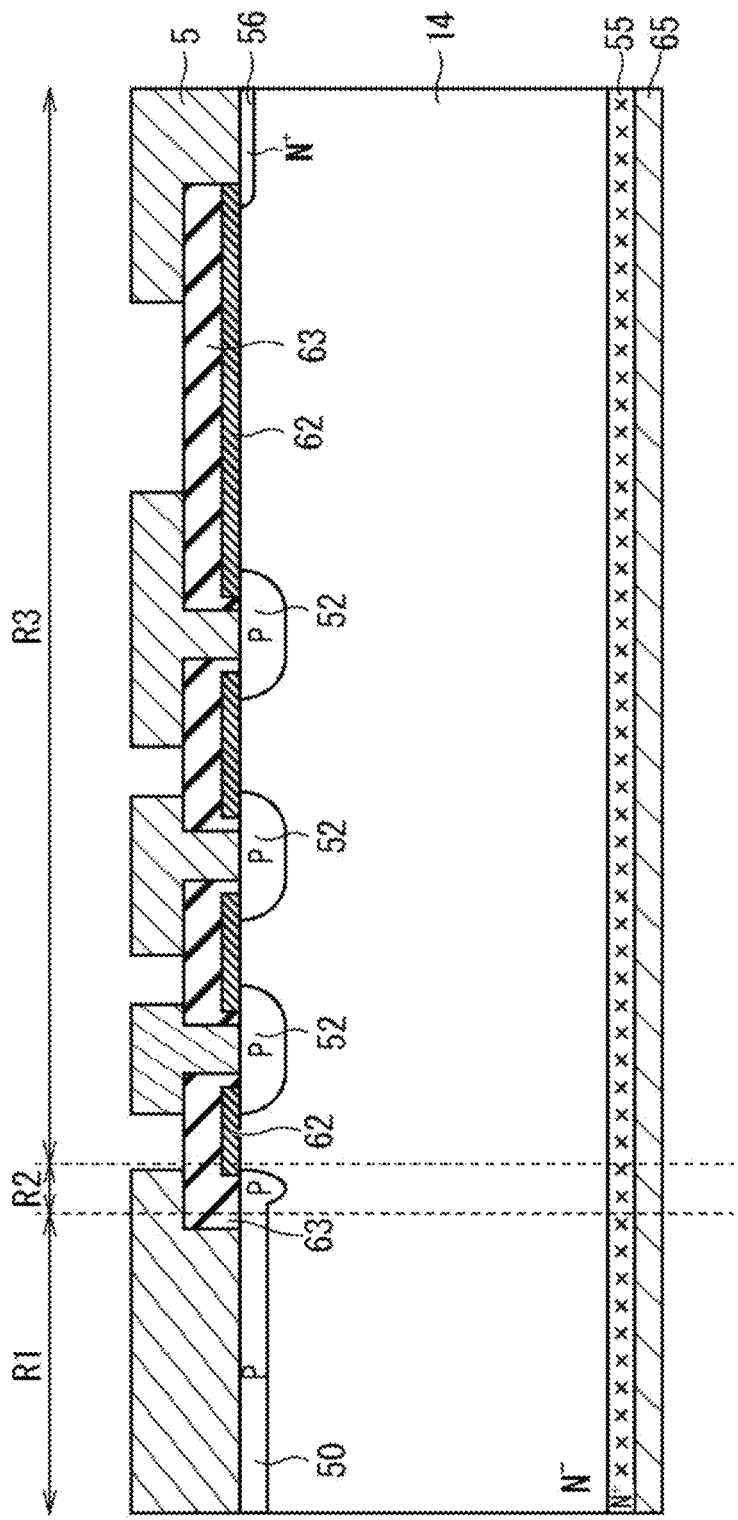
FIG. 23 is a sectional view illustrating a step of manufacturing the RFC diode.

Next, as illustrated in FIG. 23, contact holes that expose the P layers 52, the P layer 50, and the N⁺ layer 56 are formed in the upper surface of the semiconductor base substrate. That is, the TEOS layer 63 is processed as illustrated in FIG. 23. Thereafter, aluminum lines 5 for an anode electrode 5A with Si added in amounts of approximately 1 to 3% is formed by sputtering.

Figure 24:
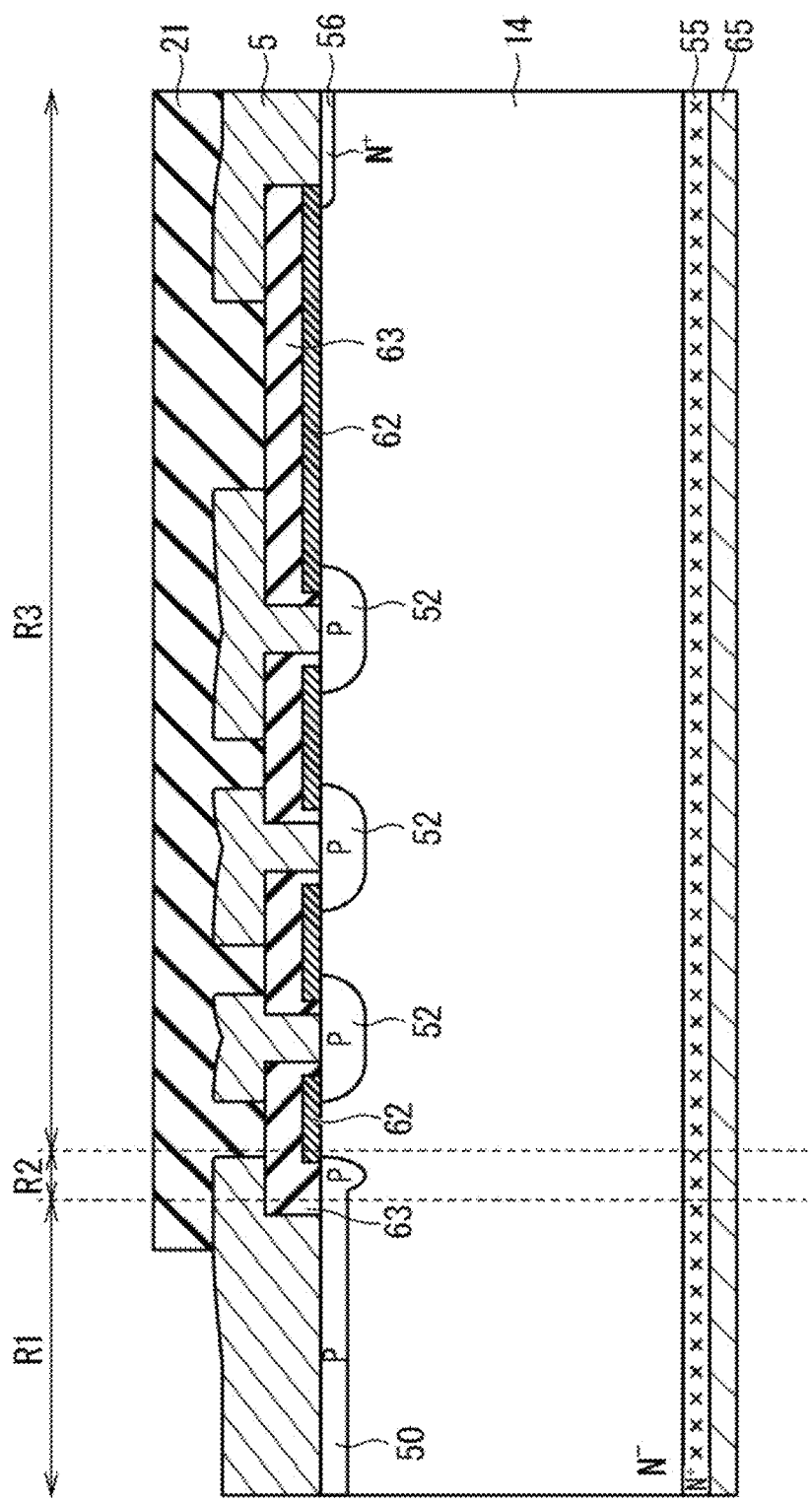
FIG. 24 is a sectional view illustrating a step of manufacturing the RFC diode.

Subsequently, as illustrated in FIG. 24, a passivation film 21 serving as a protective film is formed on the upper surface of the semiconductor base substrate.

Figure 25:
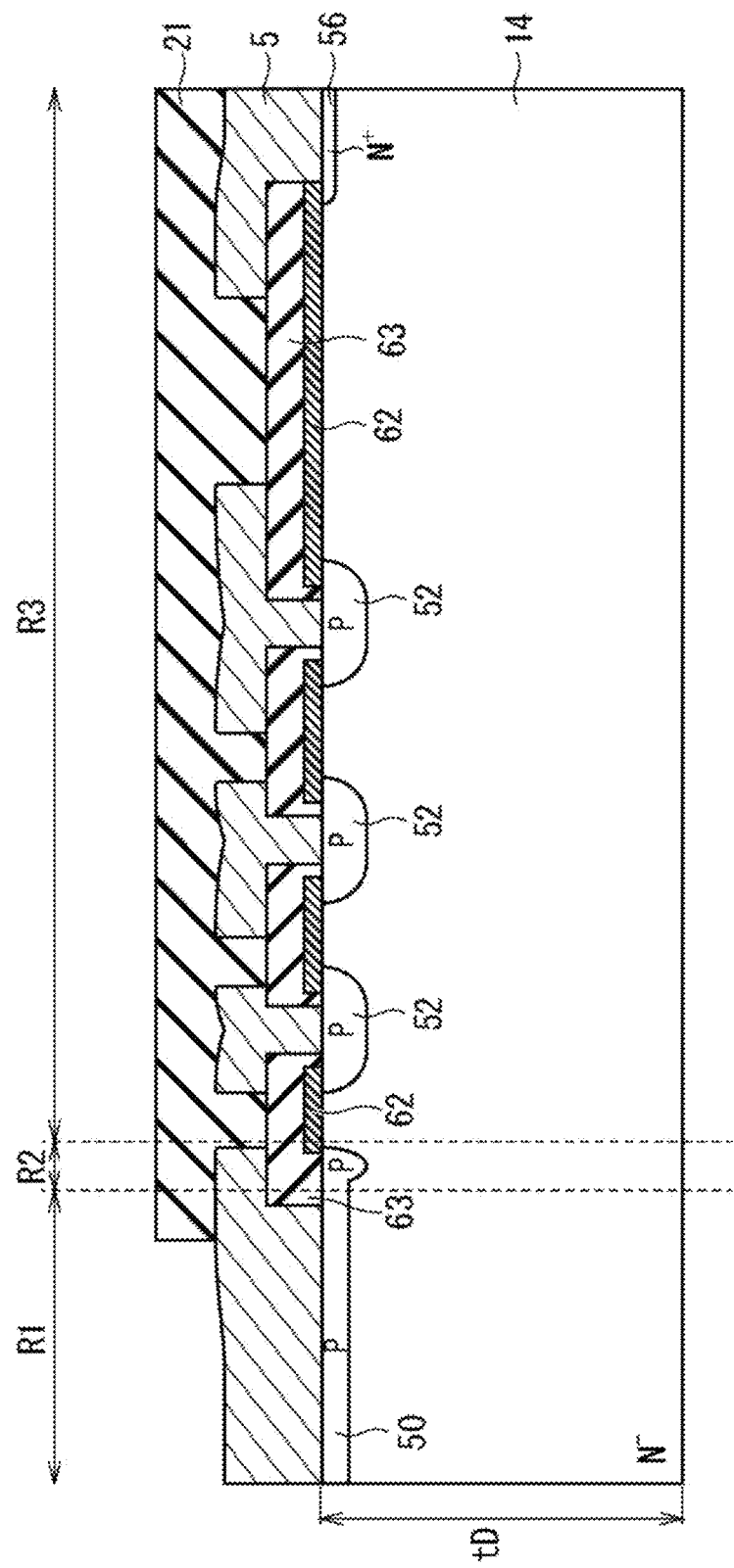
FIG. 25 is a sectional view illustrating a step of manufacturing the RFC diode.

Next, as illustrated in FIG. 25, the gettering layer 55 and the polysilicon layer 65 formed on the lower surface side of the semiconductor base substrate are removed by polishing or etching. This removal step makes the thickness of the semiconductor base substrate (N⁻ drift layer 14) compatible with the withstand-voltage class of the semiconductor device.

Figure 26:
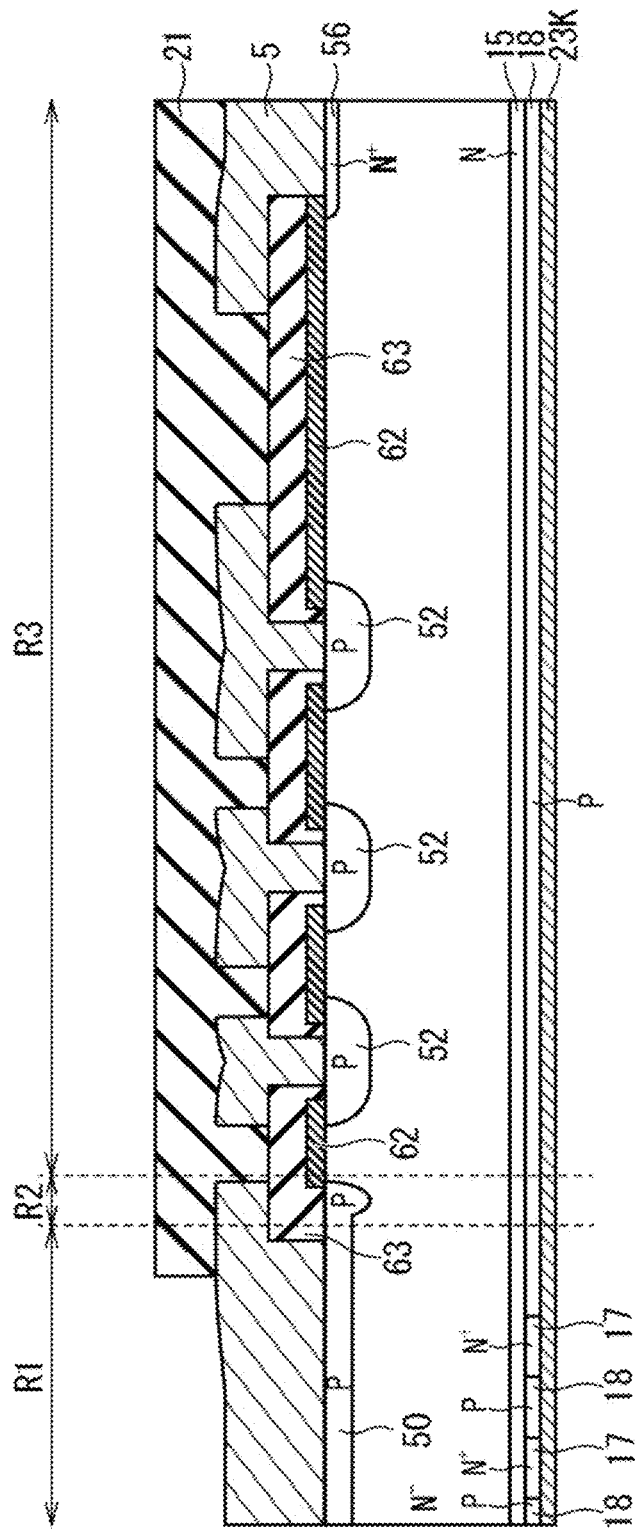
FIG. 26 is a sectional view illustrating a step of manufacturing the RFC diode.

Then, as illustrated in FIG. 26, the N buffer layer 15 is formed on the lower surface side of the N⁻ drift layer 14. Thereafter, a P cathode layer 18 is formed on the lower surface of the N buffer layer 15. Then, an N⁺ cathode layer 17 is formed in part of the P cathode layer 18 in the active cell area R1. The N buffer layer 15, the N⁺ cathode layer 17, and the P cathode layer 18 are diffusion layers formed by ion implantation and annealing. Finally, a cathode electrode 23K is formed on the lower surface of the semiconductor base substrate.

A relationship between FIGS. 26 and 3 is such that the P layer 50 corresponds to the P anode layer 10, the P layers 52 correspond to the P areas 22, the N⁺ layer 56 corresponds to the N⁺ layer 26, and the aluminum lines 5 correspond to the anode electrode 5A.

Figure 28:
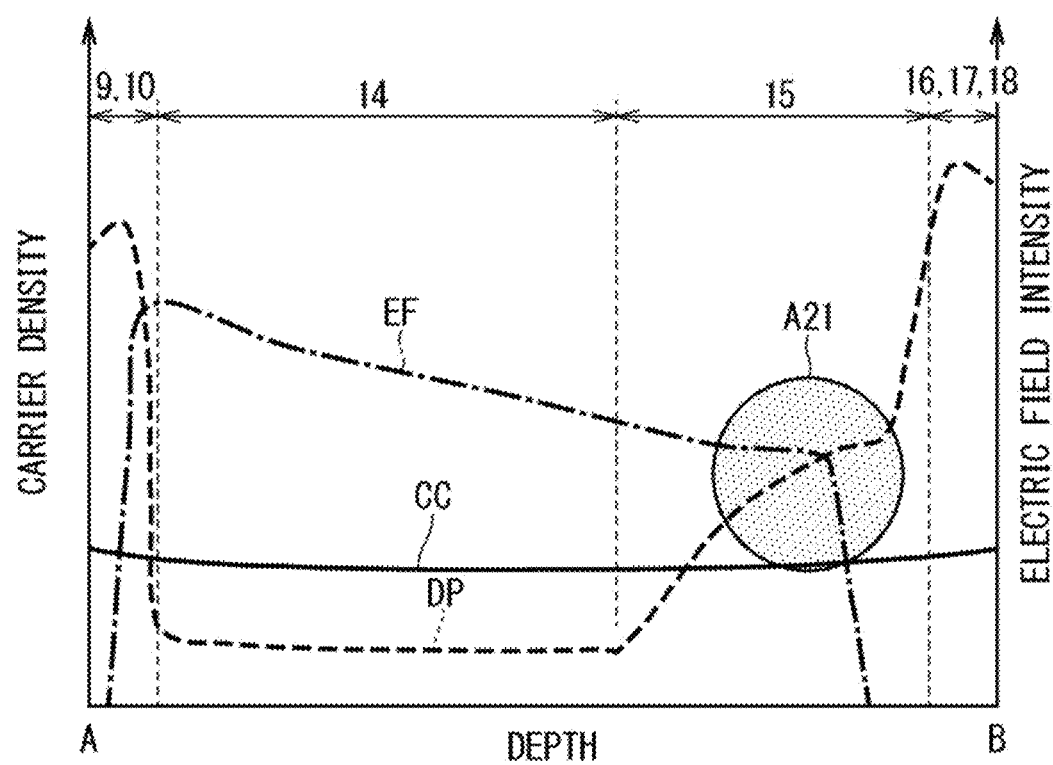
FIG. 28 is an explanatory diagram illustrating the idea about the vertical structure area proposed by the present invention.

A substrate concentration ($C_d$) of the Si wafer used for the IGBT or the diode is determined according to the withstand-voltage class of a semiconductor element to be manufactured. For example, $C_d$ is in the range of $1.0 \times 10^{12}$ to $5.0 \times 10^{14}$ cm⁻³. The Si wafer is made by the FZ method. Then, the device thickness is accurately adjusted according to the withstand-voltage class in the wafer process illustrated in FIG. 16 or 25, and the vertical structure area 27 is constructed in the wafer process illustrated in FIG. 17 or 26. In this way, the wafer process of using the FZ wafer and constructing the vertical structure area is becoming the mainstream, and this is due to backgrounds described below.

a) A wafer in which the N⁻ drift layer 14 is prepared by an epitaxial method as a wafer has a demerit that the cost of the Si wafer increases extremely because of dependence on the thickness of Si formed by the epitaxial method. On the other hand, a low-cost wafer can be adopted by setting only the concentration of the N⁻ drift layer 14 to an appropriate value depending on the withstand-voltage class by the FZ method, and by using an Si wafer in which the N⁻ drift layer 14 has the same thickness irrespective of the withstand-voltage class, at the start of the wafer process.

b) A wafer process that minimizes modifications to a process unit as much as possible can be adopted by controlling the device thickness to a value required for the withstand-voltage class in the final stage of the wafer process illustrated in FIG. 16 or 28 and constructing the vertical structure for the purpose of making use of the aforementioned wafer produced by the FZ method. Thus, various different wafer thicknesses in the range of 40 μm to 700 μm can be handled even in the wafer process for manufacturing an Si wafer having a large diameter greater than or equal to 200 mm.

c) With the background b), device structures such as MOS transistor structures that are formed on the wafer surface, various diffusion layers, and wiring structures can be prepared, along with IGBTs and diodes, by using a latest process unit without changes.

The impurity concentration of an n drift layer and the device thickness are required to be highly accurate because they serve as device parameters that affect not only the withstand voltage characteristics of the IGBT and the diode but also total loss and controllability and breakdown tolerance during dynamic operations.

In the wafer process illustrated in FIGS. 5 to 17 or FIGS. 18 to 26, the vertical structure area is formed after the step of forming the aluminum lines illustrated in FIG. 15 or 23 or after the step of forming the passivation film illustrated in FIG. 24. Therefore, for example in the case of the IGBT, the MOS transistor structure is formed and either the aluminum lines or the passivation film exists on the surface where the vertical structure area is not formed. Thus, at the time of formation of the diffusion layers (the N buffer layer 15, the P collector layer 16, the N+ cathode layer 17, and the P cathode layer 18) that constitute the vertical structure area, considerations need to be given to ensure that the surface where the vertical structure area is not formed has a temperature lower than 660° C., i.e., the melting point of aluminum that is the metal used for the aluminum lines. Therefore, annealing may be performed using a laser whose wavelength has a temperature gradient in the depth direction of the device, or annealing may be performed at low temperatures less than or equal to 660° C., which is the melting point of aluminum.

Figure 33:
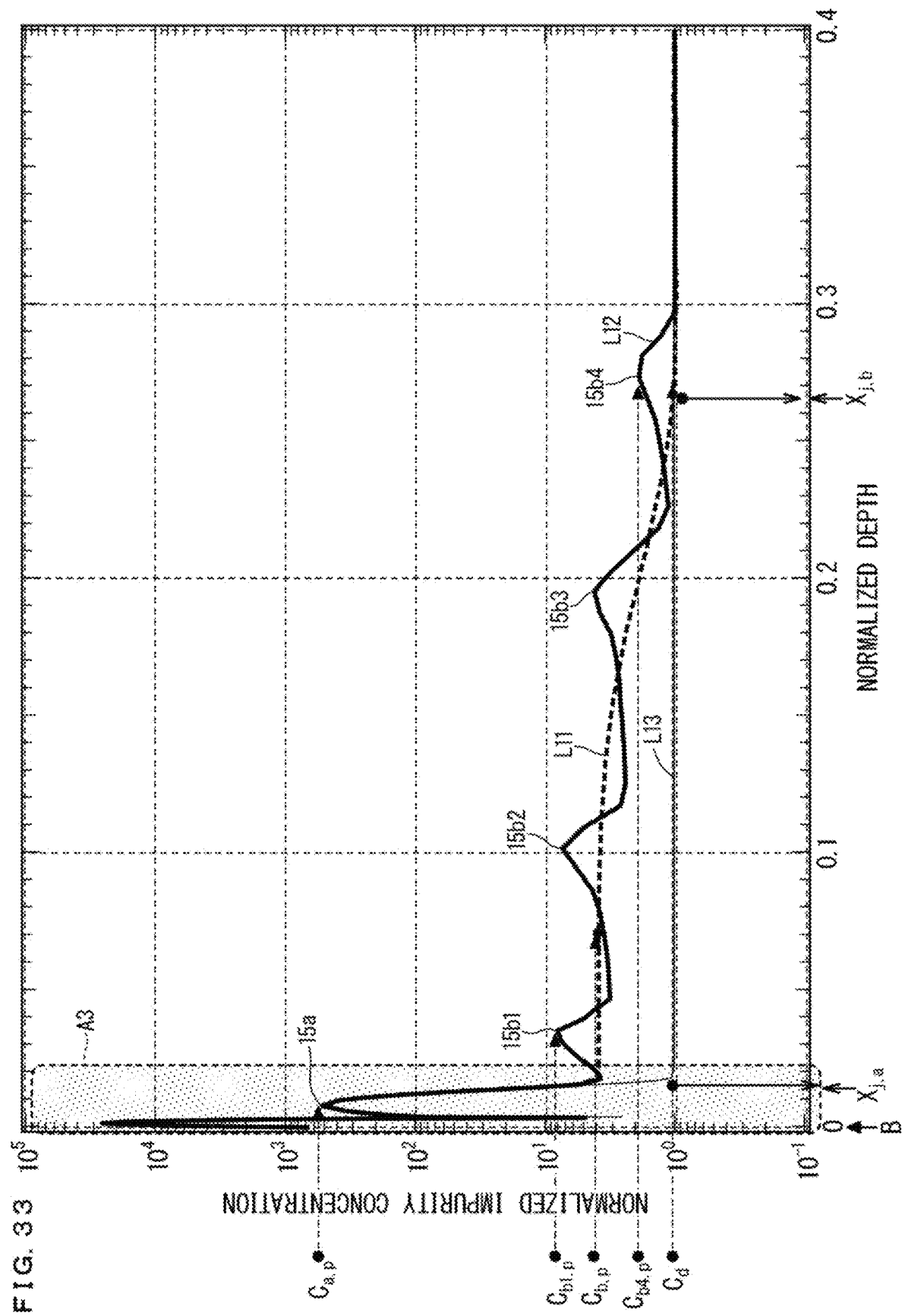
FIG. 33 illustrates impurity profiles of first and second structures.
Figure 34:
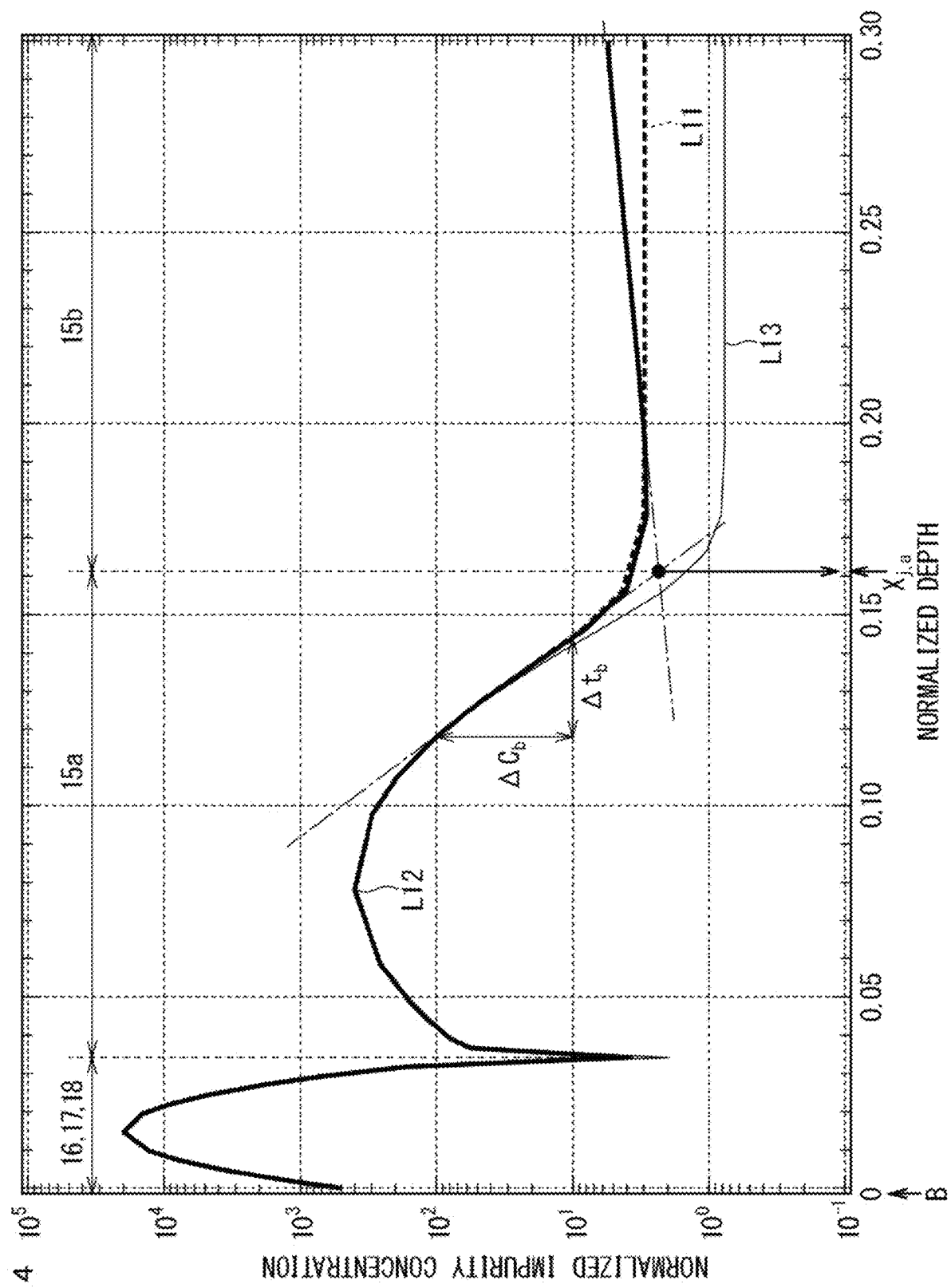
FIG. 34 is an enlarged view of an area A3 in FIG. 33.

As a result, the N buffer layer 15 in the IGBT or the diode manufactured by the above-described wafer process has a distinctive impurity profile that has a shallow junction depth $X_{j,a}$ and a steep concentration gradient toward the junction between the N⁻ drift layer 14 and the N buffer layer 15, like an impurity profile according to a comparative example indicated by a thin solid line L13 in FIGS. 33 and 34. Besides, the N buffer layer 15 has processing characteristics at the time of forming an N layer that diffusion is unlikely to occur in the depth direction and the horizontal direction, because the profile of the N layer reproduces the depth-direction profile obtained at the time of ion implantation for introducing impurities and because the aforementioned annealing technique is used. As a technique for forming an N-type diffusion layer having a deep and gentle concentration gradient, long-term and high-temperature annealing is conceivable. However, this technique cannot be used in the step where a low melting-point metal exists as described above and is thus used in the early stage of the wafer process illustrated in FIG. 5 or 18. In that case, the thickness of the wafer becomes a desired thickness (from 40 to 700 µm) either before or after the step of long-term and high-temperature annealing. Thus, in subsequent processes, each process unit needs to be modified to be able to process the wafer of the desired thickness, which involves a huge cost and is thus unrealistic. Besides, the long-term and high-temperature annealing is a process technique that is incompatible with an increase in the diameter of the Si wafer. The IGBT or the diode including this N buffer layer 15 has three significant problems described below in terms of performance.

(1) Under high temperature conditions, turn-off losses will increase due to increased leakage current when the withstand voltage is held, and besides the device will be out of control due to thermal runaway caused by heat generated by the device itself. Thus, it is not possible to ensure high-temperature operations.

(2) When each of the IGBT and the diode performs a dynamic operation such as a turn-off operation, a carrier plasma layer in the vicinity of the junction between the N⁻ drift layer 14 and the N buffer layer 15 will be depleted due to a relationship between a carrier plasma state inside the device and an electric field intensity distribution, and an electric field intensity at the junction between the N⁻ drift layer 14 and the N buffer layer 15 will increase. Moreover, a phenomenon in which a voltage jumps up at the end of the turn-off operation (hereinafter, simply referred to as a "snap-off phenomenon") and an oscillation phenomenon triggered by the snap-off phenomenon will occur. The snap-off phenomenon may cause an increase in voltage higher than the withstand voltage that can be held, leading to a device breakdown. This results in poor controllability of the turn-off operation in the IGBT and the diode and causes impairment of blocking capability at turn-off. This also causes malfunctions due to noise generation in an inverter system that includes a power module on which the IGBT or the diode is mounted. Note that the carrier plasma layer refers to a neutral layer whose electron concentration and hole concentration are almost the same and whose carrier density is higher than or equal to $10^{16}$ cm$^{-3}$, i.e., higher by two to three orders of magnitude than a doping carrier density $C_d$ of the N⁻ drift layer 14.

(3) In view of the above-described characteristics at the time of formation of the N buffer layer 15, the IGBT or the diode becomes sensitive to a phenomenon of withstand voltage failures due to partial non-formation of the N buffer layer 15 caused by flaws or foreign materials generated on the surface where the N buffer layer 15 is formed during the wafer process, which is performed at the time of forming the vertical structure area illustrated in FIGS. 16 and 17 or FIGS. 25 and 26. This results in an increase of percent defective of the IGBT or the diode chip.

As one example of the technique for solving the above-described problems, a technique for optimizing parameters of the N⁻ drift layer 14 have conventionally been selected, such as increasing the thickness of the N⁻ drift layer 14 in order to prevent depletion layers to come in contact with the N buffer layer 15 during a turn-off operation, or increasing the impurity concentration of the N⁻ drift layer 14 in order to reduce variations in impurity concentration.

However, increasing the thickness of the N⁻ drift layer 14 will increase the ON-state voltage in both of the IGBT and the diode and cause a reaction, specifically, an increase in total loss. On the other hand, reducing variations in the impurity concentration of the N⁻ drift layer 14 imposes limitations on the technique for manufacturing the Si wafer and on the Si wafer that can be adopted, thus causing an increase in the cost of the Si wafer. In this way, conventional IGBTs and diodes have technical problems that are dilemmas when improving device performance.

As a solution to the above-described problem (2), U.S. Pat. Nos. 6,482,681, 7,514,750, and 7,538,412 propose to form an N buffer layer 15 consisting of a plurality of layers by using protons (H⁺). With these techniques, however, the concentration of protons has to be increased in order to hold the withstand voltage, which is a basic characteristic of the power semiconductor, in consideration of a reduction in the thickness of the N⁻ drift layer 14, which is the trend to reduce the total loss in the IGBT or the diode. However, increasing the concentration of protons involves an increase in crystal defect at the time of proton introduction or an increase in defect density that becomes the center of recombination of carriers due to crystal defects, and therefore has demerits of causing an increase in turn-off loss (i.e., an increase in leakage current at high temperatures and high voltages) in the IGBT and the diode and impairment of breakdown tolerance. The basic performance required for a power semiconductor is to have voltage holding capability and ensure breakdown tolerance while reducing the total loss. An increase in turn-off loss will increase the amount of heat generated by the IGBT or the diode itself and thus poses a problem on high-temperature operations or the thermal design of the power module itself provided with the power semiconductor. That is, the above-described techniques fail to satisfy the requirement of the power semiconductor whose latest trend is to reduce the thickness of the N⁻ drift layer 14. Moreover, increasing the concentration of protons causes deterioration in the processing capacity of an ion implanter that is used to introduce protons into Si, resulting in a demerit in terms of device manufacturing techniques.

As described above, it is difficult with the conventional techniques to improve controllability during turn-off operations, improve blocking capability at turn-off, and ensure stable withstand voltage characteristics, which are the basic performance of the power semiconductor, while controlling the device internal state during dynamic operations in the latest IGBT or diode whose trend is to reduce the thickness of the N⁻ drift layer 14 in order to improve performance, i.e., reduce the ON-state voltage. Therefore, an N buffer layer structure that can solve the above-described problems is necessary in the wafer process that uses a wafer manufactured by the FZ method and that is compatible even with an increase in the diameter of an Si wafer. There is also demand for the ability to increase insensitivity to a phenomenon of withstand voltage failures in the IGBT or the diode due to partial non-formation of the N buffer layer 15 caused by adverse effects occurring during the wafer process.

It is an object of the present invention to solve the dilemmas of conventional IGBTs and diodes in terms of device performance by using the FZ wafer described above, and to reduce the ON-state voltage, provide stable withstand voltage characteristics, reduce turn-off losses along with a reduction in leakage current when the device is off, improve controllability during turn-off operations, improve blocking capability significantly at turn-off, and expand the operating temperature range.

Figure 27:
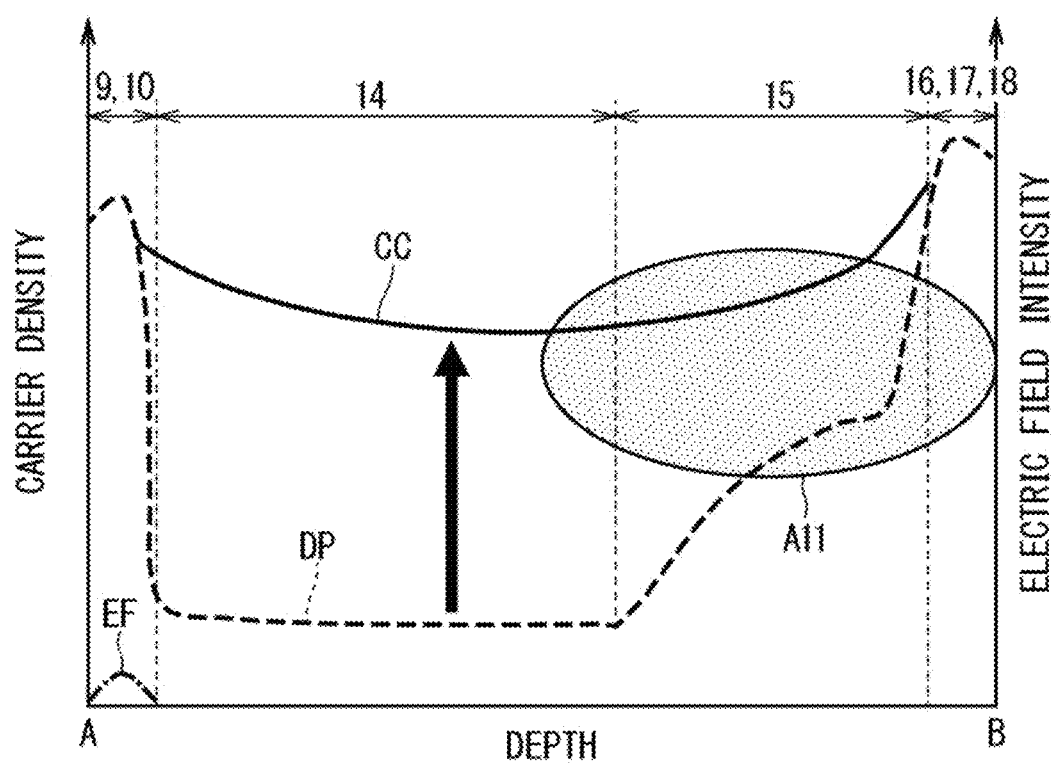
FIG. 27 is an explanatory diagram illustrating an idea about a vertical structure area proposed by the present invention.
Figure 29:
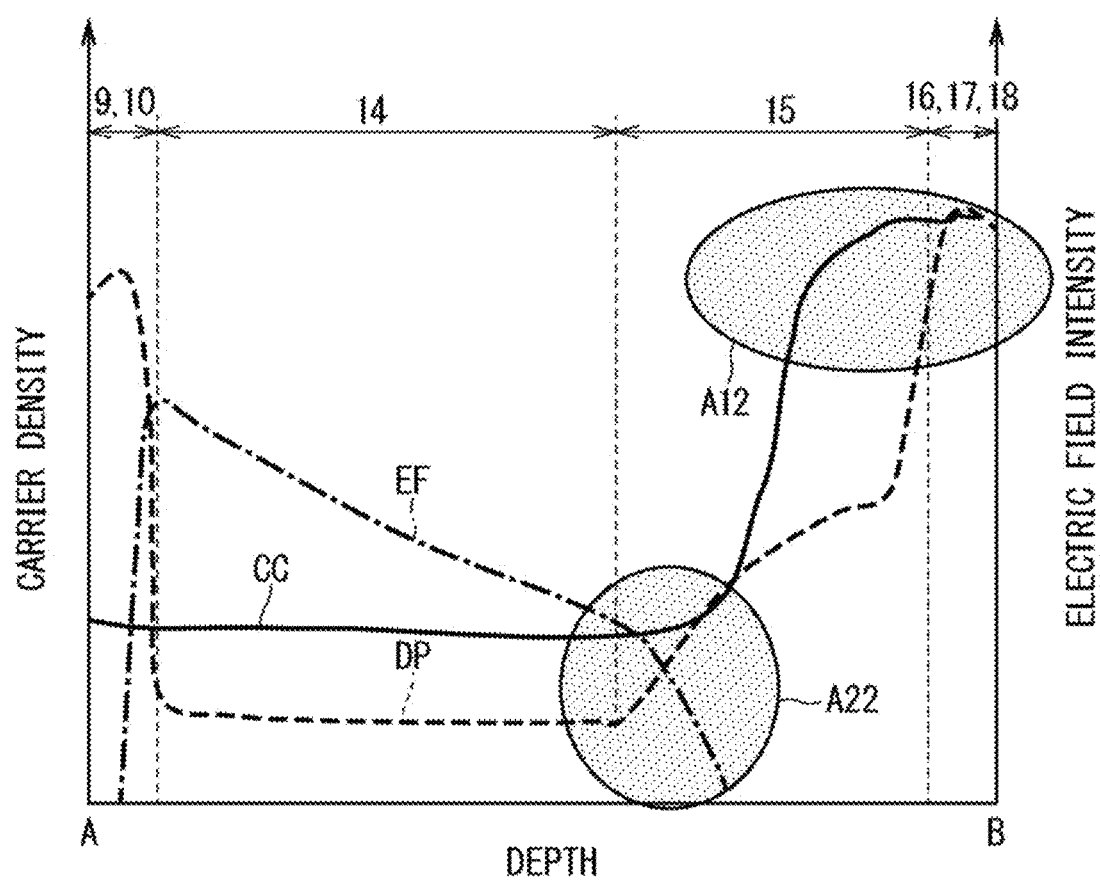
FIG. 29 is an explanatory diagram illustrating the idea about the vertical structure area proposed by the present invention.

FIGS. 27 to 29 are explanatory diagrams illustrating an idea about the vertical structure area proposed by the present invention. FIG. 27 illustrates a carrier density CC, an impurity profile (doping profile) DP, and an electric field intensity EF in an ON state, and FIGS. 28 and 29 illustrate the carrier density CC, the impurity profile DP, and the electric field intensity EF in a voltage blocking state and in a dynamic state, respectively. Numbers on the horizontal axes in FIGS. 27 to 29 indicate constituent elements of the IGBT or the diode, such as the P anode layer 10 illustrated in FIGS. 1 to 3.

It is conceivable that the above-described technical issues caused by the problems of the vertical structure area in conventional IGBTs and diodes can be solved by achieving the vertical structure area 27 as described below, and in particular, the structure of the N buffer layer 15. The concept described below is commonly applicable to the IGBT structure illustrated in FIG. 1 and the diode structures illustrated in FIGS. 2 and 3. The idea about the structure of the N buffer layer 15, which constitutes the vertical structure area proposed by the present invention, is described below as (1) to (3).

(1) With regard to a phenomenon in which the carrier plasma layer is depleted in the vicinity of the junction between the N⁻ drift layer 14 and the N buffer layer 15 during a turn-off operation, the concentration of the N buffer layer 15 is reduced so that a conductivity modulation phenomenon occurs even inside the N buffer layer 15 when the device is in the ON state, and the carrier plasma layer remains as indicated by an area A12 in FIG. 29. Since the concentration of the carrier plasma layer is higher than or equal to $10^{16}$ cm$^{-3}$, the impurity concentration of the N buffer layer 15 is set to be on the order of $10^{15}$ cm$^{-3}$, i.e., lower than or equal to the concentration of the carrier plasma layer. In this way, the impurity concentration of the N buffer layer 15 is reduced to such an extent that the carrier plasma layer remains in the N buffer layer 15.

(2) The concentration gradient in the vicinity of the junction between the N⁻ drift layer 14 and the N buffer layer 15 is made gentle. By so doing, the electric field intensity will be stopped inside the N buffer layer 15 in a static state as indicated by an area A21 in FIG. 28, and the depletion layer will gradually extend inside the N buffer layer 15 during a dynamic operation as indicated by an area A22 in FIG. 29.

(3) The N buffer layer 15 is made to have a concentration gradient, a low impurity concentration, and an increased thickness in order to reduce a current amplification factor (αpnp) of a PNP bipolar transistor built in the IGBT or the RFC diode and achieve a reduction in turn-off loss along with a reduction in leakage current when the device is off.

In this way, the N buffer layer 15 according to the present invention has the function of controlling the carrier plasma state inside the device when the device operates, while stabilizing and ensuring withstand voltage characteristics such as low turn-off losses.

First Preferred Embodiment 1

Figure 30:
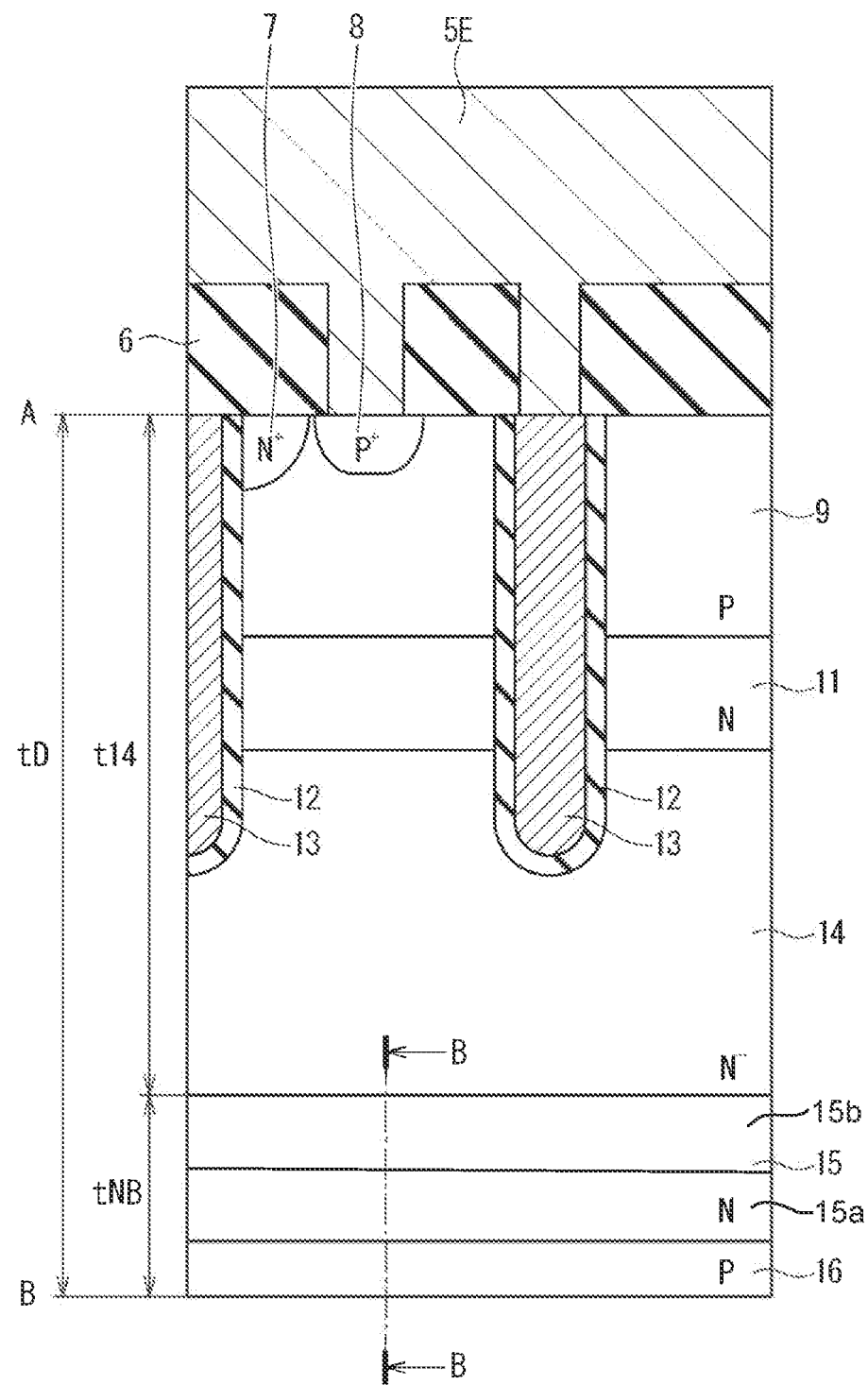
FIG. 30 is a sectional view of an active cell area in the trench-gate IGBT.
Figure 31:
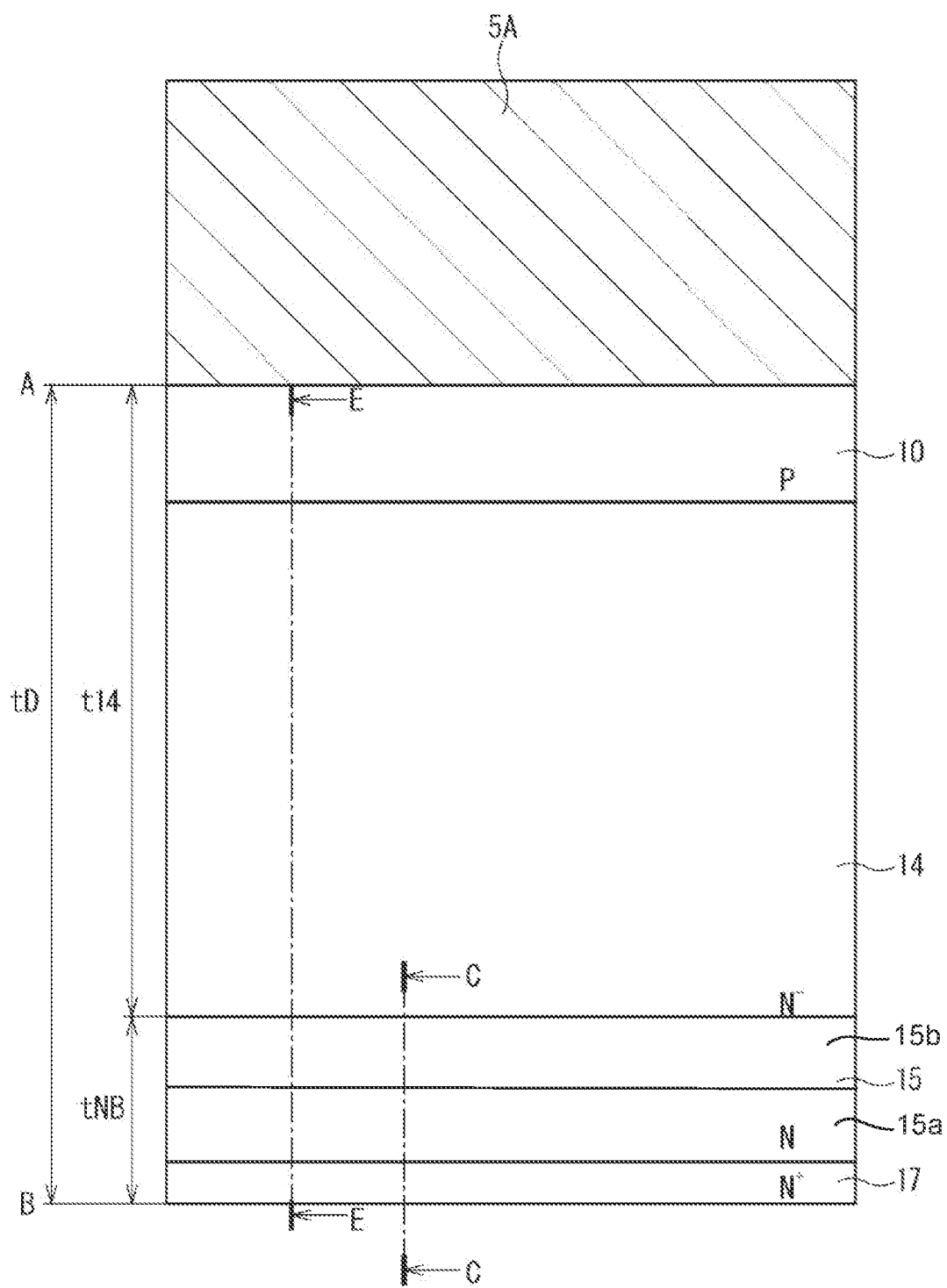
FIG. 31 is a sectional view of an active cell area in the PIN diode.
Figure 32:
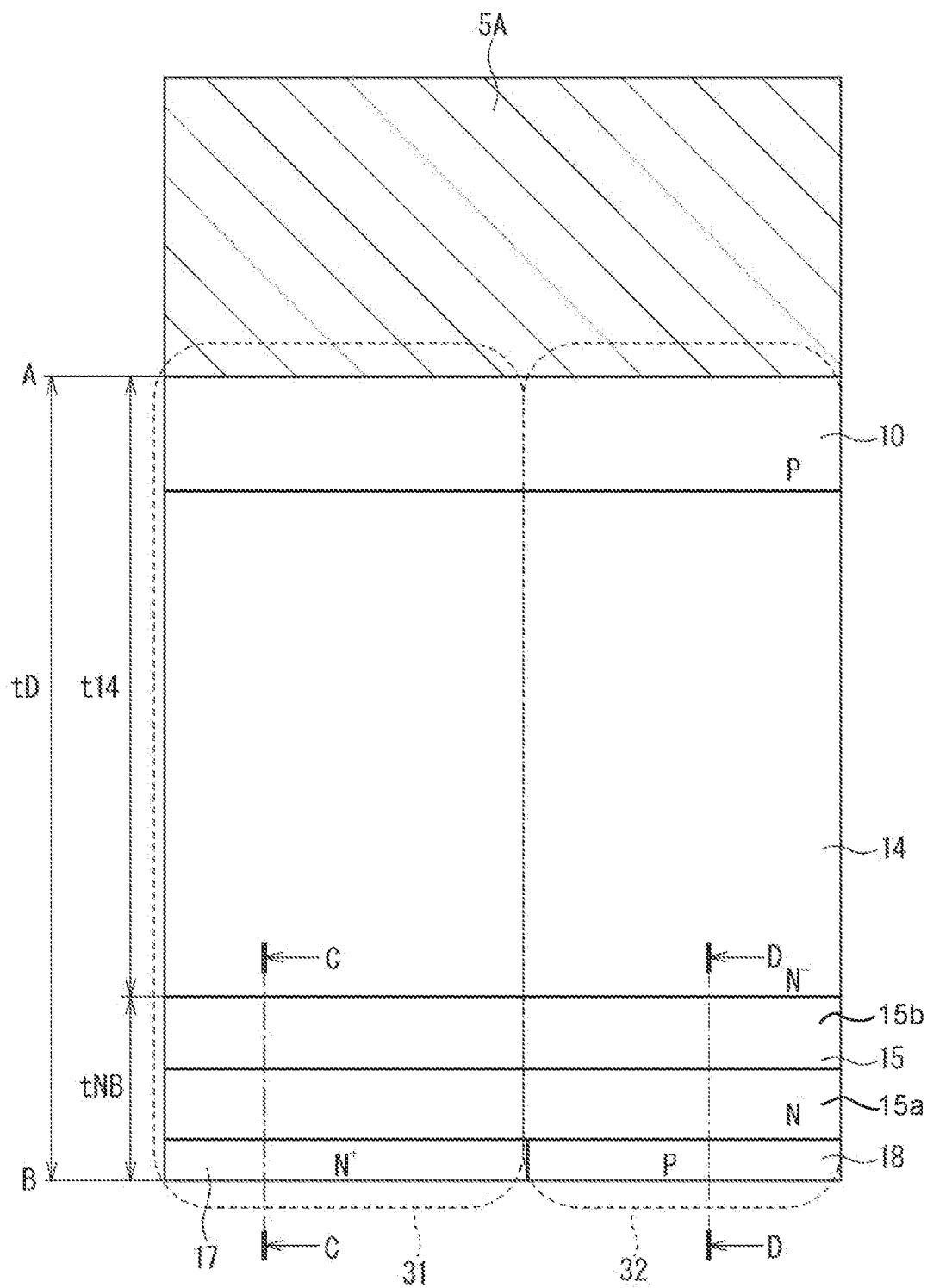
FIG. 32 is a sectional view of an active cell area in the RFC diode.

FIGS. 30 to 32 are cross-sectional views of the IGBT, the PIN diode, and the RFC diode that are semiconductor devices according to the first preferred embodiment of the present invention. FIGS. 30 to 32 are sectional views taken along line A2-A2 in the active cell area R1 illustrated in FIG. 4 and respectively illustrate configurations in the active cell areas R1 of the IGBT, the PIN diode, and the RFC diode illustrated in FIGS. 1 to 3. Note that a section taken along line E-E in FIG. 31 corresponds to the horizontal axis of the depth in FIGS. 27 to 29, described in "Principle of Present Invention." The N⁻ drift layers 14 illustrated in FIGS. 30 to 32 have impurity concentrations in the range of $1.0 \times 10^{12}$ to $5.0 \times 10^{4}$ cm$^{-3}$ and are formed using FZ wafers prepared by the floating zone (FZ) method. In the IGBT illustrated in FIG. 30, the junction between the P base layer 9 and the N layer 11 makes a main junction. In the PIN diode illustrated in FIG. 31 and the RFC diode illustrated in FIG. 32, the junction between the P anode layer 10 and the N⁻ drift layer 14 makes a main junction. In the RFC diode illustrated in FIG. 32, the P anode layer 10, the N⁻ drift layer 14, the N buffer layer 15, and the N⁺ cathode layer 17 configure a PIN diode area 31, and the P anode layer 10, the N⁻ drift layer 14, the N buffer layer 15, and the P cathode layer 18 configure a PNP transistor area 32.

The following description describes parameters of each diffusion layer, using the RFC diode as a typical example.

P anode layer 10: the surface impurity concentration is set to be higher than or equal to $1.0 \times 10^{16}$ cm$^{-3}$, the peak impurity concentration is set in the range of $2.0 \times 10^{16}$ to $1.0 \times 10^{18}$ cm$^{-3}$, and the depth is set in the range of 2.0 to 10.0 μm.

N⁺ cathode layer 17: the surface impurity concentration is set in the range of $1.0 \times 10^{18}$ to $1.0 \times 10^{21}$ cm$^{-3}$, and the depth is set in the range of 0.3 to 0.8 μm.

P cathode layer 18: the surface impurity concentration is set in the range of $1.0 \times 10^{16}$ to $1.0 \times 10^{20}$ cm$^{-3}$, and the depth is set in the range of 0.3 to 0.8 μm.

The N buffer layer 15 illustrated in FIGS. 30 to 32 has two types of structures, namely, a first structure and a second structure. Irrespective of whether the first structure or the second structure, the N buffer layer 15 is configured to have a laminated structure of a first buffer layer 15a and a second buffer layer 15b. The first buffer layer 15a is joined to the P collector layer 16, the N⁺ cathode layer 17, or the P cathode layer 18, and the second buffer layer 15b is joined to the N⁻ drift layer 14. In the first structure, the first buffer layer 15a and the second buffer layer 15b each have one peak point in its impurity concentration.

On the other hand, in the N buffer layer 15 having the second structure, the second buffer layer 15b is configured to have a laminated structure of n buffer layers, i.e., first to nth sub-buffer layers 15b1 to 15bn. The first sub-buffer layer 1561 is joined to the first buffer layer 15a, and the nth sub-buffer layer 15bn is joined to the N⁻ drift layer 14. Each of the sub-buffer layers 15b1 to 15bn has one peak in its impurity concentration. The second buffer layer 15b in the N buffer layer 15 having the second structure is hereinafter referred to as a "second buffer layer 15bs" in order to distinguish it from the second buffer layer 15b in the N buffer layer 15 having the first structure. That is, the N buffer layer 15 having the second structure includes the first buffer layer 15a that is joined to the P collector layer 16, the N⁺ cathode layer 17, or the P cathode layer 18, and the second buffer layer 15b that is laminated on the first buffer layer 15a and joined to the N⁻ drift layer 14. The second buffer layer 15bs includes the first sub-buffer layer 15b1, the second sub-buffer layer 15b2, . . . and the nth sub-buffer layer 15bn that are laminated in order from the side of the first buffer layer 15a to the side of the N⁻ drift layer 14. Each sub-buffer layer has one peak point in its impurity concentration. The parameters of the first buffer layer 15a and second buffer layer 15b in the first and second structures are as follows.

A peak impurity concentration $C_{a,p}$ of the first buffer layer 15a is set in the range of $1.0 \times 10^{16}$ to $5.0 \times 10^{16}$ cm$^{-3}$, and a depth $X_{j,a}$ thereof is set in the range of 1.2 to 5.0 μm.

A maximum peak impurity concentration $(C_{b,p})$ max that is a maximum value of a peak impurity concentration $C_{b,p}$ of the second buffer layer 15*b* having the first structure and the peak impurity concentrations of the sub-buffer layers 15*b*1 to 15*bn* of the second buffer layer 15*b* having the second structure is set to be higher than the impurity concentration $C_d$ of the N⁻ drift layer 14 and lower than or equal to $1.0 \times 10^{15}$ cm⁻³. A depth $X_{j,b}$ of the second buffer layer 15*b* is set in the range of 4.0 to 50 μm. Note that the peak impurity concentration $C_{b,p}$ of the second buffer layer 15*b* having the first structure and the maximum peak impurity concentration $(C_{b,p})$ max in the second buffer layer 15*b* having the second structure are maximum impurity concentrations of the second buffer layers 15*b*.

FIG. 33 illustrates impurity profiles for the first and second structures, and FIG. 34 is an enlarged view of an area A3 in FIG. 33. The horizontal axes in FIGS. 33 and 34 indicate the depth normalized by tD and correspond to a section taken along line B-B in FIG. 30 and a section taken along line C-C in FIGS. 31 and 32. Also, zero on the horizontal axes in FIGS. 33 and 34 corresponds to B of the lower side in FIGS. 30, 31, and 32. That is, the lower surface of the P collector layer 16 in the IGBT illustrated in FIG. 30, the lower surface of the N⁺ cathode layer 17 in the PIN diode illustrated in FIG. 31, and the lower surface of the N⁺ cathode layer 17 or the P cathode layer 18 in the RFC diode illustrated in FIG. 32 correspond to zero on the horizontal axes in FIGS. 33 and 34.

In FIGS. 33 and 34, the impurity profile for the first structure is indicated by a thick dotted line L11, and the impurity profile for the second structure is indicated by a thick solid line L12. Also, in FIG. 33 and FIG. 34, an impurity profile for a conventional structure that is a conventional vertical structure area that does not have the features of the present invention is indicated by a thin solid line L13 for comparison.

The depth and impurity profile of the first buffer layer 15*a* are common to the first and second structures. FIG. 33 illustrates the impurity profile for the second structure including the first buffer layer 15*a* and the first to fourth sub-buffer layers 15*b*1 to 15*b*4. In FIGS. 33 and 34, reference characters indicate each peak in the impurity profile. For example, in the impurity profile for the second structure, a peak indicated by "15*b*1" indicates the peak of the first sub-buffer layer 15*b*1 in the second structure.

The first structure is first described with reference to FIGS. 33 and 34. The N buffer layer 15 having the first structure includes the first buffer layer 15*a* and the second buffer layer 15*b* that is a single layer. The peak impurity concentration $C_{b,p}$ of the second buffer layer 15*b* is located at a position closer to the junction (depth $X_{j,a}$) between the first buffer layer 15*a* and the second buffer layer 15*b* than the center portion of the second buffer layer 15*b*. The impurity profile of the second buffer layer 15*b* has a low concentration and a gentle concentration gradient $\delta_b$ in the depth direction toward the junction (depth $X_{j,b}$) between the second buffer layer 15*b* and the N⁻ drift layer 14. The second buffer layer 15*b* is formed such that its peak impurity concentration $C_{b,p}$ is located at a position closer to the junction between the first buffer layer 15*a* and the second buffer layer 15*b* than the center portion of the second buffer layer 15*b*. Thus, in techniques such as ion implantation and irradiation for forming the second buffer layer 15*b*, a peak position at the time of introducing ion species into Si is set to be deeper than the junction between the first buffer layer 15*a* and the second buffer layer 15*b*.

Note that the amount of inclination of concentration on the main junction side, i.e., the concentration gradient $\delta_b$ (decade cm⁻³/μm), in the vicinity of the junction between the second buffer layer 15*b* and the N⁻ drift layer 14 is expressed by Expression (1) below.

$$\delta_b = \frac{(\Delta \log_{10} C_b)}{\Delta t_b} \qquad (1)$$

where $\Delta \log_{10} C_b$ is the amount of change in the impurity concentration $C_b$ of the second buffer layer 15*b* illustrated in FIG. 33, log is the common logarithm with base 10, and $\Delta t_b$ is the amount of change in the depth $t_b$ of the second buffer layer 15*b*.

The depth $X_{j,a}$ at the junction between the first buffer layer 15*a* and the second buffer layer 15*b* is defined as follows. As illustrated in FIG. 34, a point at which the tangent of inclination of the impurity profile of the first buffer layer 15*a* intersects with the tangent of inclination of the impurity profile of the second buffer layer 15*b*, i.e., a point at which the gradient of the impurity profile changes from negative to positive, is defined as the depth $X_{j,a}$ at the junction. Similarly, the depth $X_{j,b}$ at the junction between the second buffer layer 15*b* and the N⁻ drift layer 14 is also defined as a point illustrated in FIG. 33 at which the tangent of inclination of the impurity profile of the second buffer layer 15*b* intersects with the tangent of inclination of the impurity profile of the N⁻ drift layer 14.

In the first structure, the first buffer layer 15*a* and the second buffer layer 15*b* satisfy the relationship expressed by Expressions (2) to (4) below.

$$C_{a,p} > C_{b,p} \qquad (2)$$

$$X_{j,a} < X_{j,b} \qquad (3)$$

$$\delta_a > \delta_b \qquad (4)$$

where $\delta_a$ is 9.60 (decade cm⁻³/μm) and $\delta_b$ is in the range of 0.001 to 0.70 (decade cm⁻³/μm).

Next, the second structure is described with reference to FIGS. 33 and 34. In the N buffer layer 15 having the second structure, the second buffer layer 15*b* is configured to have a laminated structure of a plurality of sub-buffer layers. FIG. 33 illustrates an impurity profile when the second buffer layer 15*b* consists of four sub-buffer layers 15*b*1 to 15*b*4. The impurity profile of the first buffer layer 15*a* is similar to that of the first buffer layer 15*a* in the first structure.

Peak impurity concentrations $C_{b1,p}, C_{b2,p}, \ldots, C_{bn,p}$ of the sub-buffer layers 15*b*1, 15*b*2, ..., 15*bn* in the second buffer layer 15*b* are set to decrease gradually in the depth direction from the second main surface to the first main surface from the junction $X_{j,a}$ between the second buffer layer 15*b* and the first buffer layer 15*a* toward the junction $X_{j,b}$ between the second buffer layer 15*b* and the N⁻ drift layer 14, i.e., set to decrease as the distance from the main junction decreases. Similarly, concentration gradients $\delta_{b1}, \delta_{b2}, \ldots, \delta_{bn}$ thereof are also set to decrease gradually in the direction from the second main surface to the first main surface from the junction $X_{j,a}$ between the second buffer layer 15*b* and the first buffer layer 15*a* toward the junction $X_{j,b}$ between the second buffer layer 15*b* and the N⁻ drift layer 14, i.e., set to decrease as the distance from the main junction decreases. Also, each pair of adjacent sub-buffers in the second buffer layer 15*b* has an equal distance $\Delta S_{n,n-1}$ between their impurity concentration peak points. For example, $\Delta S_{b1,b2} \approx \Delta S_{b2,b3} = \Delta S_{b3,b4}$, where $S_{b1,b2}$ is the distance between the impurity concentration peak points of the first and second sub-buffer layers 15b1 and 15b2, $S_{b2, b3}$ is the distance between the impurity concentration peak points of the second and third sub-buffer layers 15b2 and 15b3, and $S_{b3, b4}$ is the distance between the impurity concentration peak points of the third and fourth sub-buffer layers 15b3 and 15b4 in FIG. 33. Note that "has an equal distance between their impurity concentration peak points" as used herein refers not only to the case where the distances are strictly equal but also to the case where the distances are equal within a range of half-value width (2 µm) of each sub-buffer layer.

The impurity concentrations of the sub-buffer layers 15b1 to 15bn, which constitute the second buffer layer 15b, are set to be higher than the impurity concentration $C_d$ of the N⁻ drift layer 14 throughout the entire area including the junctions between each pair of adjacent sub-buffer layers.

In the second structure, the first buffer layer 15a and the first sub-buffer layer 15b1 of the second buffer layer 15b satisfy the relationship expressed below.

$$C_{a,p} > C_{b1,p} \quad (5)$$

$$X_{j,a} < X_{j,b1} \quad (6)$$

$$\delta_a > \delta_{b1} \quad (7)$$

where $\delta_a$ is 9.60 (decade cm⁻³/µm) and $\delta_{b1}$ is in the range of 0.30 (decade cm⁻³/µm) to 1.00 (decade cm⁻³/µm).

Also, each of the sub-buffer layers 15b1 to 15bn of the second buffer layer 15b satisfies the relationships expressed by Expressions (8) and (9) below.

$$C_{b1,p} \geq C_{b2,p} \ldots \geq C_{bn,p} \quad (8)$$

$$\delta_{b1} \geq \delta_{b2} \ldots \delta_{bn} \quad (9)$$

Here, the concentration gradient $\delta_{bn}$ in the vicinity of the junction between the nth sub-buffer layer 15bn and the N⁻ drift layer 14 (also referred to as the concentration gradient on the main junction side) is in the range of 0.14 (decade cm⁻³/µm) to 0.50 (decade cm⁻³/µm).

Moreover, a concentration gradient $\delta'_b$ obtained by a linear approximation connecting the peak impurity concentrations of the sub-buffer layers 15b1 to 15bn in the impurity profile is in the range of 0.001 (decade cm⁻³/µm) to 0.70 (decade cm⁻³/µm).

In view of the above-described relationships and considering the function of the target N buffer layer 15 illustrated in FIGS. 27 to 29, the functions of the first buffer layer 15a and the second buffer layer 15b that constitute the N buffer layer 15 according to the present invention are as follows.

As indicated by the area A21' in FIG. 28, the first buffer layer 15a has the function of preventing extension of the depletion layers from the main junction in a static state. This provides stable withstand voltage characteristics and achieves a reduction in turn-off losses along with a reduction in leakage current when the device is off.

The impurity concentration of the second buffer layer 15b increases from that in the doping profile obtained at the time of formation of the second buffer layer 15b due to the carrier plasma layer generated by a conductivity modulation phenomenon in the ON state, i.e., in the state where rated principal current flows (area A11 in FIG. 27). This increase in impurity concentration serves to expand the base width of the PNP transistor and, as a result, reduces αpnp and achieves a reduction in turn-off losses along with a reduction in leakage current when the device is off. The carrier plasma layer generated by the conductivity modulation phenomenon serves as a residual carrier plasma layer in the dynamic state (area A12 in FIG. 29). The second buffer layer 15b also has the function of reducing the speed of extension of the depletion layers from the main junction in the dynamic state, as compared with the extension speed in the N⁻ drift layer 14, and causing the carrier plasma layer generated in the ON state to remain in order to control the electric field intensity distribution (area A22 in FIG. 29). This makes it possible to suppress the occurrence of a snap-off phenomenon at the end of a turn-off operation and the occurrence of an oscillation phenomenon caused by the snap-off phenomenon and to improve breakdown tolerance in the dynamic state while improving controllability of switching operations.

The first buffer layer 15a and the second buffer layer 15b having the above-described functions are formed after the step of accurately forming the thickness of the device during the wafer process (FIG. 16 or 25). Here, the device thickness corresponds to a distance tD from A to B in FIGS. 30 to 32. For the first buffer layer 15a and the second buffer layer 15b, the order of formation and the setting of a peak position of an acceleration energy at the time of introducing the second buffer layer 15b are important. That is, the first buffer layer 15a is formed by implanting first ions from the second main surface side of the semiconductor base substrate and activating the first ions by annealing, and then the second buffer layer 15b is formed by implanting second ions from the second main surface side of the semiconductor base substrate and activating the second ions by annealing.

The annealing temperature at the time of forming the first buffer layer 15a is higher than the annealing temperature at the time of forming the second buffer layer 15b. Thus, if the second buffer layer 15b is formed before the first buffer layer 15a, this will adversely affect the impurity profile after the activation of the second buffer layer 15b and the type of crystal defects in the second buffer layer 15b, which are introduced in order to form the second buffer layer 15b, and will have adverse effects on carriers (electrons or holes) when the device is in the ON state. Therefore, the second buffer layer 15b is formed after the activation annealing of the first buffer layer 15a. The second buffer layer 15b having the above-described characteristics can be formed by, after the activation annealing of the first buffer layer 15a, introducing ions into Si to form the P collector layer 16, N⁺ cathode layer, or the P cathode layer 18 or to form the collector electrode 23C or the cathode electrode 23K and then performing annealing.

The peak position of the concentration of the ion species that are introduced into Si to form the second buffer layer 15b is set as follows. In the first structure, the distance from the peak position to the junction $X_{j,a}$ between the first buffer layer 15a and the second buffer layer 15b is set to be shorter than the distance from the peak position to the center portion of the second buffer layer 15b. This prevents interference between the first buffer layer 15a and the second buffer layer 15b and enables accurately forming the second buffer layer 15b that satisfies the desired relationship between the first buffer layer 15a and the second buffer layer 15b. In the second structure, the distances ($\Delta S_{b1, b2}$, $\Delta S_{b2, b3}$, ..., $\Delta S_{b(n-1), bn}$) between each pair of adjacent peak positions in the sub-buffer layers 15b1 to 15bn, which constitute the second buffer layer 15b, are set to be equal. Note that "the distances between the peak points are equal" as used herein refers not only to the case where the distances are strictly equal, but also to the case where the distances are equal within the range of half-value width (2 µm) of each sub-buffer layer. In the second structure, the peak position in the first sub-buffer layer 15b1 is set at a position closer to the junction $X_{j, b1}$ between the first sub-buffer layer 15b1 and the first buffer layer 15a than the center portion of the first sub-buffer layer 15b1. This prevents interference between the first buffer layer 15a and the first sub-buffer layer 15b1 and enables accurately forming the desired first sub-buffer layer 15b1.

The first buffer layer 15a uses phosphorus as its ion species, and the second buffer layer 15b uses selenium, sulfur, phosphorus, protons ($H^+$), or helium as its ion species. The first buffer layer 15a and the second buffer layer 15b are formed by introducing these ion species into Si with high acceleration energy. In the case of using protons or helium, a process technique for forming a diffusion layer is used in which an n layer is formed by a donor phenomenon using annealing conditions, which will be described later. Also, protons or helium can be introduced into Si by an irradiation technique using a cyclotron, instead of by ion implantation.

When protons are introduced into Si, (a) complex defects (VOH, V2H, VO, CiOS (G-centres), CiOi (C-centres)) are generated as a result of voids (V) generated during the introduction being diffused and reacting with impurities (hydrogen atoms (H), oxygen atoms (O), and carbon (C) atoms) or as a result of a substitution reaction between carbon atoms and lattice defects. Also, (b) complex defects ($V_2O$, $V_2O_2$) are generated as a result of lattice defects generated during the introduction being diffused and auto-agglutinated and reacting with oxygen atoms by annealing. Also, (c) lattice defect pairs (X-centres) are generated as a result of aggregates (W-centres) of lattice defects generated during the introduction being diffused and re-coagulated by annealing. Among these, complex defects generated by the reaction of voids and impurities contain hydrogen and thus make electron supply sources (donors). The donor concentration increases along with an increase in the density of complex defects by annealing, and the donor concentration is further increased by a mechanism for accelerating a thermal donor phenomenon caused by ion implantation or an irradiation process. As a result, a layer as illustrated in FIG. 33 is formed that has a higher impurity concentration than the $N^-$ drift layer 14 and serves as a donor, and this layer contributes to device operations as the second buffer layer 15b. In this way, device performance can be improved by making use of the complex defects generated in the second buffer layer 15b. On the other hand, the complex defects generated in the second buffer layer 15b also include defects serving as lifetime killers that shorten the lifetimes of carriers. Thus, the impurity dose at the time of forming the second buffer layer 15b and the annealing conditions for donors are important. It is also important to form the second buffer layer 15b by ion implantation and an annealing technique after the formation of the first buffer layer 15a.

Different annealing techniques are used for activation of the first buffer layer 15a and the second buffer layer 15b, respectively. At that time, the annealing temperature used for the first buffer layer 15a is higher than that for the second buffer layer 15b. Thus, an activation rate Rb of the second buffer layer 15b is lower than an activation rate Ra of the first buffer layer 15a, and each diffusion layer is formed under the condition that Rb/Ra=0.01. The activation rate R (%) is expressed by (the dose calculated from the impurity profile after activation/the dose of ionic atoms contained in the actual diffusion layer area)×100.

Here, the dose calculated from the impurity profile after activation refers to a dose calculated from a relationship between the impurity concentration and depth of the diffusion layer by spreading resistance analysis. The dose of ionic atoms contained in the actual diffusion layer area refers to a dose calculated by analyzing the mass of ions in the depth direction by secondary ion mass spectrometry (SIMS).

Figure 35:
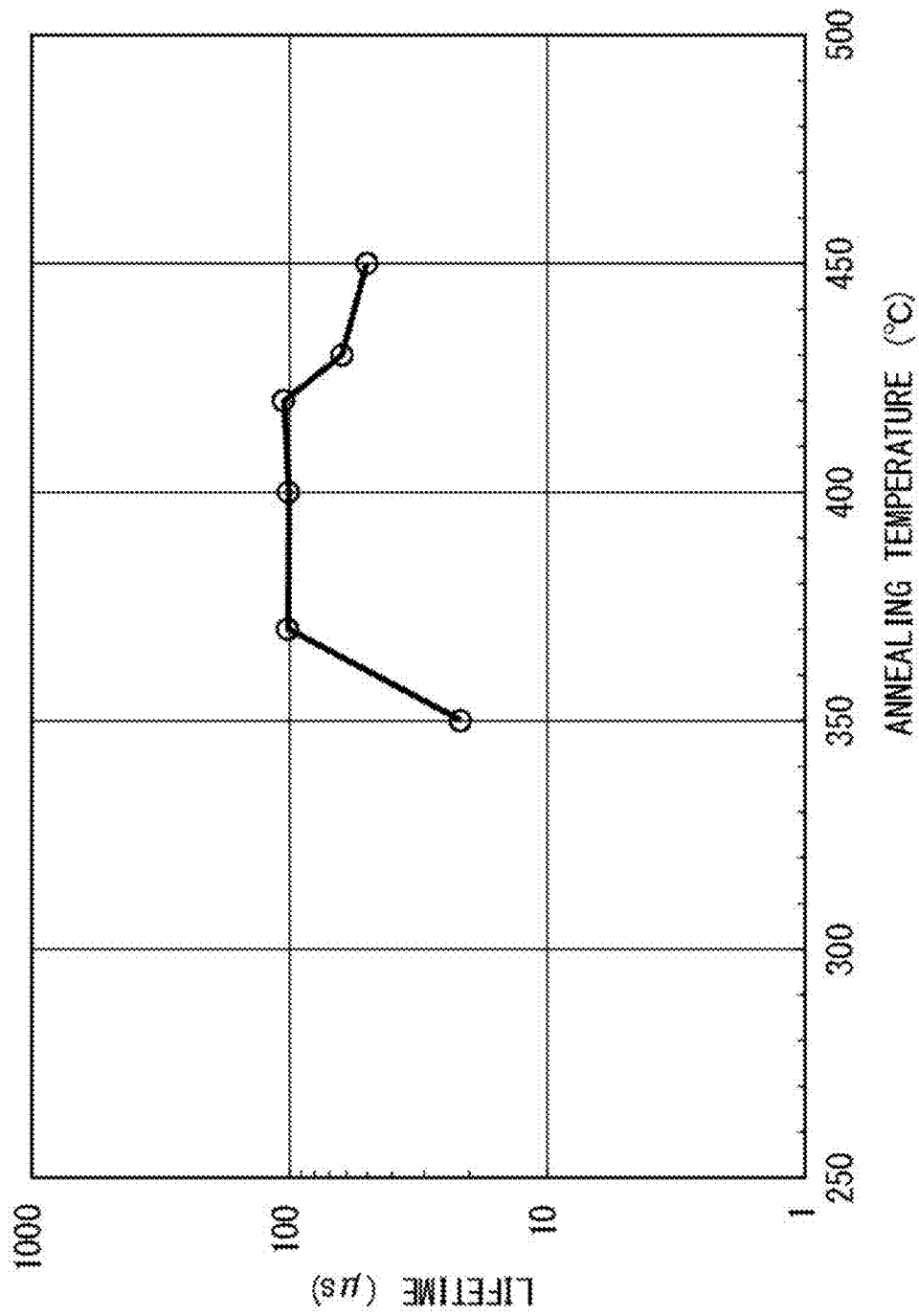
FIG. 35 illustrates a relationship between the carrier lifetime of a second buffer layer and the annealing temperature.

FIG. 35 illustrates a relationship between the carrier lifetime of the second buffer layer 15bs and the annealing temperature at the time of annealing for activation (donors) of the second buffer layer 15bs. While several characteristics will be described hereinafter, the annealing temperature at the time of annealing for activation (donors) of the second buffer layer 15bs is hereinafter simply referred to as the "annealing temperature for the second buffer layer 15bs." In FIG. 35, a nitrogen atmosphere is used during the annealing. The carrier lifetime of the second buffer layer 15b is measured by the microwave photo-conductivity decay (μ-PCD) method. FIG. 35 indicates that, when the annealing temperature for the second buffer layer 15bs is higher than or equal to 370° C. and lower than or equal to 420° C., the carrier lifetime of the second buffer layer 15bs is 100 μs and long. Note that the carrier lifetime of the first buffer layer 15a, evaluated by the same method, is 300 μs. Therefore, in the second structure, the carrier lifetime of the first buffer layer 15a has to be made longer than that in the second buffer layer 15bs. If the first buffer layer 15a that is in contact with the P collector layer 16, the $N^+$ cathode layer 17, or the P cathode layer 18 has a long carrier lifetime, normal carriers can be supplied from a carrier supply source, i.e., the P collector layer 16, the $N^+$ cathode layer 17, or the P cathode layer 18, to the $N^-$ drift layer 14 in the ON state in both of the IGBT and the diode. Moreover, as will be described later, normal on-state operations are guaranteed within a wide operating temperature range, turn-off losses at high temperatures are reduced, and a residual carrier plasma layer is formed on the collector or cathode side during dynamic operations in both of the IGBT and the diode. This enables control of the electric field intensity distribution extending from the main junction. Accordingly, controllability and blocking capability during turn-off operations can be improved.

Figure 36:
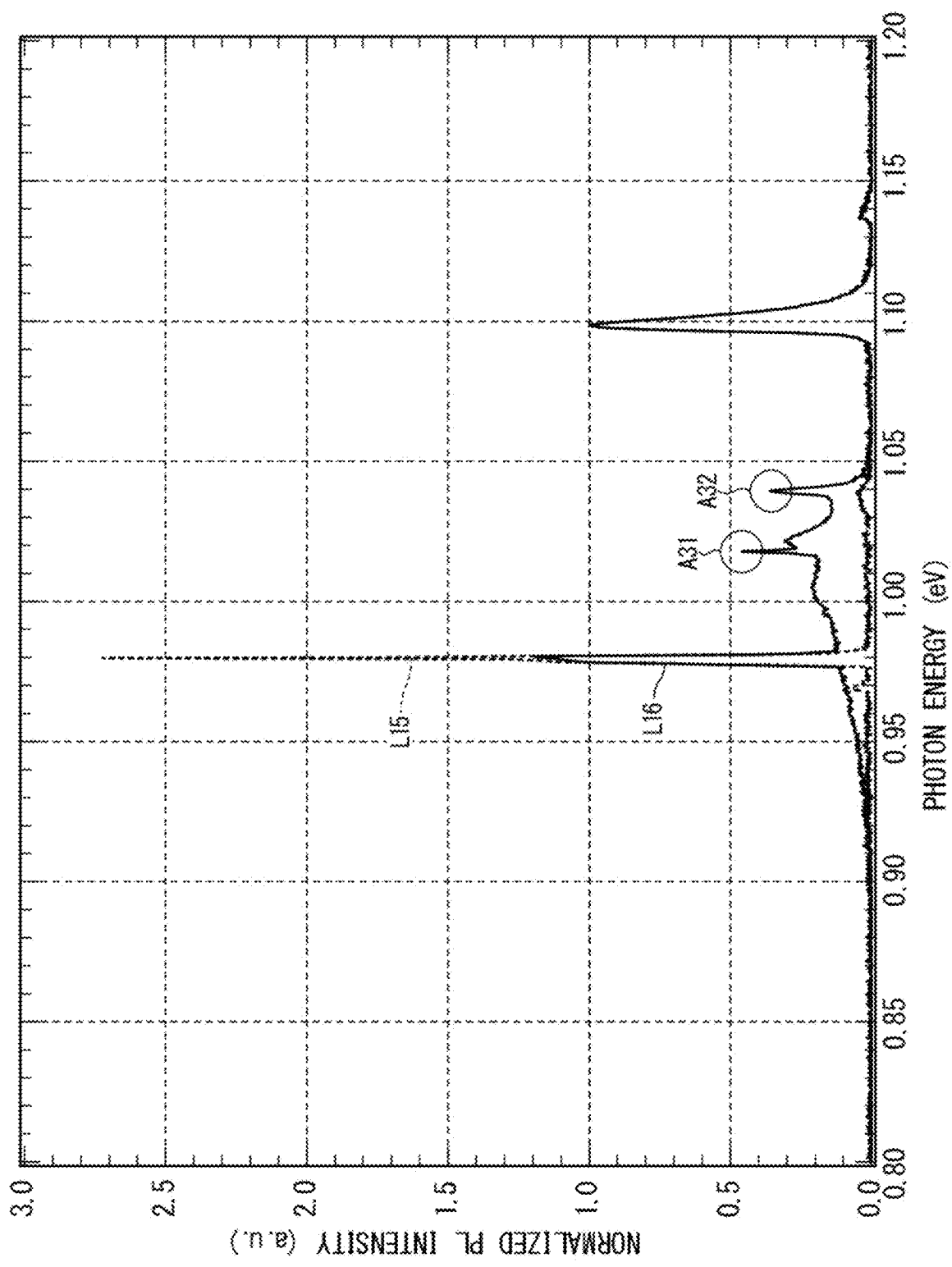
FIG. 36 illustrates the results of measurement on spectra of first and second buffer layers in the second structure by a photoluminescence method.

FIG. 36 illustrates the results of measurement on spectra of the first and second buffer layers 15a and 15bs in the second structure by the photoluminescence (PL) method. The PL method is an analysis technique for irradiating a semiconductor with light and observing light emitted when electron-hole pairs recombine via a defect level. In FIG. 36, the horizontal axis indicates photon energy (eV), and the vertical axis indicates photoluminescence (PL) intensity (a.u.) normalized at a temperature of 30 (K). The normalized PL intensity is standardized by the intensity at the band edge of each layer. Note that the PL intensity relates to the number of defects, and a higher PL intensity indicates a larger number of defects derived therefrom.

In FIG. 36, the result of measurement on the first buffer layer 15a is indicated by a broken line L15, and the result of measurement on the second buffer layer 15bs is indicated by a solid line L16. The spectra of the first buffer layer 15a and the second buffer layer 15bs both have a peak derived from laser light emitted at 0.98 eV and also have a peak derived from 1.1 eV light emission at the band edge. The spectrum of the first buffer layer 15a has no other specific peaks other than the aforementioned peaks. However, the spectrum of the second buffer layer 15bs has two distinctive peaks indicated by areas A31 and A32 in FIG. 36, in addition to the aforementioned peaks. These peaks are derived from lattice defects existing in the second buffer layer 15bs. More specifically, the peak indicated by the area A31 is at a level of W-centres (with photon energy of 1.018 eV), and the peak indicated by the area A32 is a level of X-centres (with photon energy of 1.040 eV). Note that the results obtained by the PL method, described in G. Davies et al., "Radiation Damage in Silicon Exposed to High-Energy Protons," Phys. Rev. B, 73, pp. 165202-1-165202-10, 2006, are referenced for the photon energy levels of the W-centres and the X-centres.

In the N buffer layer 15 having the second structure, the carrier lifetime of the first buffer layer 15*a* is longer than the carrier lifetime of the second buffer layer 15*bs*. Thus, even if lattice defects exist in the second buffer layer 15*bs* as will be described later in a third preferred embodiment, the diode performs a normal turn-on operation and has low turn-off losses and sufficient withstand voltage capability without causing thermal runaway even at high temperatures. The diode also has high blocking capability even under high temperatures, high voltages, and large current and achieves high-temperature operations. Similar effects can also be obtained with the IGBT that includes the N buffer layer 15 having the second structure.

Figure 37:
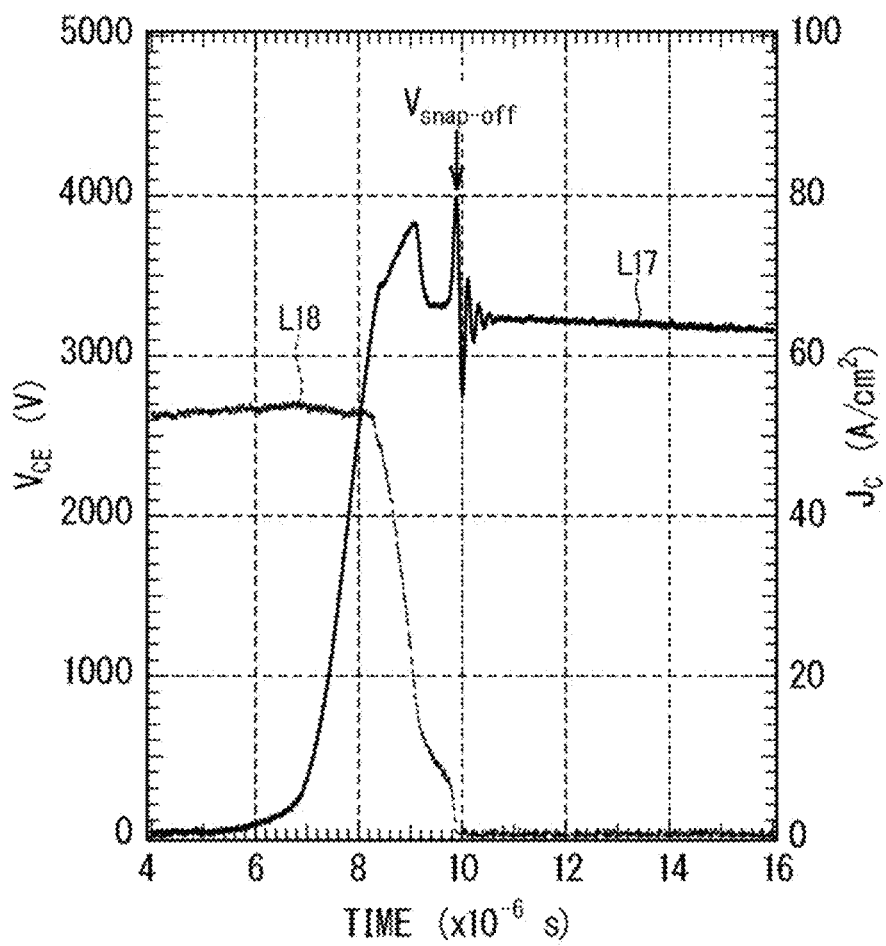
FIG. 37 illustrates a turn-off waveform of the IGBT.

FIG. 37 illustrates a turn-off waveform of the IGBT and a performance par meter extracted from that waveform. In FIG. 37, the horizontal axis indicates time ($\times 10^{-6}$ seconds), and the vertical axis indicates a collector-emitter voltage $V_{CE}$ (V) and a collector current density $J_C$ (A/cm$^2$). A solid line L17 in FIG. 37 indicates the collector-emitter voltage $V_{CE}$, and a broken line L18 indicates the collector current density $J_C$.

Figure 38:
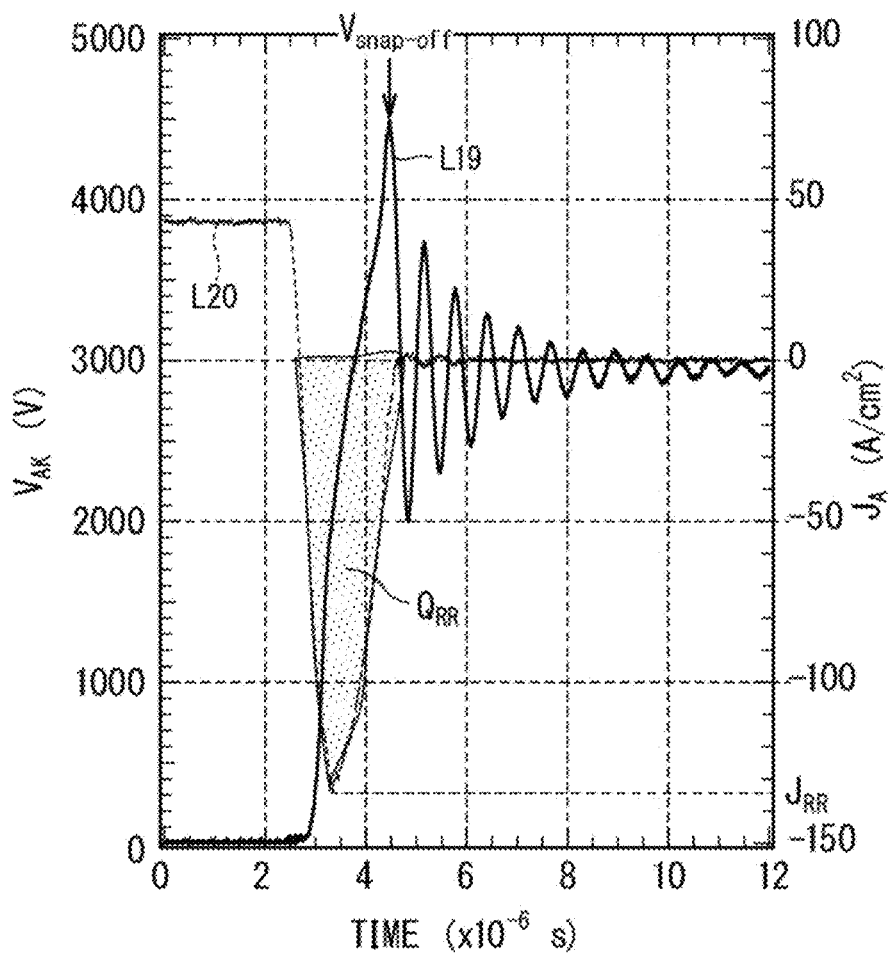
FIG. 38 illustrates a recovery waveform of the diode.

FIG. 38 illustrates a recovery waveform of the diode and a performance parameter extracted from that waveform. A turn-off operation of the diode illustrated in FIG. 38 and a recovery operation of the diode, which will be described later, are in the same operating state. In FIG. 38, the horizontal axis indicates time ($\times 10^{-6}$ seconds), and the vertical axis indicates an anode-cathode voltage VA (V) and an anode current density $J_A$ (A/cm$^2$). A solid line L19 in FIG. 38 indicates the anode-cathode voltage $V_{AK}$ (V), and a broken line L20 indicates the anode current density $J_A$ (A/cm$^2$). $J_{RR}$ indicates a maximum value of $J_A$ during the recovery operation, i.e., a maximum reverse recovery current density. $Q_{RR}$ indicates the amount of accumulated charge during the recovery operation and is obtained by integrating $J_A$ within a range less than or equal to 0 A. In FIG. 37 or 38, a snap-off voltage $V_{snap\text{-}off}$ is a maximum value of $V_{CE}$ or $V_{AK}$ during the turn-off operation. $V_{snap\text{-}off}$ is set to be less than or equal to a rated withstand voltage because $V_{snap\text{-}off}$ greater than the rated withstand voltage may cause a device breakdown.

Figure 39:
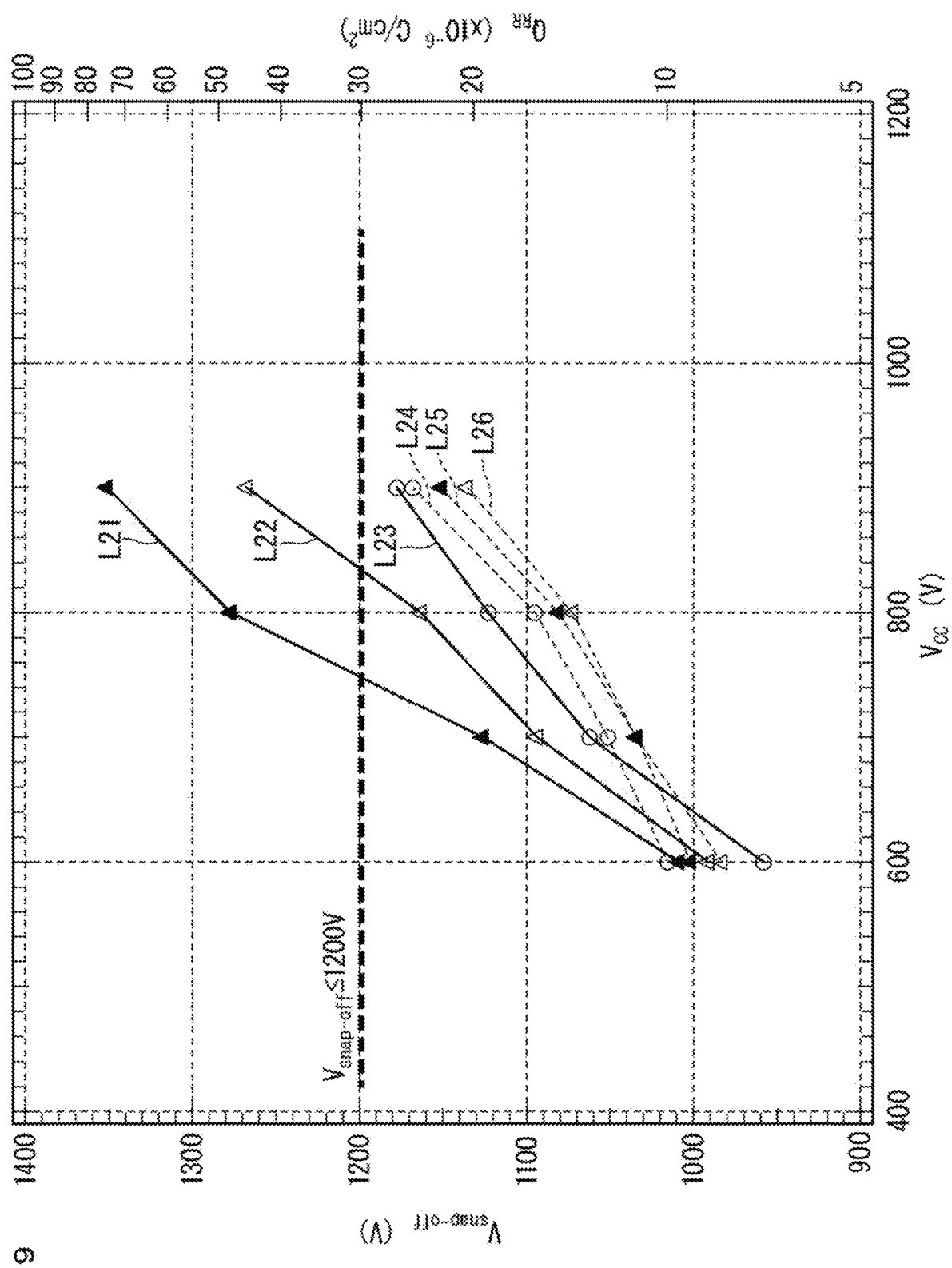
FIG. 39 illustrates characteristics of a snap-off voltage and the amount of accumulated charge in the RFC diode with respect to a power supply voltage.

FIG. 39 illustrates characteristics of the snap-off voltage $V_{snap\text{-}off}$ and the amount of accumulated charge $Q_{RR}$ with respect to a power supply voltage $V_{CC}$ in an RFC diode with a withstand voltage class of 1200 V, as parameters of the annealing temperature for the second buffer layer 15*bs*. In FIG. 39, characteristics obtained in the case where the annealing temperature for the second buffer layer 15*bs* is set to 345° C., 400° C., and 430° C. are plotted respectively as solid triangles, open circles, and open triangles. Also, the characteristics of $V_{snap\text{-}off}$ are indicated by solid lines L21, L22, and L23, and the characteristics of $Q_{RR}$ are indicated by broken lines L24, L25, and L26.

FIGS. 35 and 39 show that the RFC diode including the second buffer layer 15*bs* formed at an annealing temperature of 345° C. that shortens the lifetime has a small $Q_{RR}$ as indicated by the broken line L25 and has $V_{snap\text{-}off}$ higher than or equal to the rated withstand voltage of 1200 V as indicated by the solid line L21. This is considered because the shortening of the lifetime of the second buffer layer 15*bs* involves shortening the lifetime on the cathode side, thus causing the residual carrier plasma layer (area A12 in FIG. 29) on the cathode side to be depleted during the recovery operation of the RFC diode and increasing the value of $V_{snap\text{-}off}$.

Figure 40:
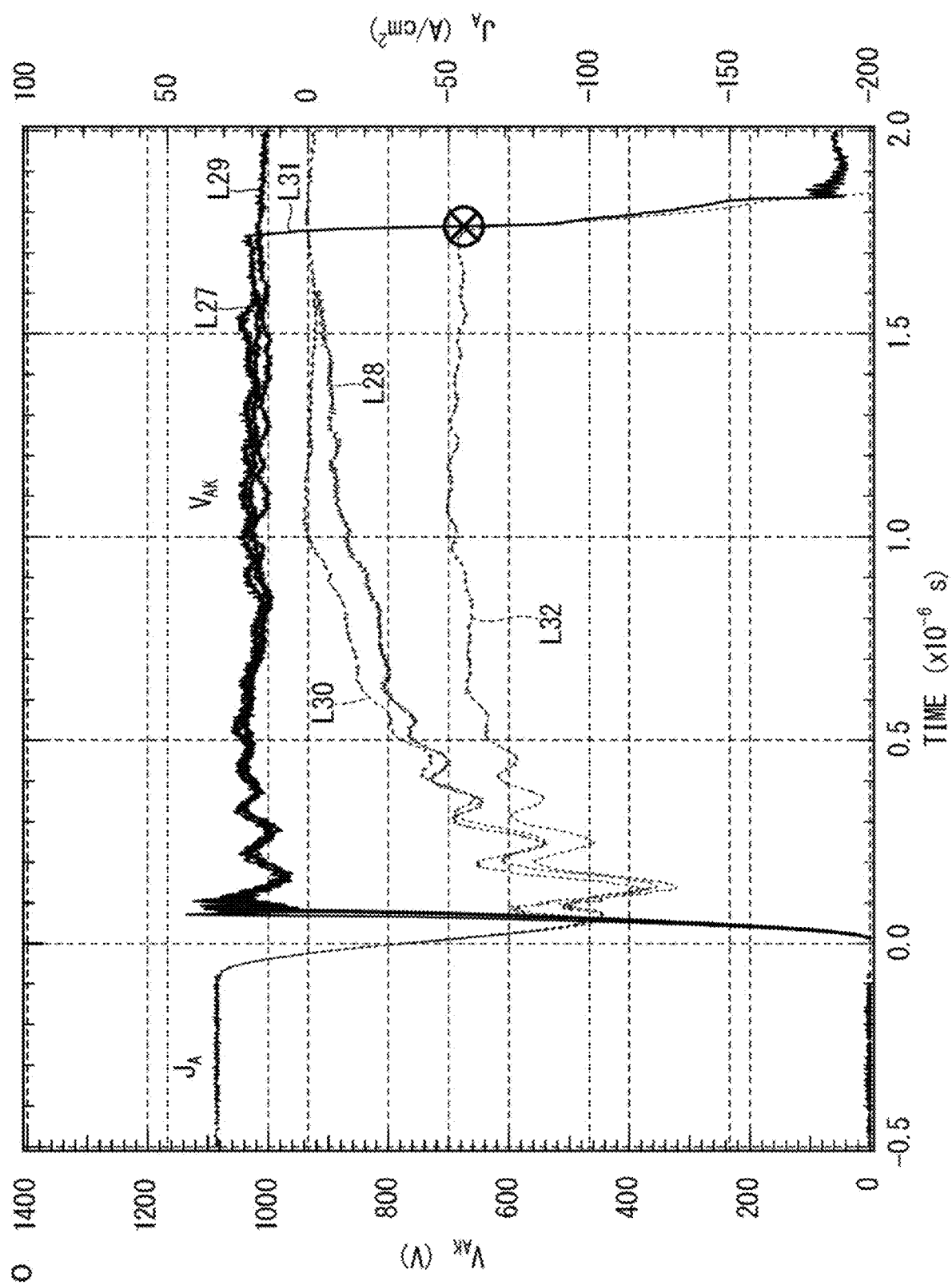
FIG. 40 illustrates a recovery waveform of the RFC diode at low temperatures.
Figure 41:
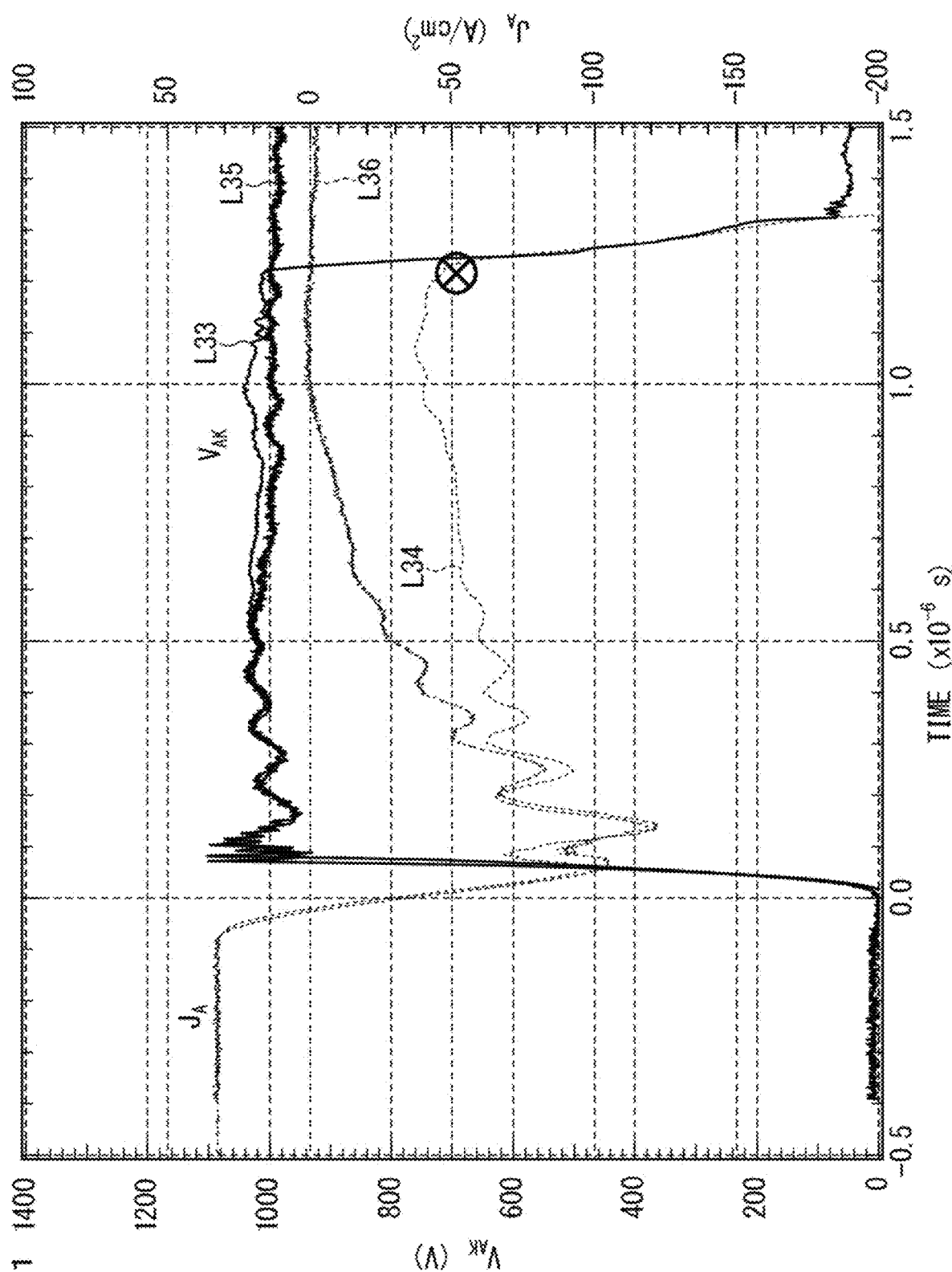
FIG. 41 illustrates a recovery waveform of the RFC diode at low temperatures.

FIGS. 40 and 41 illustrate waveforms during a recovery operation at low temperatures in the RFC diode with a withstand voltage class of 1200 V. In these drawings, the horizontal axes indicate time ($\times 10^6$ seconds), and the vertical axes indicate the anode-cathode voltage $V_{AK}$ (V) and the anode current density $J_A$ (A/cm$^2$). Switching conditions include $V_{CC}$=1000 V, $J_F$=31.7 A/cm$^2$ (0.1 $J_A$), dj/dt=1000 A/cm$^2$ µs, dV/dt=12500 V/µs, and $L_S$=2.0 µH. The operating temperature is 253 K in FIGS. 40 and 233 K in FIG. 41.

In FIG. 40, a solid line L27 and a broken line L28 respectively indicate $V_{AK}$ and $J_A$ in the case where the annealing temperature for the second buffer layer 15*bs* is set to 345° C. A solid line L29 and a broken line L30 respectively indicate $V_{AK}$ and $J_A$ in the case where the annealing temperature for the second buffer layer 15*bs* is set to 400° C. A solid line L31 and a broken line L32 respectively indicate $V_{AK}$ and $J_A$ in the case where the annealing temperature for the second buffer layer 15*bs* is set to 430° C. In FIG. 41, a solid line L33 and a broken line L34 respectively indicate $V_{AK}$ and $J_A$ in the case where the annealing temperature for the second buffer layer 15*bs* is set to 345° C. A solid line L35 and a broken line L36 respectively indicate $V_{AK}$ and $J_A$ in the case where the annealing temperature for the second buffer layer 15*bs* is set to 400° C. In FIGS. 40 and 41, crosses in the waveforms indicate points at which a device breakdown has occurred.

It can be seen from FIG. 40 that the RFC diode including the second buffer layer 15*bs* formed at an annealing temperature of 430° C. that shortens the lifetime when the operating temperature drops to a low temperature of 253 K is broken during the recovery operation and has a lower breakdown tolerance. It can also be seen from FIG. 41 that, if the operating temperature further drops to a temperature of 233 K, the RFC diode including the second buffer layer 15*bs* formed at an annealing temperature of 345° C. that shortens the lifetime is also broken during the recovery operation and has a lower breakdown tolerance.

Figure 42:
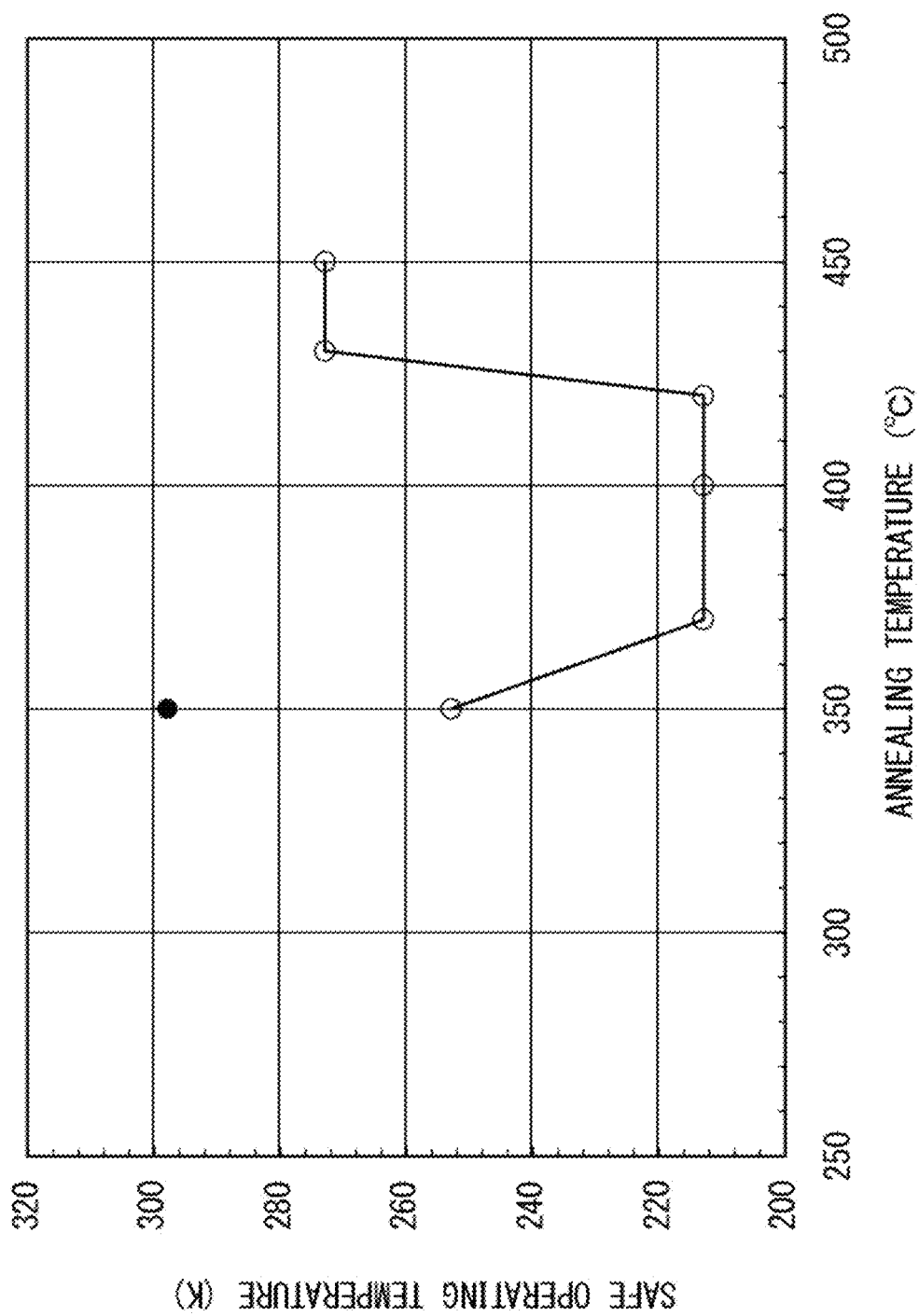
FIG. 42 illustrates a relationship between the safe operating temperature and the annealing temperature of the second buffer layer.

FIG. 42 illustrates a relationship between a safe operating temperature (K) and the annealing temperature (° C.) for the second buffer layer 15*bs*. It is assumed here that $V_{CC}$=1000 V, $J_F$=0.1 $J_A$, dj/dt=1000 A/cm$^2$ µs, dV/dt=12500 V/µs, and $L_S$=2.0 µH. In FIG. 42, characteristics of the diode in which the N buffer layer 15 is configured of only the first buffer layer 15*a* are plotted as solid circles as a comparative example. It can be seen from FIG. 42 that the range of safe operating temperatures is enlarged to the low temperature side as compared with that in the comparative example by forming the second buffer layer 15*bs* at an annealing temperature (higher than or equal to 370° C. and lower than or equal to 420° C.) that does not shorten the lifetime.

Second Preferred Embodiment

A second preferred embodiment describes an impurity profile of the second buffer layer 15*bs* exhibiting preferable characteristics in the RFC diode illustrated in FIG. 2. The preferable characteristics involve increasing the withstand voltage blocking capability in the OFF state, achieving low turn-off losses and high-temperature operations along with a reduction in leakage current at high temperatures, suppressing the occurrence of a snap-off phenomenon and during turn-off (recovery) operations and the occurrence of a subsequent oscillation phenomenon, enlarging the range of temperatures guaranteed in the safe operating area to the low-temperature side, and achieving an improvement in breakdown tolerance during recovery operations.

Figure 43:
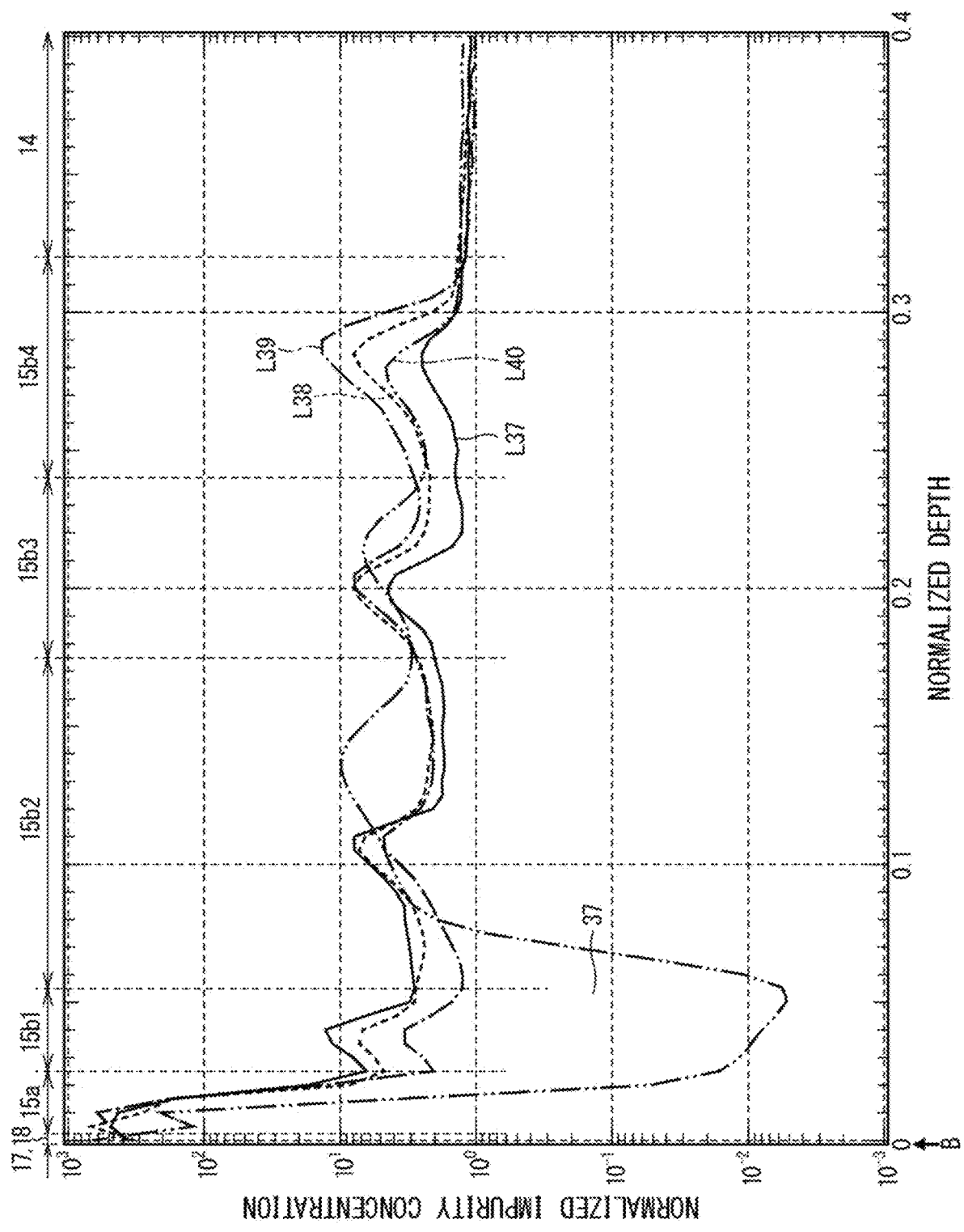
FIG. 43 illustrates four different impurity profiles of an N buffer layer having the second structure.

FIG. 43 illustrates four different impurity profiles of the N buffer layer 15 having the second structure. Activation annealing conditions for the second buffer layer 15bs include a temperature of 400° C. and a nitrogen atmosphere that elongate the carrier lifetime. In FIG. 43, a solid line L37, a broken line L38, a dashed-and-dotted line L39, and a dash-double-dot line L40 respectively indicate impurity profiles of Samples 1, 2, 3, and 4. In FIG. 43, a location B where the normalized depth is 0 corresponds to B in the sectional view in FIG. 32. The profiles of Samples 1 to 4 have a constant total dose in the range from the first sub-buffer layer 15b1 to fourth sub-buffer layer 15b4. In all of Samples 1 to 4, the peak impurity concentration $C_{a,p}$ in the first buffer layer 15a is higher than the peak impurity concentration $C_{b,p}$ in the first sub-buffer layer 15b1.

In Sample 1, peak impurity concentrations decrease from that in the first sub-buffer layer 15b1 to that in the fourth sub-buffer layer 15b4, and the peak impurity concentration in the fourth sub-buffer layer 15b4 is higher than the impurity concentration in the N⁻ drift layer 14. That is, $C_{a,p} > C_{b1,p}$ and $C_{b(n-1),p} > C_{bn,p}$ are satisfied.

In Sample 2, the first to fourth sub-buffer layers 15b1 to 15b4 have a constant peak impurity concentration, and that peak impurity concentration is higher than the impurity concentration $C_d$ in the N⁻ drift layer 14. That is, $C_{b(n-1),p} = C_{bn,p} > C_d$ is satisfied.

In Sample 3, the peak impurity concentration $C_{b1,p}$ in the first sub-buffer layer 15b1 is higher than the impurity concentration $C_d$ in the N⁻ drift layer 14, and peak impurity concentrations increase from that in the first sub-buffer layer 15b1 to that in the fourth sub-buffer layer 15b4. That is, $C_{b(n-1),p} < C_{bn,p}$ and $C_{b1,p} > C_d$ are satisfied.

In Sample 4, the peak impurity concentration in the first sub-buffer layer 15b1 is lower than the impurity concentration in the N⁻ drift layer 14, peak impurity concentrations decrease from that in the second sub-buffer layer 15b2 to that in the fourth sub-buffer layer 15b4, and the peak impurity concentration in the fourth sub-buffer layer 15b4 is higher than the impurity concentration in the N⁻ drift layer 14. Here, the area of the first sub-buffer layer 15b1 whose impurity concentration is lower than the impurity concentration in the N⁻ drift layer 14 is referred to as a crystal defect area 37. That is, $C_{b1,p} < C_d$ and $C_{b(n-1),p} > C_{bn,p}$ are satisfied.

Figure 44:
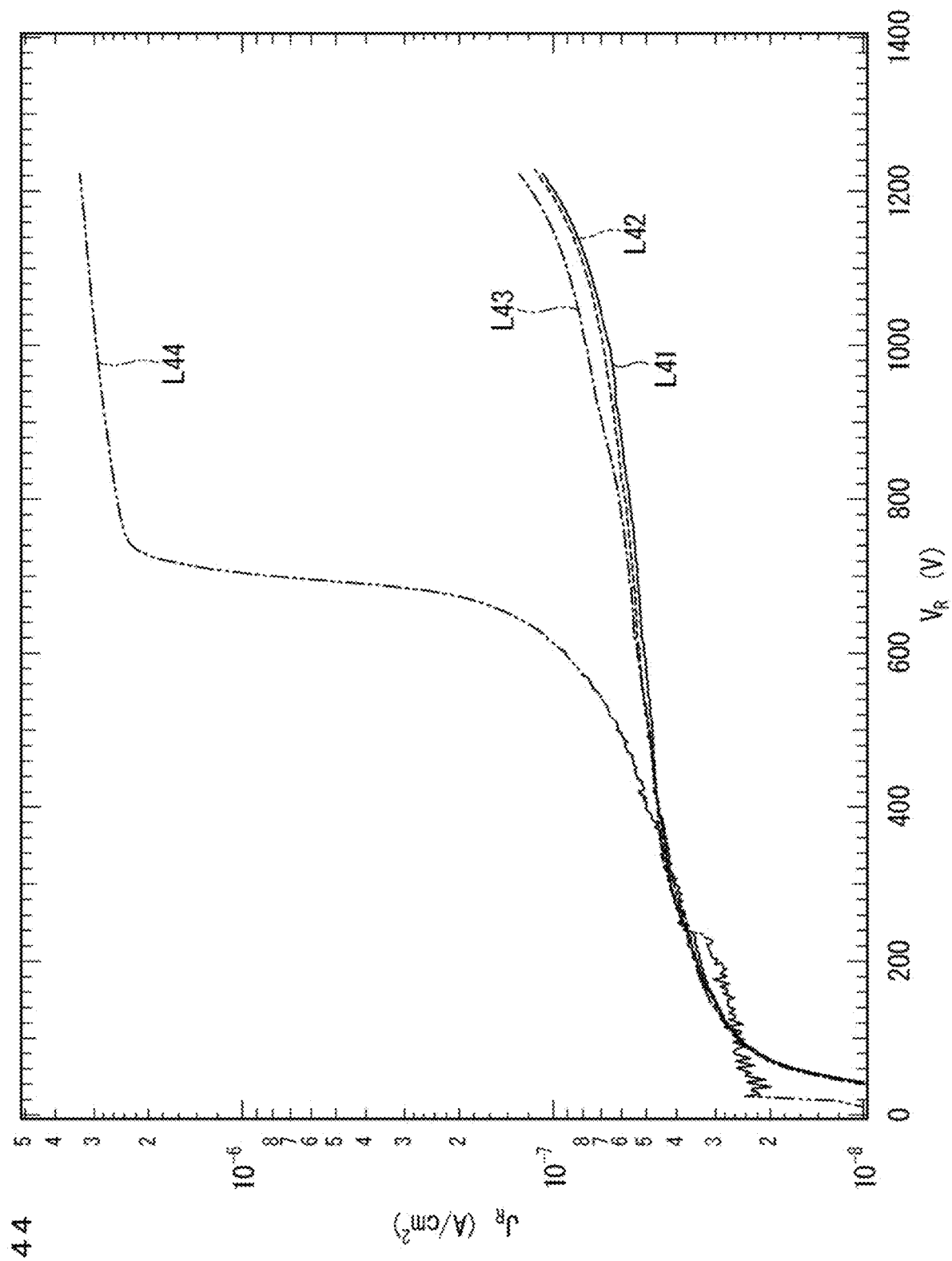
FIG. 44 illustrates a relationship between the leakage current density and the reverse bias voltage when the RFC diode is reverse-biased.

FIG. 44 illustrates $J_R$-$V_R$ characteristics in the case where the RFC diode with a withstand voltage class of 1200 V is reverse-biased. Here, $J_R$ is the leakage current density (A/cm²) and $V_R$ is the reverse bias voltage (V). The operating temperature is 298 K. The $J_R$-$V_R$ characteristics of Samples 1, 2, 3, and 4 are respectively indicated by a solid line L41, a broken line L42, a dashed-and-dotted line L43, and a dash-double-dot line L44. FIG. 44 indicates that the presence of the crystal defect area 37 in the second buffer layer 15b as in Sample 4 increases the leakage current and hinders a reduction in leakage current when the device is off, thus causing impairment of the withstand voltage blocking capability in the OFF state.

Figure 45:
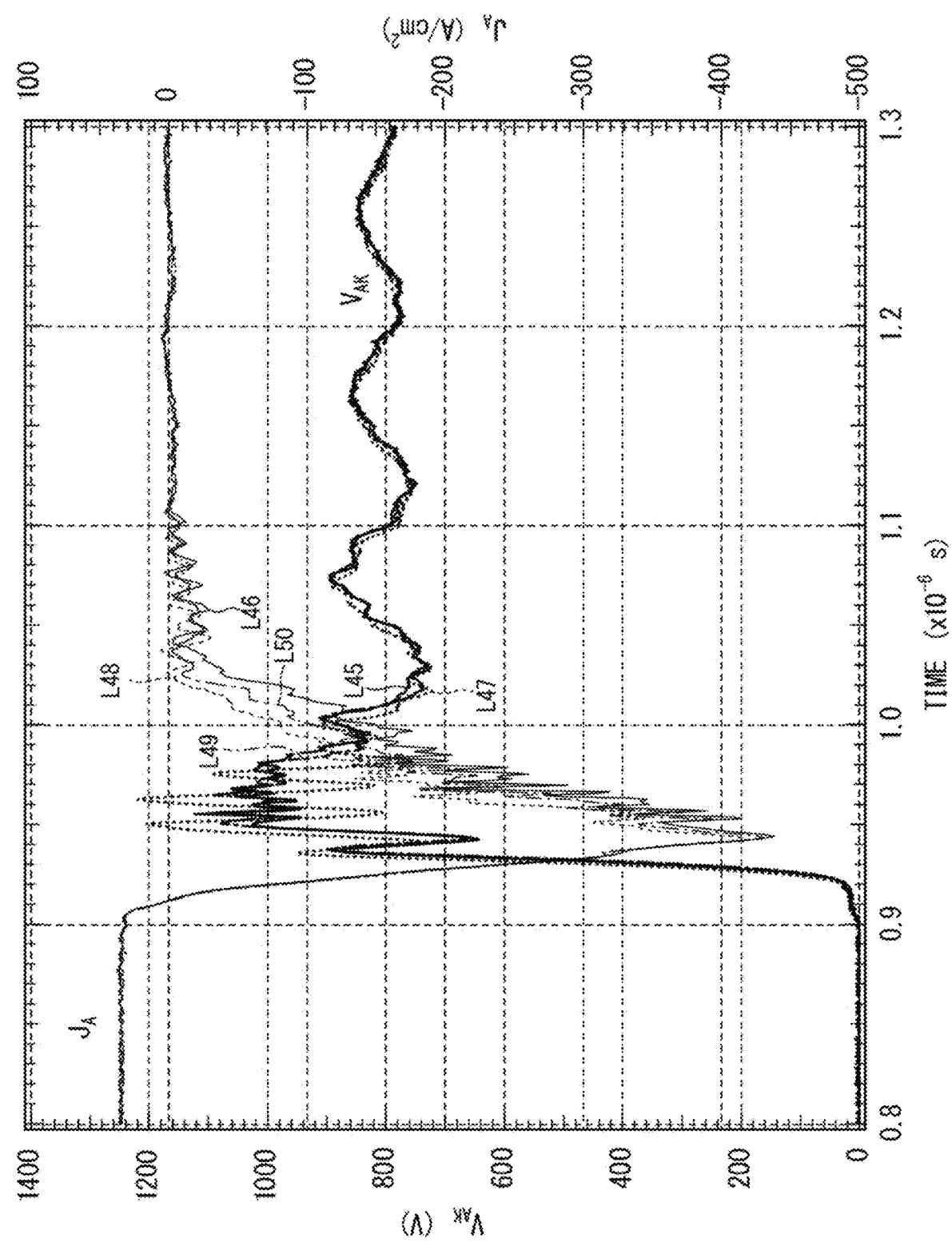
FIG. 45 illustrates recovery waveforms of the RFC diode that applies impurity profiles of Samples 1 to 3.

FIG. 45 illustrates recovery waveforms of the RFC diode with a withstand voltage class of 1200 V in the case where the impurity profiles of Samples 1 to 3 are applied to the RFC diode. In FIG. 45, the horizontal axis indicates time (×10⁻⁶ seconds), and the vertical axis indicates the anode-cathode voltage VA (V) and the anode current density $J_A$ (A/cm²). Switching conditions include $V_{CC}$=800 V, $J_F$=31.7 A/cm² (0.1 $J_A$), dj/dt=5000 A/cm² μs, dV/dt=50000 V/μs, $L_S$=200 nH, and an operating temperature of 298 K. In FIG. 45, solid lines L45 and L46 respectively indicate $V_{AK}$ and $J_A$ for Sample 1. Broken lines L47 and L48 respectively indicate $V_{AK}$ and $J_A$ for Sample 2. Chain lines L49 and L50 respectively indicate $V_{AK}$ and $J_A$ for Sample 3.

Figure 46:
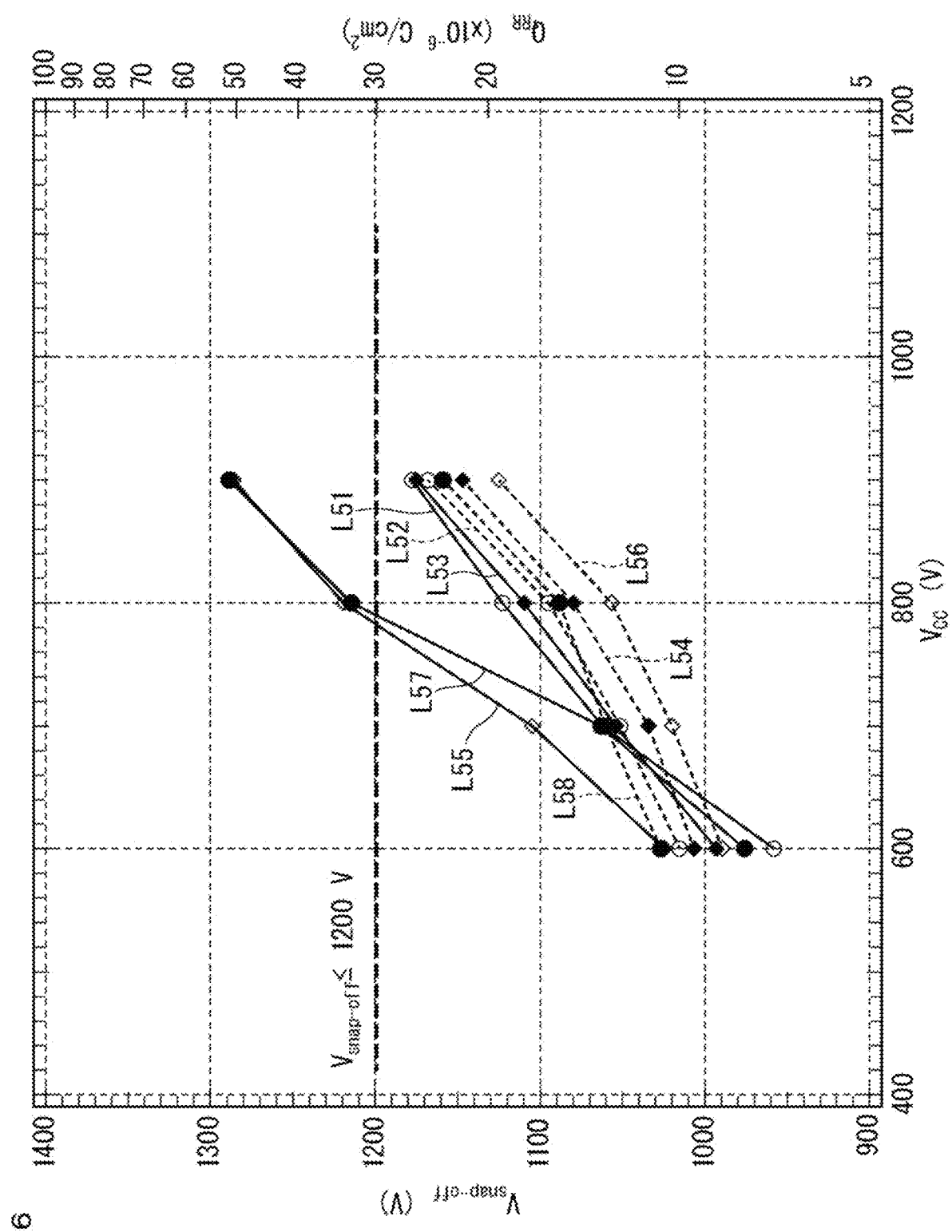
FIG. 46 illustrates a relationship between the power supply voltage and the snap-off voltage extracted from the recovery waveform in FIG. 45.

FIG. 46 illustrates a relationship between the power supply voltage $V_{CC}$ and the snap-off voltage $V_{snap-off}$ extracted from the recovery waveform illustrated in FIG. 45. In FIG. 46, a solid line L51 that connects open circles indicates $V_{snap-off}$ for Sample 1, and a broken line L52 that connects open circles indicates $V_{CC}$ for Sample 1. A solid line L53 that connects solid rhombuses indicates $V_{snap-off}$ for Sample 2, and a broken line L54 that connects solid rhombuses indicates $V_{CC}$ for Sample 2. A solid line L55 that connects open rhombuses indicates $V_{snap-off}$ for Sample 3, and a broken line L56 that connects solid rhombuses indicates $V_{CC}$ for Sample 3. FIG. 46 also illustrates, as a comparative example, characteristics of an RFC diode that includes an N buffer layer 15 configured of only the first buffer layer 15a. A solid line L57 that connects solid circles indicates $V_{snap-off}$ for the comparative example, and a broken line L58 that connects solid circles indicates $V_{CC}$ for the comparative example.

It can be seen from FIGS. 45 and 46 that $Q_{RR}$ needs to be increased in order to reduce dependence of $V_{snap-off}$ on $V_{CC}$ during a recovery operation of the RFC diode, and the impurity profile of the second buffer layer 15bs as in Sample 1 or 2 is suited to that case. The result indicates that, in Samples 1 and 2 as compared with Sample 3, a residual carrier plasma layer exists on the cathode side in the latter half of the recovery operation, i.e., in the area where $J_A$ exceeds the maximum reverse recovery current density $J_{RR}$.

FIG. 47 illustrates diode performance in the case where the impurity profiles of Samples 1 to 3 are applied to the second buffer layer 15bs in the RFC diode with a withstand voltage class of 1200 V. Note that activation annealing conditions for the second buffer layer 15bs include an annealing temperature of 400° C. and a nitrogen atmosphere. FIG. 47 indicates that Samples 1 and 2 satisfy various diode performance. In Sample 3, $V_{snap-off}$ exceeds the rated voltage of 1200 V, and breakdown tolerance during a recovery operation is low because a maximum blocking current density $J_A$ (break) is low during a recovery operation at a high voltage (900 V) and a high temperature (448 K). This low value of $J_A$ (break) in Sample 3 is considered because the residual carrier plasma layer on the cathode side has a low concentration during the recovery operation, and this increases an electric field intensity at the joined surface of the N⁻ drift layer 14 and the second buffer layer 15bs.

Figure 48:
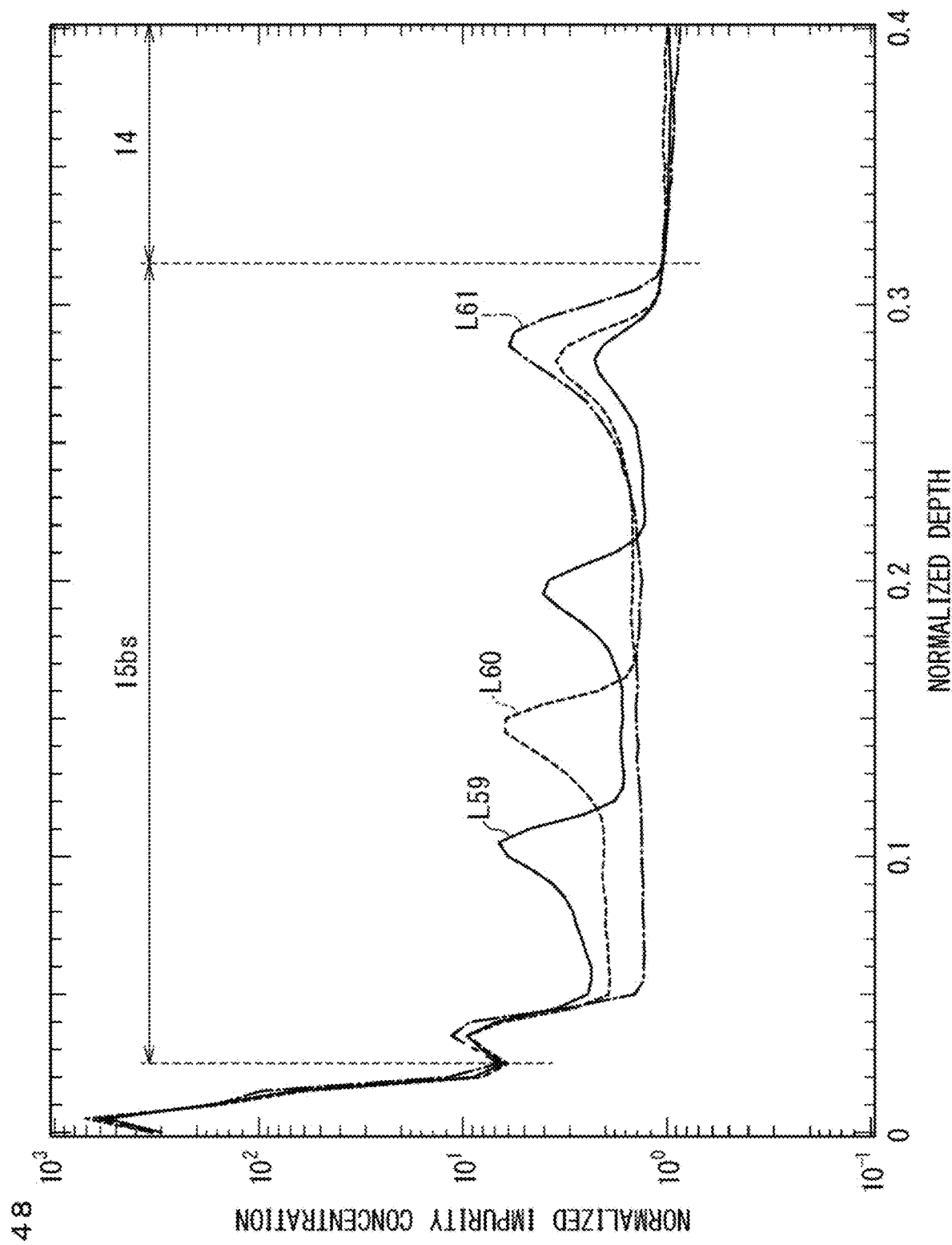
FIG. 48 illustrates impurity profiles of the second buffer layer that can ensure diode performance equivalent to that of Sample 1.

FIG. 48 illustrates other impurity profiles (Samples 5 and 6) of the second buffer layer 15bs that can ensure diode performance equivalent to that in Sample 1. In FIG. 48, a solid line L59 indicates the impurity profile of Sample 1, a broken line L60 indicates the impurity profile of Sample 5, and a dashed-and-dotted line L61 indicates the impurity profile of Sample 6.

Sample 5 exhibits an impurity profile that has three impurity concentration peaks in the second buffer layer 15bs, the impurity concentration peaks decreasing in the depth direction. Sample 6 exhibits an impurity profile that has two impurity concentration peaks in the second buffer layer 15bs, and the impurity concentration peaks decreasing in the depth direction. Both of Samples 5 and 6 do not have the crystal defect area 37 as illustrated in the impurity profile of Sample 4 in FIG. 43.

FIG. 49 illustrates diode performance in the case where the impurity profiles of Samples 1, 5, and 6 are applied to the second buffer layer 15bs in the RFC diode with a withstand voltage class of 1200 V. FIG. 49 indicates that Samples 1, 5, and 6 have no difference in diode performance and all exhibit ideal impurity profiles. Therefore, in order to obtain preferable characteristics, the second buffer layer 15bs is required not to include the crystal defect area 37, i.e., required to have an impurity concentration higher than the impurity concentration of the N⁻ drift layer 14 in the entire area of the second buffer layer 15bs.

Third Preferred Embodiment

A third preferred embodiment describes a relationship between an effective dose $Dose_b$ of the second buffer layer 15bs and the performance of an IGBT or an RFC diode. The structures of the IGBT and RFC diode are as illustrated in FIGS. 30 and 32. The effective dose Doseb is, for example, defined by Expression (10).

$$Dose_b = \text{(Dose at Introduction of Impurities into Si Wafer)} \times \frac{Ra}{100} (\text{cm}^{-2}) \quad (10)$$

Here, Ra (%) represents the proportion of the dose calculated from the impurity profile obtained after activation to the actual does of ionic atoms contained in an actual diffusion layer area.

Alternatively, the effective dose $Dose_b$ is defined as the "dose calculated from the impurity profile after activation." The "dose calculated from the impurity profile obtained after activation" as used herein refers to a dose calculated from the relationship between the impurity concentration and depth of a diffusion layer by spreading resistance analysis. Also, the "dose of ionic atoms contained in an actual diffusion layer area" refers to a dose calculated by analyzing the mass of ions in the depth direction by secondary ion mass spectrometry (SIMS).

The IGBT illustrated in FIG. 30 is formed by ion implantation and annealing through the steps illustrated in FIGS. 5 to 17. Hereinafter, parameters of each diffusion layer in the IGBT are described.

P base layer 9: the peak impurity concentration is set in the range of $1.0 \times 10^{16}$ cm$^{-3}$ to $1.0 \times 10^{18}$ cm$^{-3}$, and the junction depth is set to be deeper than the N⁺ emitter layer 7 and shallower than the N layer 11.

N layer 11: the peak impurity concentration is set in the range of $1.0 \times 10^{15}$ cm$^{-3}$ to $1.0 \times 10^{17}$ cm$^{-3}$, and the junction depth is set to be 0.5 µm to 1.0 µm deeper than the P base layer 9.

N⁺ emitter layer 7: the peak impurity concentration is set in the range of $1.0 \times 10^{18}$ cm$^{-3}$ to $1.0 \times 10^{21}$ cm$^{-3}$, and the junction depth is set in the range of 0.2 µm to 1.0 µm.

P⁺ layer 8: the surface impurity concentration is set in the range of $1.0 \times 10^{18}$ cm$^{-3}$ to $1.0 \times 10^{21}$ cm$^{-3}$, and the junction depth is set to be the same as or deeper than the N⁺ emitter layer 5.

The parameters of the N buffer layer 15 are as described in the first preferred embodiment.

P collector layer 16: the surface impurity concentration is set in the range of $1.0 \times 10^{16}$ cm$^{-3}$ to $1.0 \times 10^{20}$ cm$^{-3}$, and the junction depth is set in the range of 0.3 µm to 0.8 µm.

The third preferred embodiment describes effects achieved by controlling the effective dose of the N buffer layer 15 in the IGBT illustrated in FIG. 30. However, similar effects can also be obtained with IGBTs that include no dummy electrodes and whose gate electrodes 13 are all at gate potentials (e.g., FIG. 66 in Japanese Patent No. 5908524), IGBTs that include no N layer 11 in diffusion layers between adjacent gate electrodes 13 (e.g., FIG. 1 in Japanese Patent No. 5908524), and IGBTs in which the gate structure of the MOS transistor portion is a planar-gate structure (e.g., FIGS. 79 to 52 in Japanese Patent No. 5908524).

Figure 50:
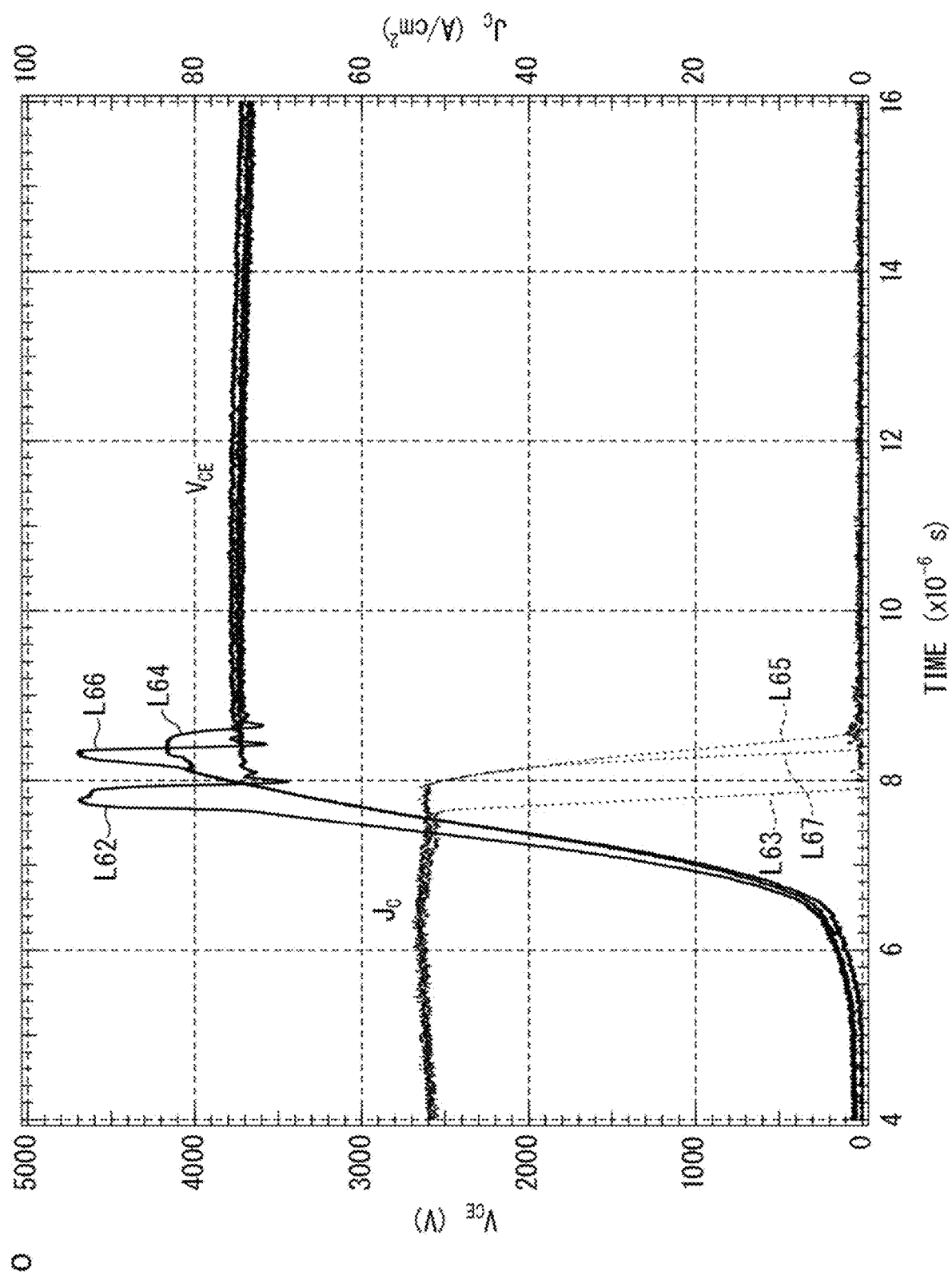
FIG. 50 illustrates turn-off waveforms of the IGBT.

FIG. 50 illustrates waveforms of the IGBT with a withstand voltage class of 4500 V during a turn-off operation. In FIG. 50, the horizontal axis indicates time ($\times 10^{-6}$ seconds), and the vertical axis indicates $V_{CE}$ (V) and $J_C$ (A/cm$^2$). In FIG. 50, a solid line L64 and a broken line L65 respectively indicate $V_{CE}$ and $J_C$ in the case where the effective dose $Dose_b$ of the second buffer layer 15bs is set to $4.0 \times 10^{10}$ cm$^{-2}$, and a solid line L66 and a broken line L67 respectively indicate $V_{CE}$ and $J_C$ in the case where the effective dose $Dose_b$ is set to $1.5 \times 10^{12}$ cm$^{-2}$. FIG. 50 also illustrates, as a comparative example, an IGBT that includes an N buffer layer 15 configured of only the first buffer layer 15a, and a solid line L62 and a broken line L63 respectively indicate $V_{CE}$ and $J_C$ for the comparative example. Note that switching conditions in FIGS. 50 and 51 include $V_{CC}$=3600 V, $J_F$=53.9 A/cm$^2$, dV/dt=3100 V/µs, $L_S$=2.3 µH, and a temperature of 298 K.

Figure 51:
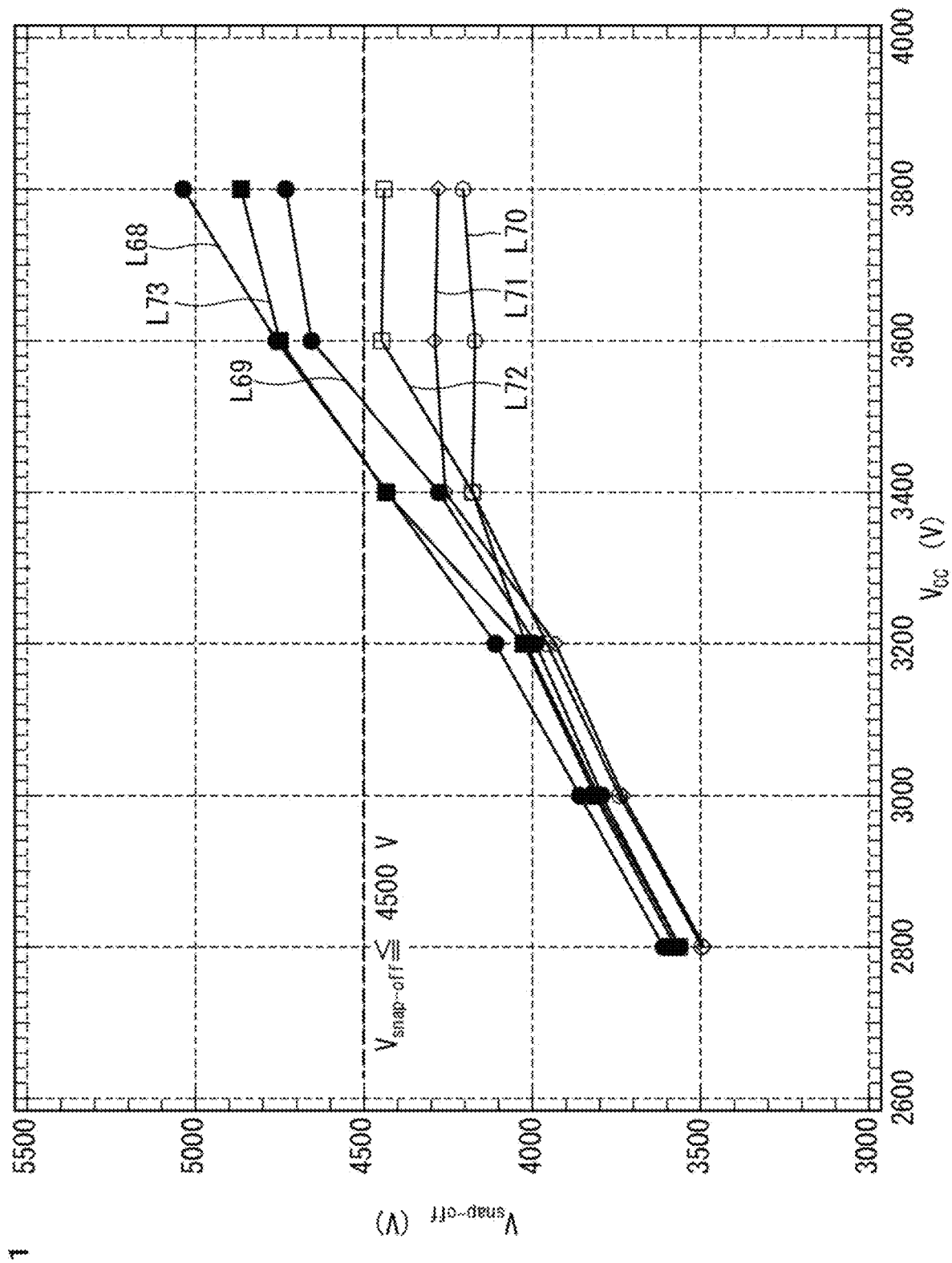
FIG. 51 illustrates a relationship between the snap-off voltage and the power supply voltage when the IGBT performs a turn-off operation.

FIG. 51 illustrates a relationship between the power supply voltage $V_{CC}$ and the snap-off voltage $V_{snap-off}$ during a turn-off operation in the IGBT with a withstand voltage class of 4500 V, using the effective dose $Dose_b$ of the second buffer layer 15b as a parameter. In FIG. 51, the horizontal axis indicates $V_{CC}$, and the vertical axis indicates $V_{snap-off}$. Solid lines L69, L70, L71, L72, and L73 respectively indicate $V_{snap-off}$ in the case where $Dose_b$ is set to $7.0 \times 10^9$ cm$^{-2}$, $4.0 \times 10^{10}$ cm$^{-2}$, $1.2 \times 10^{11}$ cm$^{-2}$, $9.8 \times 10^{11}$ cm$^{-2}$, and $1.5 \times 10^{12}$ cm$^{-2}$. A solid line L68 indicates $V_{snap-off}$ in the IGBT that includes the N buffer layer 15 configured of only the first buffer layer 15a as a comparative example. It can be seen from FIG. 51 that the relationship between $V_{snap-off}$ and $V_{CC}$ is affected by the effective dose $Dose_b$ of the second buffer layer 15b. Note that activation annealing conditions for the second buffer layer 15b include a temperature of 400° C. and a nitrogen atmosphere. These conditions are described in the first preferred embodiment as conditions that stabilize the carrier lifetime.

Figure 52:
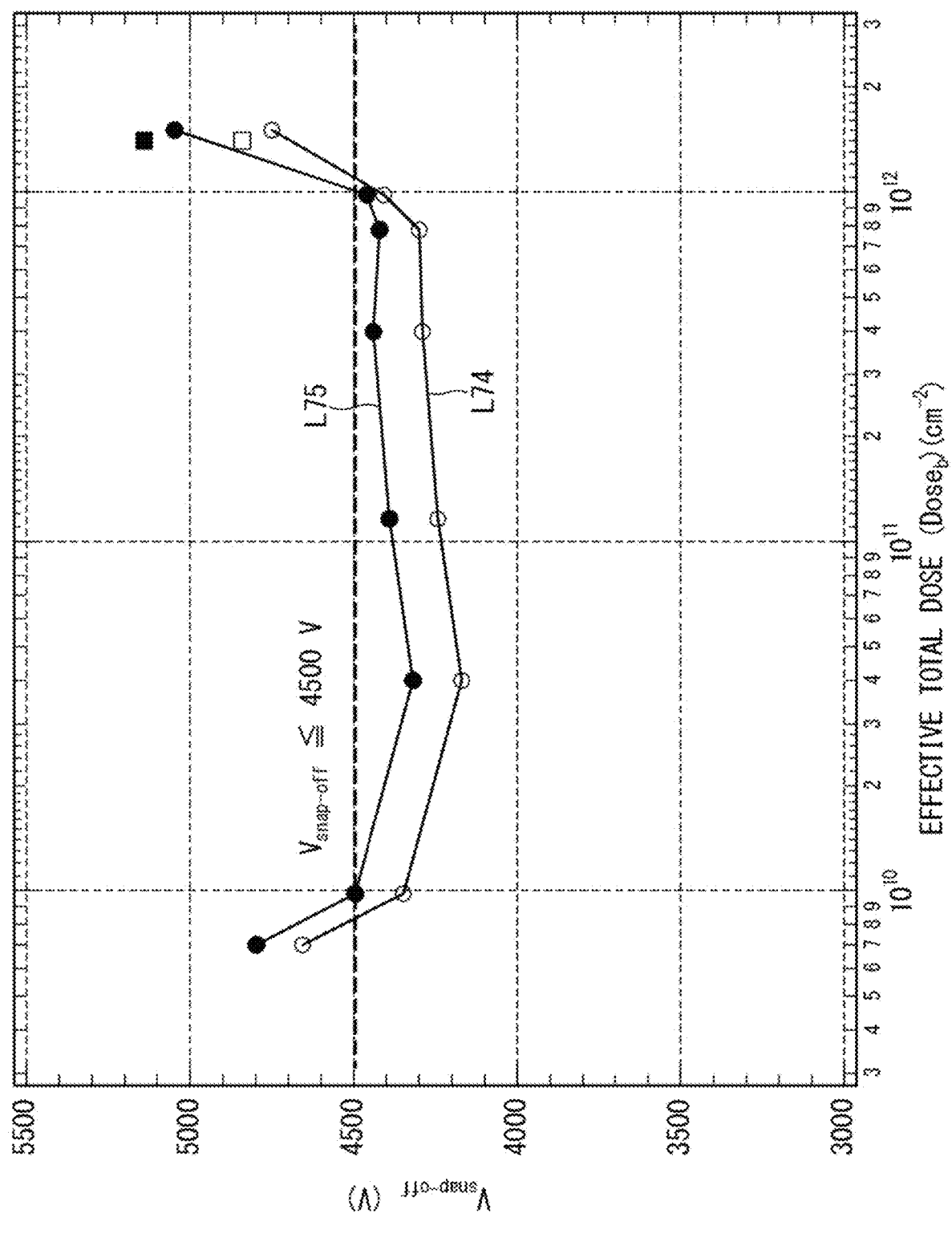
FIG. 52 illustrates a relationship between the snap-off voltage and an effective total dose of the second buffer layer in the IGBT.

FIG. 52 illustrates a relationship between the snap-off voltage $V_{snap-off}$ and the effective total dose $Dose_b$ of the second buffer layer 15bs in the IGBT with a withstand voltage class of 4500 V. In FIG. 52, the horizontal axis indicates $Dose_b$, and the vertical axis indicates $V_{snap-off}$. Switching conditions other than a floating inductance $L_S$ are the same as those in FIGS. 50 and 51. Solid lines L74 and L75 respectively indicate characteristics in the case where the floating inductance $L_S$ is set to 2.3 µH and 6.8 µH. FIG. 52 also plots, as a comparative example, characteristics of an IGBT that includes the N buffer layer 15 configured of only the first buffer layer 15a. In the plot, a solid squire indicates characteristics in the comparative example in the case where the floating inductance $L_S$ is set to 2.3 µH, and an open square indicates characteristics in the comparative example in the case where the floating inductance $L_S$ is set to 2.3 µH.

Since the evaluation device has a withstand voltage class of 4500 V, if $V_{snap-off} \leq 4500$ V is targeted, the effective total dose $Dose_b$ of the second buffer layer 15bs needs to be set in the range of $1.0 \times 10^{10}$ cm$^{-2}$ to $1.0 \times 10^{12}$ cm$^{-2}$. If the effective total dose $Dose_b$ of the second buffer layer 15bs becomes lower than $1.0 \times 10^{10}$ cm$^{-2}$, the structure of the N buffer layer 15 will become close to that in the comparative example, and the residual carrier plasma layer on the collector side will be depleted. Also, if the effective total dose $Dose_b$ of the second buffer layer 15bs becomes higher than $1.0 \times 10^{12}$ cm$^{-2}$, a large number of lattice defects will be formed at the time of formation of the second buffer layer 15bs. This shortens the carrier lifetime and causes the residual carrier plasma layer on the collector side to be depleted. Accordingly, in either case, a snap-off phenomenon will occur at turn-off, and $V_{snap-off}$ becomes higher than or equal to 4500 V.

Figure 53:
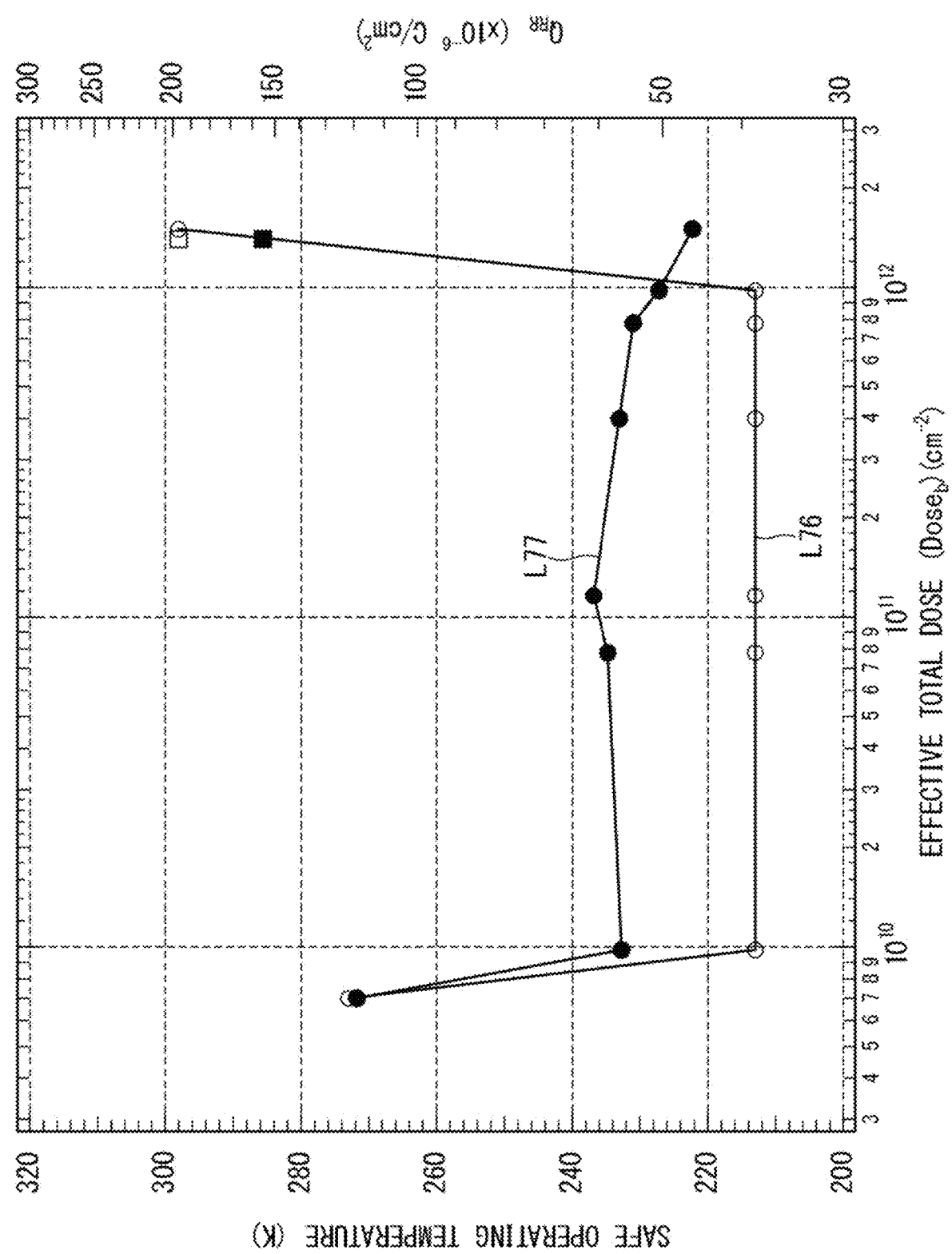
FIG. 53 illustrates a relationship between the safe operating temperature, the amount of accumulated charge, and the effective total dose of the second buffer layer when the RFC diode performs a recovery operation at low temperatures.

FIG. 53 illustrates a relationship of a safe operating temperature, $Q_{RR}$, and $Dose_b$ during a recovery operation at low temperatures in the RFC diode with a withstand voltage class of 1200 V. Switching conditions include $V_{CC}$=1000 V, $J_F$=0.1 $J_A$, dj/dt=1000 A/cm$^2$, dV/dt=12500 V/μs, and $L_S$=2.0 μH. In FIG. 53, the horizontal axis indicates $Dose_b$, and the vertical axis indicates $Q_{RR}$ and the safe operating temperature. A solid line L76 indicates the safe operating temperature, and a solid line L77 indicates $Q_{RR}$. FIG. 53 also plots, as a comparative example, characteristics of the IGBT that includes the N buffer layer 15 configured of only the first buffer layer 15a. In the plot, an open square indicates the safe operating temperature in the comparative example, and a solid squire indicates $Q_{RR}$ in the comparative example. FIG. 53 indicates that, in order to enlarge the range of safe operating temperatures during a recovery operation to the low temperature side, the effective total dose $Dose_b$ of the second buffer layer 15bs needs to be set higher than or equal to $1.0 \times 10^{10}$ cm$^{-2}$ and lower than or equal to $1.0 \times 10^{12}$ cm$^{-2}$.

Figure 54:
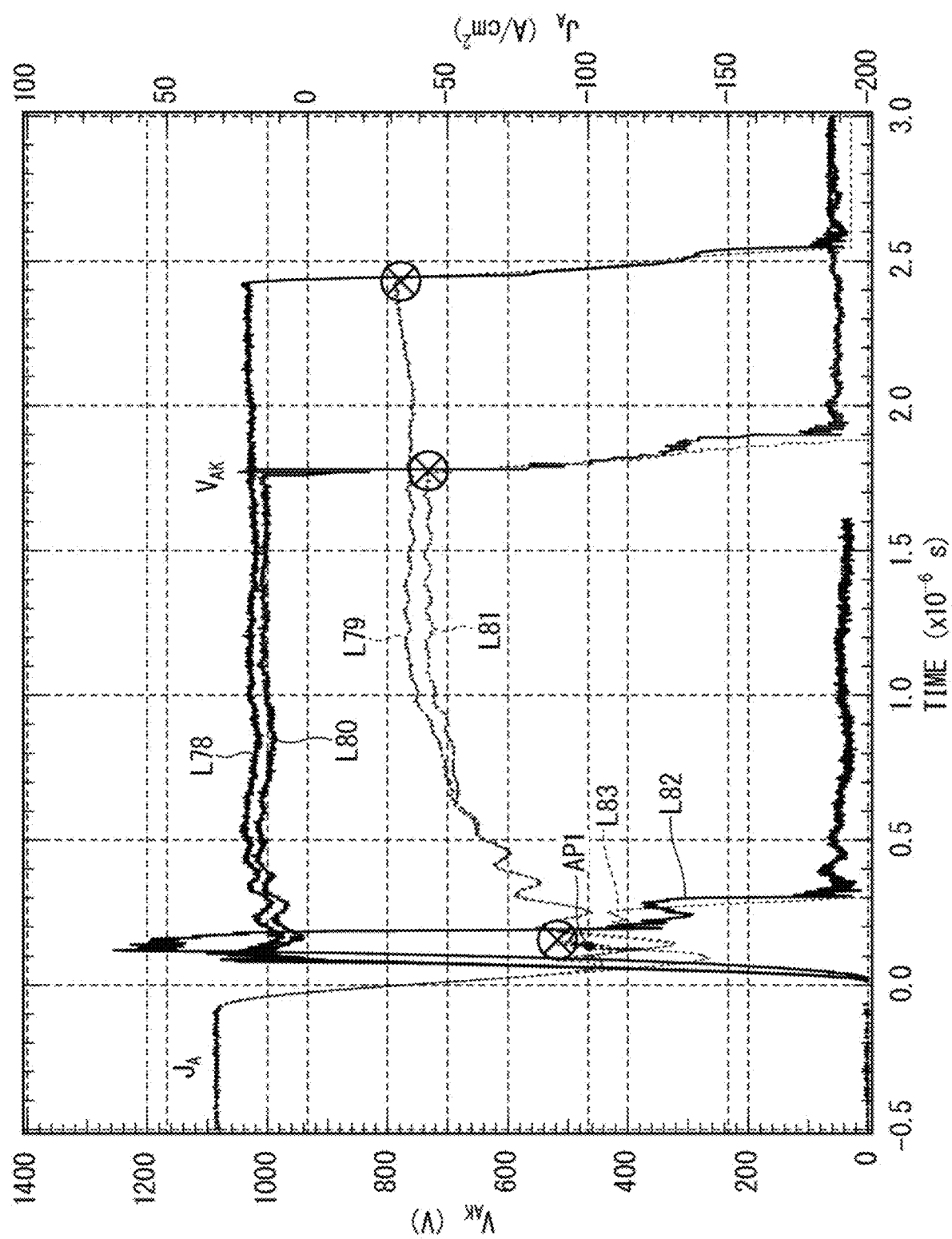
FIG. 54 illustrates breakdown waveforms when the RFC diode performs a recovery operation at temperatures of 273 K to 298 K.

FIG. 54 illustrates breakdown waveforms of the RFC diode during a recovery operation from 273 K to 298 K. In FIG. 54, crosses in the waveform indicate points at which a device breakdown has occurred. In FIG. 54, the horizontal axis indicates time ($\times 10^{-6}$ seconds), and the vertical axis indicates the anode-cathode voltage $V_{AK}$ (V) and the anode current density $J_A$ (A/cm$^2$). A solid line L80 and a broken line L81 respectively indicate $V_{AK}$ and $J_A$ in the case where the effective total dose $Dose_b$ of the second buffer layer 15bs is set to $7.9 \times 10^9$ cm$^{-2}$. A solid line L82 and a broken line L83 respectively indicate $V_{AK}$ and $J_A$ in the case where the effective total dose $Dose_b$ of the second buffer layer 15bs is set to $1.5 \times 10^{12}$ cm$^{-2}$. FIG. 54 also illustrates, as a comparative example, an RFC diode that includes the N buffer layer 15 configured of only the first buffer layer 15a, and $V_{AK}$ and $J_A$ for the comparative example are respectively indicated by a solid line L78 and a broken line L79. Note that switching conditions in FIG. 54 are the same as those in FIG. 53.

It can be seen from FIG. 54 that the second buffer layer 15bs with an effective total dose $Dose_b$ lower than $1.0 \times 10^{10}$ cm$^{-2}$ has a similar breakdown waveform to that in the comparative example and thus has the same breakdown mode as in the comparative example. On the other hand, the second buffer layer 15bs with an effective total dose $Dose_b$ higher than $1.0 \times 10^{12}$ cm$^{-2}$ has a different breakdown waveform from that in the comparative example, and is thus thought to have a different breaking mode from that in the comparative example and from the second buffer layer 15bs having a lower effective total dose $Dose_b$.

Figure 55:
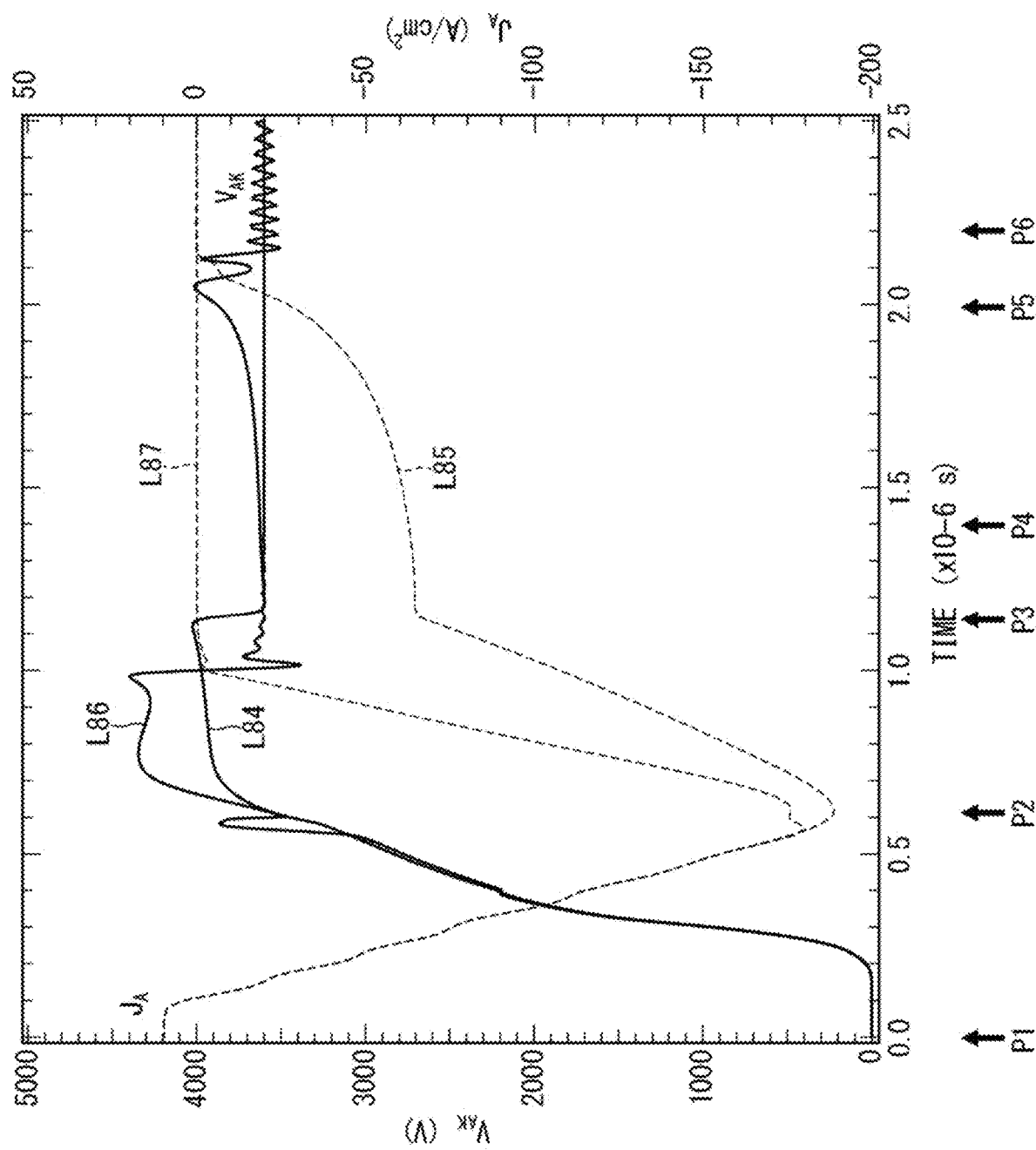
FIG. 55 illustrates recovery waveforms of the RFC diode.

FIG. 55 illustrates the results of simulation on the recovery waveform of an RFC diode with a withstand voltage class of 4500 V in the cases where the N buffer layer 15 has the second structure and where the N buffer layer 15 is configured of only the first buffer layer 15a (comparative example). Switching conditions include $V_{CC}$=3600 V, $J_F$=9.6 A/cm$^2$ (0.1 $J_A$), $L_S$=2.0 μH, and a temperature of 298 K. In FIG. 55, the horizontal axis indicates time ($\times 10^{-6}$ seconds), and the vertical axis indicates the anode-cathode voltage $V_{AK}$ (V) and the anode current density $J_A$ (A/cm$^2$). A solid line L84 and a broken line L85 respectively indicate $V_{AK}$ and $J_A$ in the comparative example, and a solid line L86 and a broken line L87 respectively indicate $V_{AK}$ and $J_A$ in the second structure. In the second structure, the effective total dose $Dose_b$ of the second buffer layer 15bs is set in the range of $1.0 \times 10^{10}$ cm$^{-2}$ to $1.0 \times 10^{12}$ cm$^{-2}$.

Figure 56:
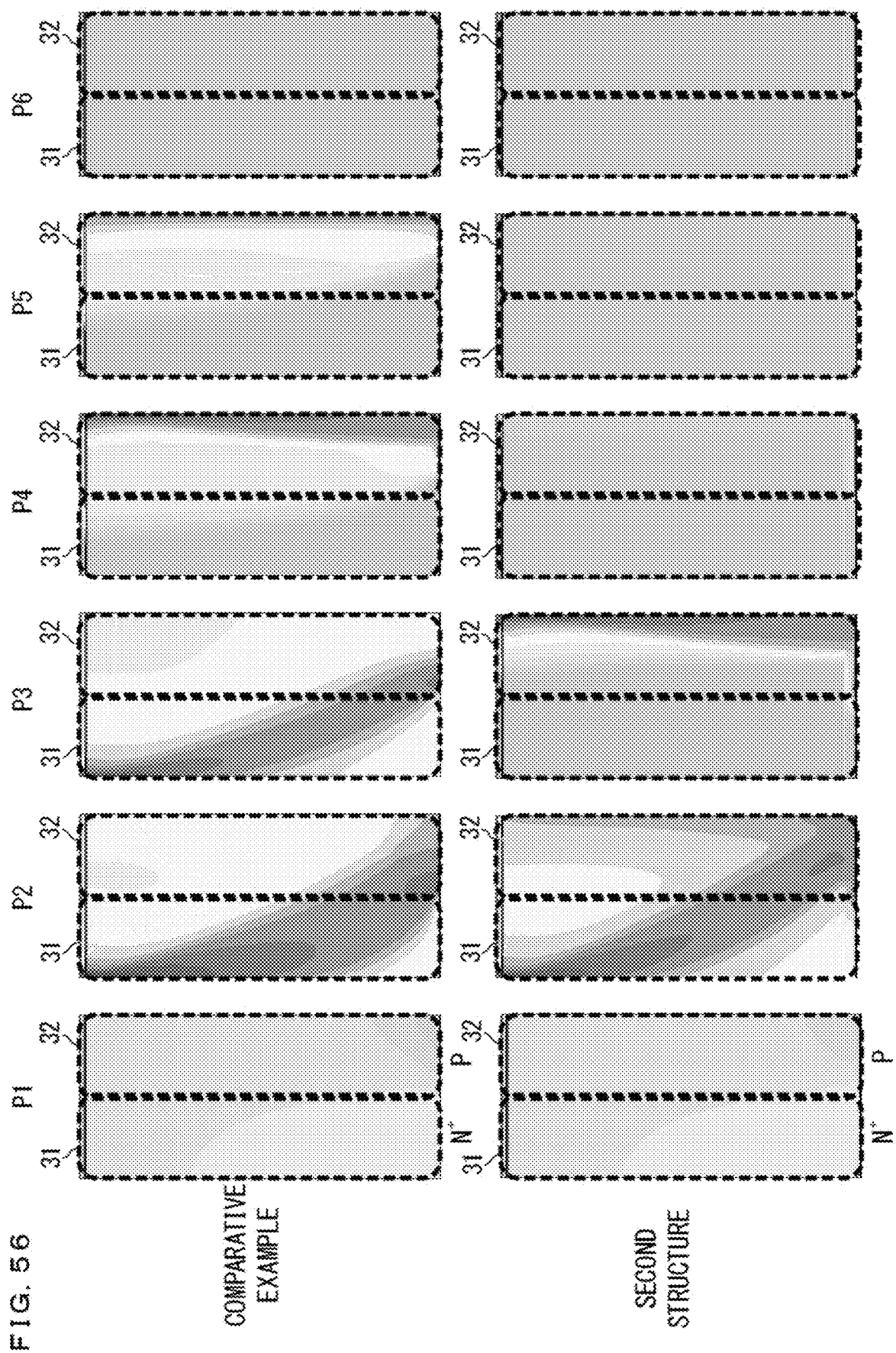
FIG. 56 illustrates current density distributions at analysis points in FIG. 55.

FIGS. 56 to 68 illustrate the results of analysis on the device internal state at six analysis points P1 to P6 illustrated in FIG. 55. FIG. 56 illustrates current density distributions in the PIN diode area 31 and the PNP transistor area 32 for each of the RFC diode according to the comparative example and the RFC diode having the second structure.

Figure 57:
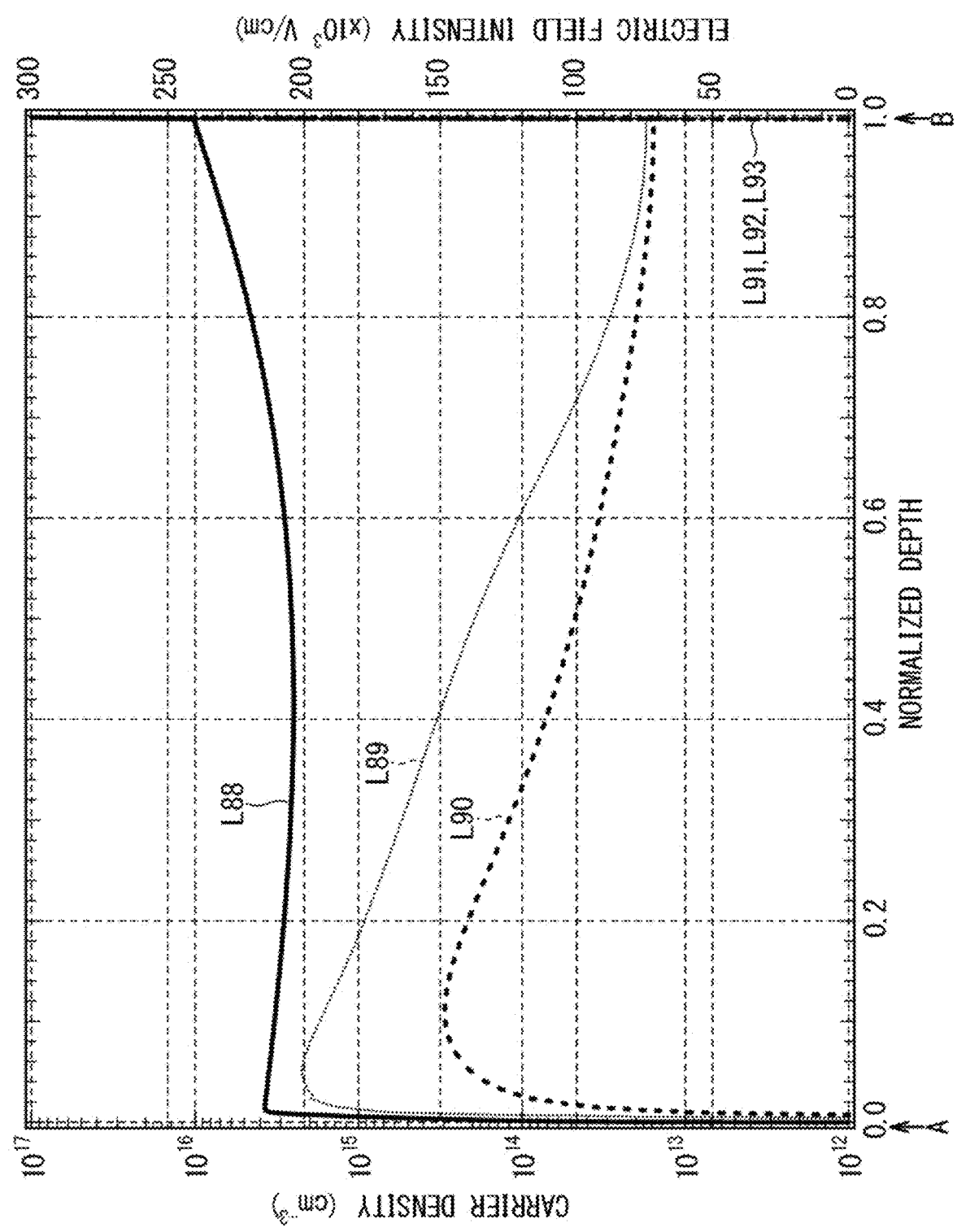
FIG. 57 illustrates electron concentration distributions at the analysis points in FIG. 55 in a PIN diode area of an RFC diode according to a comparative example.
Figure 58:
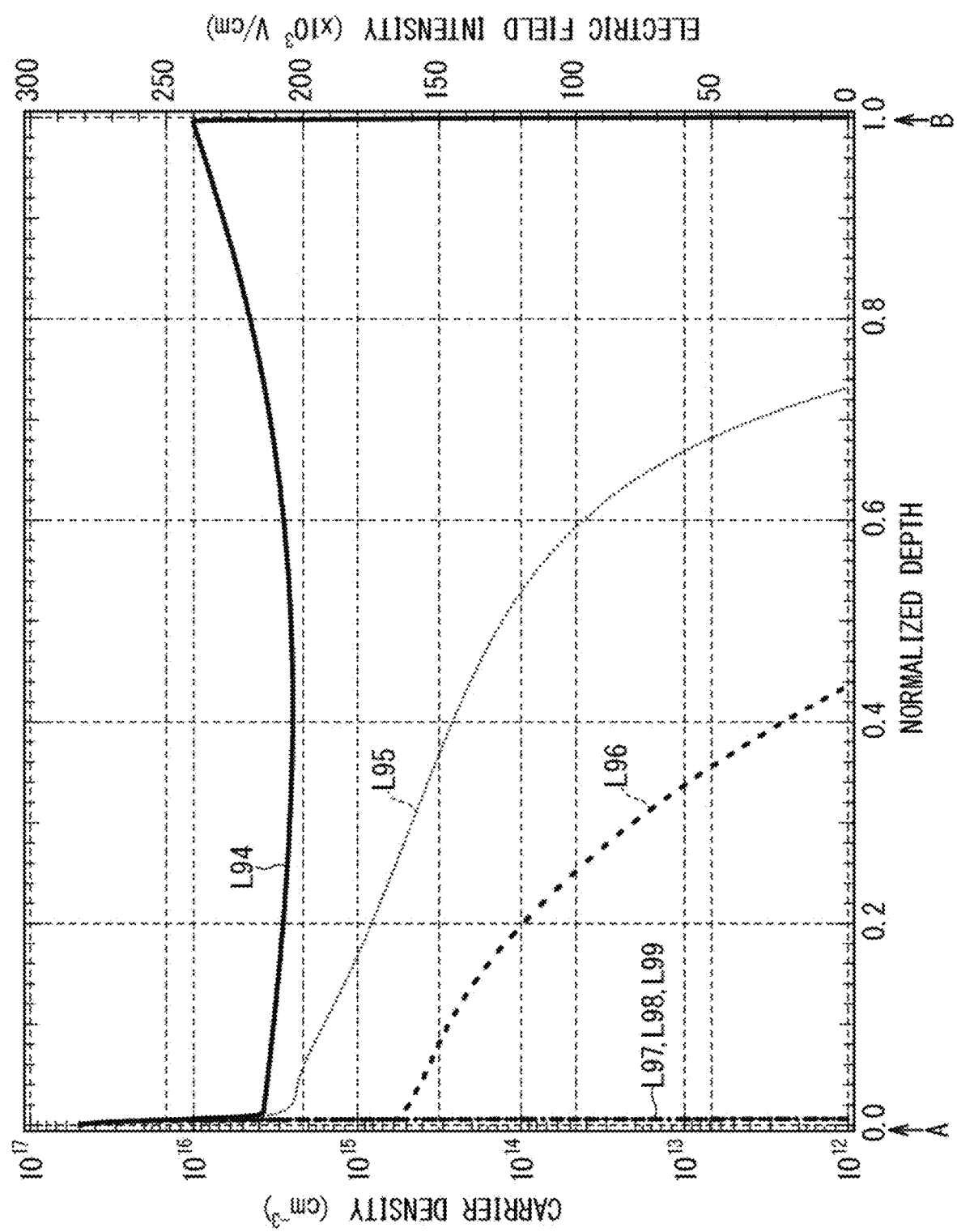
FIG. 58 illustrates hole concentration distributions in the PIN diode area at the analysis points in FIG. 55 in the RFC diode according to the comparative example.
Figure 59:
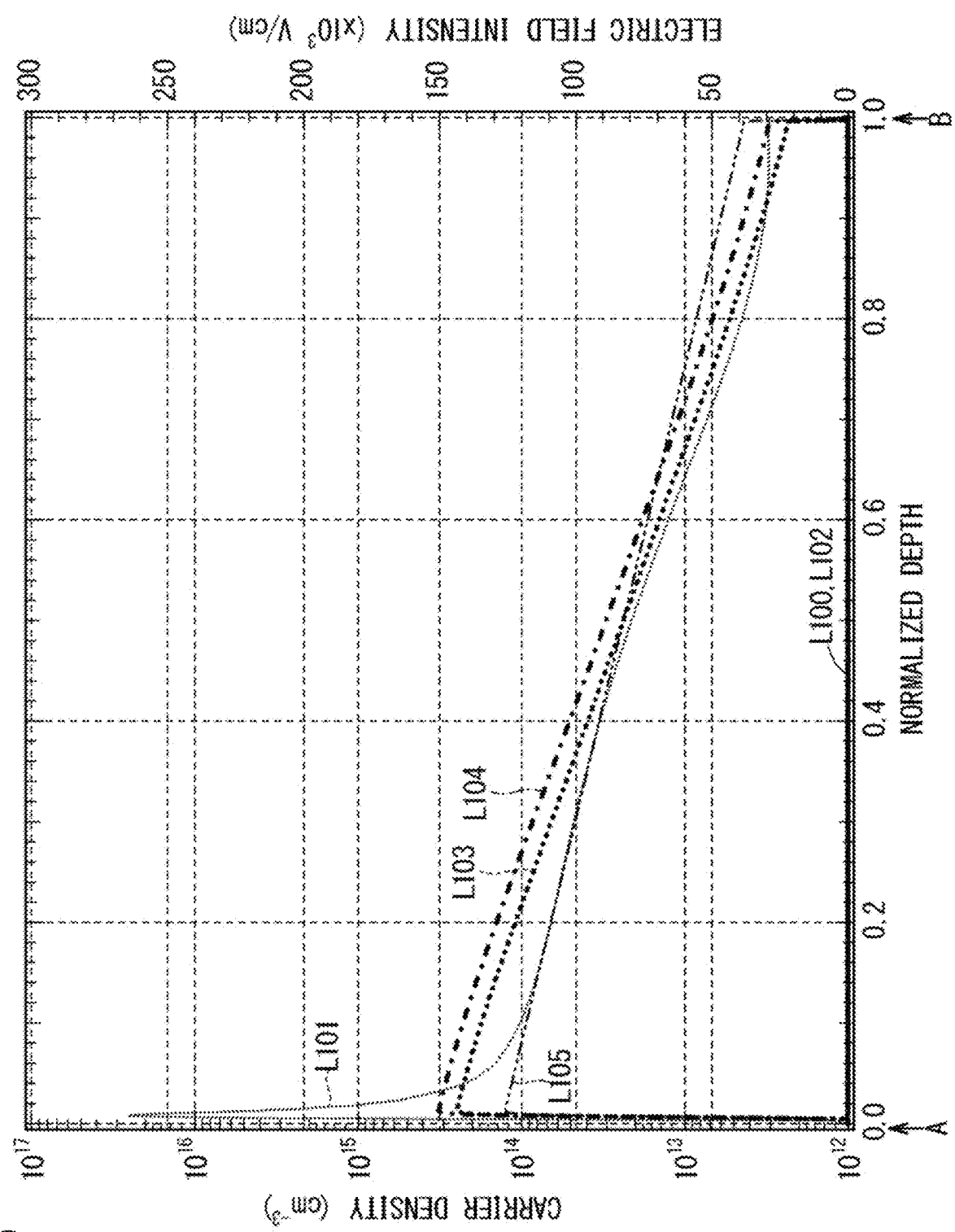
FIG. 59 illustrates field intensity distributions at the analysis points in FIG. 55 in the PIN diode area of in the RFC diode according to the comparative example.

FIGS. 57, 58, and 59 respectively illustrate electron concentration distributions, hole concentration distributions, and electric field intensity distributions in the PIN diode area 31 of the RFC diode according to the comparative example. In FIG. 57, lines L88 to L93 respectively indicate the electron concentration distributions at the points P1 to P6. In FIG. 58, lines L94 to L99 respectively indicate the hole concentration distributions at the points P1 to P6. In FIG. 59, lines L100 to L105 respectively indicate the electric field intensity distributions at the points P1 to P6.

Figure 60:
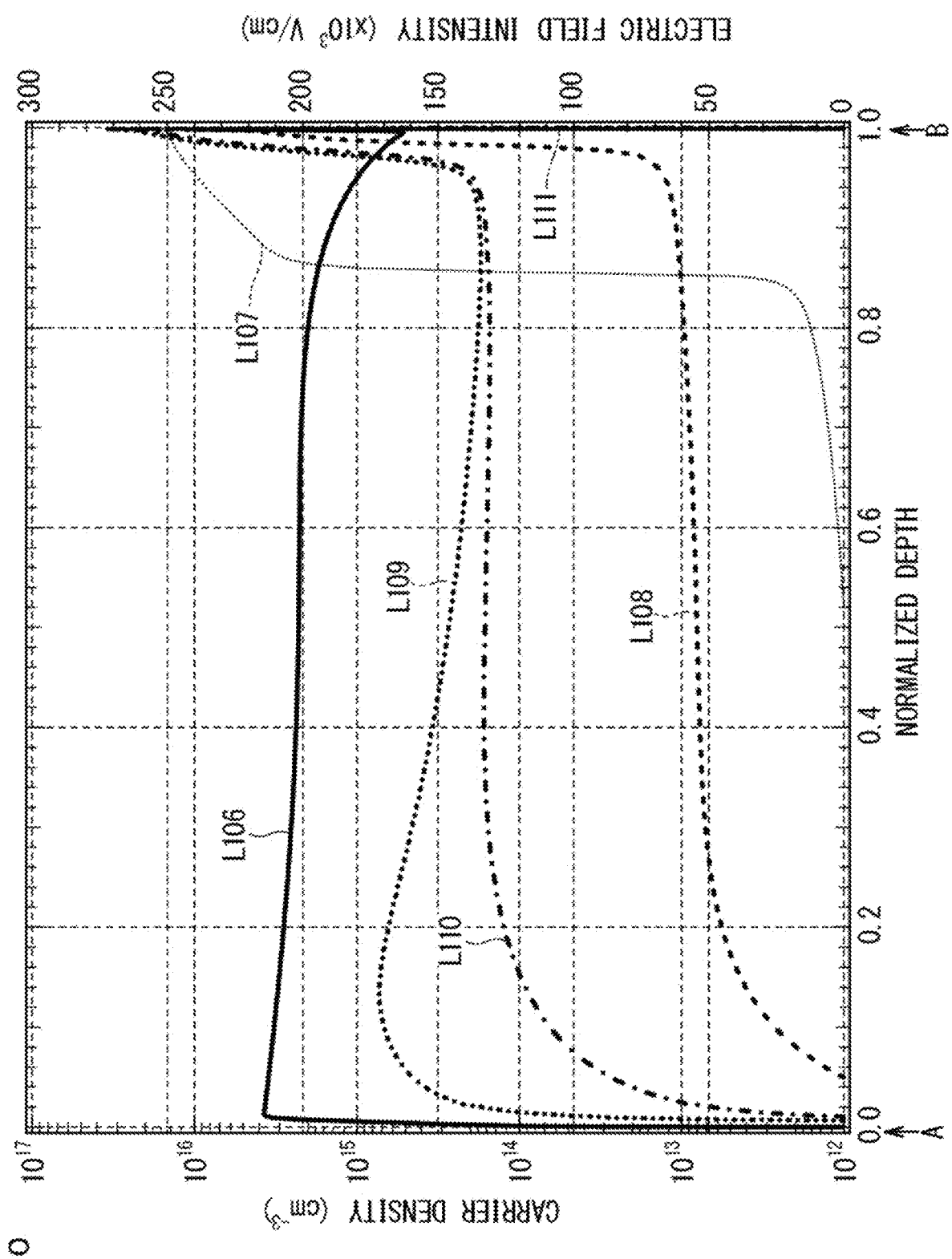
FIG. 60 illustrates electron concentration distributions at the analysis points in FIG. 55 in a PNP transistor area of the RFC diode according to the comparative example.
Figure 61:
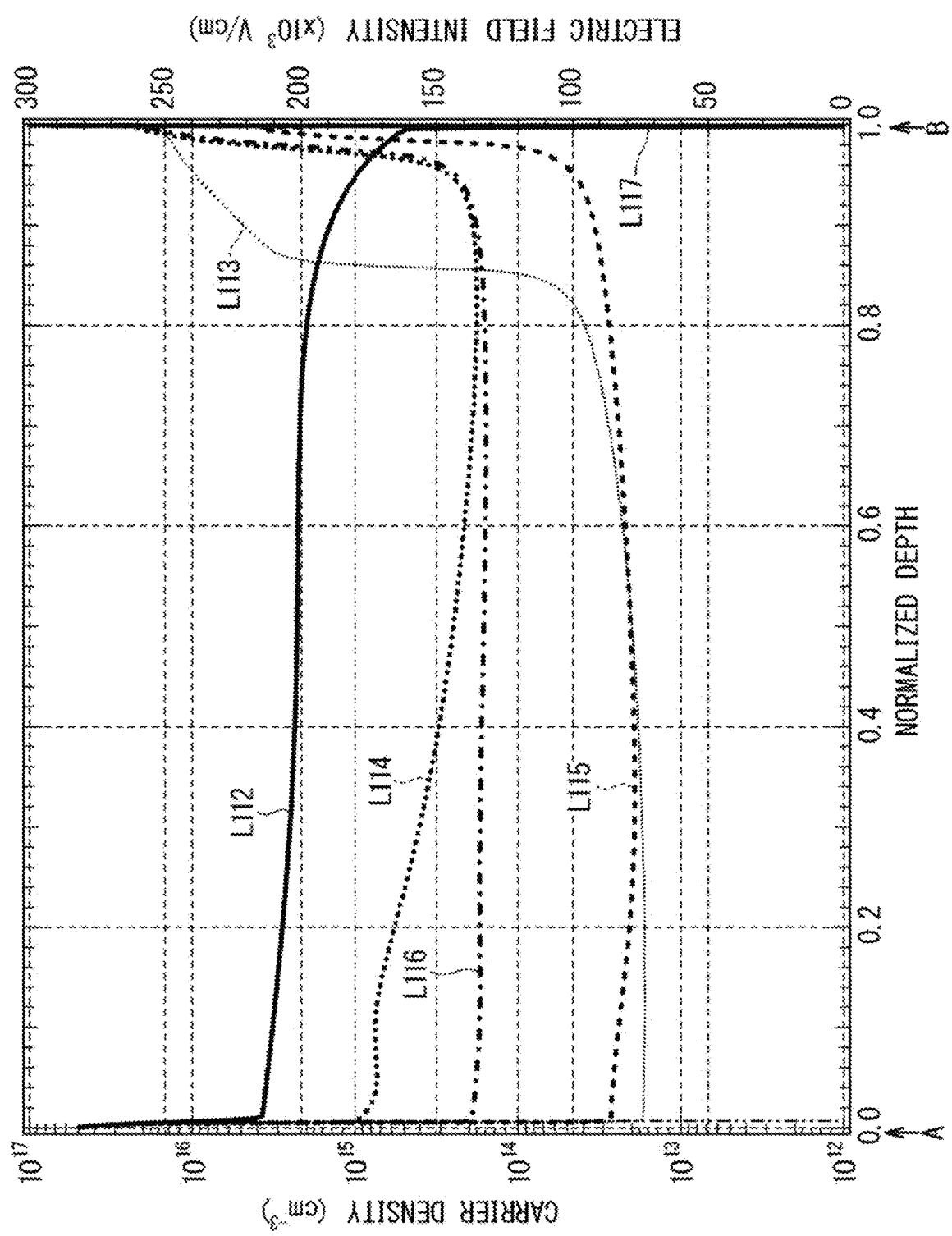
FIG. 61 illustrates hole concentration distributions at the analysis points in FIG. 55 in the PNP transistor area of the RFC diode according to the comparative example.
Figure 62:
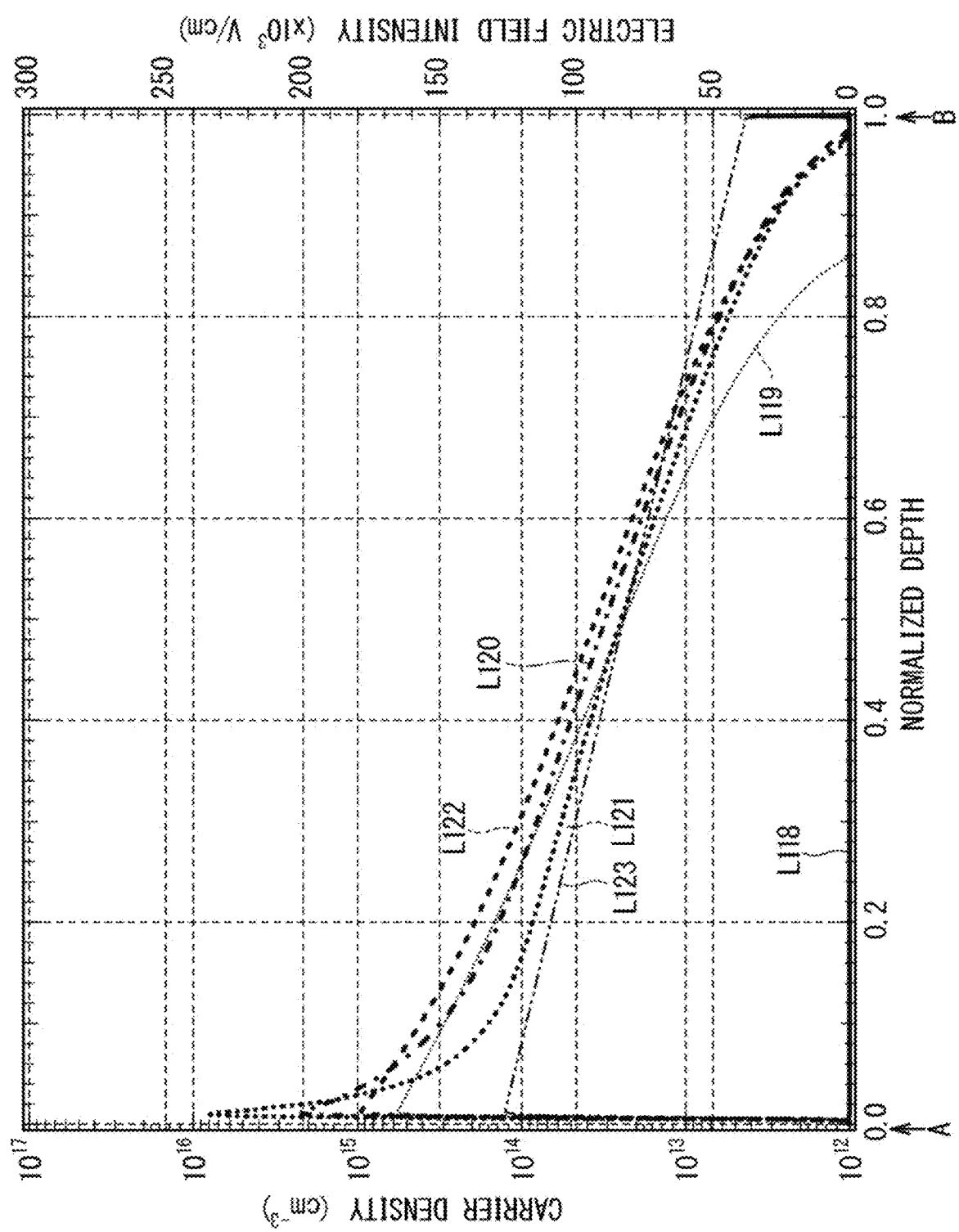
FIG. 62 illustrates field intensity distributions at the analysis points in FIG. 55 in the PNP transistor area of the RFC diode according to the comparative example.

FIGS. 60, 61, and 62 respectively indicate electron concentration distributions, hole concentration distributions, and electric field intensity distributions in the PNP transistor area 32 of the RFC diode according to the comparative example. In FIG. 60, lines L106 to L111 respectively indicate the electron concentration distributions at the points P1 to P6. In FIG. 61, lines L112 to L117 respectively indicate the hole concentration distributions at the points P1 to P6. In FIG. 62, lines L118 to L123 respectively indicate the electric field intensity distributions at the points P1 to P6.

Figure 63:
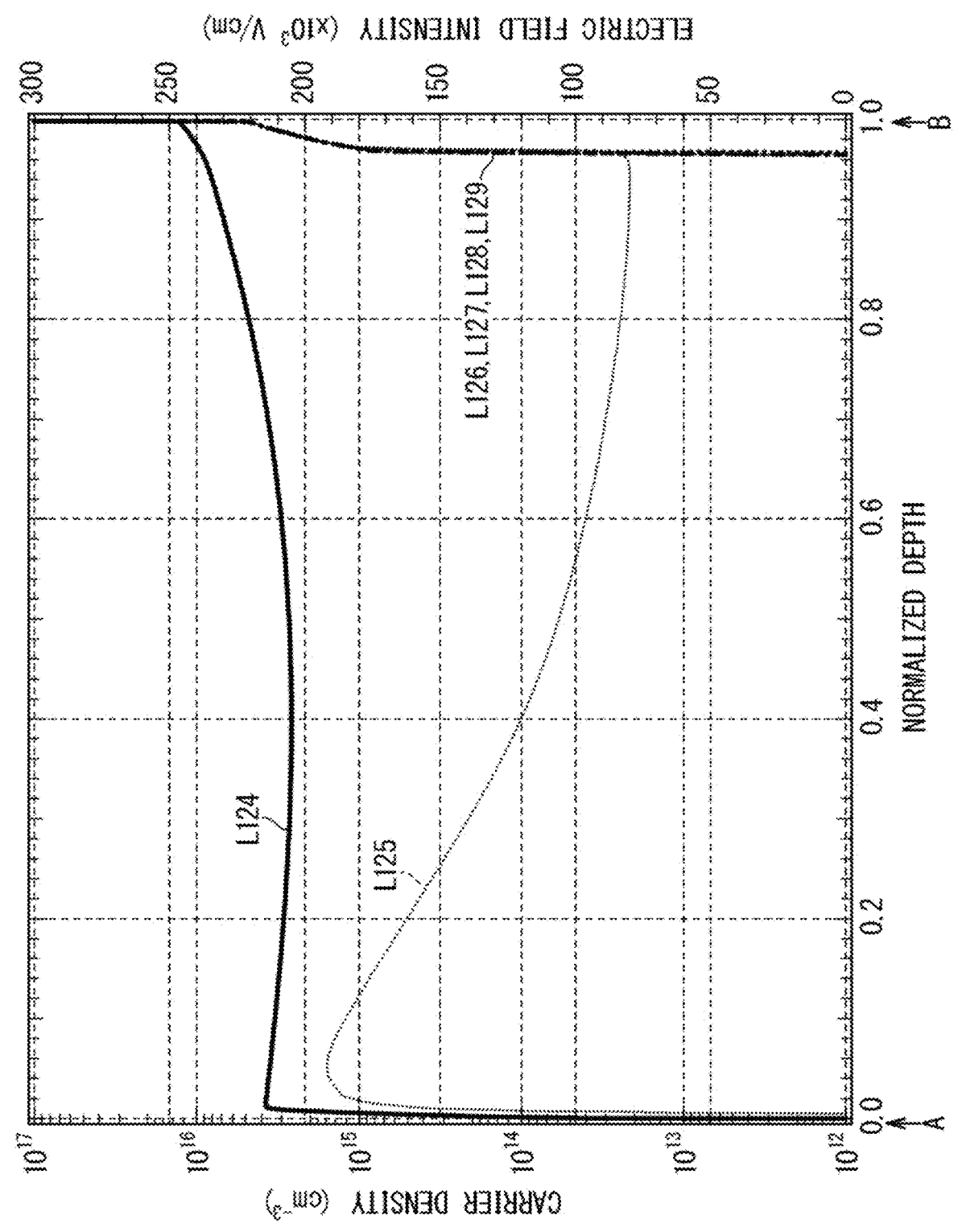
FIG. 63 illustrates electron concentration distributions at the analysis points in FIG. 55 in the PIN diode area of the RFC diode having the second structure.
Figure 64:
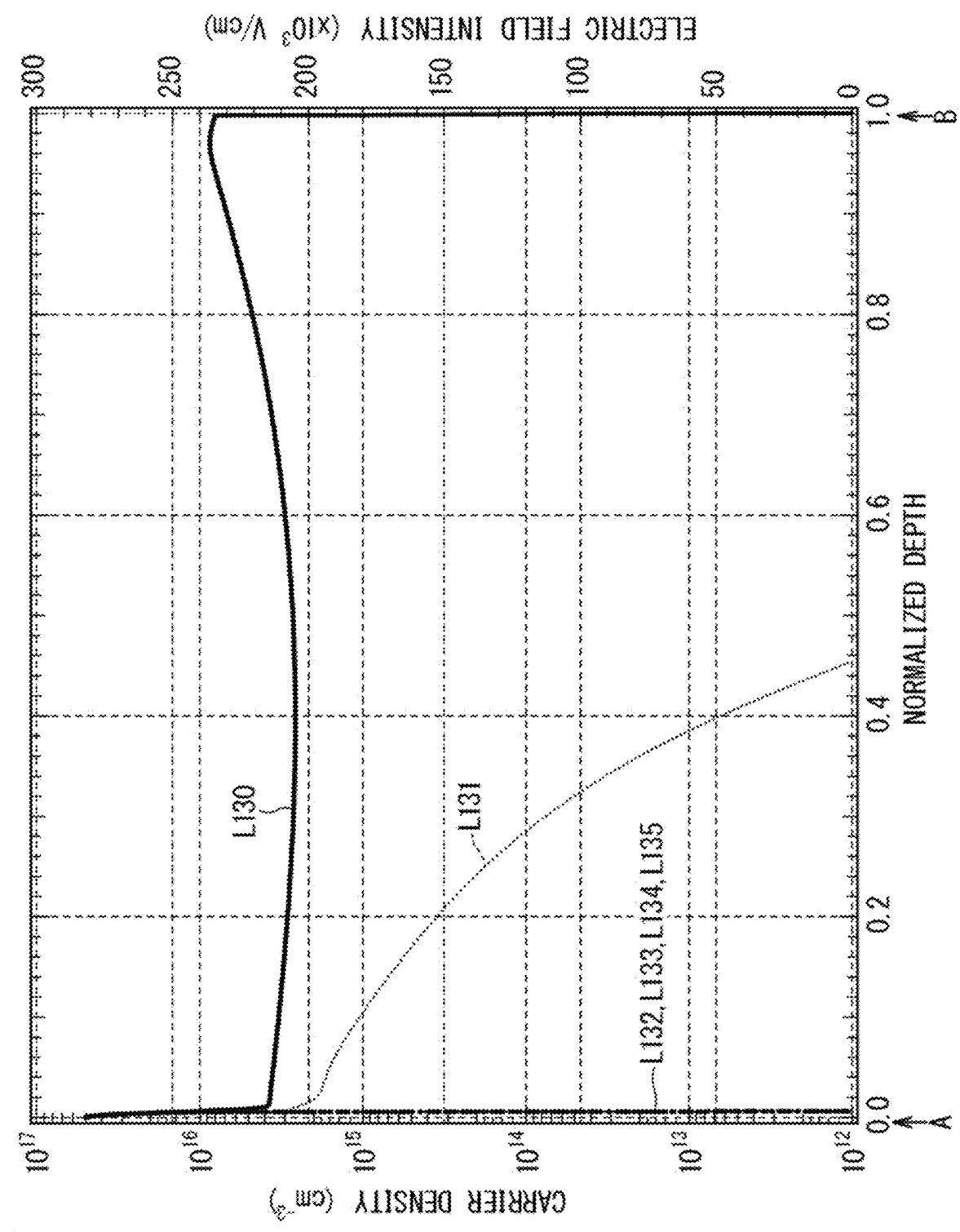
FIG. 64 illustrates hole concentration distributions at the analysis points in FIG. 55 in the PIN diode area of the RFC diode having the second structure.
Figure 65:
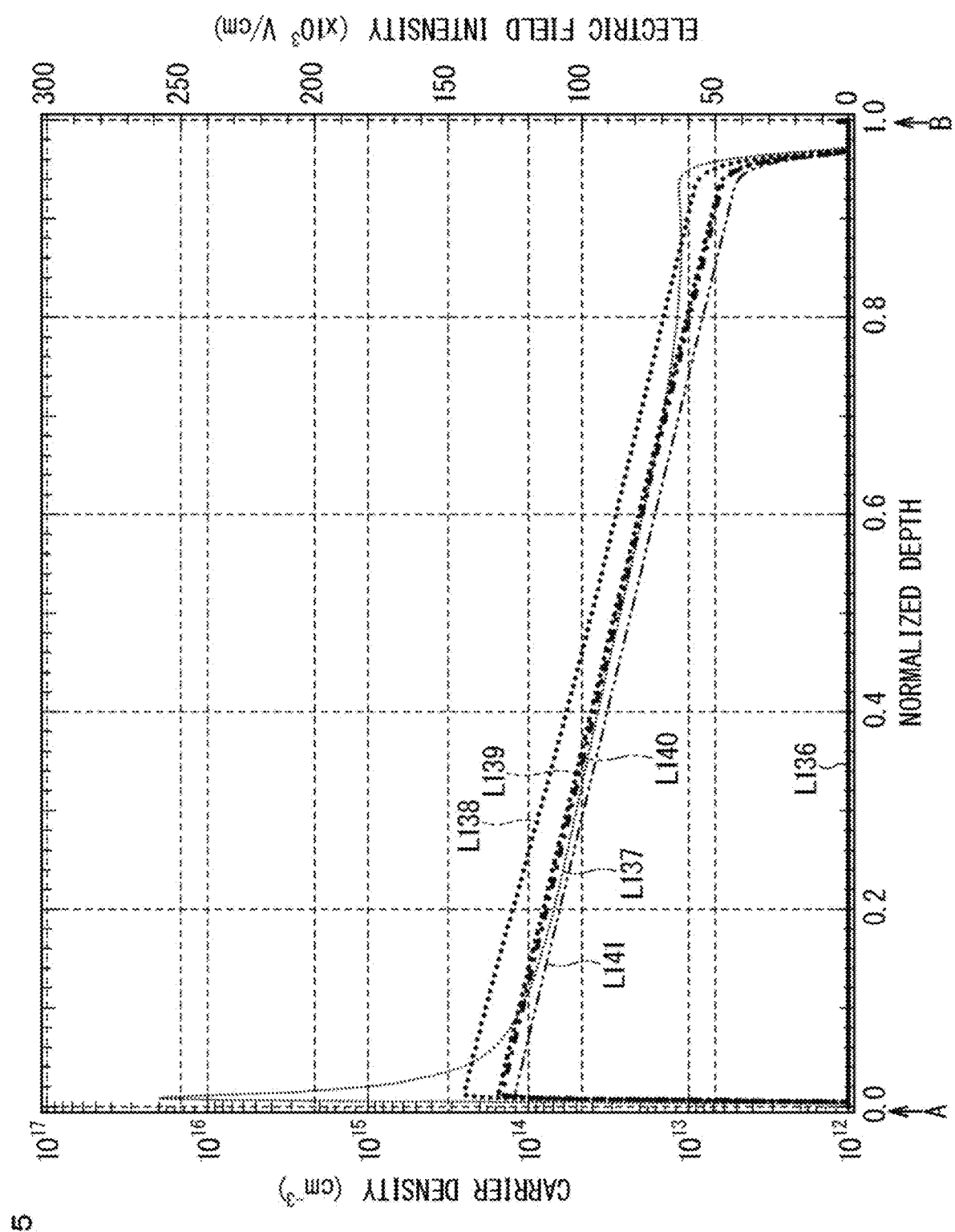
FIG. 65 illustrates field intensity distributions at the analysis points in FIG. 55 in the PIN diode area of the RFC diode having the second structure.

FIGS. 63, 64, and 65 respectively indicate electron concentration distributions, hole concentration distributions, and electric field intensity distributions in the PIN diode area 31 of the RFC diode having the second structure. In FIG. 63, lines L124 to L129 respectively indicate the electron concentration distributions at the points P1 to P6. In FIG. 64, lines L130 to L135 respectively indicate the hole concentration distributions at the points P1 to P6. In FIG. 65, lines L136 to L141 respectively indicate the electric field intensity distributions at the points P1 to P6.

Figure 66:
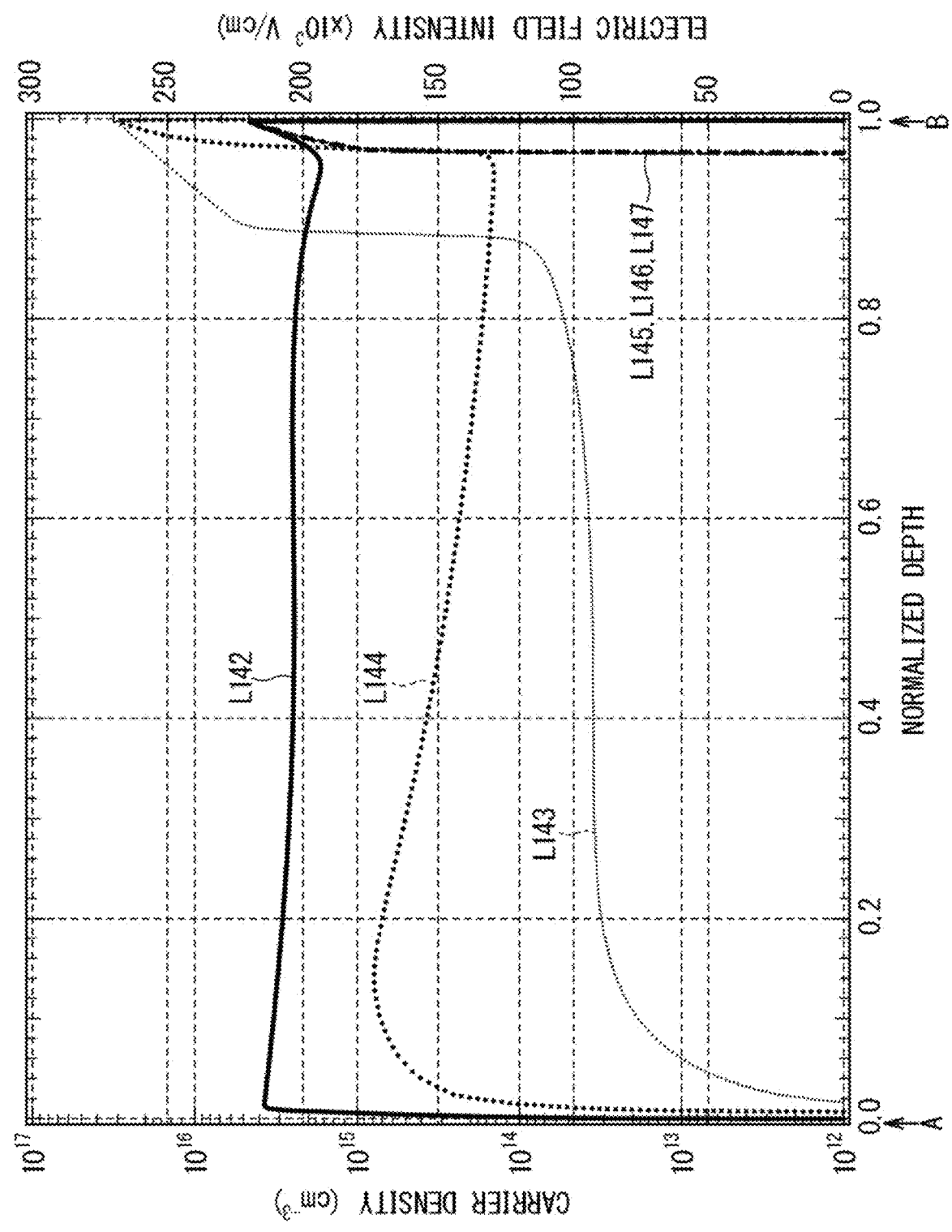
FIG. 66 illustrates electron concentration distributions at the analysis points in FIG. 55 in the PNP transistor area of the RFC diode having the second structure.
Figure 67:
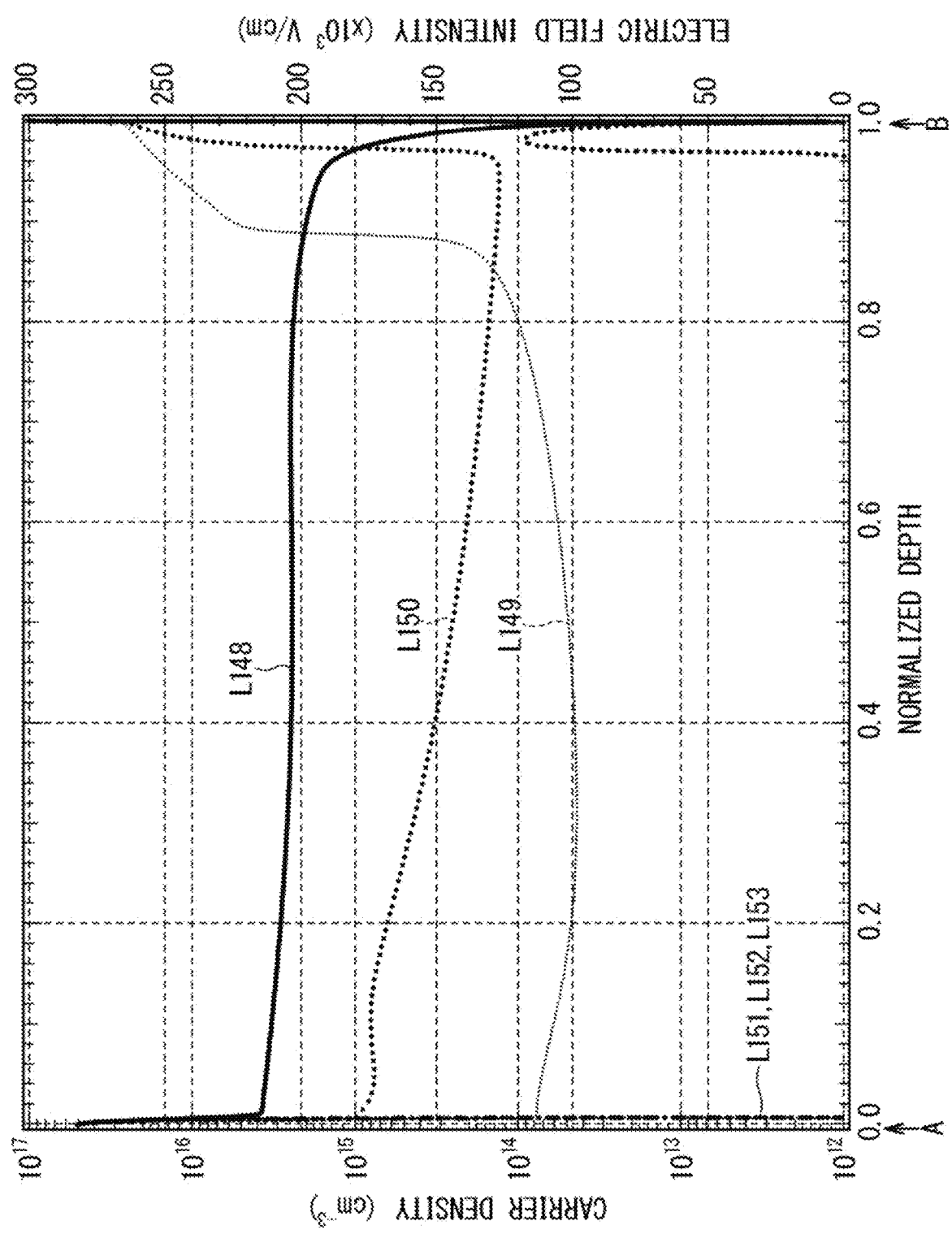
FIG. 67 illustrates hole concentration distributions at the analysis points in FIG. 55 in the PNP transistor area of the RFC diode having the second structure.
Figure 68:
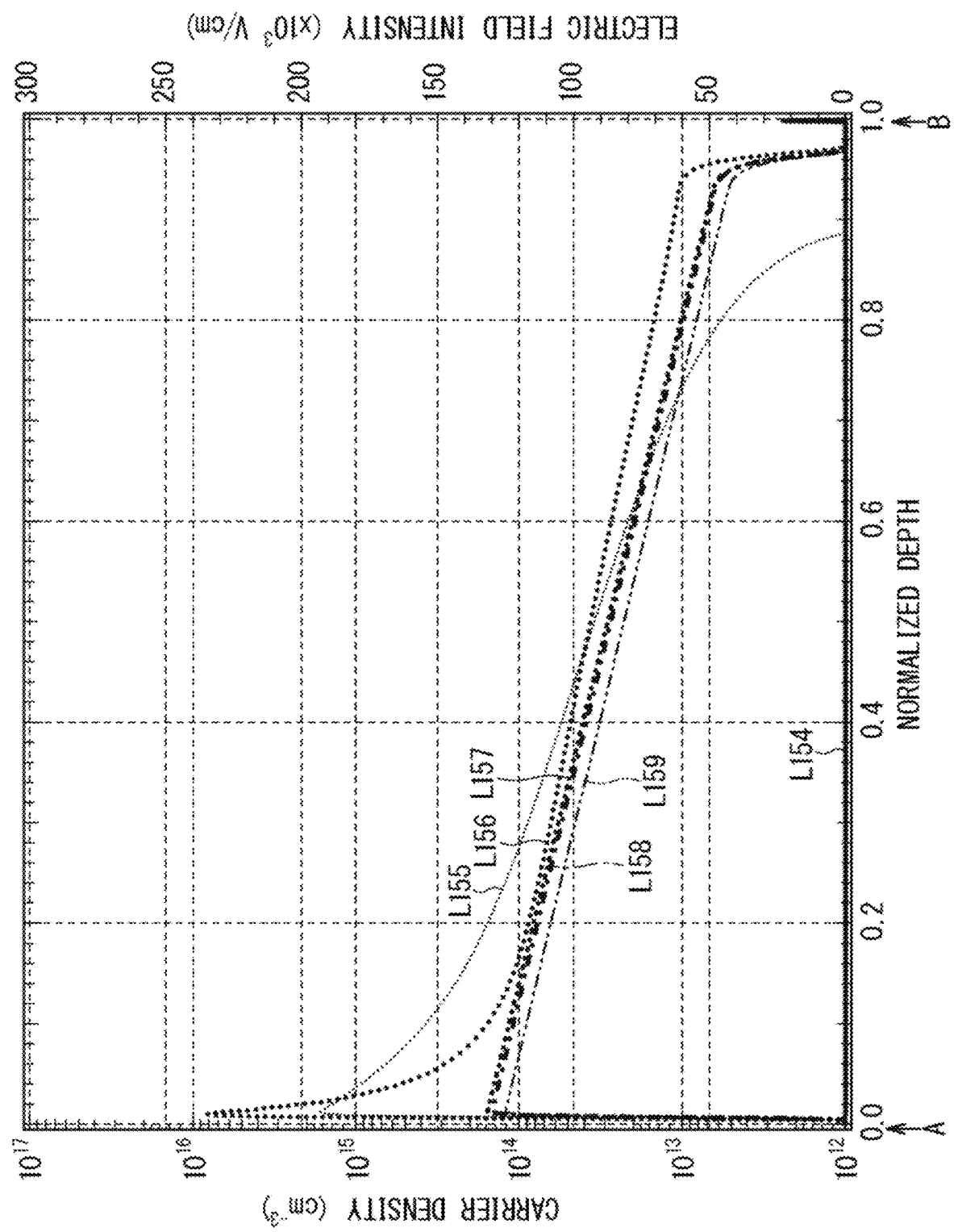
FIG. 68 illustrates field intensity distributions at the analysis points in FIG. 55 in the PNP transistor area of the RFC diode having the second structure.

FIGS. 66, 67, and 68 respectively indicate electron concentration distributions, hole concentration distributions, and field intensity distributions in the PNP transistor area 32 of the RFC diode having the second structure. In FIG. 66, lines L142 to L93 respectively indicate the electron concentration distributions at the points P1 to P6. In FIG. 67, lines L148 to L153 respectively indicate the hole concentration distributions at the points P1 to P6. In FIG. 68, lines L154 to L159 respectively indicate the electric field intensity distributions at the points P1 to P6. In FIGS. 57 to 68, A and B on the horizontal axes correspond to positions A and B in FIG. 32.

As indicated by the broken line L85 in FIG. 55, in the RFC diode according to the comparative example that includes the N buffer layer 15 configured of only the first buffer layer 15a, an anomalously large tail current is generated in the latter half of the recovery operation, eventually resulting in a device breakdown. This phenomenon goes through steps described below.

Step 1: there is an operating time in which the rate of operation in each of the PIN diode area 31 and the PNP transistor area 32 is controlled. Approximately after the device has passed a JRR point (point P1 in FIG. 55) to which the operation of the PIN diode area 31 converges, it enters an operation mode in which the rate of operation of the PNP transistor area 32 is controlled.

Step 2: on the cathode side, the carrier density increases to accelerate hole injection, and this alleviates an electric field. On the other hand, an electric field intensity at the main junction between the P anode layer 10 and the N⁻ drift layer 14 increases and accelerates impact ionization.

Step 3: Electrons generated by the impact ionization accelerated at the main junction are injected into the N⁻ drift layer 14, and this injection increases a base current in the PNP transistor area 32 and generates an anomalously large tail current in the recovery waveform.

Step 4: Simultaneously with the generation of an anomalously large tail current, the PNP transistor area 32 starts to operate and becomes uncontrollable, eventually resulting in a device breakdown.

In contrast, in the RFC diode that includes the N buffer layer 15 having the second structure, the operation in Step 3 described above does not occur, and the recovery operation ends without causing an increase in electric field intensity at the main junction between the P anode layer 10 and the N⁻ drift layer 14. The result is that the operation of the PNP transistor area 32 is suppressed to a minimum as indicated by the current density distribution in the second structure in FIG. 56, and accordingly an anomalously large tail current is not generated. As a result, in the RFC diode that includes the N buffer layer 15 having the second structure, if the effective total dose $Dose_b$ of the second buffer layer 15$bs$ is set to be higher than $1.0\times10^{10}$ cm$^{-2}$, an anomalously large tail current will not be generated during the recovery operation at low temperatures, and the safe operating temperature range that ensures recovery operations will be enlarged to the low-temperature side. However, if the effective total dose $Dose_b$ is set to be lower than $1.0\times10^{10}$ cm$^{-2}$, the same operation as that in the RFC diode according to the comparative example will occur, which will eventually result in a device breakdown.

Figure 69:
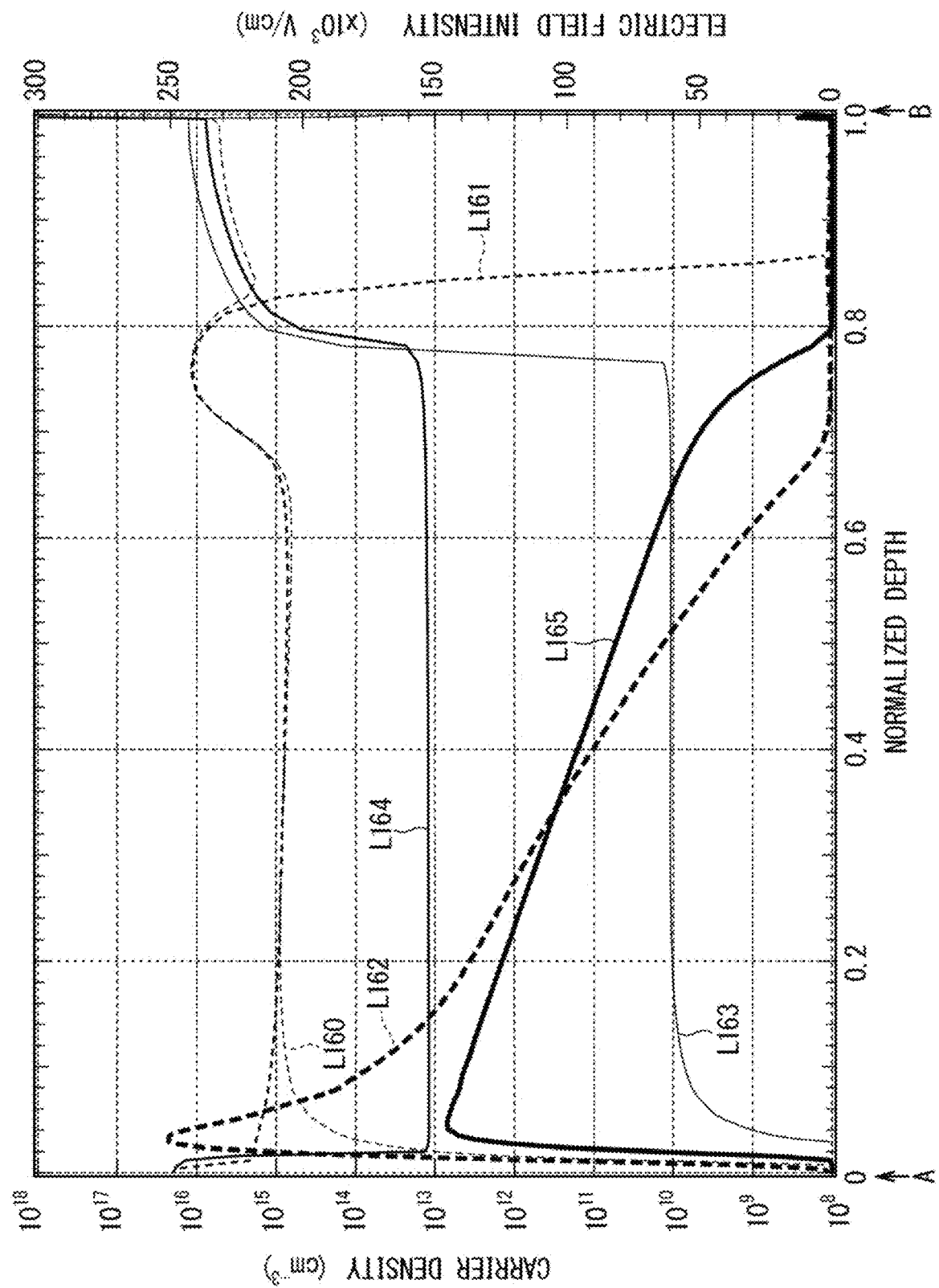
FIG. 69 illustrates the results of simulation on a device internal state at an analysis point API in FIG. 54.
Figure 70:
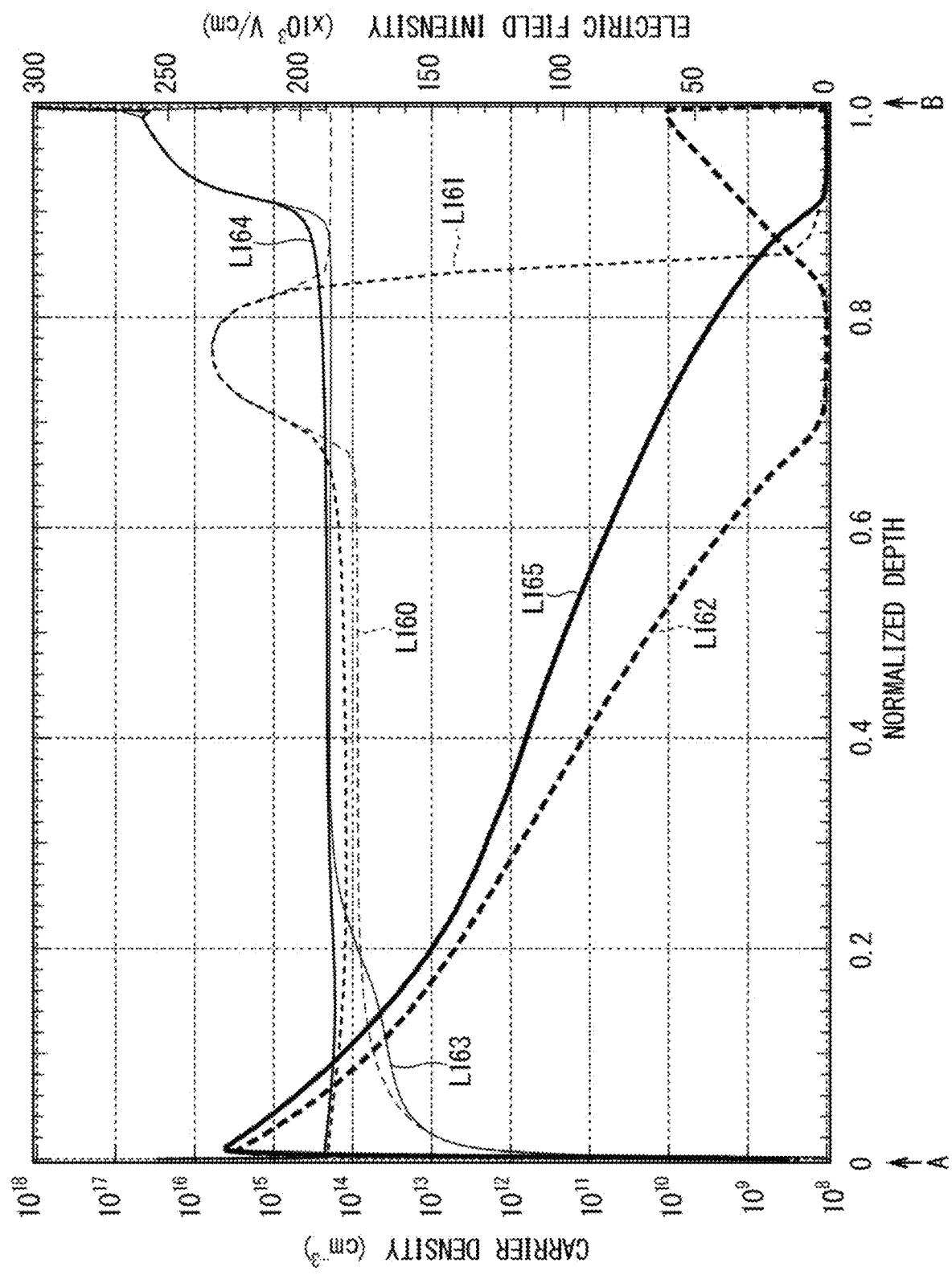
FIG. 70 illustrates the results of simulation on the device internal state at the analysis point API in FIG. 54.

As illustrated in FIG. 54, if the effective dose $Dose_b$ of the second buffer layer 15$bs$ in the RFC diode is set to be higher than $1.0\times10^{12}$ cm$^{-2}$, the RFC diode exhibits a distinctive breakdown behavior. In order to describe a mechanism for this breakdown behavior, FIGS. 69 and 70 illustrate the results of simulation on the device internal state at an analysis point API in FIG. 54. FIG. 69 illustrates the simulation results in the case where $Dose_b$ is in the range of $1.0\times10^{10}$ cm$^{-2}$ to $1.0\times10^{12}$ cm$^{-2}$, and FIG. 70 illustrates the simulation results in the case where $Dose_b$ is higher than $1.0\times10^{12}$ cm$^{-2}$.

The horizontal axes in FIGS. 69 and 70 indicate the normalized depth. The point 0 on the horizontal axes corresponds to A in FIG. 32, i.e., the outermost surface of the P anode layer 10, and the point 1.0 on the horizontal axes corresponds to B in FIG. 32, i.e., the surface of the P cathode layer 18. The vertical axes indicates the carrier density (cm³) and the electric field intensity (×10³ V/cm). In FIGS. 69 and 70, characteristics in the PIN diode area 31 are indicated by broken lines, among which a thin broken line L160 indicates an electron concentration, a medium thin broken line L161 indicates a hole concentration, and a thick broken line L162 indicates an electric field intensity. Also, characteristics in the PNP transistor area 32 are indicated by solid lines, among which a thin solid line L163 indicates an electron concentration, a medium thin solid line L164 indicates a hole concentration, and a thick solid line L165 indicates an electric field intensity.

In the RFC diode in which the effective dose $Dose_b$ of the second buffer layer 15$bs$ is set in the range of $1.0\times10^{10}$ cm$^{-2}$ to $1.0\times10^{12}$ cm$^{-2}$, as illustrated in FIG. 69, the PIN diode area 31 and the PNP transistor area 32 exhibit electric field intensity distributions respectively having approximately a triangular shape and approximately a trapezoidal shape and both having a peak in the vicinity of the main junction while controlling the residual carrier plasma layer on the cathode side. In the internal state of such a diode, it is conceivable that the diode operates stably and gives no adverse effect on breakdown tolerance. However, in the RFC diode in which the effective dose $Dose_b$ of the second buffer layer 15$bs$ is set to be higher than $1.0\times10^{12}$ cm$^{-2}$, as illustrated in FIG. 70, the residual carrier plasma layer is locally distributed in the vicinity of the junction between the N⁻ drift layer 14 and the nth sub-buffer layer 15$bn$ in the second buffer layer 15$bs$ in the PIN diode area 31. Thus, an electric field intensity in the vicinity of that junction increases, and the electric field intensity becomes unbalanced.

The unbalanced electric field intensity caused during the operation of the diode results in a reduction in breakdown tolerance. That is, although the behavior that dramatically reduces the breakdown tolerance when the effective total dose $Dose_b$ of the second buffer layer 15$bs$ is set to be higher than $1.0\times10^{12}$ cm$^{-2}$ has been described with reference to FIG. 53, this behavior can be considered to be triggered by the unbalanced electric field intensity inside the diode during a recovery operation as illustrated in FIG. 70.

Also, a comparison in cathode area between FIGS. 69 and 70 shows that, if the effective total dose $Dose_b$ of the second buffer layer 15$bs$ is higher than $1.0\times10^{12}$ cm$^{-2}$, the area for the residual carrier plasma layer in the second buffer layer 15$bs$ is narrowed and both of the PIN diode area 31 and the PNP transistor area 32 are depleted in the area of the second buffer layer 15$bs$ during a dynamic operation indicated by the area A12 in FIG. 29, which is one of the target functions of the N buffer layer 15. That is, if the effective total dose $Dose_b$ of the second buffer layer 15$bs$ is higher than $1.0\times10^{12}$ cm$^{-2}$, the breakdown tolerance of the diode decreases will be reduced as a result of the area for the residual carrier plasma layer in the second buffer layer 15$bs$ being narrowed during a dynamic operation.

From the above, in order to improve the performance of the IGBT and the diode with the second structure, it is necessary to form the first buffer layer 15$a$ and the second buffer layer 15$bs$ that satisfy the following conditions a) to d):

a) Concentration profile: $\delta a \geq \delta b1$, $\delta b(n-1) \geq \delta bn$, $C_{a,\,p} \geq C_{b1,\,p}$, $C_{b(n-1),\,p} \geq C_{bn,\,p}$;

b) Effective total dose: $1.0\times10^{10}$ cm$^{-2} \leq Dose_b \leq 1.0\times10^{12}$ cm$^{-2}$;

c) Each of the sub-buffer layers 15$b1$ to 15$b$, which constitute the second buffer layer 15$bs$, has an impurity profile trailing in a direction toward the P collector layer 16 in the case of the IGBT, or toward the N⁺ cathode layer 17 in the case of the PIN diode, or toward the N⁺ cathode layer 17 or the cathode layer 18 in the case of the RFC diode; and d) The condition c) is applied to the impurity profiles of two or more sub-buffer layers located after at least the second sub-buffer layer 15$b2$ on the main junction side.

FIGS. 71 to 78 illustrate the results of comparison in performance between an RFC diode that is configured in accordance with the contents described in the first to third preferred embodiments of the present invention and has a second structure that satisfies the above-described conditions a) to c) and an RFC diode according to a comparative example that includes the N buffer layer 15 configured of only the first buffer layer 15$a$. The evaluation devices are RFC diodes with a withstand voltage class of 1200 V.

Figure 71:
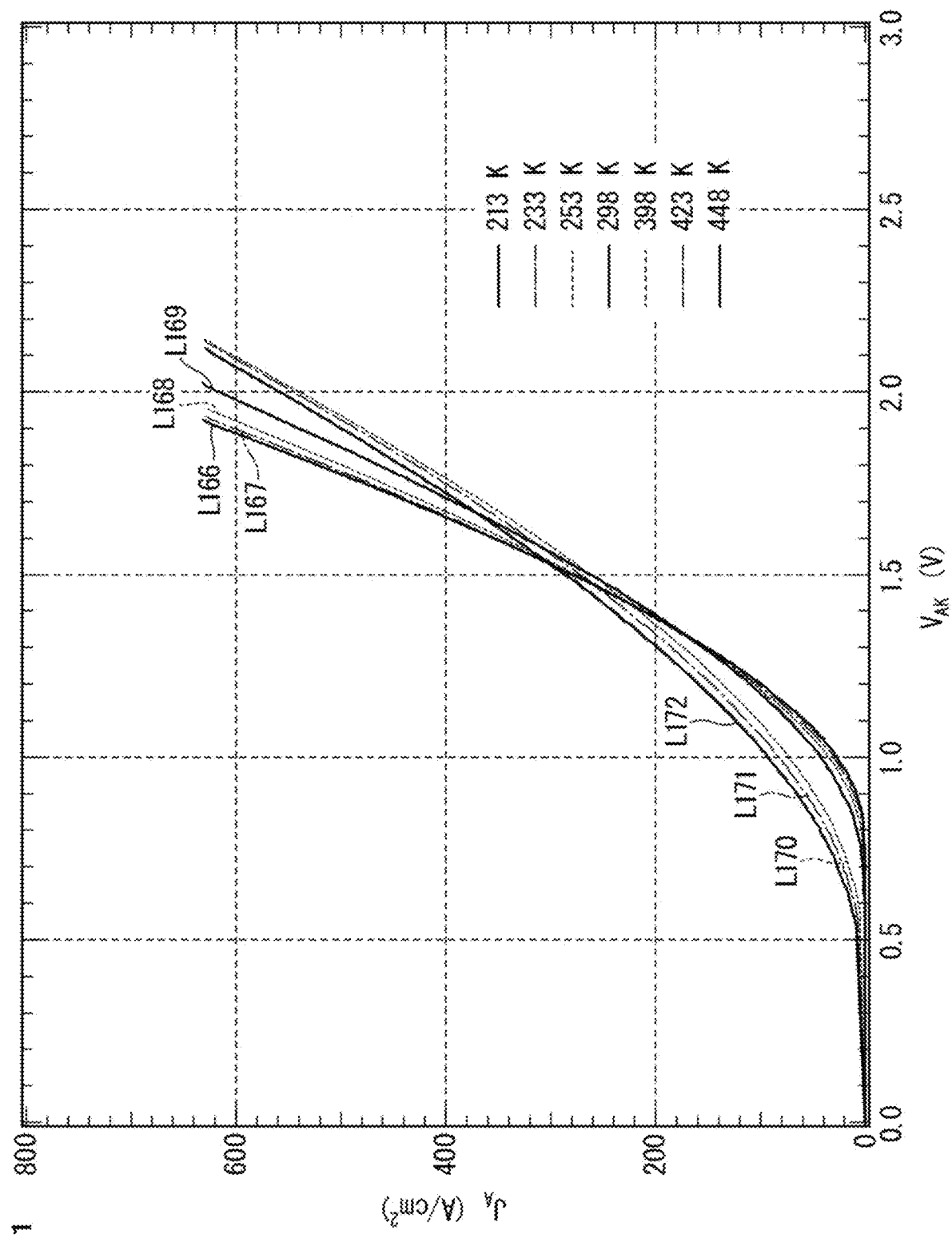
FIG. 71 illustrates output characteristics of the RFC diode, using the operating temperature as a parameter.

FIG. 71 illustrates output characteristic of the RFC diode using the operating temperature as its parameter. In FIG. 71, the horizontal axis indicates the anode-cathode voltage $V_{AK}$ (V), and the vertical axis indicates the anode current density $J_A$ (cm$^{-2}$). In FIG. 71, solid lines L166 to L172 respectively indicate output characteristics in the case where the operating temperature is set to 213 K, 233 K, 253 K, 298 K, 398 K, 423 K, and 448 K. It is found that the RFC diode performs a normal ON-state operation at any operating temperature, without exhibiting snap-back characteristics.

Figure 72:
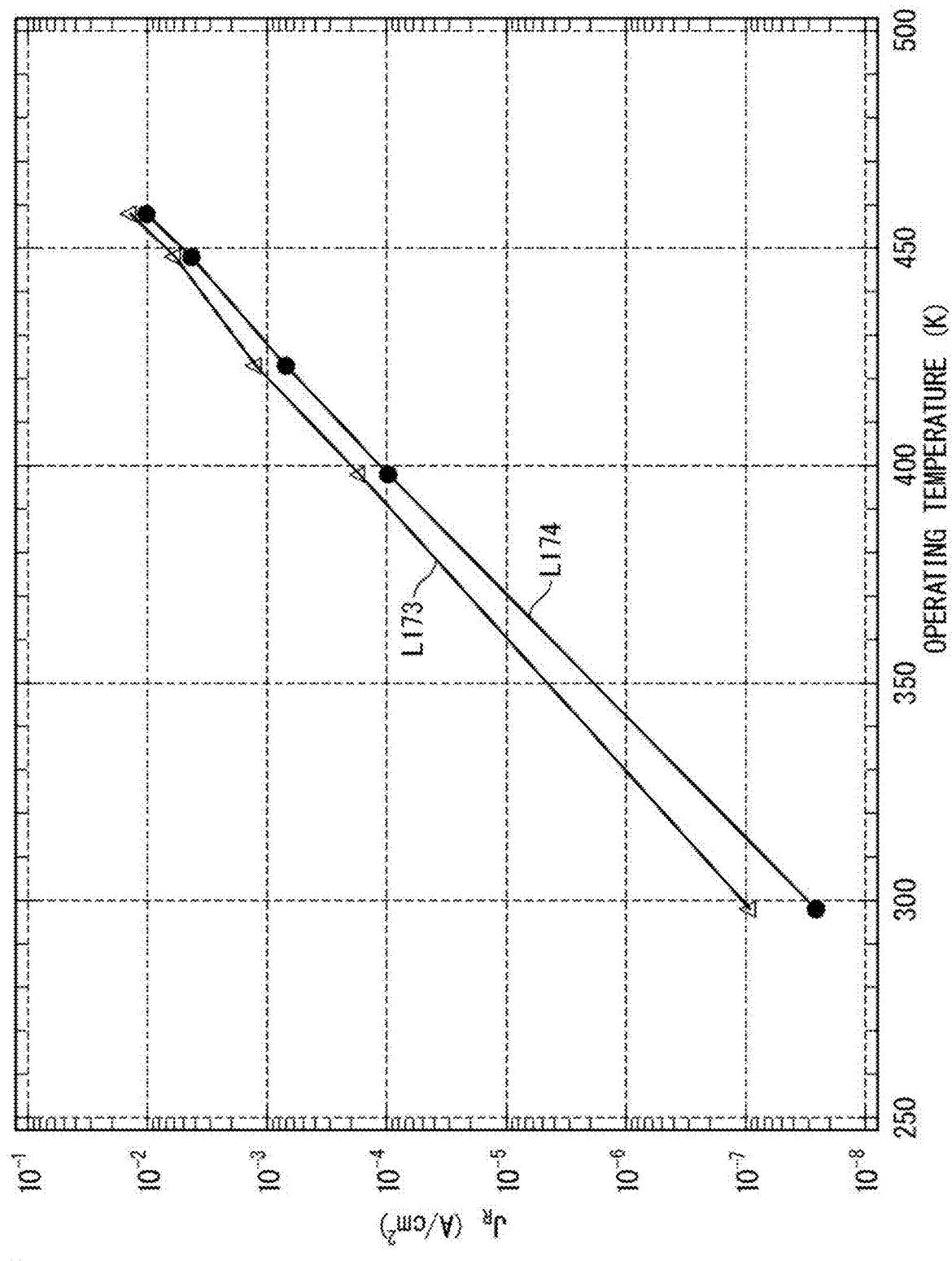
FIG. 72 illustrates a relationship between the leakage current density and the operating temperature when the RFC diode is in the OFF state.

FIG. 72 illustrates a relationship between a leakage current $J_R$ and the operating temperature in the off-state of the RFC diode. A reverse voltage $V_R$ is 1200 V. In FIG. 72, the horizontal axis indicates the operating temperature, and the vertical axis indicates the leakage current $J_R$. In FIG. 72, a solid line L173 indicates characteristics of the RFC diode according to the comparative example, and a solid line L174 indicates characteristics of the RFC diode having the second structure. It can be seen from FIG. 72 that, although the RFC diode having the second structure has lattice defects in the second buffer layer 15bs, it has a smaller leakage current $J_R$ than that in the comparative example and is capable of holding voltage and achieving low turn-off loss characteristics, without causing thermal runaway even at a high temperature of 478 K.

Figure 73:
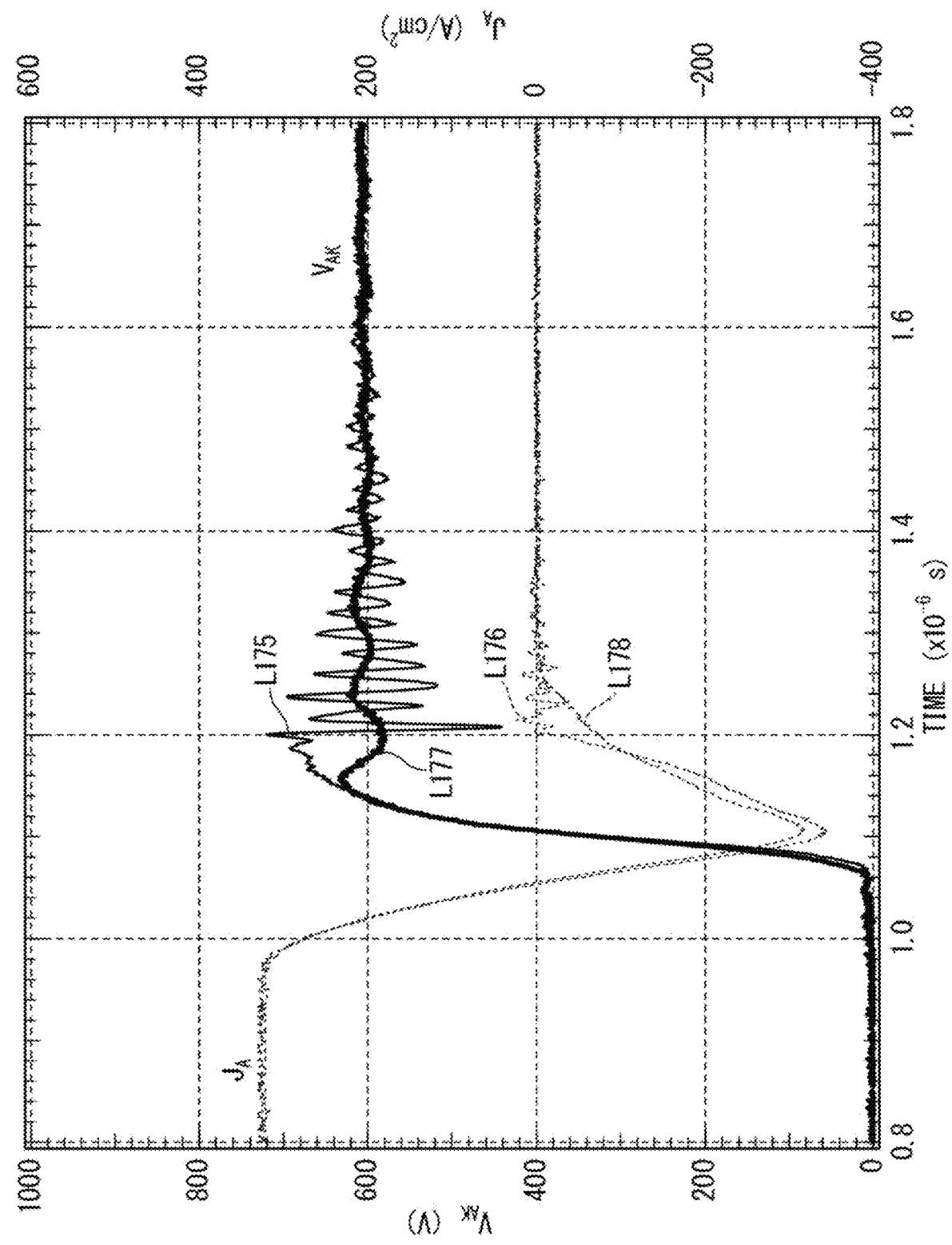
FIG. 73 illustrates recovery waveforms of the RFC diode.

FIG. 73 illustrates the results of comparison in recovery operation. Switching conditions include $V_{CC}$=600 V, $J_F$=326 A/cm$^{-2}$, dj/dt=6200 A/cm$^{-2}$1 μs, $L_S$=200 nH, and a temperature of 298 K. In FIG. 73, the horizontal axis indicates time (×10$^{-6}$ seconds), and the vertical axis indicates the anode-cathode voltage $V_{AK}$ (V) and the anode current density $J_A$ (cm$^{-2}$). In FIG. 73, a solid line L175 and a broken line L176 respectively indicate $V_{AK}$ and $J_A$ of the RFC diode according to the comparative example, and a solid line L177 and a broken line L178 respectively indicate $V_{AK}$ and $J_A$ of the RFC diode having the second structure. The RFC diode having the second structure exhibits neither snap-off phenomenon nor subsequent oscillation phenomena, which are found in the RFC diode according to the comparative example, and achieves a normal recovery operation.

Figure 74:
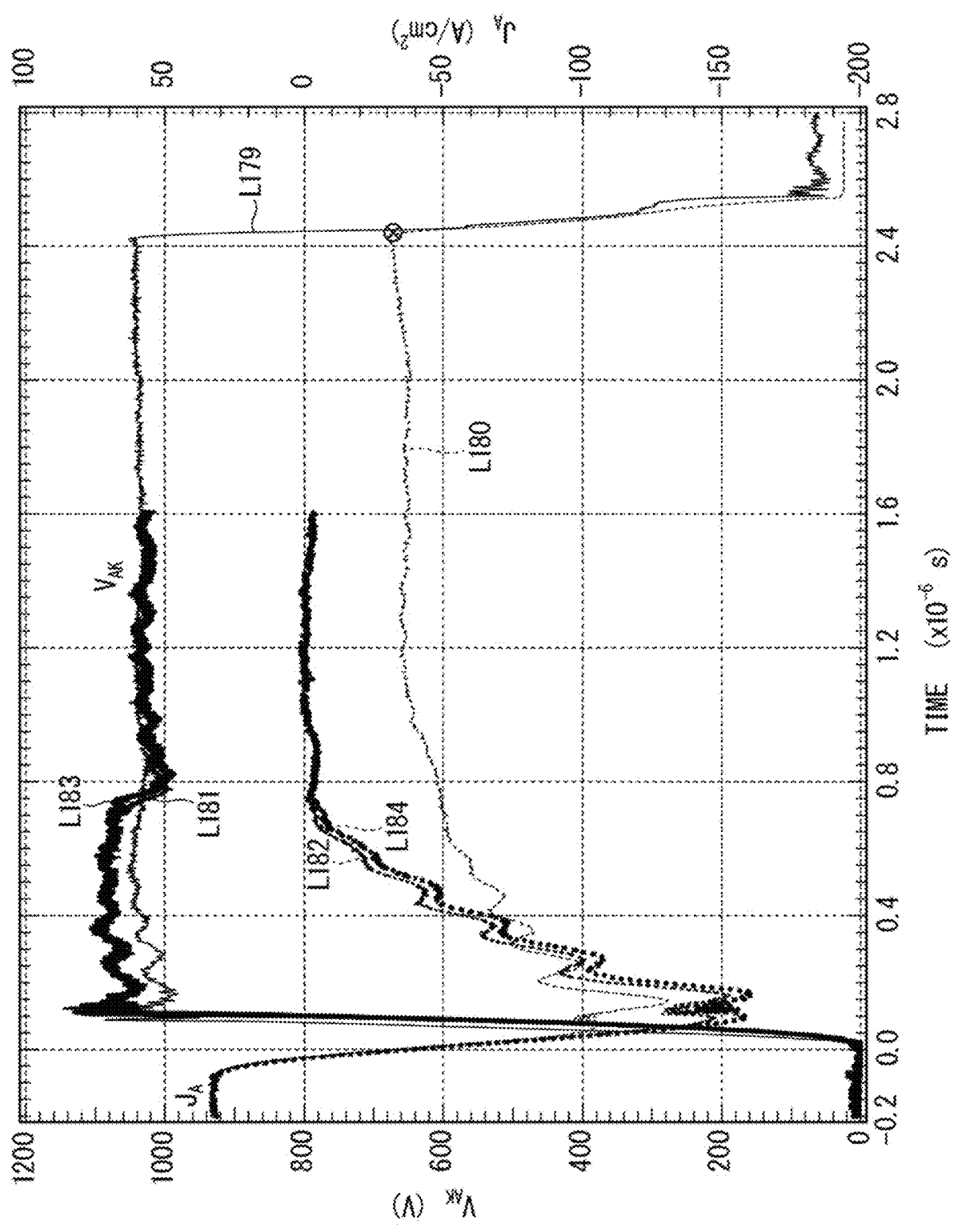
FIG. 74 illustrates recovery waveforms of the RFC diode at a temperature of 253 K.
Figure 75:
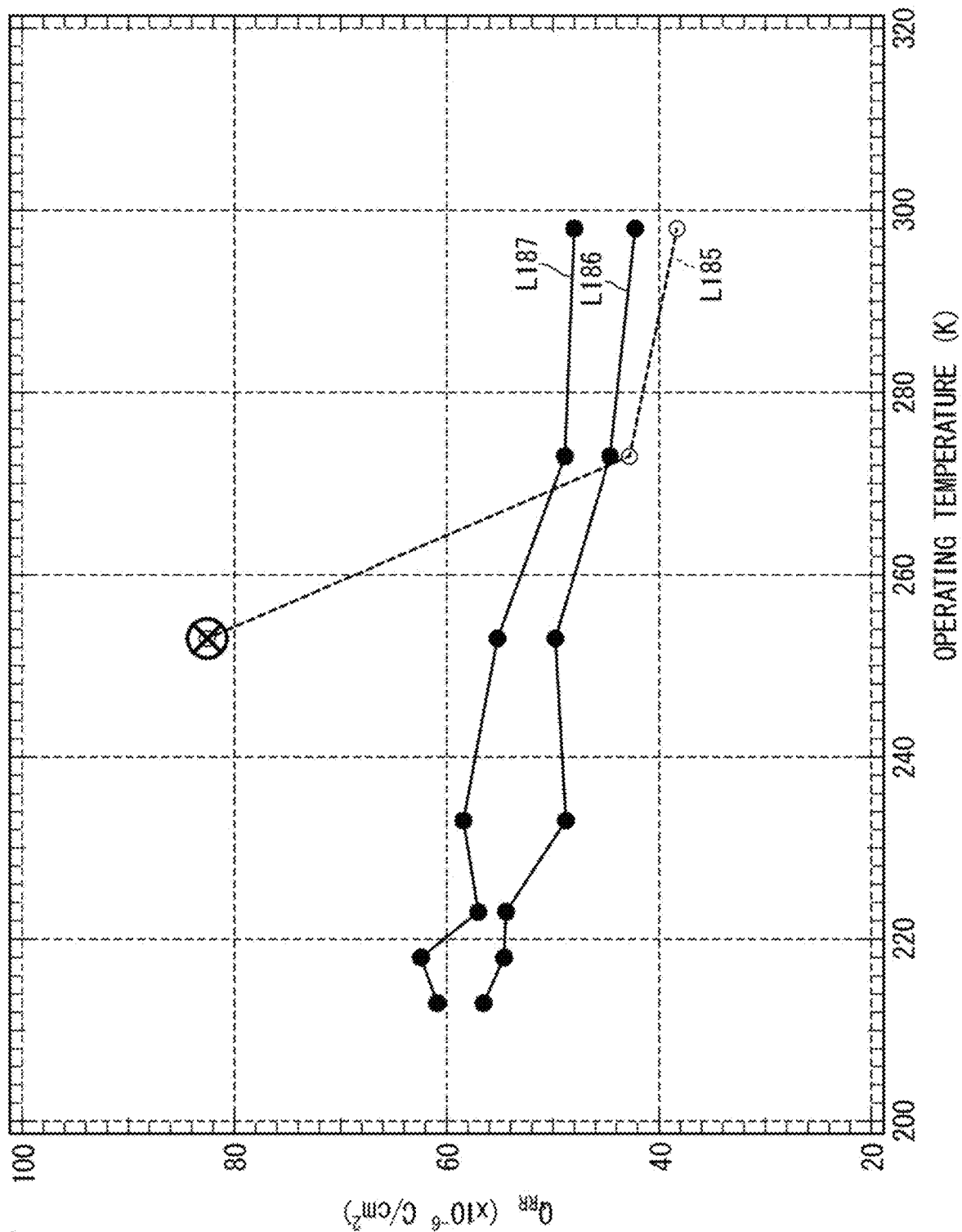
FIG. 75 illustrates a relationship between the amount of accumulated charge and the operating temperature in the RFC diode.
Figure 76:
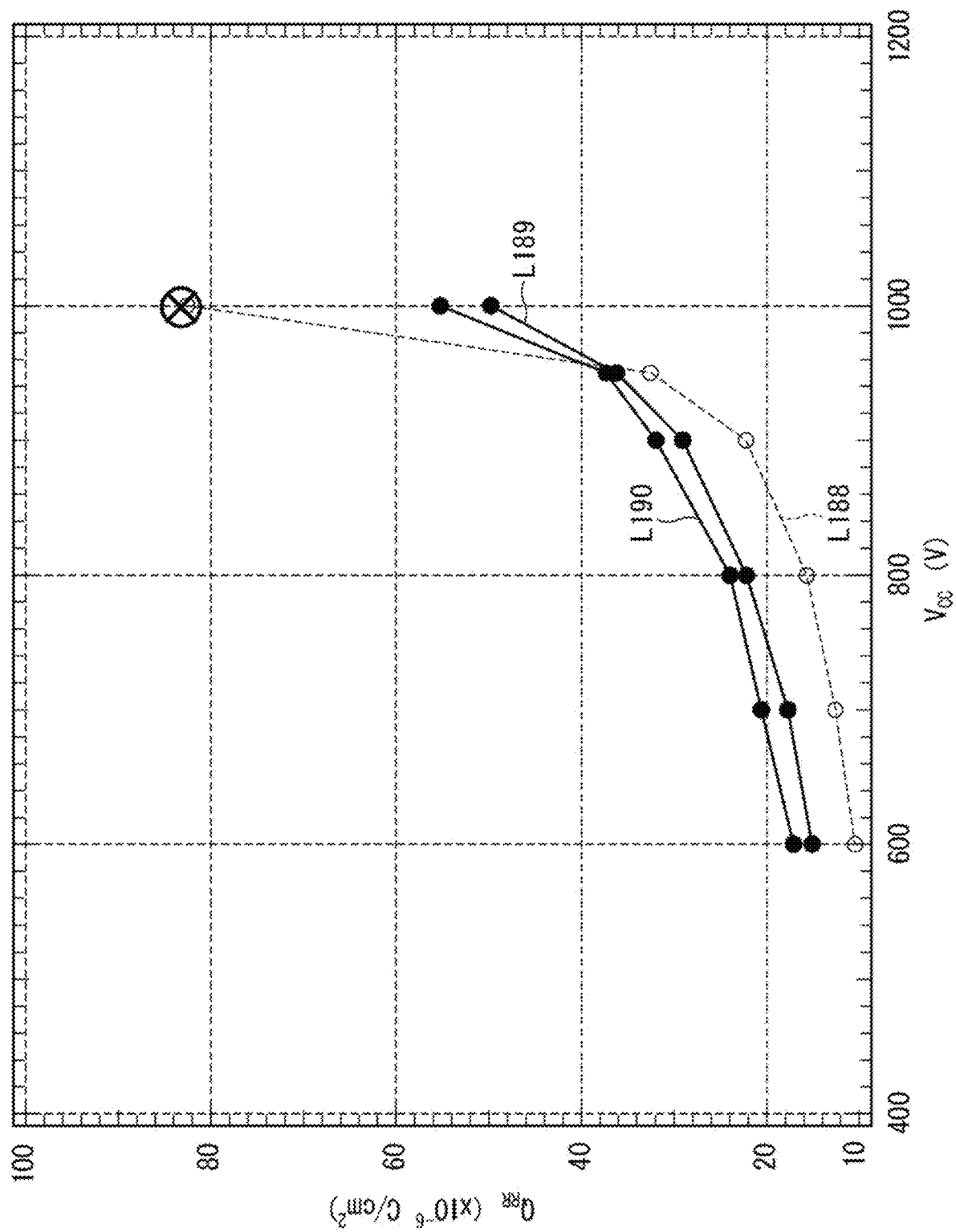
FIG. 76 illustrates a relationship between the amount of accumulated charge and the power supply voltage in the RFC diode.

FIGS. 74 to 76 illustrate the results of comparison in recovery operation at low temperatures and indicate that the second buffer layer 15bs in the second structure enlarges the safe operating temperature range to the low temperature side during recovery operations at lower temperatures.

FIG. 74 illustrates a recovery waveform at a temperature of 253 K. The horizontal axis indicates time (×10$^{-6}$ seconds), and the vertical axis indicates the anode-cathode voltage $V_{AK}$ (V) and the anode current density $J_A$ (cm$^{-2}$). Other switching conditions include $V_{CC}$=1000 V, $J_F$=0.1 $J_A$, dj/dt=1000 A/cm$^{-2}$ μs, dV/dt=12500 V/μs, and $L_S$=2.0 μH. Here, a thin solid line L179 and a thin broken line L180 respectively indicate $V_{AK}$ and $J_A$ for the comparative example. A medium solid line L181 and a medium broken line L182 respectively indicate $V_{AK}$ and $J_A$ for the first structure. Also, a thick solid line L183 and a thick broken line L184 respectively indicate $V_{AK}$ and $J_A$ for the second structure. In FIG. 74, a cross in the waveform indicates a point at which a device breakdown has occurred.

It can be seen from FIG. 74 that, although the comparative example generates an anomalously large tail current in the latter half of the recovery operation and accordingly causes a device breakdown, the first and second structures suppress and block the tail current and exhibit sufficient blocking capability even at a low temperature of 253 K. As an indicator of the effect of suppressing an anomalously large tail current, FIG. 75 illustrates a relationship between the amount of accumulated charge $Q_{RR}$ and the operating temperature, and FIG. 76 illustrates a relationship between the amount of accumulated charge $Q_{RR}$ and the power supply voltage $V_{CC}$.

In FIG. 75, the horizontal axis indicates the operating temperature, and the vertical axis indicates $Q_{RR}$ (×10$^{-6}$ C/cm$^{-2}$). In FIG. 75, a broken line L185 indicates characteristics of the comparative example, and solid lines L186 and L187 respectively indicate characteristics of the first and second structures. It can be seen from FIG. 75 that the first and second structures can suppress an increase in $Q_{RR}$ even at low temperatures.

In FIG. 76, the horizontal axis indicates the power supply voltage $V_{CC}$, and the vertical axis indicates $Q_{RR}$ (×10$^{-6}$ C/cm$^{-2}$). In FIG. 76, a broken line L188 indicates characteristics of the comparative example, and solid lines L189 and L190 respectively indicate characteristics of the first and second structures. It can be seen from FIG. 76 that the first and second structures can suppress an increase in $Q_{RR}$ even at a high $V_{CC}$.

Figure 77:
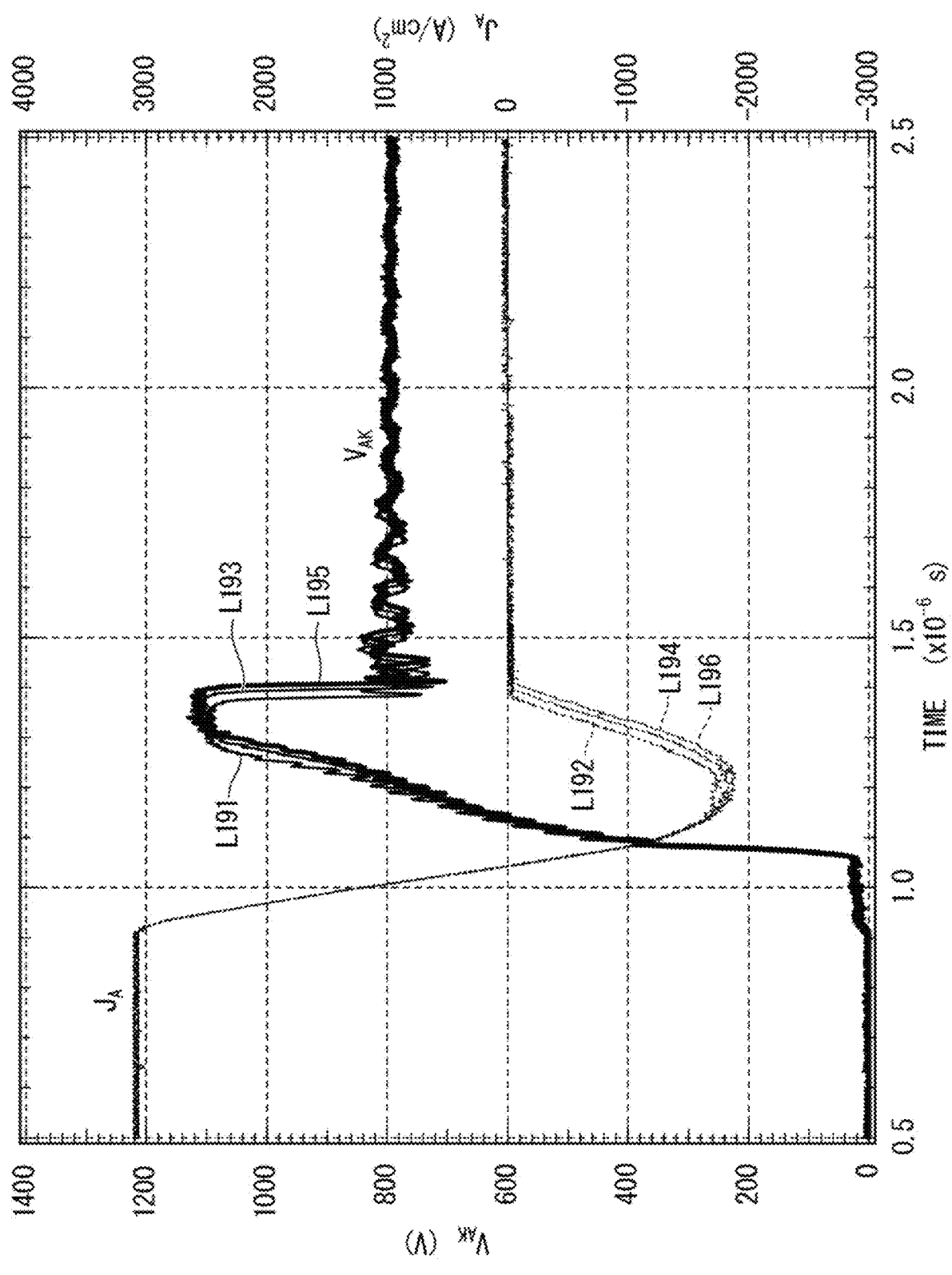
FIG. 77 illustrates recovery waveforms of the RFC diode at a high power supply voltage, a high current density, and a high temperature.

FIG. 77 illustrates recovery waveforms at a high $V_{CC}$, a high large-current density, and a high temperature (in the range of 423 to 468 K). In FIG. 77, the horizontal axis indicates times (×10$^{-6}$ seconds), and the vertical axis indicates the anode-cathode voltage $V_{AK}$ (V) and the anode current density $J_A$ (cm$^{-2}$). In FIG. 77, a thin solid line L191 and a thin broken line L192 respectively indicate $V_{AK}$ and $J_A$ at 423 K, a medium solid line L193 and a medium broken line L194 respectively indicate $V_{AK}$ and $J_A$ at 448 K, and a thick solid line L195 and a thick broken line L196 respectively indicate $V_{AK}$ and $J_A$ at 468 K. FIG. 77 indicates that the RFC diode having the second structure can block a high current density higher than or equal to 3000 A/cm$^{-2}$ even at a high $V_{CC}$ of 900 V and a high temperature of 468 K. That is, it can be seen from FIGS. 72 and 77 that the second structure can also achieve high-temperature operations.

Figure 78:
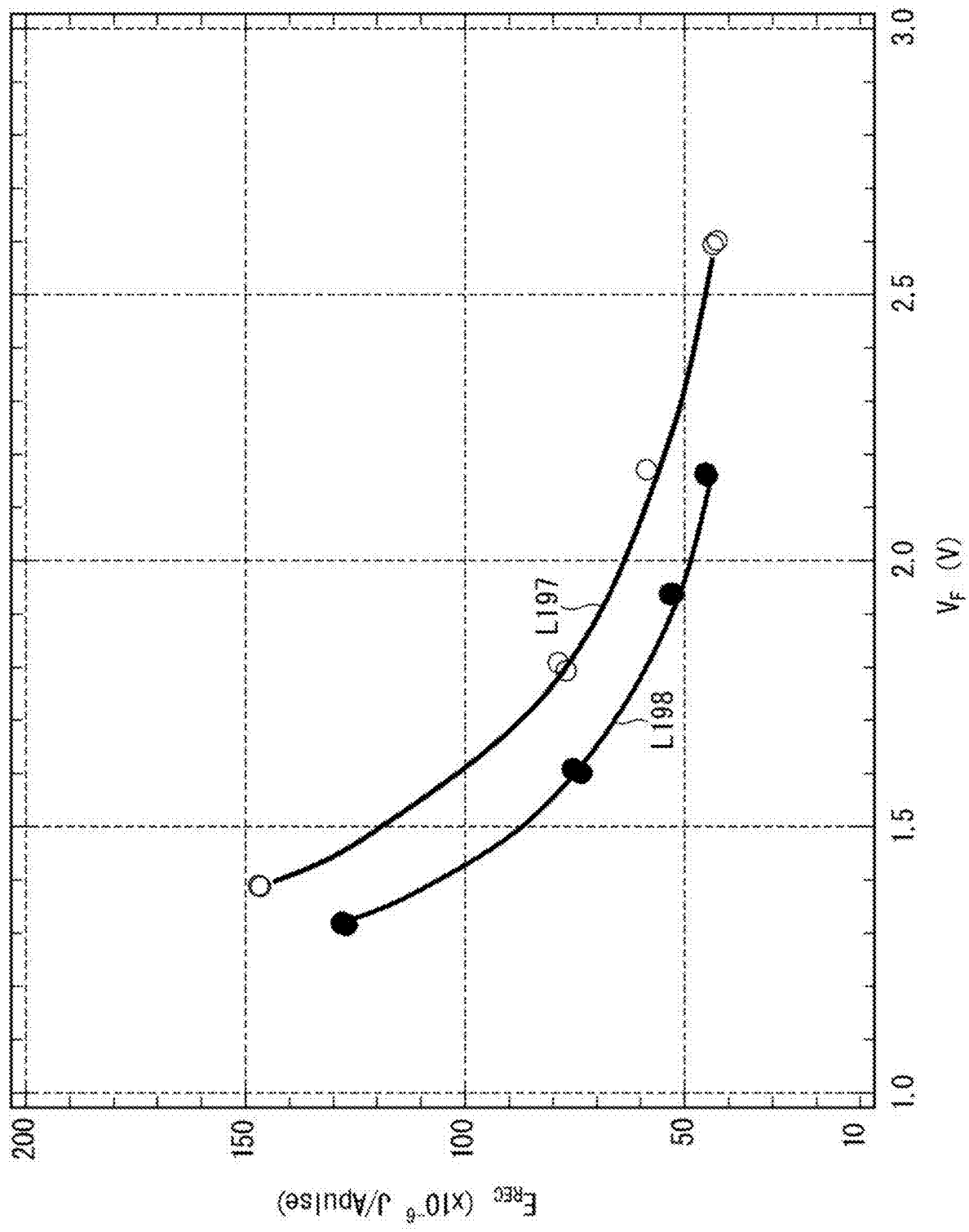
FIG. 78 illustrates total loss performance of the RFC diode.

FIG. 78 illustrates trade-off characteristics between total loss performance serving as a key indicator of diode performance, i.e., losses in the ON state (ON-state voltage: $V_F$), and losses during turn-off operations (recovery losses: $E_{REC}$). In FIG. 78, the horizontal axis indicates $V_F$, and the vertical axis indicates $E_{REC}$. Note that the power supply voltage $V_{CC}$ is 600 V, $J_F$=326 A/cm$^{-2}$, $L_S$=200 nH, and the operating temperature is 423 K. In FIG. 78, a solid line L197 indicates characteristics of the comparative example, and a solid line L198 indicates characteristics of the second structure. It can be seen from FIG. 78 that the RFC diode having the second structure can improve the total loss performance as compared with that in the comparative example.

It can be seen from FIGS. 71 and 78 that although lattice defects or complex defects exist in the second buffer layer 15bs, the second structure can improve its performance and achieve operations at a high temperature of 473 K, without giving adverse effects on the operation of the diode, by controlling the second buffer layer 15bs so as to satisfy the above-described conditions a) to c). Note that the first structure can also ensure similar performance to that of the second structure by controlling various conditions of the second buffer layer 15bs.

Fourth Preferred Embodiment

Figure 79:
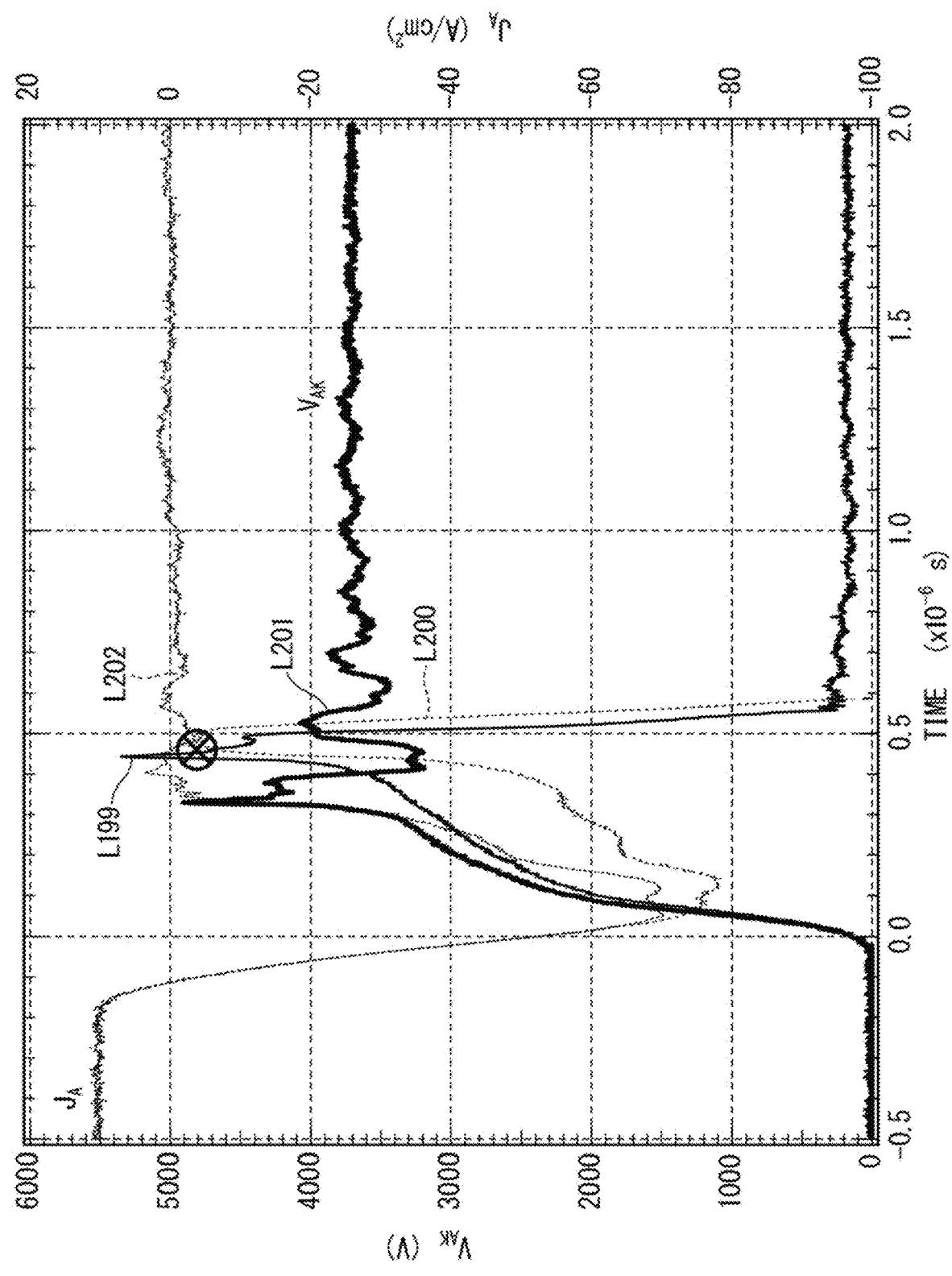
FIG. 79 illustrates snappy recovery waveforms of the PIN diode.
Figure 80:
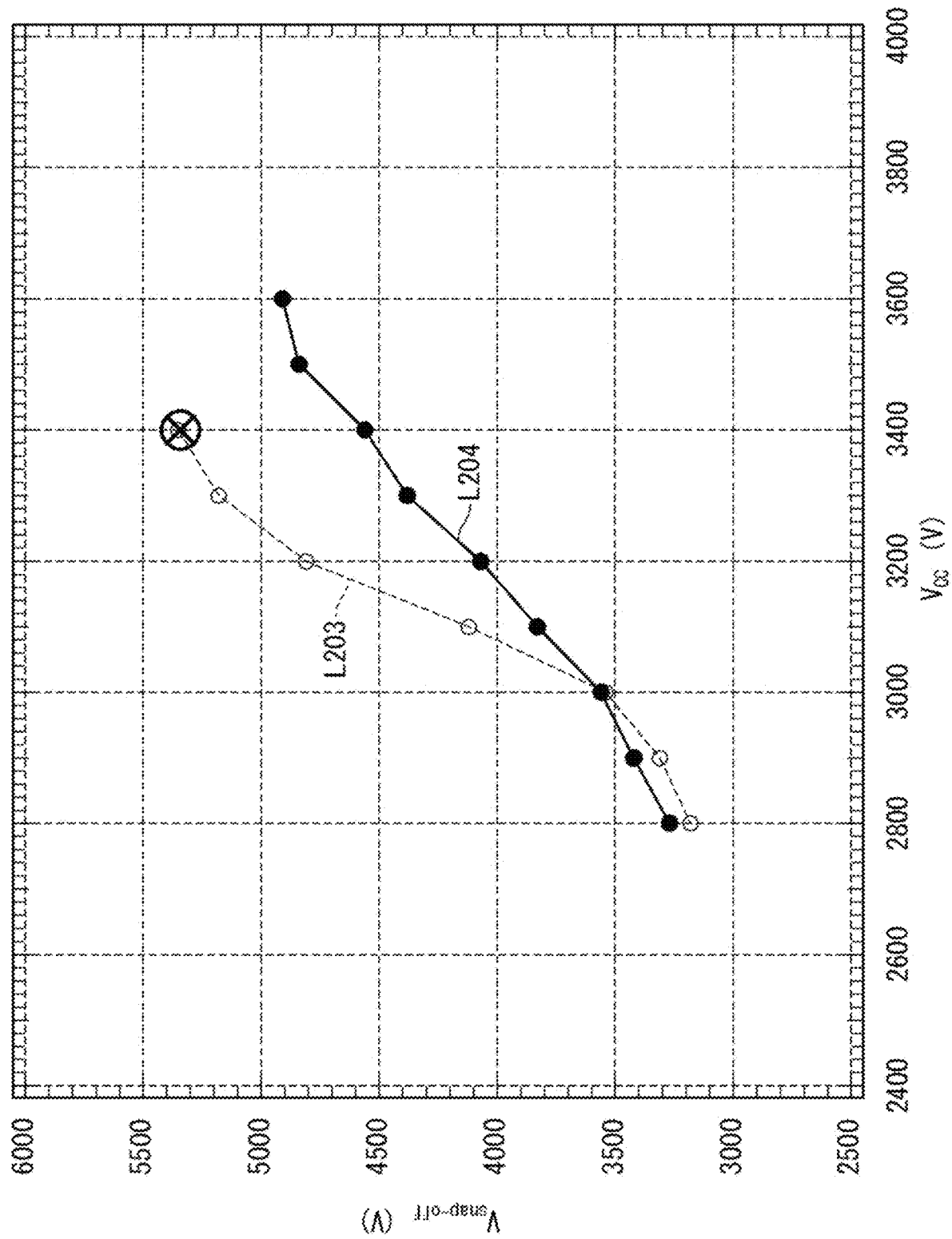
FIG. 80 illustrates a relationship between the snap-off voltage and the power supply voltage in the PIN diode.
Figure 81:
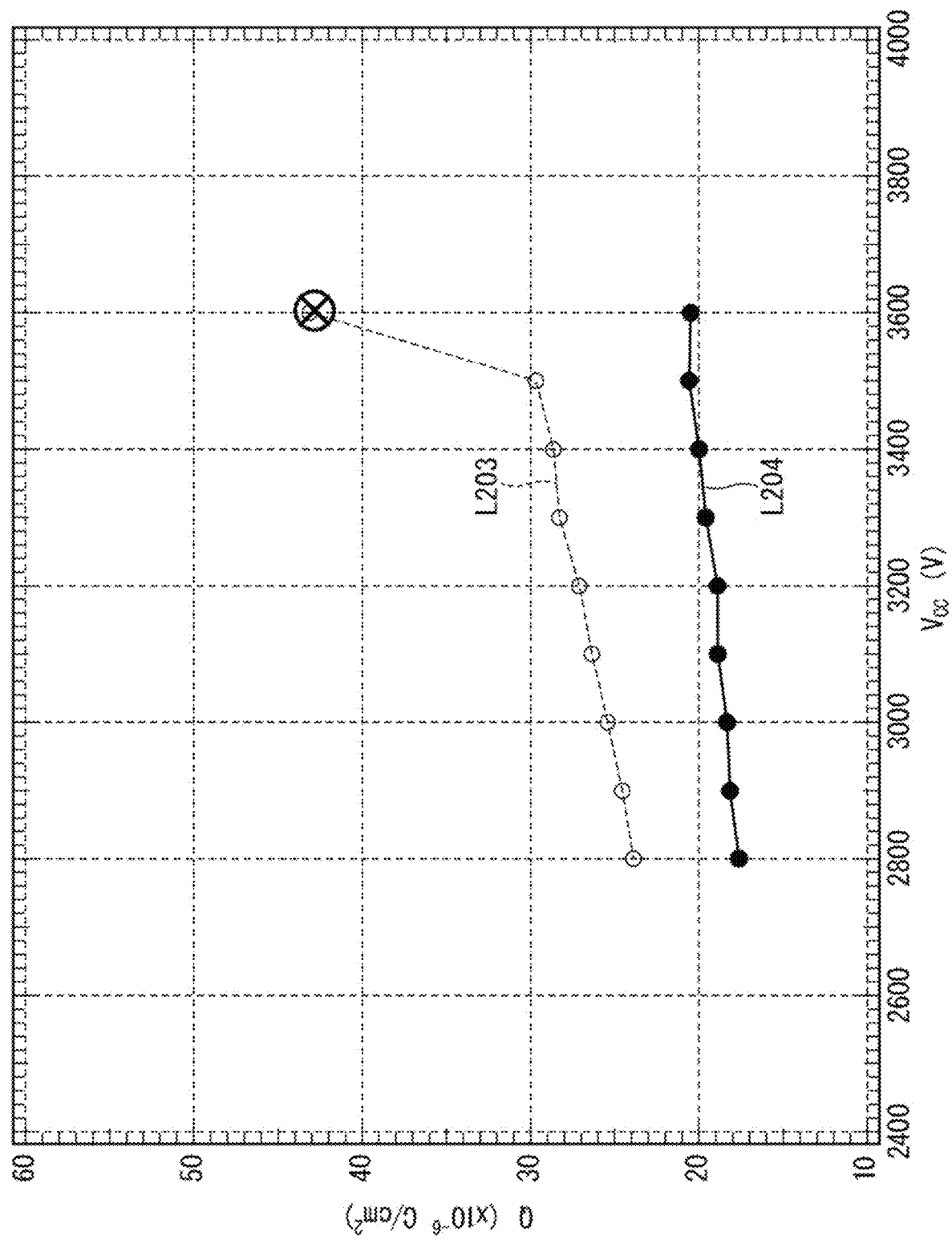
FIG. 81 illustrates a relationship between the amount of accumulated charge and the power supply voltage in the PIN diode.

FIGS. 79 to 81 illustrate the results of diode performance in the case where the activation annealing conditions, various structural parameters, and the conditions a) to c) described in the first to third preferred embodiments are applied to the N buffer layer 15 of a PIN diode with a withstand voltage class of 4500 V. Crosses in the drawings indicate points at which a breakdown of the target device has occurred. Switching conditions in these drawings include $V_{CC}$=3600 V, $J_F$=0.1 $J_A$, dj/dt=280 A/cm$^{-2}$ μs, dV/dt=23000 V/μs, $L_S$=2.0 μH, and a temperature of 298 K. These drawings also illustrate, as a comparative example, characteristics of a PIN diode that includes an N buffer layer 15 configured of only the first buffer layer 15a.

FIG. 79 illustrates a snappy recovery waveform. In FIG. 79, the horizontal axis indicates time (×10$^{-6}$ seconds), and the vertical axis indicates the anode-cathode voltage $V_{AK}$ (V) and the anode current density $J_A$ (A/cm$^{-2}$). A solid line L199 and a broken line L200 respectively indicate $V_{AK}$ and $J_A$ for the comparative example. A solid line L201 and a broken line L202 respectively indicate $V_{AK}$ and $J_A$ for the second structure.

As compared with the RFC diode, the PIN diode has a smaller effect of suppressing the snap-off phenomenon during a recovery operation because the residual carrier plasma layer is easily depleted on the cathode side of the N buffer layer 15 in the latter half of the recovery operation. As a result, in the comparative example, a snap-off phenomenon occurs and a device breakdown occurs after the snap-off phenomenon as illustrated in FIG. 79. However, in the PIN diode having the second structure, the speed of extension of depletion layers that extend from the main junction during the recovery operation decreases in the second buffer layer 15b under the influence of the residual carrier plasma layer in the vicinity of the junction between the N$^-$ drift layer 14 and the nth sub-buffer layer 15bn. Thus, even if a snap-off phenomenon has occurred, $V_{snap-off}$ becomes smaller than in the comparative example. That is, in the second structure, the carrier plasma layer that has existed since the ON state in the second buffer layer 15b still remains during the recovery operation as indicated by an area A11 in FIG. 27 and the area A12 in FIG. 29. This allows the electric field intensity distribution to be controlled to delay the snap-off point, and as a result, a device breakdown can be avoided.

FIG. 80 illustrates a relationship between $V_{snap-off}$ and $V_{CC}$ at 25° C. In FIG. 80, the horizontal axis indicates $V_{CC}$ (V), and the vertical axis indicates $V_{snap-off}$ (V). FIG. 81 illustrates a relationship between $Q_{RR}$ and $V_{CC}$ at 25° C. In FIG. 81, the horizontal axis indicates $V_{CC}$ (V), and the vertical axis indicates $Q_{RR}$ (×10$^{-6}$/cm$^{-2}$). In FIGS. 80 and 81, characteristics of the comparative example are indicated by open circles and a solid line L203, and characteristics of the second structure are indicated by solid circles and a solid line L204.

It can be seen from FIG. 80 that the adoption of the second structure in the PIN diode avoids a device breakdown even at a voltage that causes a device breakdown in the comparative example, and it also improves breakdown tolerance during a snappy recovery operation. Besides, it can be seen that, as compared with the comparative example, the N buffer layer 15 in the second structure can reduce dependence of $V_{snap-off}$ on $V_{CC}$ and can more effectively increase breakdown tolerance on the high $V_{CC}$ side.

It can be seen from FIG. 81 that, as compared with the comparative example, the second structure can reduce dependence of $Q_{RR}$ on $V_{CC}$. Accordingly, the second structure can improve breakdown tolerance during snappy recovery operations of the PIN diode. As described above, the second structure has the effect of improving breakdown tolerance even in the PIN diode.

Fifth Preferred Embodiment

A semiconductor device according to a fifth preferred embodiment attempts to further improve blocking capability when the IGBT and the diode are turned off, according to a relationship between the consistent elements of the power semiconductor illustrated in FIG. 4 and the distinctive N buffer layer 15 described in the first to fourth preferred embodiments.

FIGS. 82 to 91 are sectional views illustrating first to tenth aspects of the semiconductor device according to the fifth preferred embodiment. Each of these sections corresponds to a section taken along A1-A1 in FIG. 4. The first, second, and ninth aspects are improvements of the IGBT (FIGS. 1 and 30), the third aspect is an improvement of the PIN diode (FIGS. 2 and 31), and the fourth to eighth and tenth aspects are improvements of the RFC diode (FIGS. 3 and 32).

Hereinafter, components that are identical to those in FIGS. 1 to 3 and FIGS. 30 to 32 are appropriately given the same reference numerals, and description thereof has been omitted. The following description focuses on distinctive parts.

Figure 82:
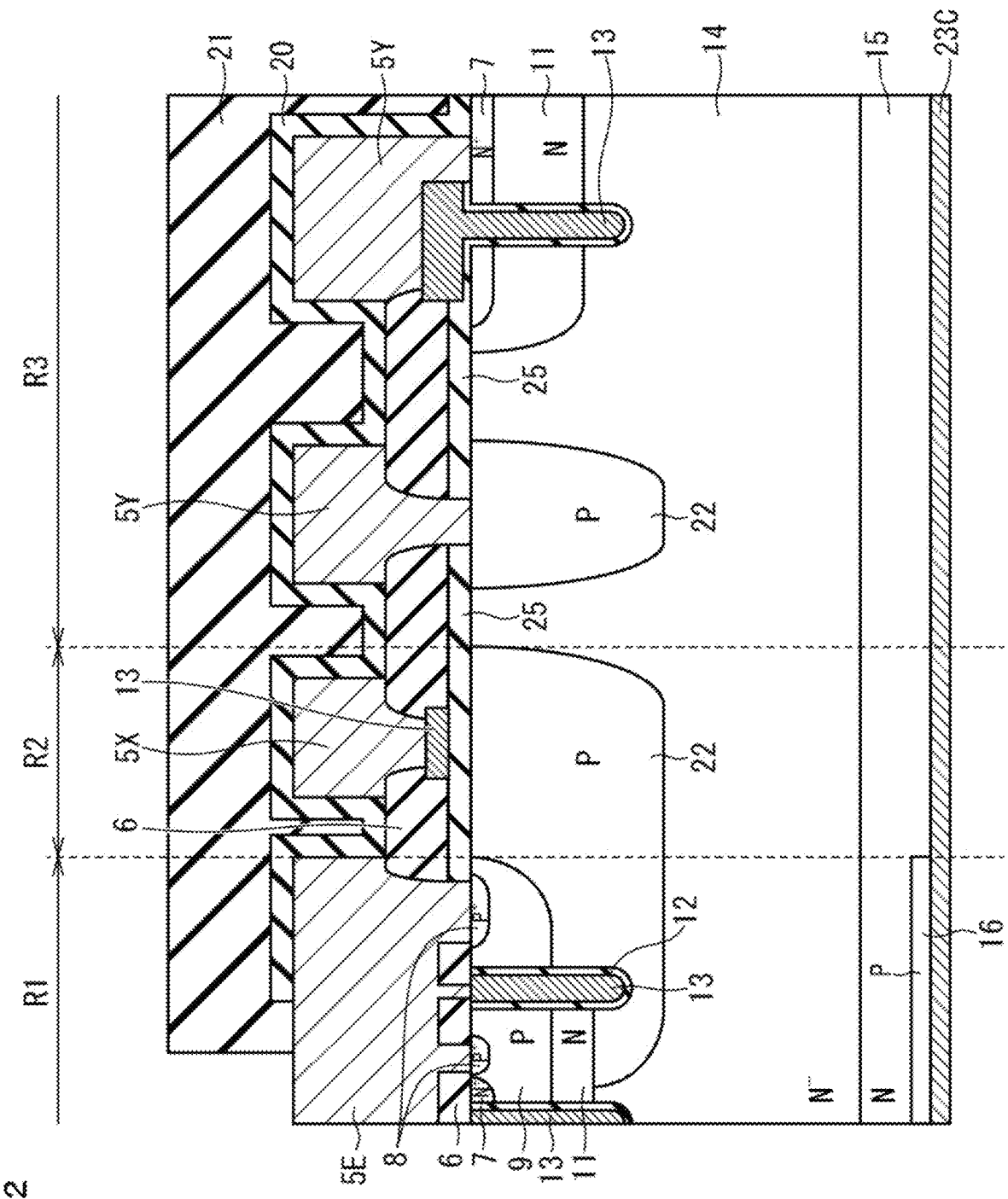
FIG. 82 is a sectional view of a semiconductor device according to a first aspect of a fifth preferred embodiment.

As compared with the IGBT illustrated in FIGS. 1 and 30, the first aspect illustrated in FIG. 82 is characterized in that the P collector layer 16 is not formed in the interface area R2 and the termination area R3, which are peripheral areas of the active cell area R1, and the N buffer layer 15 is formed extending to the area where the P collector layer 16 is not formed. That is, in the interface area R2 and the termination area R3, the collector electrode 23C is joined to the N buffer layer 15 and provided on the N buffer layer 15.

Figure 83:
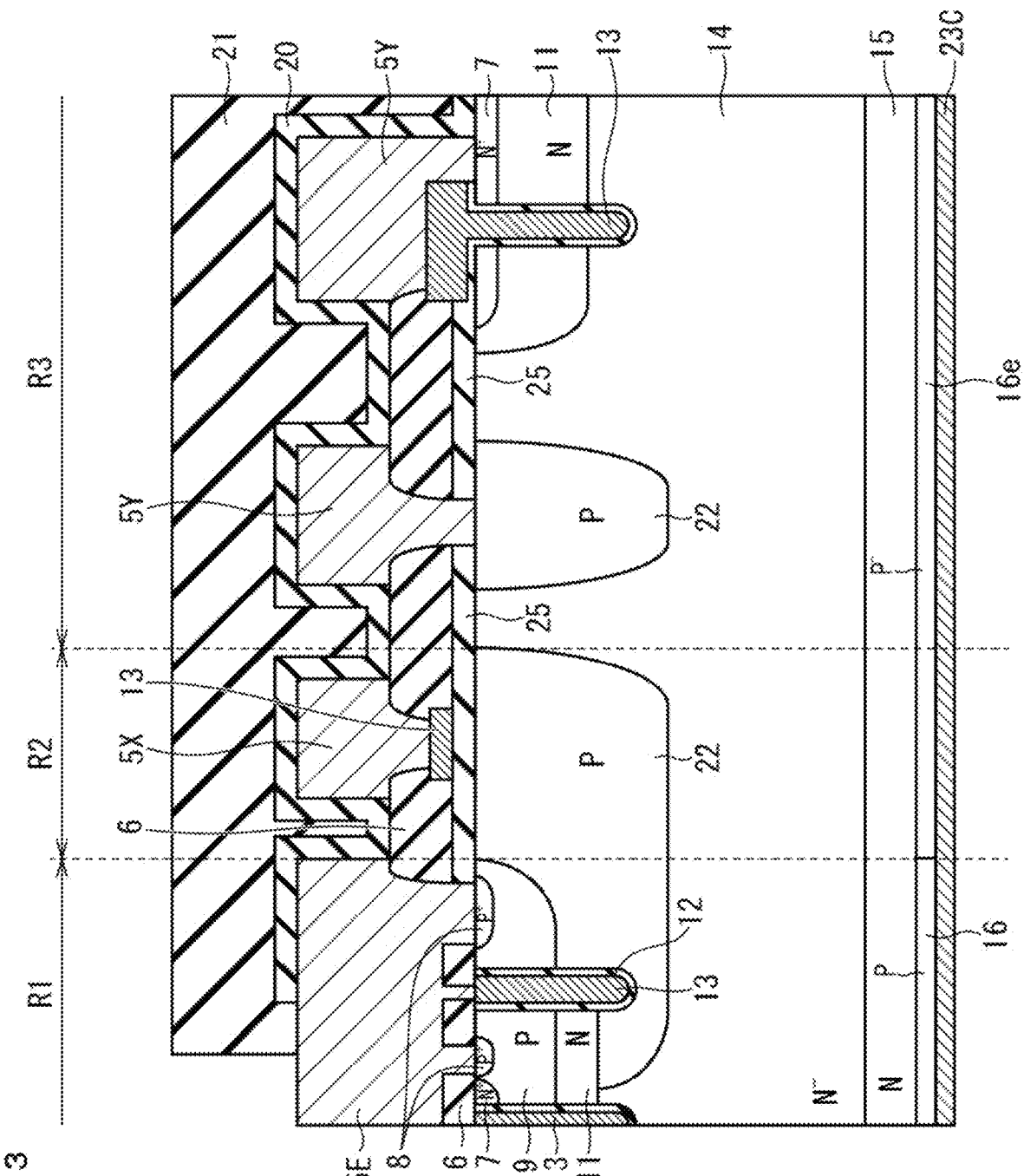
FIG. 83 is a sectional view of a semiconductor device according to a second aspect of the fifth preferred embodiment.

As compared with the IGBT illustrated in FIGS. 1 and 30, the second aspect illustrated in FIG. 83 is characterized in that a P collector layer 16e is formed in the interface area R2 and the termination area R3, which are peripheral areas of the active cell area R1, without forming the P collector layer 16 therein. Note that the P collector layer 16e is set to have a lower surface concentration than that of the P collector layer 16.

Figure 84:
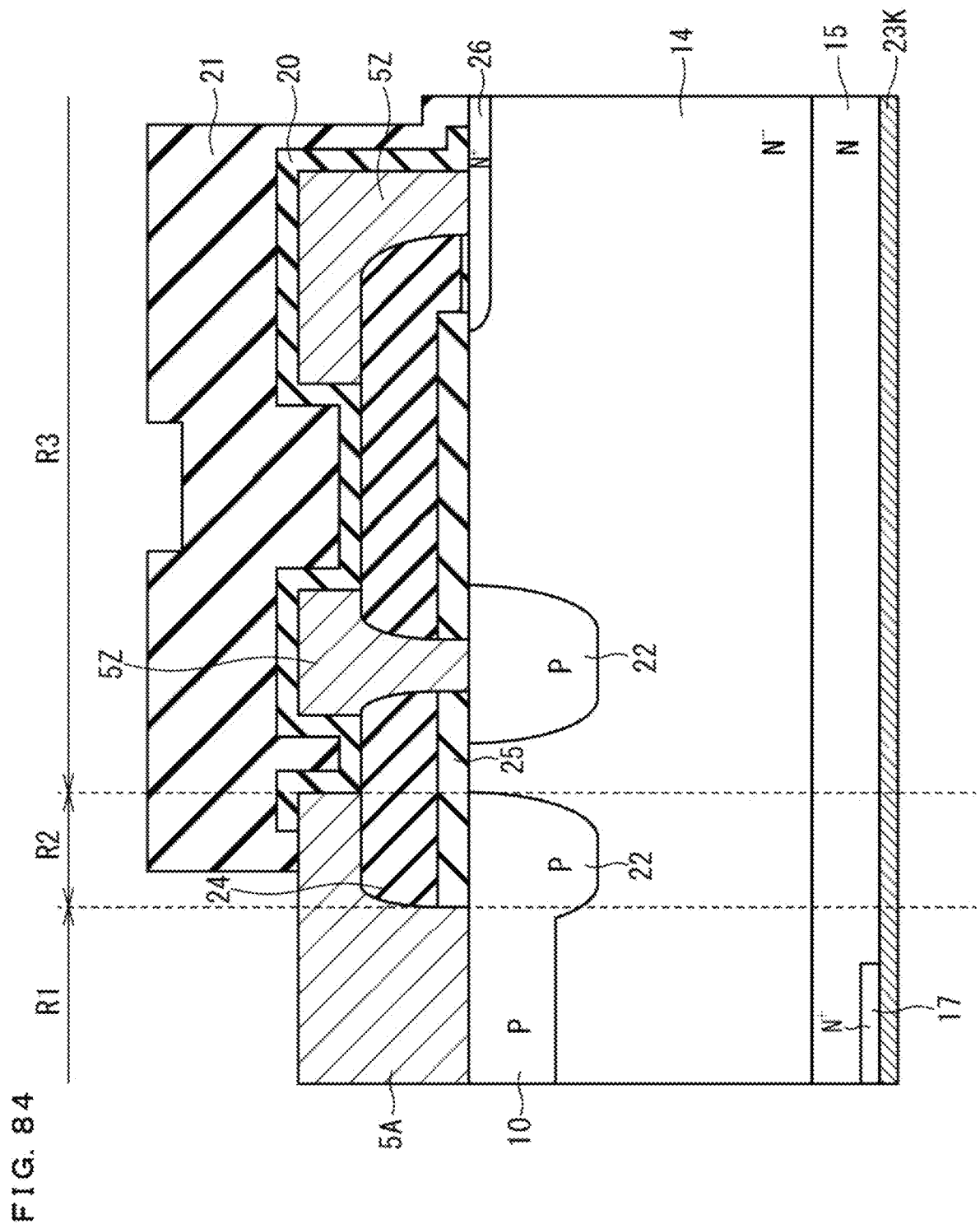
FIG. 84 is a sectional view of a semiconductor device according to a third aspect of the fifth preferred embodiment.

As compared with the PIN diode illustrated in FIGS. 2 and 31, the third aspect illustrated in FIG. 84 is characterized in that the N$^+$ cathode layer 17 is not formed in the interface area R2 and the termination area R3, which are peripheral areas of the active cell area R1, and the N buffer layer 15 is formed extending to the area where the N$^+$ cathode layer 17 is not formed. That is, in the interface area R2 and the termination area R3, the cathode electrode 23K is joined to the N buffer layer 15 and provided on the N buffer layer 15.

Figure 85:
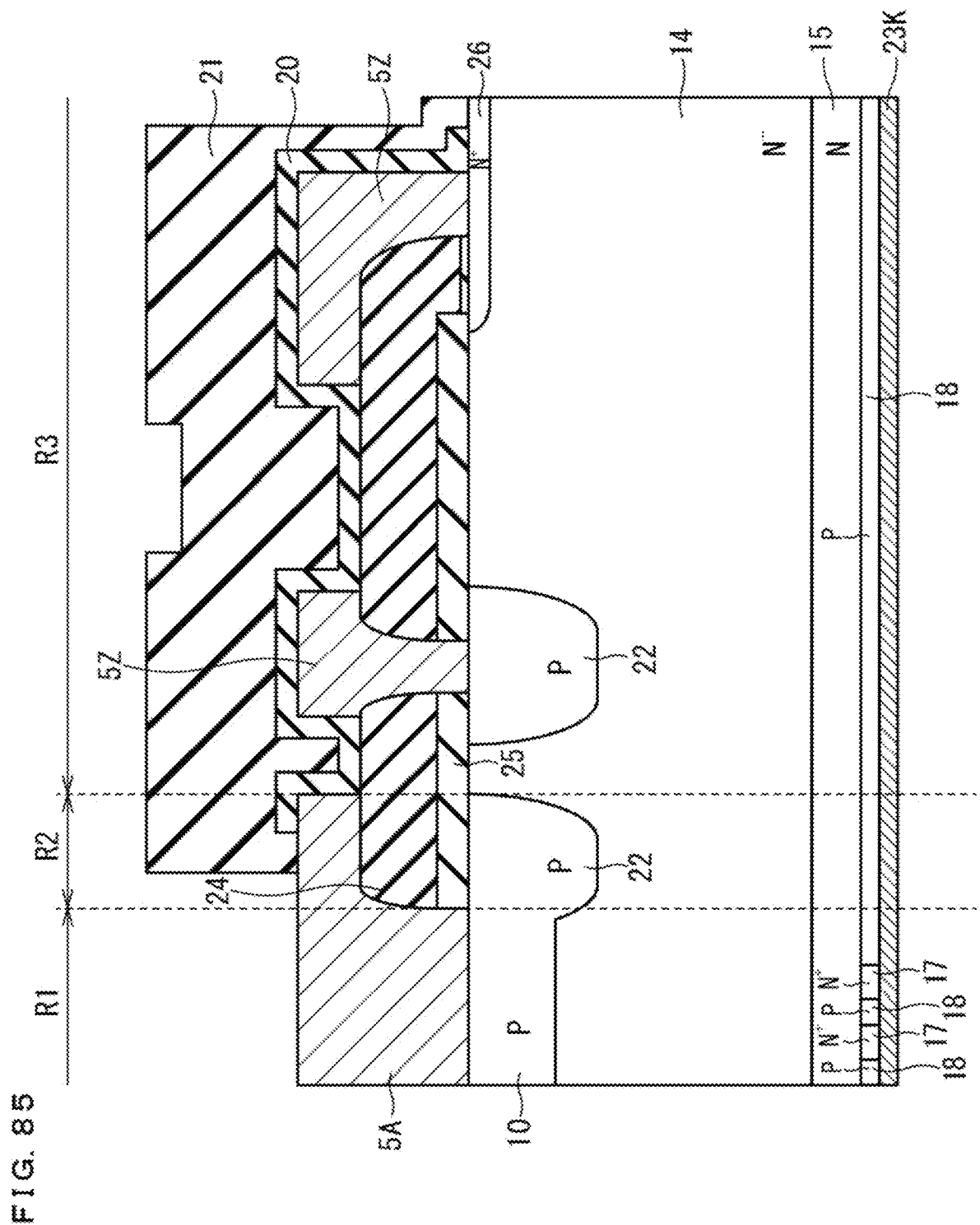
FIG. 85 is a sectional view of a semiconductor device according to a fourth aspect of the fifth preferred embodiment.
Figure 86:
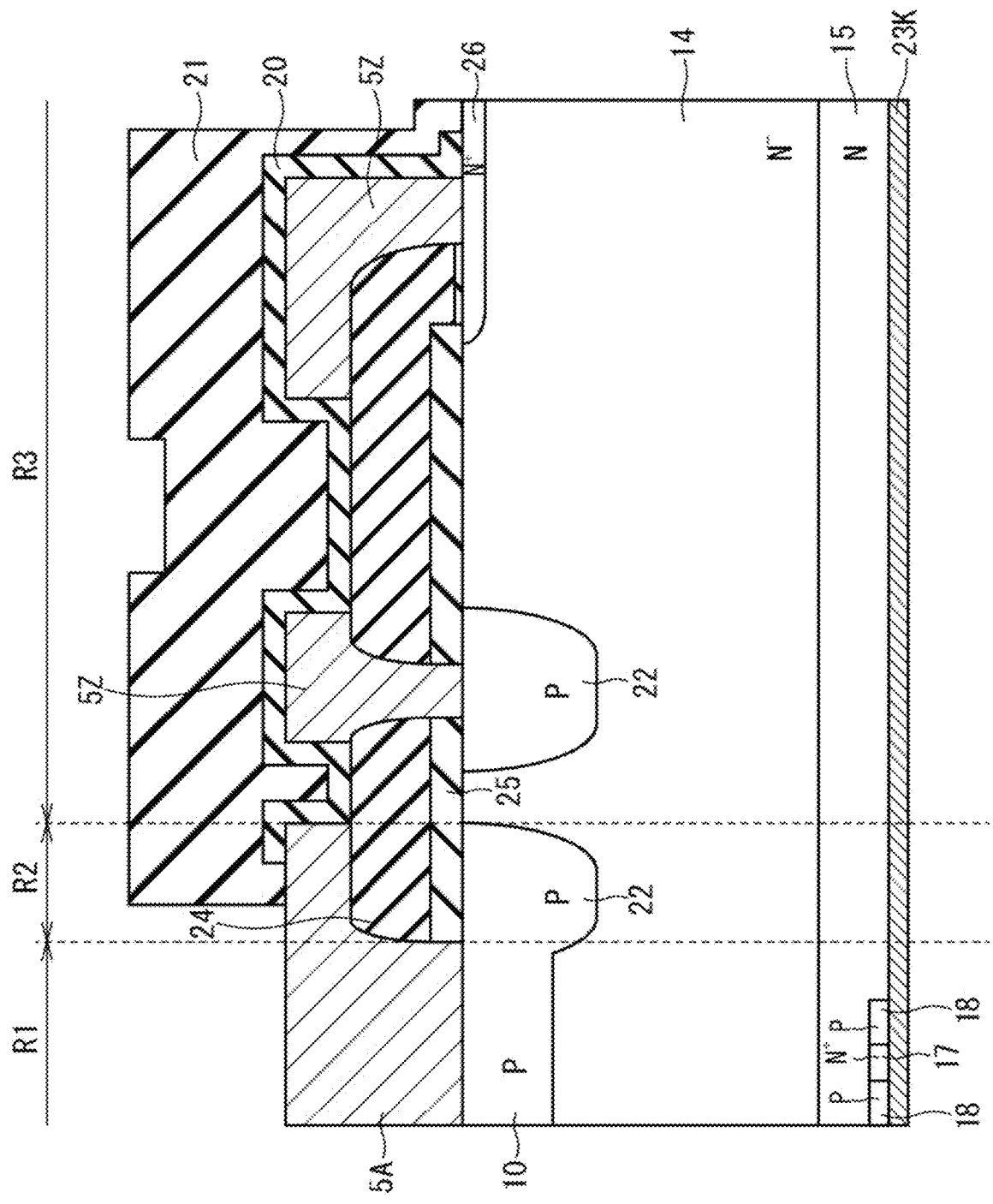
FIG. 86 is a sectional view of a semiconductor device according to a fifth aspect of the fifth preferred embodiment.

As compared with the RFC diode illustrated in FIGS. 3 and 32, the fourth aspect illustrated in FIG. 85 is characterized in that the P cathode layer 18 (second partial active layer) is formed in the interface area R2 and the termination area R3, which are peripheral areas of the active cell area R1, without forming the N$^+$ cathode layer 17 (first partial active layer) therein As compared with the RFC diode illustrated in FIGS. 3 and 32, the fifth aspect illustrated in FIG. 86 is characterized in that the P cathode layer 18 is not formed in the interface area R2 and the termination area R3, which are peripheral areas of the active cell area R1, and the N buffer layer 15 is formed extending to the area where the P cathode layer 18 is not formed. That is, in the interface area R2 and the termination area R3, the cathode electrode 23K is joined to the N buffer layer 15 and provided on the N buffer layer 15.

Figure 87:
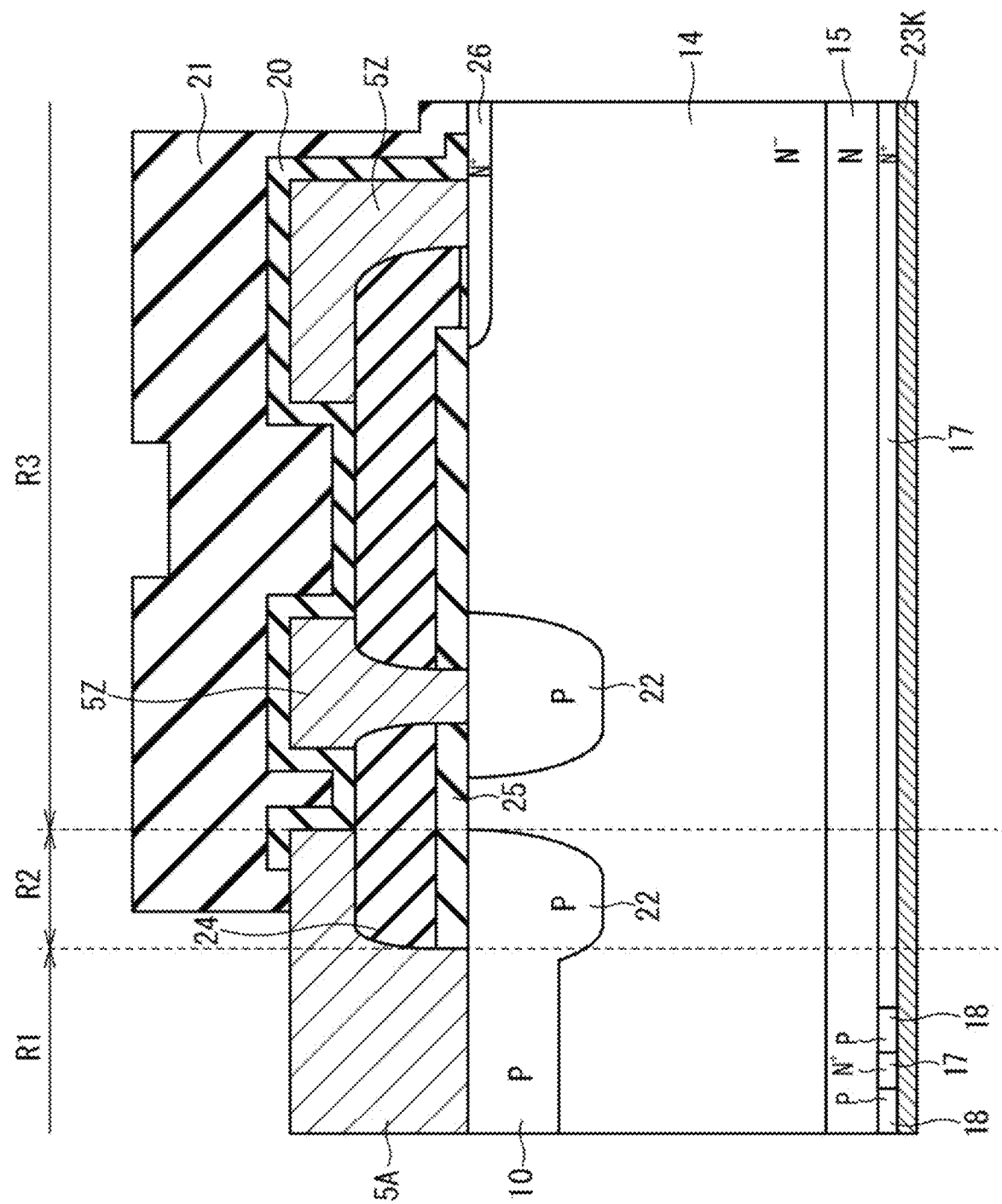
FIG. 87 is a sectional view of a semiconductor device according to a sixth aspect of the fifth preferred embodiment.

As compared with the RFC diode illustrated in FIGS. 3 and 32, the sixth aspect illustrated in FIG. 87 is characterized in that the N$^+$ cathode layer 17 (first partial active layer) is formed in the interface area R2 and the termination area R3, which are peripheral areas of the active cell area R1, without forming the P cathode layer 18 (second partial active layer) therein.

Figure 88:
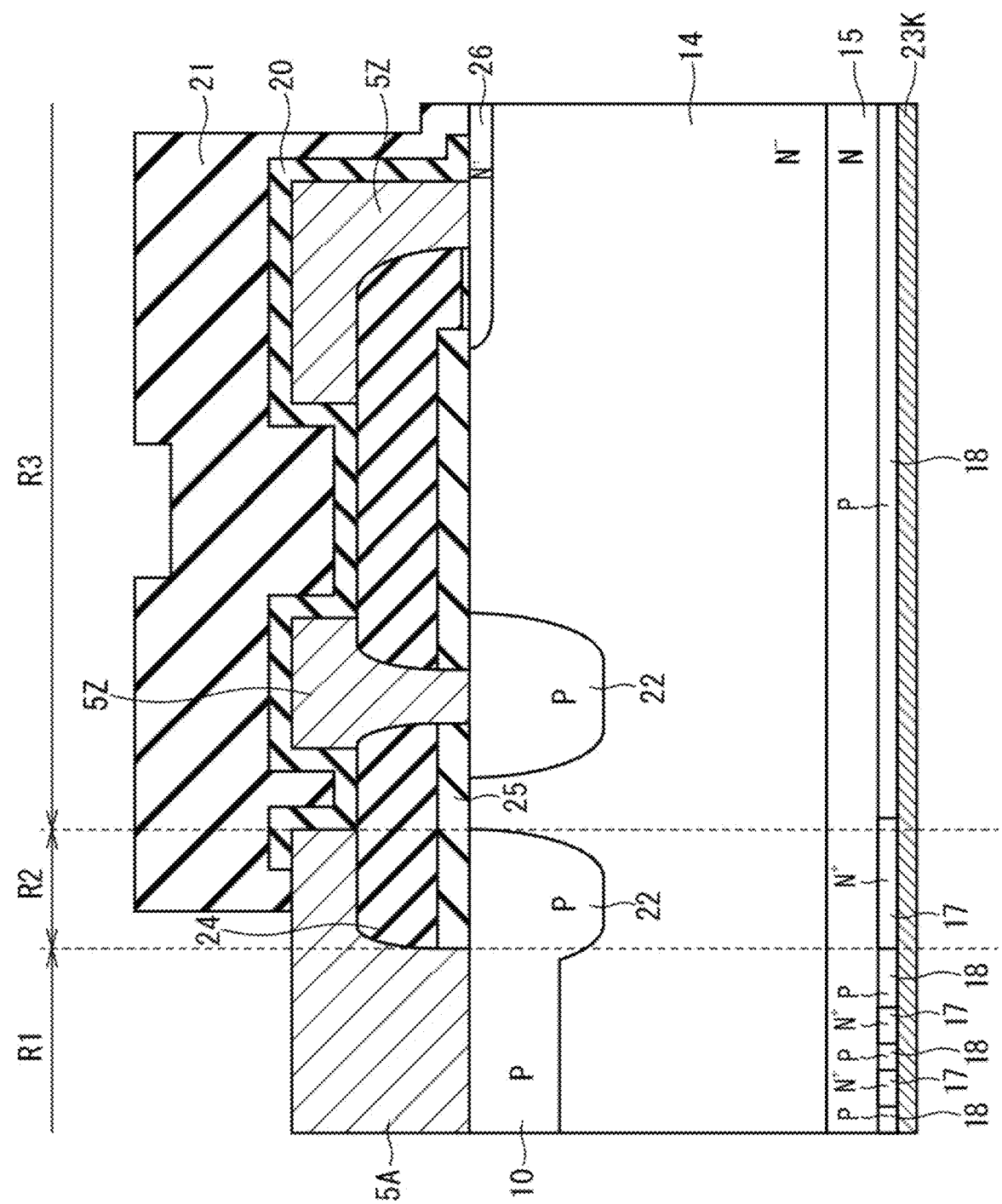
FIG. 88 is a sectional view of a semiconductor device according to a seventh aspect of the fifth preferred embodiment.

As compared with the RFC diode according to the fourth aspect illustrated in FIG. 85, the seventh aspect illustrated in FIG. 88 is characterized in that the N$^+$ cathode layer 17 (first partial active layer) is formed instead of the P cathode layer 18 in the interface area R2.

Figure 89:
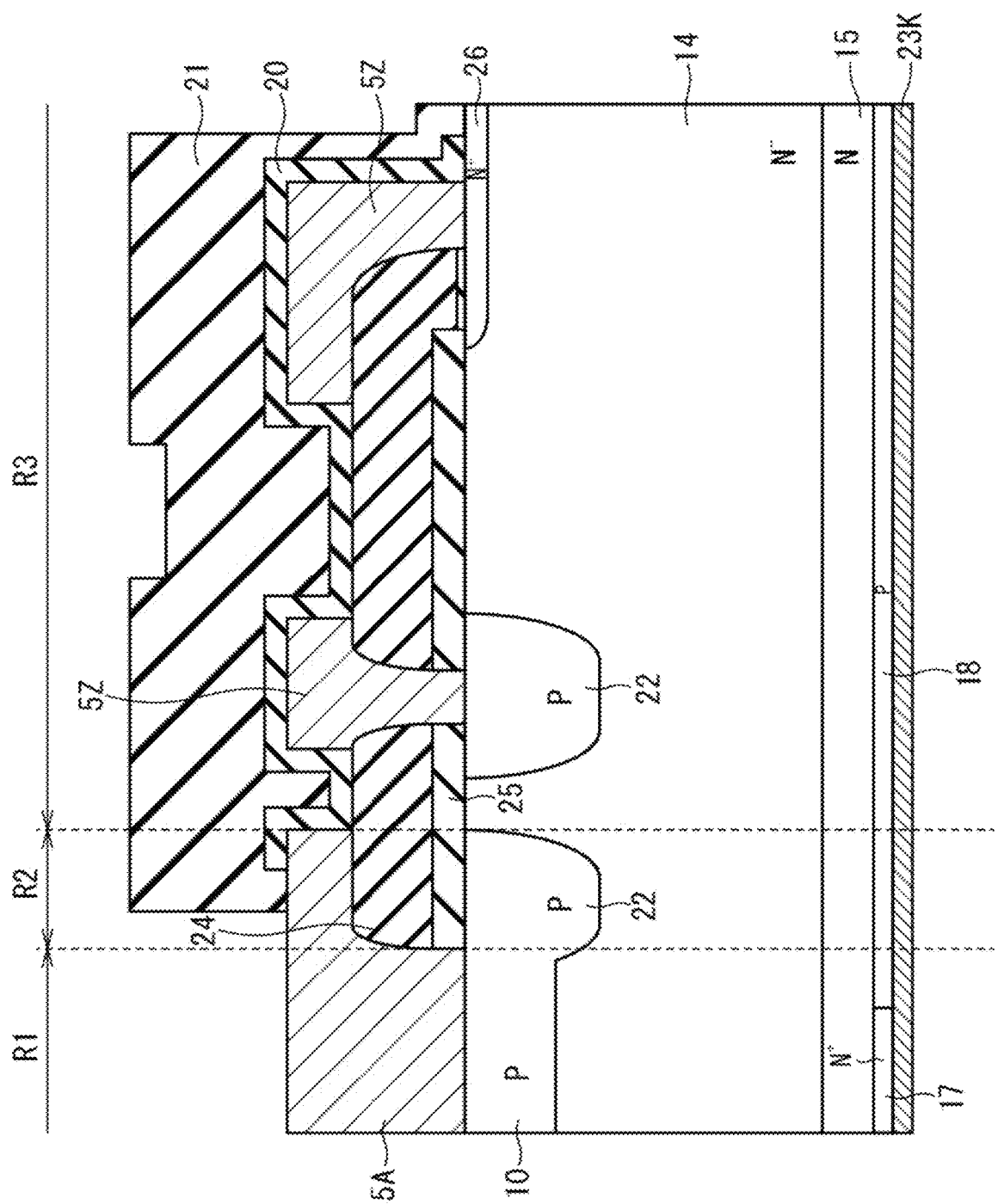
FIG. 89 is a sectional view of a semiconductor device according to an eighth aspect of the fifth preferred embodiment.

As compared with the PIN diode illustrated in FIGS. 2 and 31, the eighth aspect illustrated in FIG. 89 is characterized in that the P cathode layer 18 (second partial active layer) is formed in an area ranging from the interface area R2 to the termination area R3.

Figure 90:
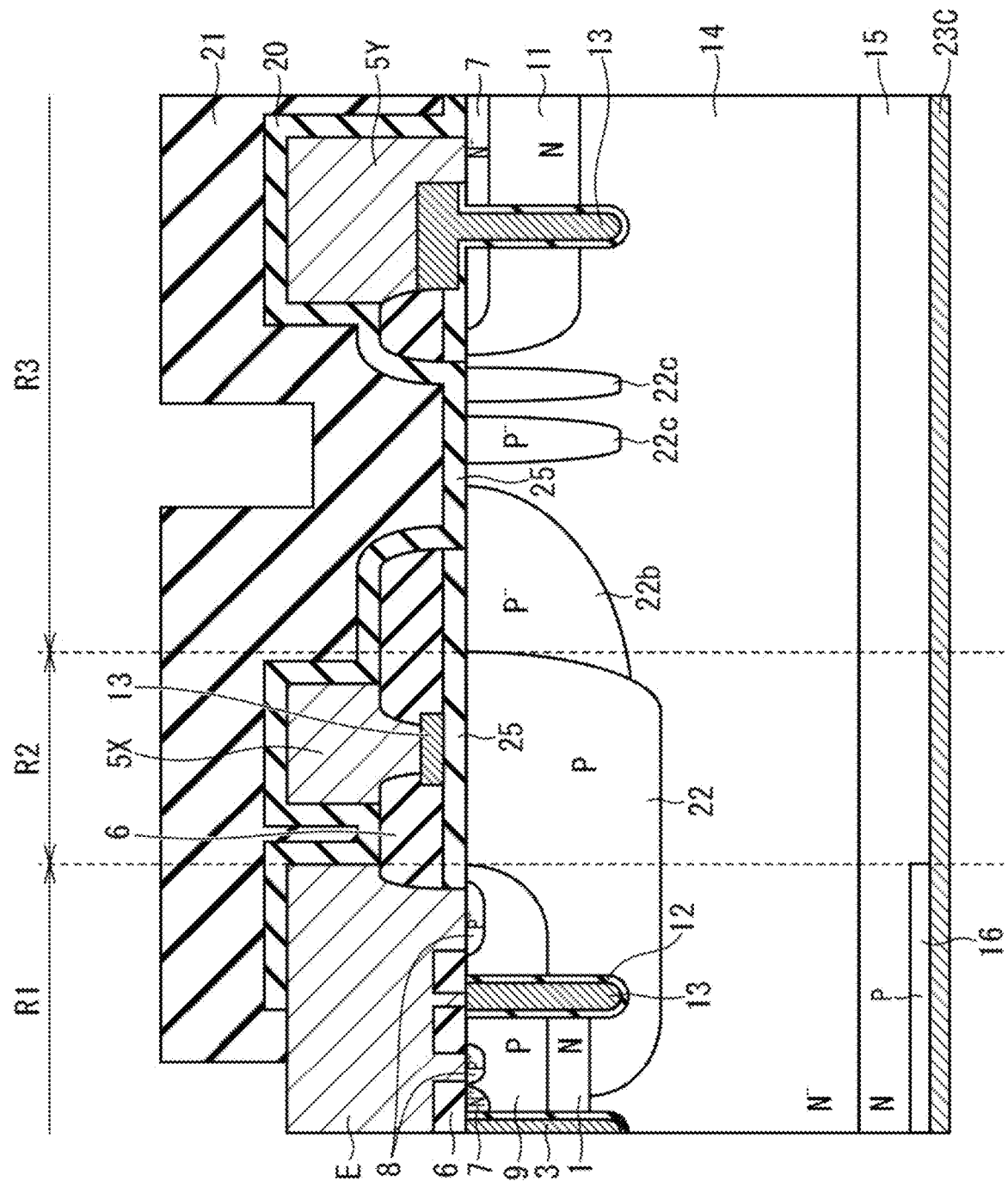
FIG. 90 is a sectional view of a semiconductor device according to a ninth aspect of the fifth preferred embodiment.

As compared with the IGBT illustrated in FIG. 82, the ninth aspect illustrated in FIG. 90 is characterized in that a P area 22b that is connected to the P area 22 and a plurality of P areas 22c that are in contact with the passivation film 20 are formed on the first main surface side within the N$^-$ drift layer 14 in the termination area R3.

Figure 91:
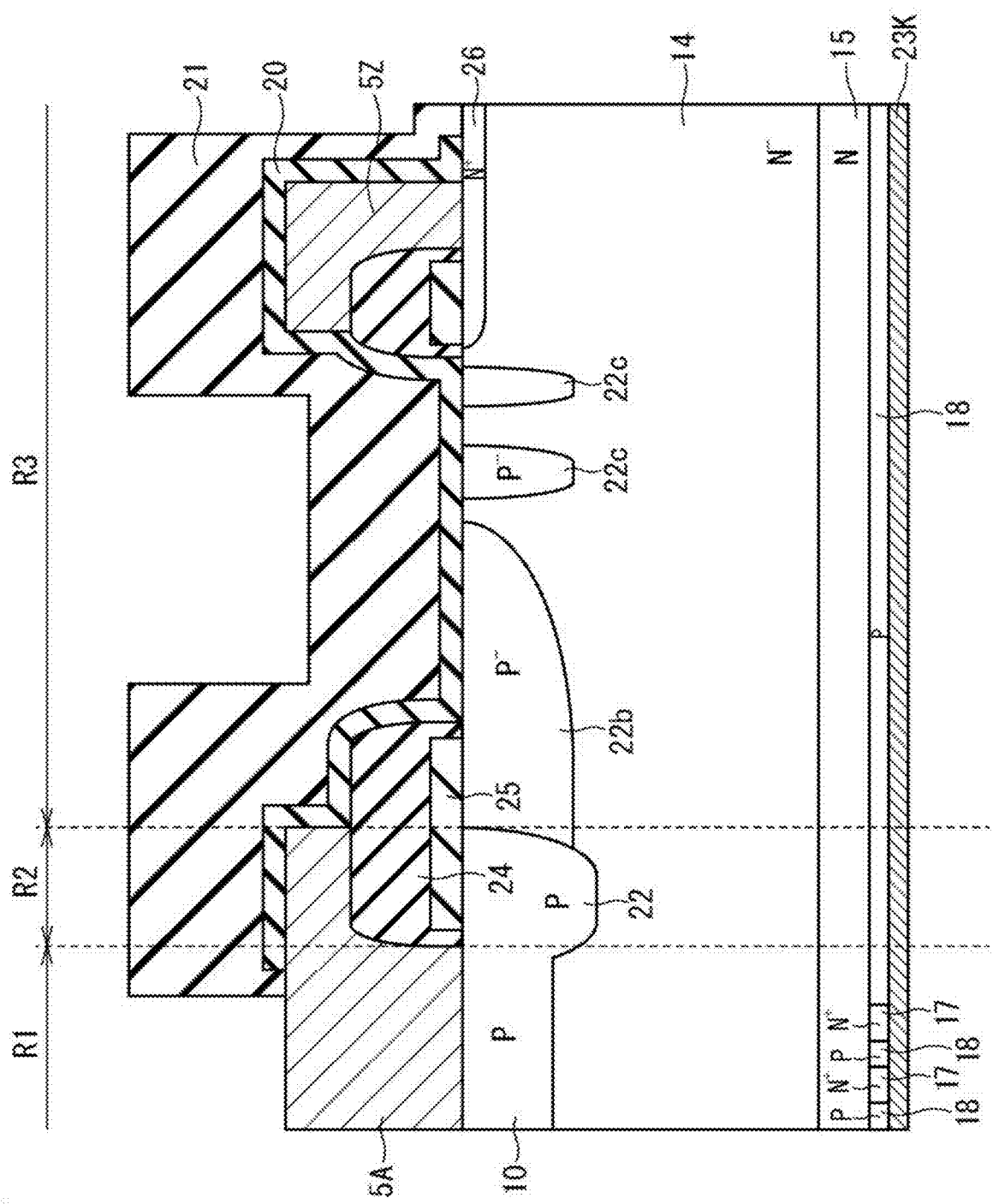
FIG. 91 is a sectional view of a semiconductor device according to a tenth aspect of the fifth preferred embodiment.

As compared with the RFC diode illustrated in FIG. 85, the tenth aspect illustrated in FIG. 91 is characterized in that a P area 22b that is connected to the P area 22 and a plurality of P areas 22c that are in contact with the passivation film 20 are formed on the first main surface side within the N$^-$ drift layer 14 in the termination area R3. Characteristics and effects of the structure in the termination area R3 in FIGS. 90 and 91 are described in International Publication No. 2015/114748 and Japanese Patent Application No. 2015-230229.

In this way, the first to tenth aspect of the fifth preferred embodiment are characterized in that, in the IGBT, the PIN diode, and the RFC diode, changes are made to the structure of an area corresponding to the active layer that comes in contact with the collector electrode 23C or the cathode electrode 23K in the active cell area R1, the interface area R2, and the termination area R3. The first to tenth aspects are structured such that, in the IGBT, the PIN diode, and the RFC diode, carrier injection from the collector or cathode side has been suppressed since the ON state in the interface area R2 and the termination area R3. As a result, the first to tenth aspects of the fifth preferred embodiment have the functions of alleviating an electric field intensity at the PN junction, which is the main junction existing in the interface area R2, during turn-off operations, suppressing a local increase in electric field intensity, and suppressing thermal breakdown resulting from a local temperature increase caused by current concentration due to impact ionization.

Details of the mechanism and effects of this phenomenon in the IGBT are described in Japanese Patents No. 5708803 and No. 5701447 and International Publication No. 2015/114747, and those in the diode are described in Japanese Patent Application Laid-Open No. 2014-241433.

Figure 92:
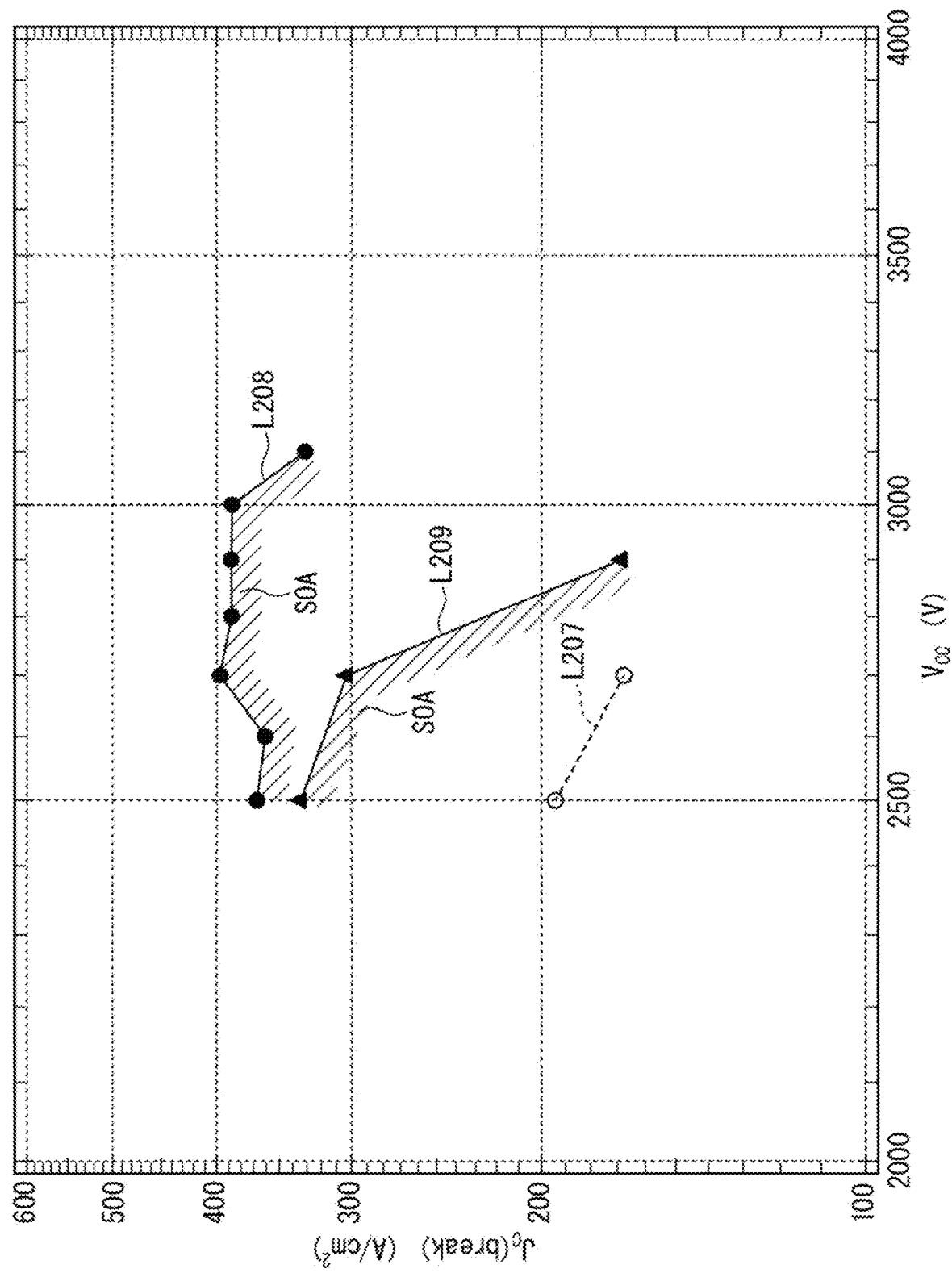
FIG. 92 illustrates an RBSOA of an IGBT according to the second aspect of the fifth preferred embodiment.

FIG. 92 illustrates a reverse bias safe operating area (RBSOA) in the IGBT with a withstand voltage class of 3300 V according to the second aspect illustrated in FIG. 83. In FIG. 92, the horizontal axis indicates the power supply voltage $V_{CC}$ (V), and the vertical axis indicates the maximum blocking current density $J_C$ (break) (A/cm$^{-2}$) at turn-off. Note that $L_S$=2.47 µs. In FIG. 92, solid lines L208 and L209 indicate characteristics in the case of adopting the N buffer layer 15 (second structure) with the impurity profile illustrated in FIG. 33, and a broken line L207 indicates characteristics of an IGBT that an N buffer layer 15 configured of only the first buffer layer 15a according to the comparative example. Note that the solid line L208 indicates the characteristics of the second structure at 423 K, and the solid line L209 indicate the characteristics of the second structure at 448 K. The inner side of each line on the graph illustrated in FIG. 92 indicate the safe operating area (SOA).

It can be seen from FIG. 92 that in the case where the N buffer layer 15 has the second structure in the IGBT according to the second aspect, the RBSOA is enlarged to the high $J_C$ (break) side and the high $V_{CC}$ side, as compared with that in the comparative example. That is, the second structure can significantly improve the RBSOA of the IGBT.

Figure 93:
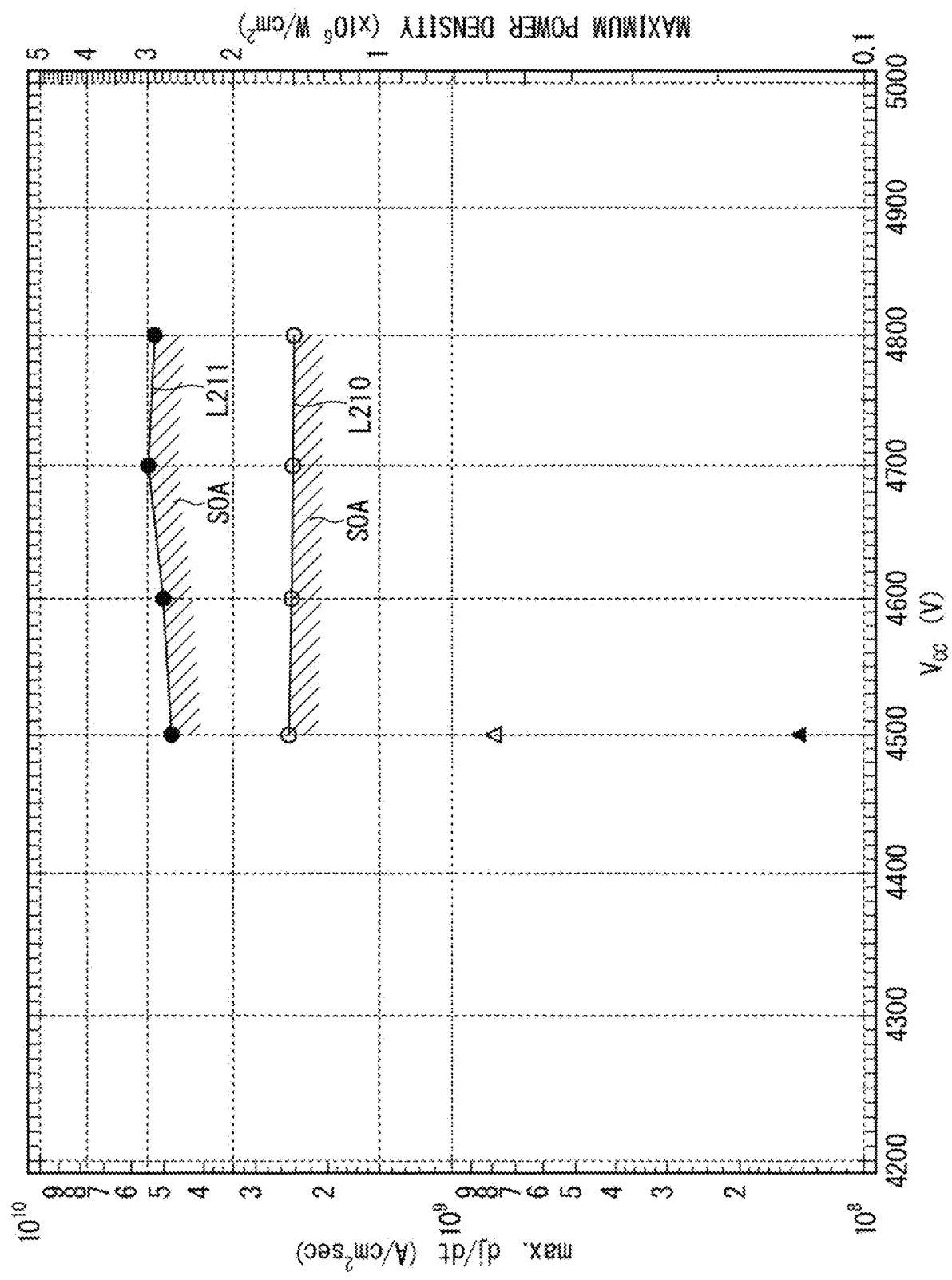
FIG. 93 illustrates a recovery SOA of an RFC diode according to the fourth aspect of the fifth preferred embodiment.

FIG. 93 illustrates a recovery SOA of the RFC diode with a withstand voltage class of 6500 V according to the fourth aspect illustrated in FIG. 83. In FIG. 93, the horizontal axis indicates $V_{CC}$ (V), and the vertical axis indicates max.dj/dt, which is a maximum blocking dj/dt, and a maximum power density during the recovery operation. Switching conditions include $J_F$=2.0 $J_A$, $L_S$=6.3 µH, and 398 K. An open triangle indicates max.dj/dt for the comparative example in which the N buffer layer 15 is configured of only the first buffer layer 15a, and a solid triangle indicates the maximum power density for the comparative example. A solid line L210 indicates max.dj/dt in the case where the N buffer layer 15 has the second structure, and a solid line L211 indicates the maximum power density in the case where the N buffer layer 15 has the second structure.

The inner side of each line on the graph in FIG. 93 indicates the SOA. It can be seen from FIG. 93 that, as compared with the RFC diode according to the comparative example, the RFC diode that includes the N buffer layer 15 having the second structure according to the fourth aspect has a recovery SOA that is enlarged to the side on which both of max.dj/dt and the maximum power density increase. That is, the second structure can significantly improve the recovery SOA of the RFC diode.

It can be seen from FIGS. 92 and 93 that the adoption of the second structure in the N buffer layer 15 of the IGBT according to the second aspect of the fifth preferred embodiment and that of the RFC diode according to the fourth aspect allows the SOA to be considerably enlarged at turn-off and considerably improves blocking capability at turn-off, which is one of the objects of the present invention. The IGBTs and the diodes according to the other aspects of the fifth preferred embodiment can also achieve similar effects to those in FIGS. 82 and 93 by adopting the second structure in the N buffer layer 15. Moreover, the termination area R3 as illustrated in FIGS. 90 and 91 also has the same vertical structure as that in FIG. 82 or 85, i.e., the vertical structure that is in contact with the collector electrode 23C or the cathode electrode 23K in the termination area R3, continued from the active cell area R1 and the interface area R2. Thus, by using the second structure in the N buffer layer 15, it is possible to achieve the same effects as those in FIGS. 92 and 93 on the SOA when the IGBT or the diode is turned off.

Note that embodiments of the present invention may be freely combined or appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
  a semiconductor base substrate having first and second main surfaces and including a drift layer of a first conductivity type as a principle component;
  a buffer layer of the first conductivity type formed adjacent to the drift layer on the second main surface side of the drift layer in the semiconductor base substrate;

an active layer formed on the second main surface of the semiconductor base substrate and having at least one of first and second conductivity types;

a first electrode formed on the first main surface of the semiconductor base substrate; and a second electrode formed on the active layer, wherein the buffer layer includes:

a first buffer layer joined to the active layer and having one peak point in impurity concentration; and a second buffer layer joined to the first buffer layer and the drift layer, having at least one peak point in impurity concentration, and having a lower maximum impurity concentration than the first buffer layer, an impurity concentration at the peak point of the first buffer layer is higher than an impurity concentration of the drift layer, and an impurity concentration of the second buffer layer is higher than the impurity concentration of the drift layer in an entire area of the second buffer layer.

2. The semiconductor device according to claim 1, wherein the second buffer layer has a laminated structure of a plurality of sub-buffer layers each having one peak point in impurity concentration, among the plurality of sub-buffer layers, a first sub-buffer layer that is a sub-buffer layer closest to the second main surface is joined to the first buffer layer, and a maximum impurity concentration of each of the plurality of sub-buffer layers is equal to or higher than a maximum impurity concentration of the sub-buffer layer adjacent to the second main surface of each of the plurality of sub-buffer layers.

3. The semiconductor device according to claim 1, wherein an effective total dose of the second buffer layer is higher than or equal to $1.0 \times 10^{10}$ cm$^{-2}$ and lower than or equal to $1.0 \times 10^{12}$ cm$^{-2}$.

4. The semiconductor device according to claim 1, wherein the second buffer layer has a carrier lifetime shorter than a carrier lifetime of the first buffer layer.

5. A method of manufacturing the semiconductor device according to claim 1, wherein (a) forming a first electrode on a first main surface of a semiconductor base substrate;

(b) after step (a), forming a protection film that protects a surface where the first electrode is formed;

(c) after step (b), controlling a thickness of the semiconductor base substrate by polishing or etching a second main surface of the semiconductor base substrate;

(d) after step (c), implanting first ions from the second main surface side of the semiconductor base substrate;

(e) after step (d), subjecting the semiconductor base substrate to annealing to activate the first ions and form the first buffer layer;

(f) after step (e), implanting second ions from the second main surface side of the semiconductor base substrate;

(g) after step (f), subjecting the semiconductor base substrate to annealing to activate the second ions and form a second buffer layer; and (h) after step (g), forming a second electrode on the second main surface of the semiconductor base substrate.

6. The method of manufacturing the semiconductor device according to claim 5, wherein an annealing temperature in the step (f) is higher than or equal to 370° C. and lower than or equal to 420° C.

* * * * *